US008193555B2

(12) United States Patent
Lin et al.

(10) Patent No.: US 8,193,555 B2
(45) Date of Patent: Jun. 5, 2012

(54) IMAGE AND LIGHT SENSOR CHIP PACKAGES

(75) Inventors: Mou-Shiung Lin, Hsin-Chu (TW); Jin-Yuan Lee, Hsin-Chu (TW)

(73) Assignee: Megica Corporation, Hsinchu (TW)

( * ) Notice: Subject to any disclaimer, the term of this patent is extended or adjusted under 35 U.S.C. 154(b) by 234 days.

(21) Appl. No.: 12/703,139

(22) Filed: Feb. 9, 2010

(65) Prior Publication Data

US 2010/0200898 A1 Aug. 12, 2010

Related U.S. Application Data

(60) Provisional application No. 61/151,529, filed on Feb. 11, 2009.

(51) Int. Cl.
*H01L 33/00* (2010.01)

(52) U.S. Cl. .................. 257/99; 257/294; 257/E51.027

(58) Field of Classification Search .................. 257/294, 257/E51.027

See application file for complete search history.

(56) References Cited

U.S. PATENT DOCUMENTS

| | | | | |
|---|---|---|---|---|
| 5,889,277 | A | 3/1999 | Hawkins et al. | |
| 6,399,418 | B1 | 6/2002 | Glenn et al. | |
| 7,638,813 | B2 * | 12/2009 | Kinsman | 257/99 |
| 2003/0010425 | A1 | 1/2003 | Lee et al. | |
| 2005/0104186 | A1 | 5/2005 | Yang et al. | |
| 2006/0154034 | A1 | 7/2006 | Araki | |

OTHER PUBLICATIONS

International Search Report and Written Opinion for International Application No. PCT/US2010/023762 by the PCT International Searching Authority dated Apr. 16, 2010.

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

(Continued)

*Primary Examiner* — Thien F Tran

(74) *Attorney, Agent, or Firm* — McDermott Will & Emery LLP

(57) ABSTRACT

An image or light sensor chip package includes an image or light sensor chip having a non-photosensitive area and a photosensitive area surrounded by the non-photosensitive area. In the photosensitive area, there are light sensors, a layer of optical or color filter array over the light sensors and micro-lenses over the layer of optical or color filter array. In the non-photosensitive area, there are an adhesive polymer layer and multiple metal structures having a portion in the adhesive polymer layer. A transparent substrate is formed on a top surface of the adhesive polymer layer and over the micro-lenses. The image or light sensor chip package also includes wirebonded wires or a flexible substrate bonded with the metal structures of the image or light sensor chip.

6 Claims, 85 Drawing Sheets

999

OTHER PUBLICATIONS

Hu, C-K. et al. "Copper-Polyimide Wiring Technology for VLSI Circuits," Materials Research Society Symposium Proceedings VLSI V (1990) pp. 369-373.
Roesch, W. et al. "Cycling copper flip chip interconnects," Microelectronics Reliability, 44 (2004) pp. 1047-1054.
Lee, Y-H. et al. "Effect of ESD Layout on the Assembly Yield and Reliability," International Electron Devices Meeting (2006) pp. 1-4.
Yeoh, T-S. "ESD Effects on Power Supply Clamps," Proceedings of the 6th International Symposium on Physical & Failure Analysis of Integrated Circuits (1997) pp. 121-124.
Edelstein, D. et al. "Full Copper Wiring in a Sub-0.25 pm CMOS ULSI Technology," Technical Digest IEEE International Electron Devices Meeting (1997) pp. 773-776.
Venkatesan, S. et al. "A High Performance 1.8V, 0.20 pm CMOS Technology with Copper Metallization," Technical Digest IEEE International Electron Devices Meeting (1997) pp. 769-772.
Jenei, S. et al. "High Q Inductor Add-on Module in Thick Cu/SiLK™ single damascene," Proceedings from the IEEE International Interconnect Technology Conference (2001) pp. 107-109.
Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.
Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.
Kumar, R. et al. "A Family of 45nm IA Processors," IEEE International Solid-State Circuits Conference, Session 3, Microprocessor Technologies, 3.2 (2009) pp. 58-59.
Bohr, M. "The New Era of Scaling in an SoC World," International Solid-State Circuits Conference (2009) Presentation Slides 1-66.
Bohr, M. "The New Era of Scaling in an SoC World," International Solid-State Circuits Conference (2009) pp. 23-28.
Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.
Kurd, N. et al. "Next Generation Intel® Micro-architecture (Nehalem) Clocking Architecture," Symposium on VLSI Circuits Digest of Technical Papers (2008) pp. 62-63.
Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.
Geffken, R. M. "An Overview of Polyimide Use in Integrated Circuits and Packaging," Proceedings of the Third International Symposium on Ultra Large Scale Integration Science and Technology (1991) pp. 667-677.
Luther, B. et al. "Planar Copper-Polyimide Back End of the Line Interconnections for ULSI Devices," Proceedings of the 10th International IEEE VLSI Multilevel Interconnection Conference (1993) pp. 15-21.
Master, R. et al. "Ceramic Mini-Ball Grid Array Package for High Speed Device," Proceedings from the 45th Electronic Components and Technology Conference (1995) pp. 46-50.
Maloney, T. et al. "Stacked PMOS Clamps for High Voltage Power Supply Protection," Electrical Overstress/Electrostatic Discharge Symposium Proceedings (1999) pp. 70-77.
Lin, M.S. et al. "A New System-on-a-Chip (SOC) Technology—High Q Post Passivation Inductors," Proceedings from the 53rd Electronic Components and Technology Conference (May 30, 2003) pp. 1503-1509.
MEGIC Corp. "MEGIC way to system solutions through bumping and redistribution," (Brochure) (Feb. 6, 2004) pp. 1-3.
Lin, M.S. "Post Passivation Technology™—MEGIC ® Way to System Solutions," Presentation given at TSMC Technology Symposium, Japan (Oct. 1, 2003) pp. 1-32.
Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

IMAGE AND LIGHT SENSOR CHIP PACKAGES

This application claims priority to U.S. provisional application No. 61/151,529, entitled "Image Sensor", filed on Feb. 11, 2009, which is incorporated herein by reference in its entirety.

BACKGROUND OF THE DISCLOSURE

1. Field of the Disclosure

The present disclosure relates to image or light sensor chip packages, and, more specifically, to image or light sensor chip packages having an image or light sensor chip with metal structures connected to an external circuit through wirebonded wires or a flexible substrate.

2. Brief Description of the Related Art

In recent years electronic technology has advanced, with each passing day presenting more new high-tech electronic products to the public. Such products have typically followed a trend of being lighter, thinner, and handier in order to provide more convenient and comfortable usage. Electronic packaging plays an important role in the fulfillment in the communication industry and for digital technology. Such electronic products have increasingly included digital imaging functions such as provided by digital camera and video features.

The key component that makes a digital camera and a digital video camera capable of sensing images is a photo-sensitive device. The photo-sensitive device is able to sense the intensity of light and transfer electrical signals based on the light intensity for further processing. Such photo-sensitive devices typically utilize a chip package to make the photo-sensitive chip connectable to an outer electrical circuit through the substrate and also to protect the photo-sensitive chip from external contamination and prevent impurities and moisture from contacting the sensitive area of the chip.

SUMMARY OF THE DISCLOSURE

Aspects of the present disclosure provide image, or light sensor, chip packages for enhancing electric properties and products while reducing manufacture cost.

In accordance with exemplary embodiments of the present disclosure, an image or light sensor chip package is provided with an image or light sensor chip having a photosensitive area and metal structures, and wirebonded wires or a flexible substrate connected to the metal structures. The photosensitive area can be used to sense light and transfer electrical signals.

In one aspect of the disclosure, a light sensor chip includes a semiconductor substrate, multiple transistors each including a diffusion or doped area in the semiconductor substrate and a gate over a top surface of the semiconductor substrate, a first dielectric layer over the top surface of the semiconductor substrate, an interconnection layer over the first dielectric layer, a second dielectric layer over the interconnection layer and over the first dielectric layer, and a metal trace over the second dielectric layer, wherein the metal trace has a width smaller than 1 micrometer. The chip also includes an insulating layer on a first region of the metal trace, over the interconnection layer and over the first and second dielectric layers, wherein an opening in the insulating layer is over a second region of the metal trace, and the second region is at a bottom of the opening, and a polymer layer on the insulating layer. Further included are a metal layer on the second region of the metal trace, wherein the metal layer includes a portion in the polymer layer, wherein the metal layer is connected to the second region of the metal trace through the opening, wherein the metal layer has a thickness between 3 and 100 micrometers and a width between 5 and 100 micrometers, and a transparent substrate on a top surface of the polymer layer and over the multiple transistors, wherein an air space is between the insulating layer and the transparent substrate and over the multiple transistors, wherein a bottom surface of the transparent substrate provides a top wall of the air space, and the polymer layer provides a sidewall of the air space.

These, as well as other components, steps, features, benefits, and advantages of the present disclosure, will now become clear from a review of the following detailed description of illustrative embodiments, the accompanying drawings, and the claims.

BRIEF DESCRIPTION OF THE DRAWINGS

The drawings disclose illustrative embodiments of the present disclosure. They do not set forth all embodiments of the present disclosure; other embodiments may be used in addition or instead. Details that may be apparent or unnecessary may be omitted to save space or for more effective illustration. Conversely, some embodiments may be practiced without all of the details that are disclosed. When the same numeral or reference character appears in different drawings, it refers to the same or like features, components, or steps.

Aspects of the present disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings.

Figure 1A:
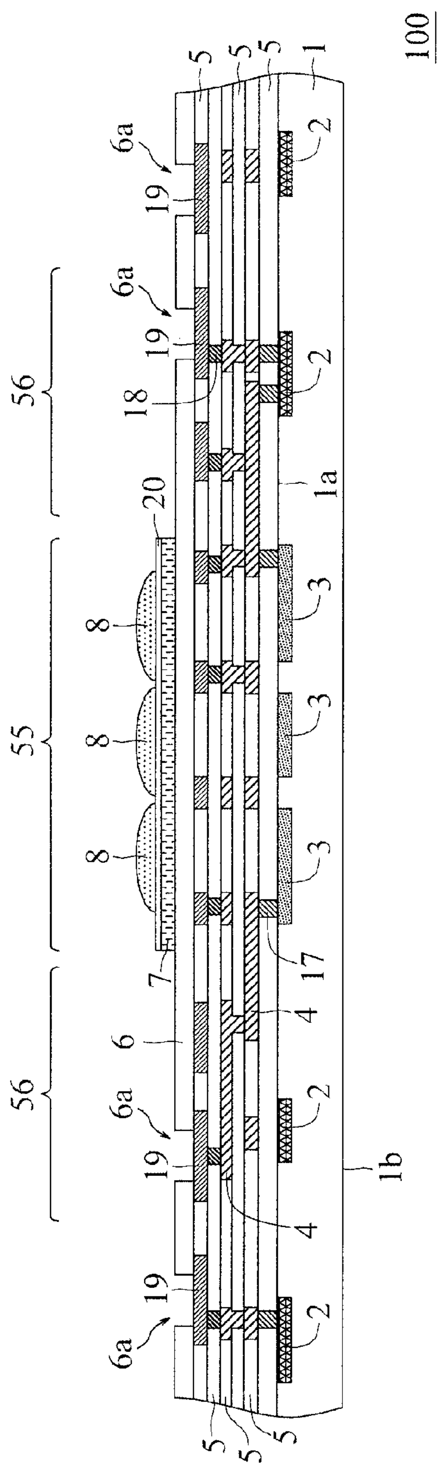
FIGS. 1A-1P are cross-sectional views depicting a process of forming an image or light sensor package according to an embodiment of the present disclosure.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION

Illustrative embodiments are now described. Other embodiments may be used in addition or instead. Details that may be apparent or unnecessary may be omitted to save space or for a more effective presentation. Conversely, some embodiments may be practiced without all of the details that are disclosed. As noted previously, when the same numeral or reference character appears in different drawings, it refers to the same or like features, components, or steps.

Figure 1B:
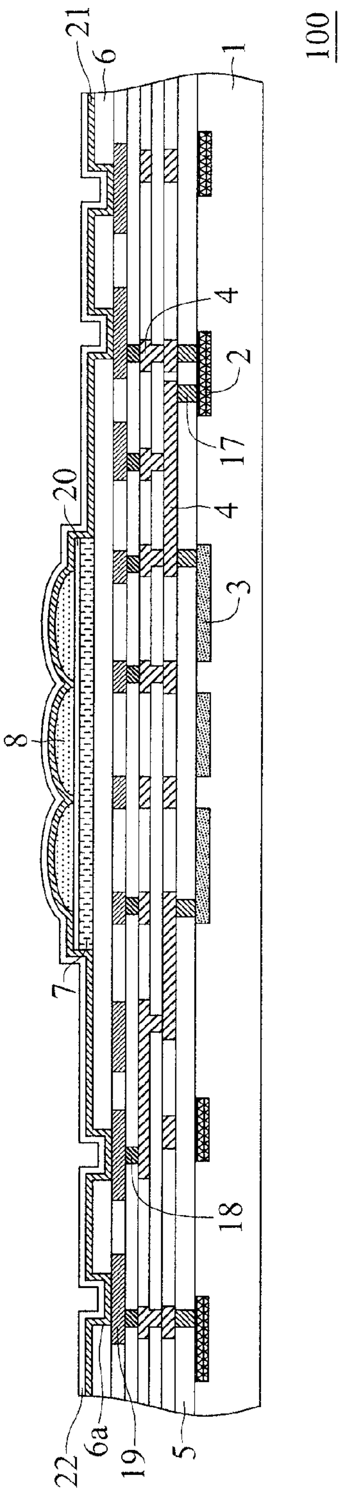
Figure 1C:
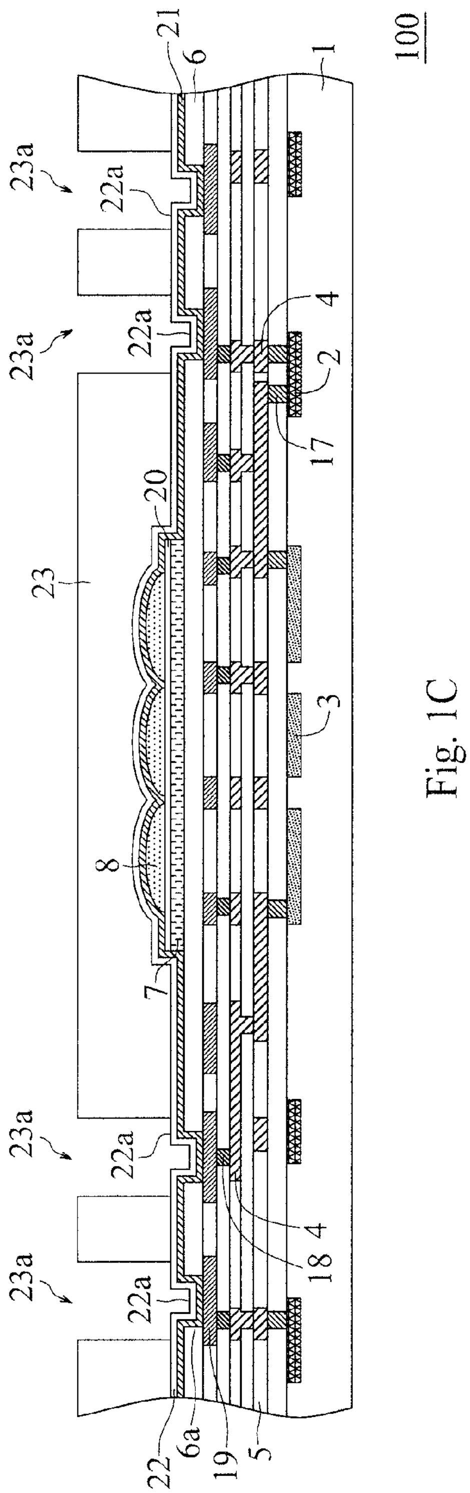
Figure 1D:
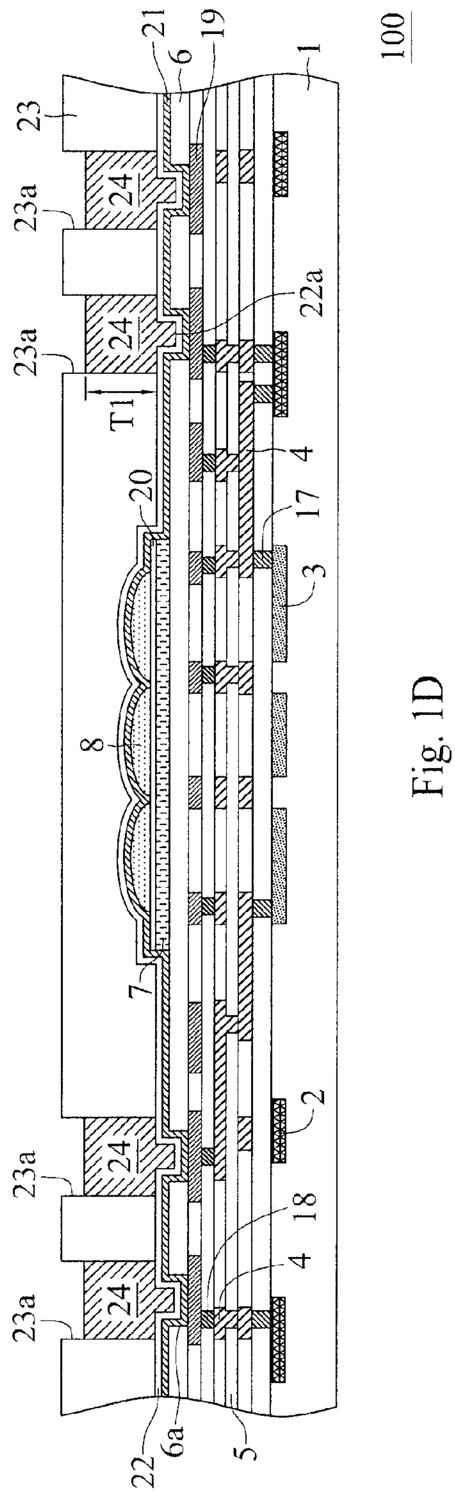
Figure 1E:
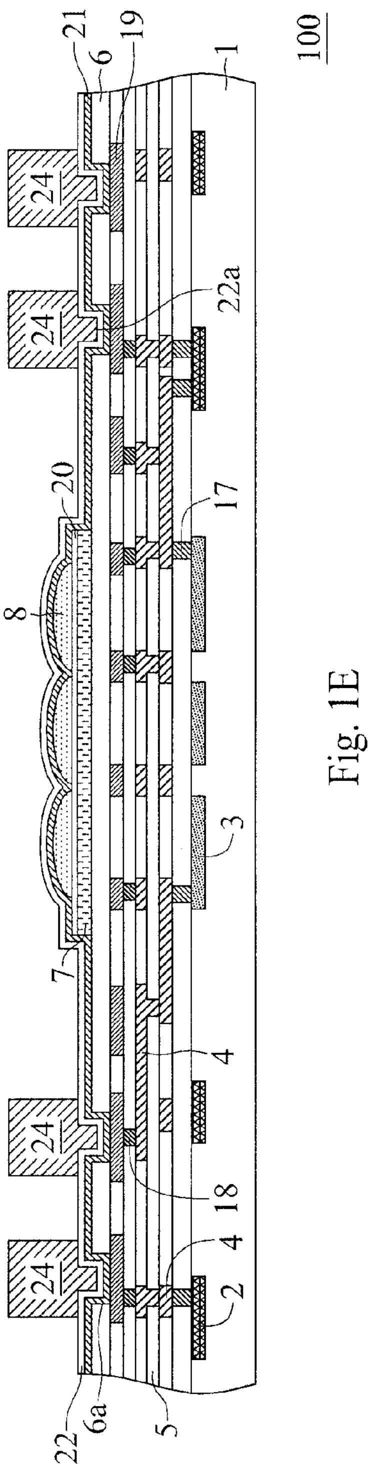
Figure 1F:
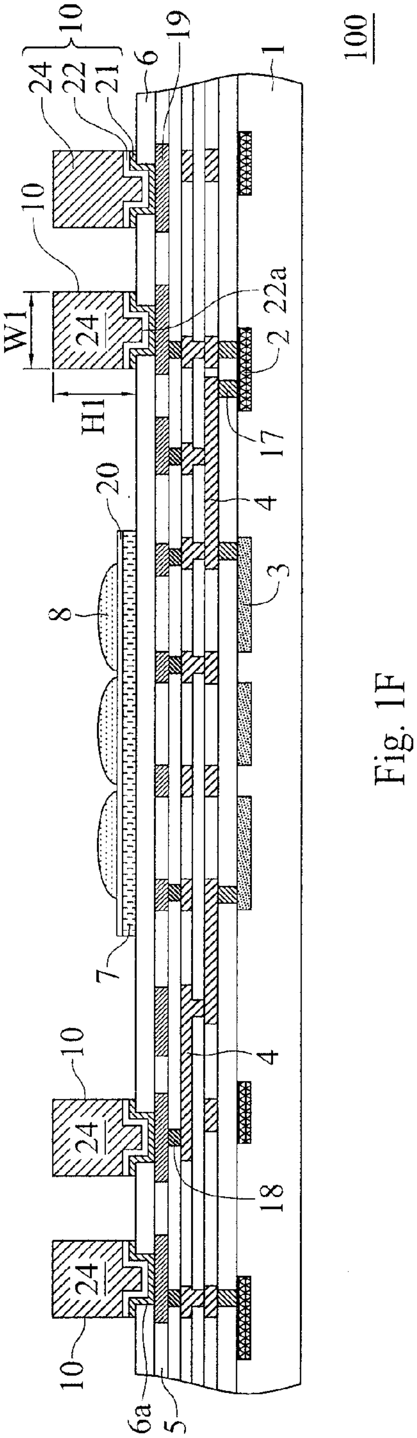
Figure 1G:
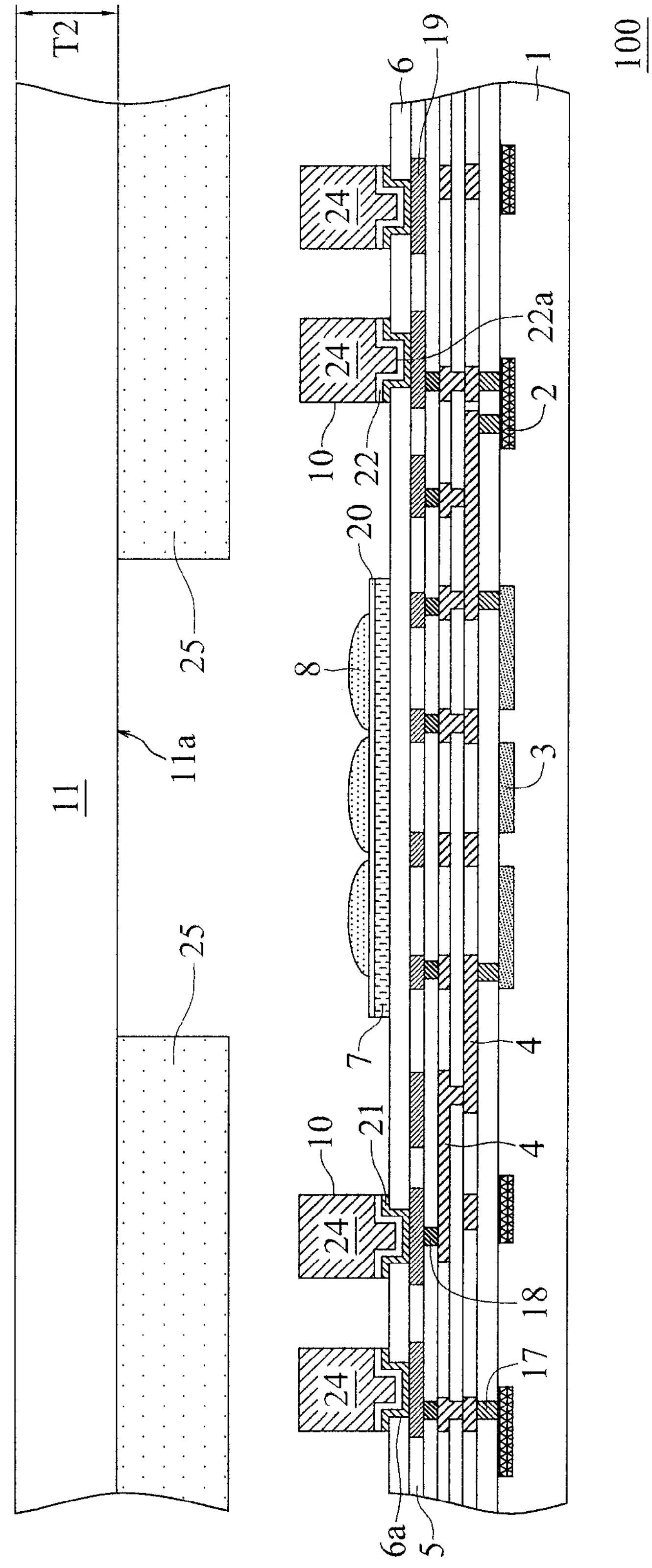
Figure 1H:
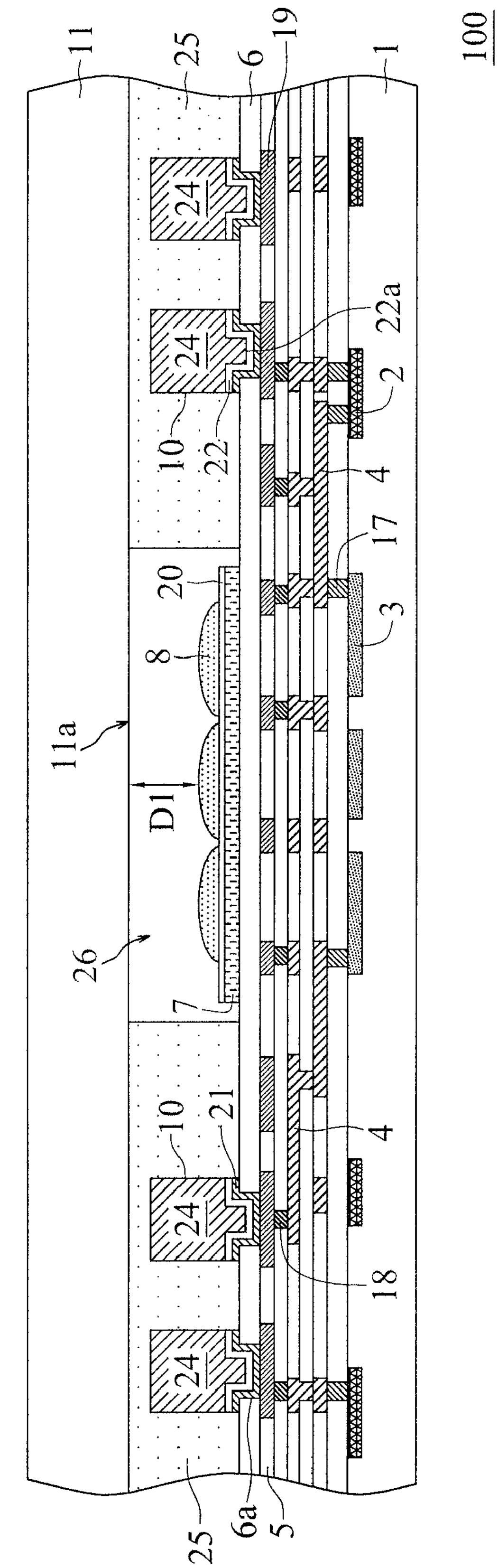
Figure 11:
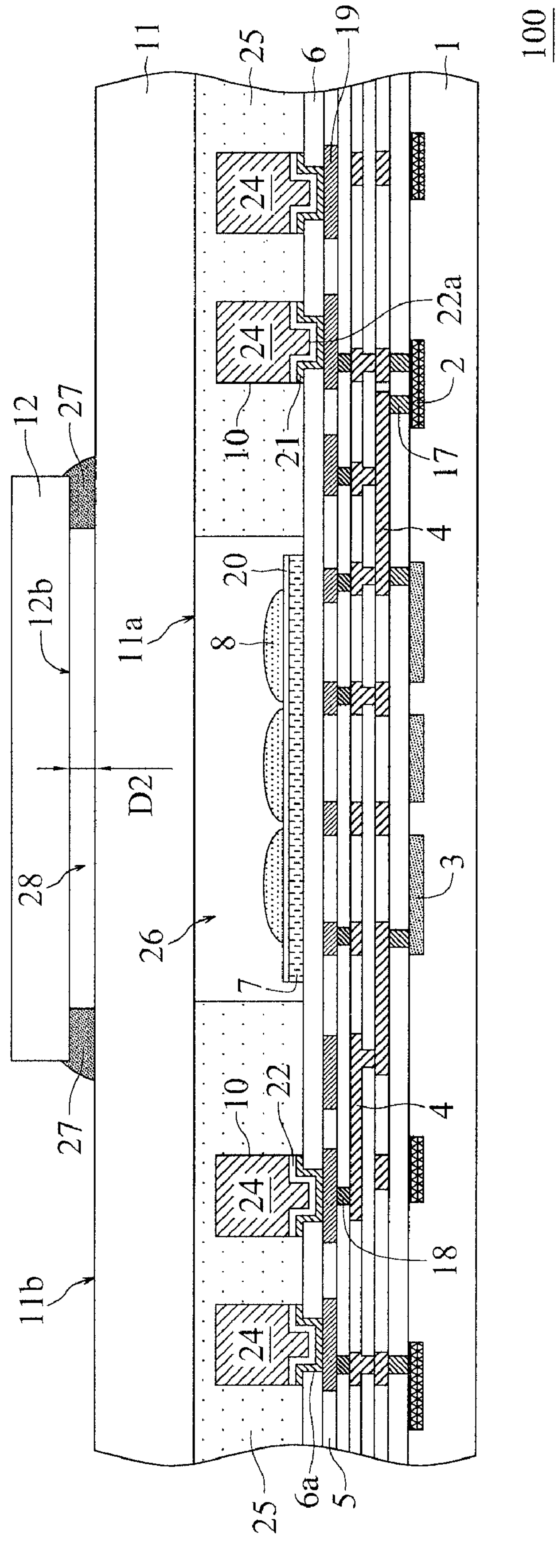
FIGS. 11A-11O are cross-sectional views depicting a process of forming an image or light sensor chip according to an embodiment of the present disclosure.
FIG. 11P is a cross-sectional view depicting an image or light sensor package according to an embodiment of the present disclosure.
Figure 1J:
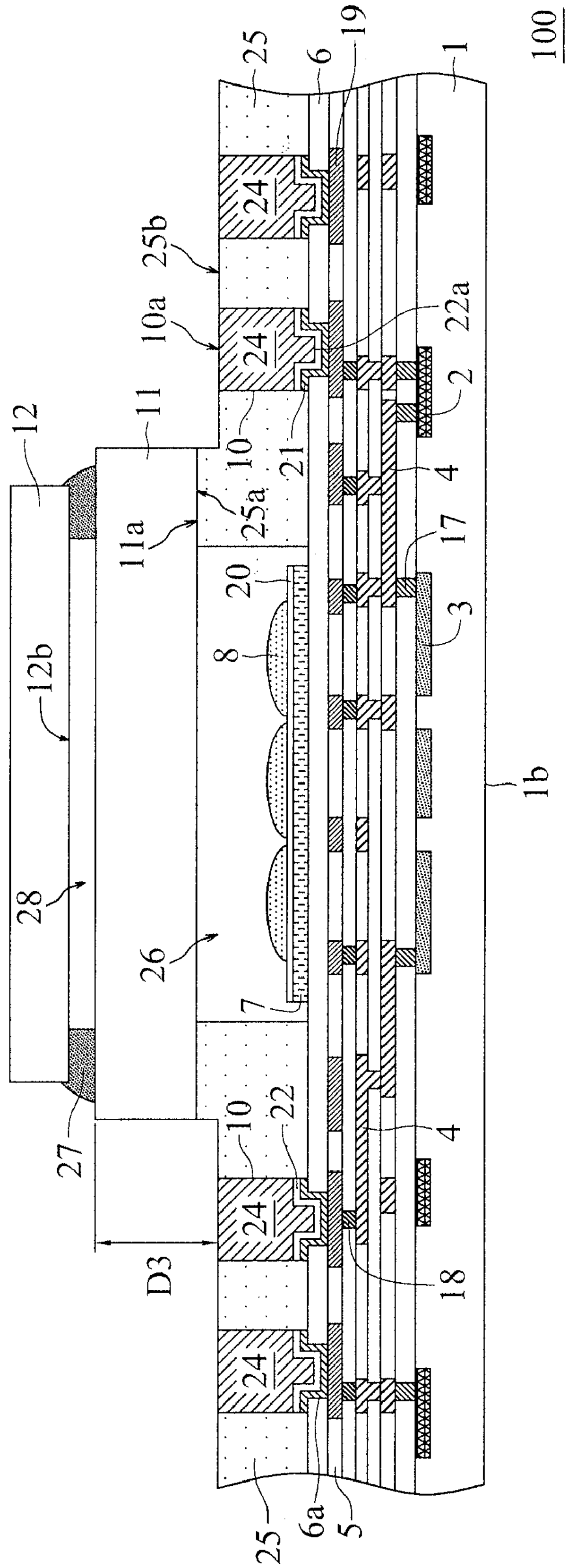
Figure 1K:
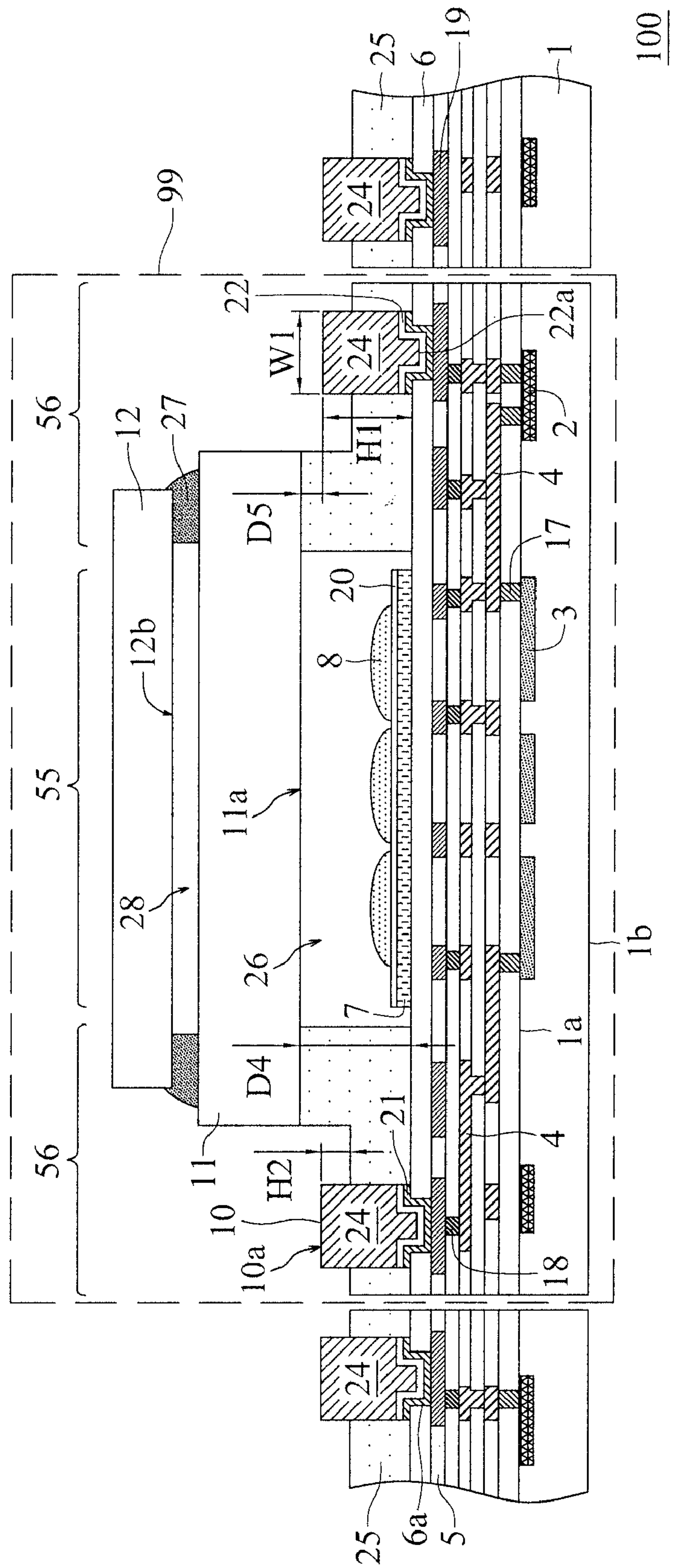
Figure 1L:
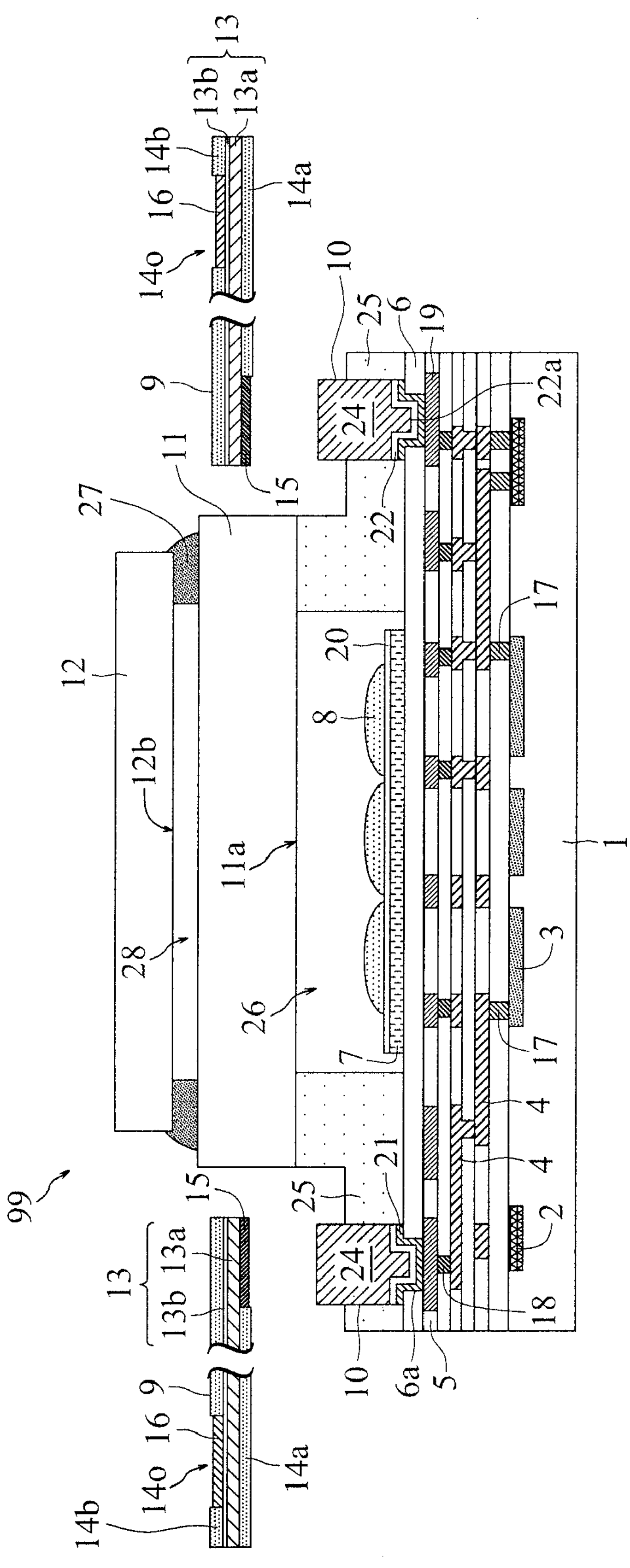
Figure 1M:
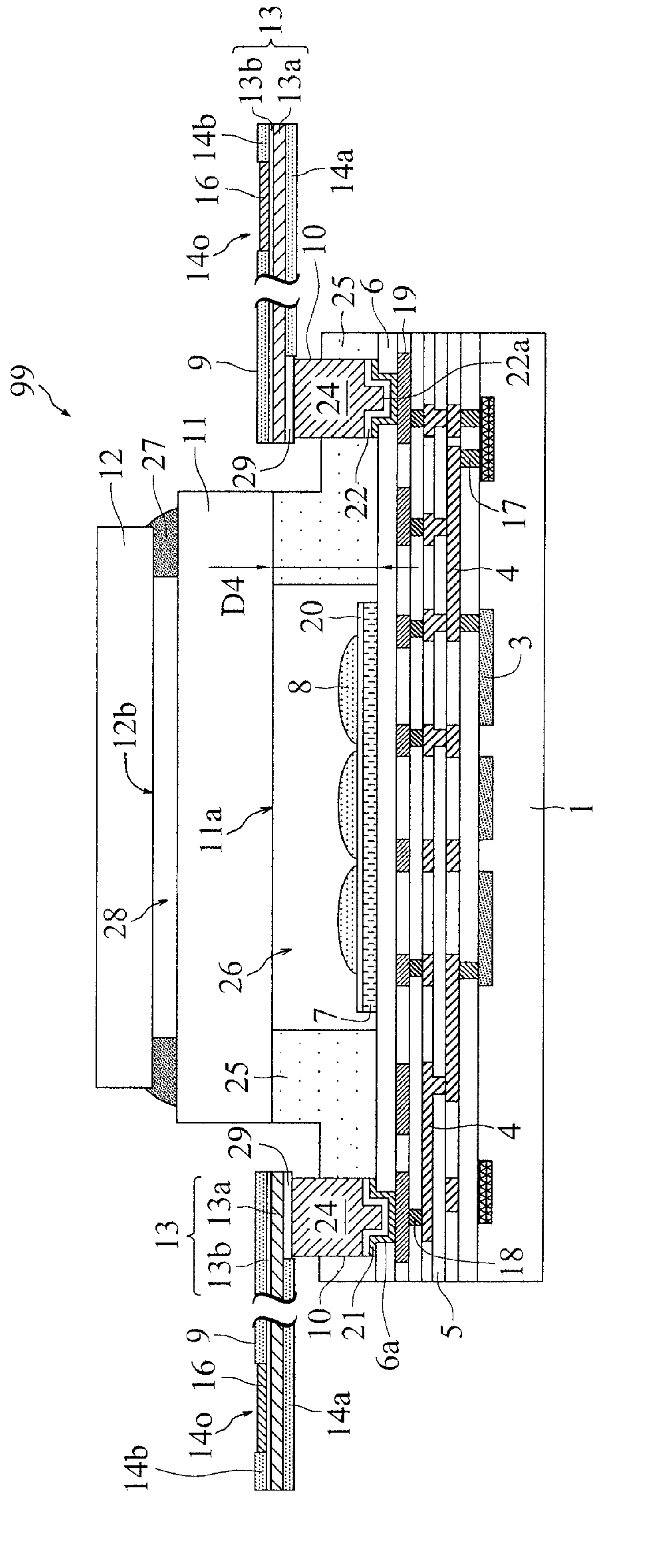
Figure 1N:
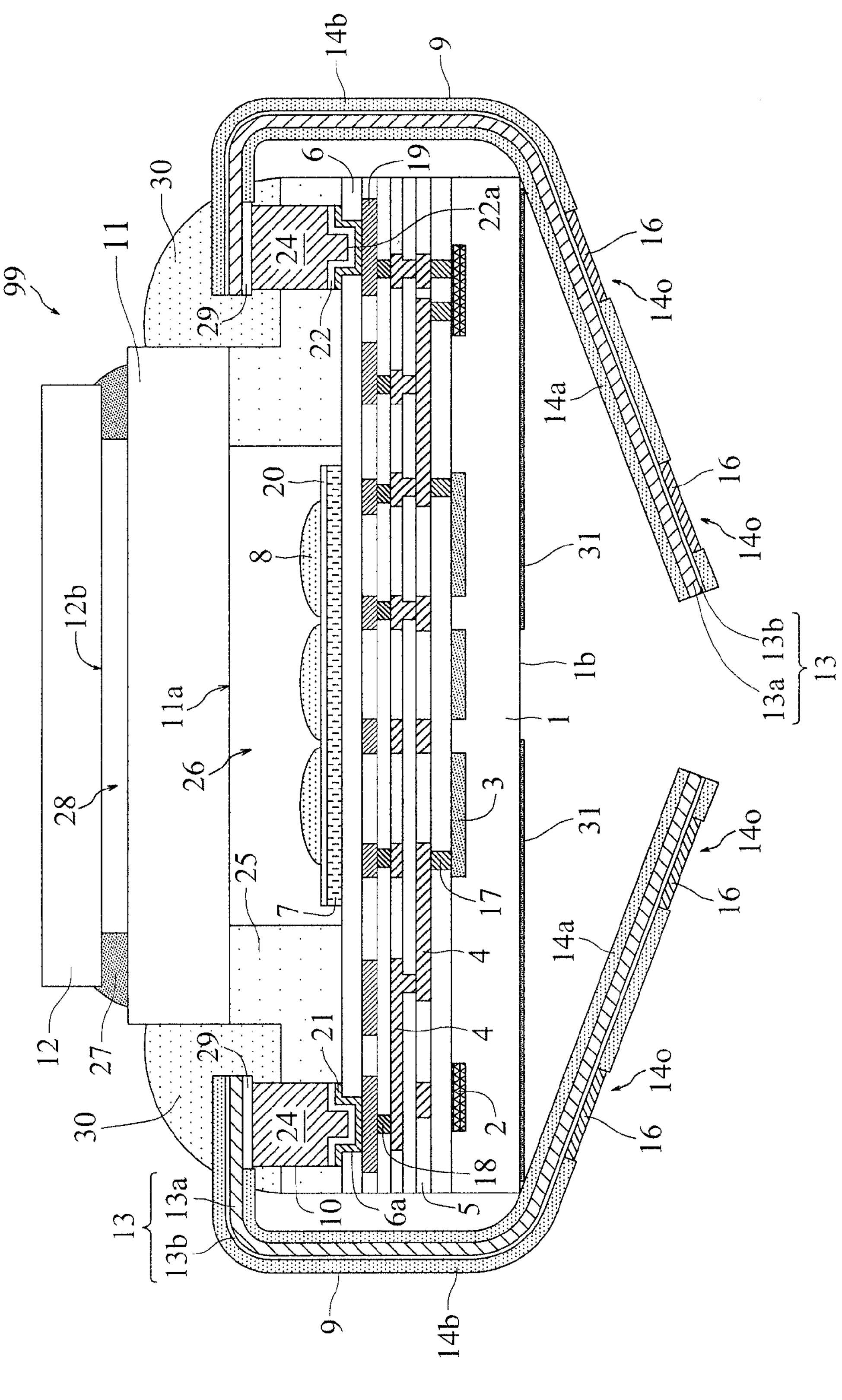
Figure 10:
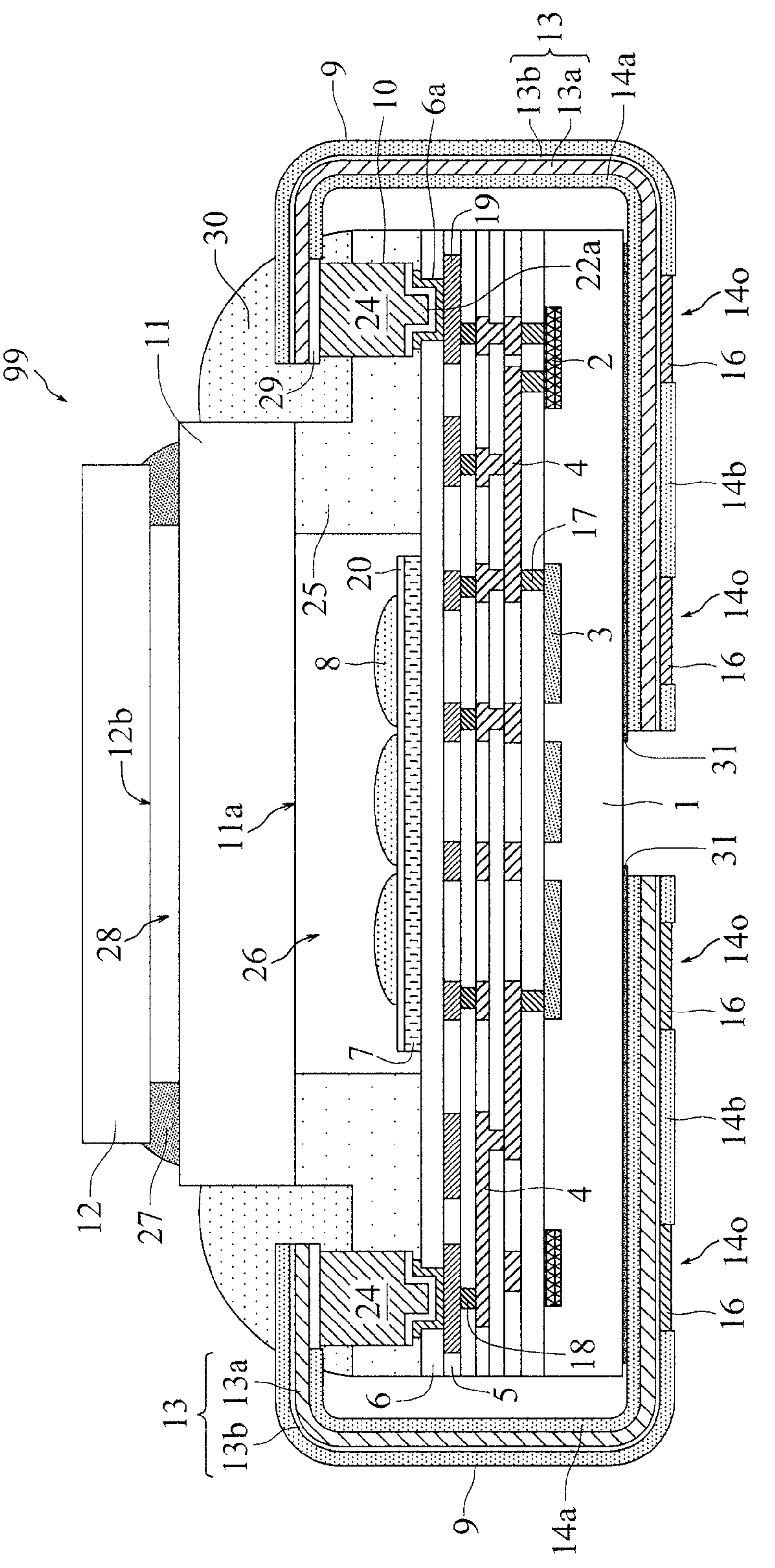
FIGS. 10A-10G are cross-sectional views depicting a process of forming an image or light sensor chip according to an embodiment of the present disclosure.
FIG. 10H is a cross-sectional view depicting a process of attaching an infrared (IR) cut filter to an image or light sensor chip according to an embodiment of the present disclosure.
FIGS. 10I-10L are cross-sectional views depicting a process of forming an image or light sensor chip according to an embodiment of the present disclosure.
FIG. 10M is a cross-sectional view depicting a process of attaching an infrared (IR) cut filter to an image or light sensor chip according to an embodiment of the present disclosure.
Figure 1P:
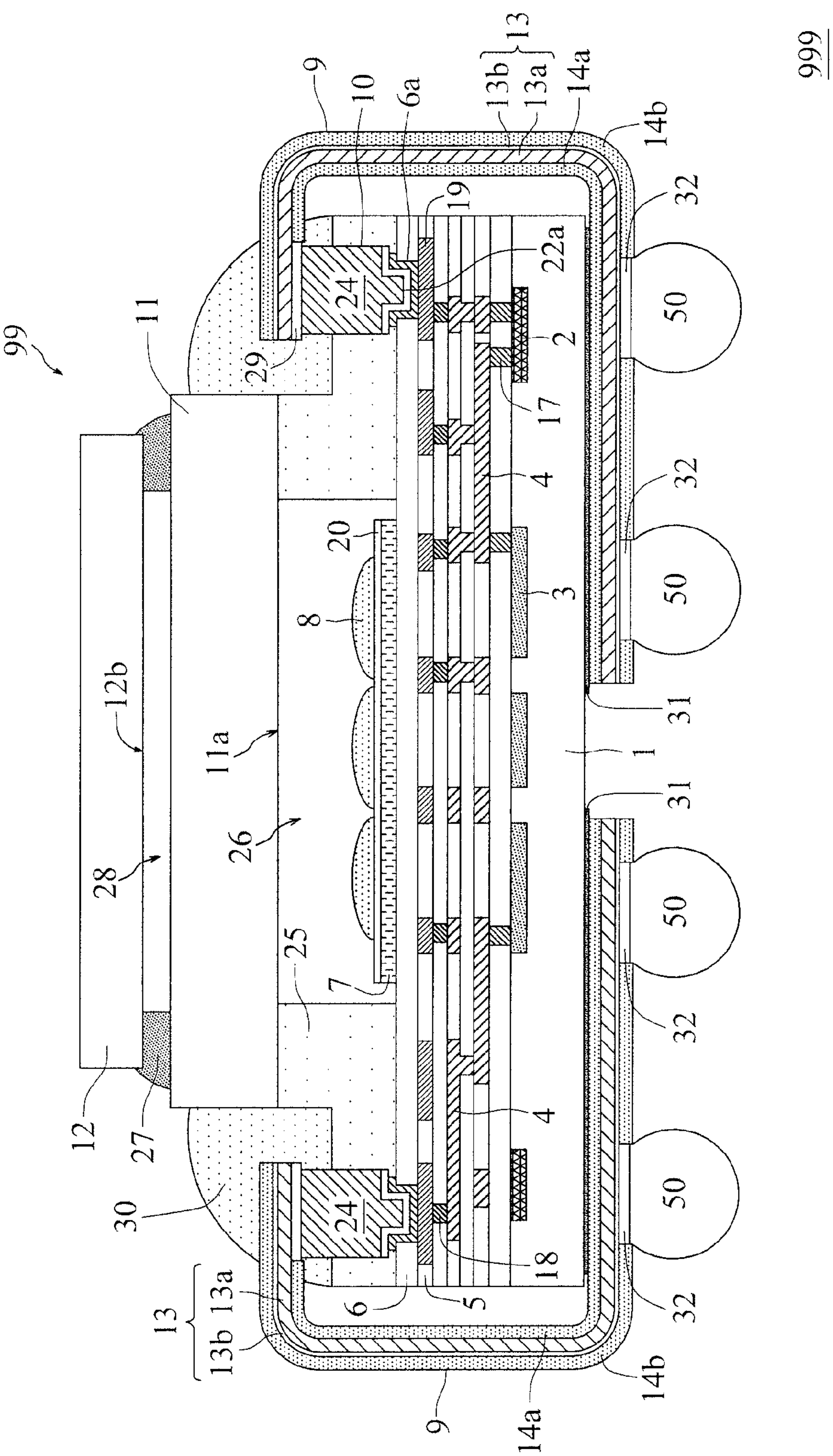

FIGS. 1A-1P illustrate a process for forming an image or light sensor package, and related structure, according to exemplary embodiments of the present disclosure. Referring to FIG. 1A, a semiconductor wafer 100 can include a semiconductor substrate 1 having a top surface 1*a* and a bottom surface 1*b*, multiple semiconductor devices 2 in and/or on the semiconductor substrate 1, multiple light sensors 3 including multiple transistors each having two diffusions (or areas with different doping characteristics) in the semiconductor substrate 1 and a gate over the top surface 1*a* between the two diffusions, multiple interconnection layers 4 over the top surface 1*a*, multiple dielectric layers 5 over the top surface 1*a*, multiple via plugs 17 and 18 in the dielectric layers 5, multiple metal traces or pads 19 over the top surface 1*a* and over the interconnection layers 4, and an insulating layer 6, that is, passivation layer, over the semiconductor devices 2, over the light sensors 3, over the dielectric layers 5, over the interconnection layers 4, over the via plugs 17 and 18, and on the metal traces or pads 19. Multiple openings 6*a* in the passivation layer 6 expose multiple regions of the metal traces or pads 19 and have a desired suitable width, e.g., between 10 and 100 micrometers, and preferably between 20 and 60 micrometers. The openings 6*a* are over the regions of the metal traces or pads 19, and the regions of the metal traces or pads 19 are at bottoms of the openings 6*a*.

The semiconductor substrate 1 can be a suitable substrate, e.g., a silicon substrate, a silicon-germanium (SiGe) based substrate, a gallium arsenide (GaAs) based substrate, a silicon indium (SiIn) based substrate, a silicon antimony (SiSb) based substrate, or an indium antimony (InSb) based substrate, with a suitable thickness, e.g., between 50 micrometers and 1 millimeter, and preferably between 75 and 250 micrometers. Of course, the foregoing examples of substrates are for illustration only; any suitable substrates may be used.

Each of the semiconductor devices 2 can be a diode or a transistor, such as p-channel metal-oxide-semiconductor (MOS) transistor or n-channel metal-oxide-semiconductor transistor, which is connected to the interconnection layers 4. The semiconductor devices 2 can, for example, be provided for NOR gates, NAND gates, AND gates, OR gates, flash memory cells, static random access memory (SRAM) cells, dynamic random access memory (DRAM) cells, non-volatile memory cells, erasable programmable read-only memory (EPROM) cells, read-only memory (ROM) cells, magnetic random access memory (MRAM) cells, sense amplifiers, inverters, operational amplifiers, adders, multiplexers, diplexers, multipliers, analog-to-digital (A/D) converters, digital-to-analog (D/A) converters or analog circuits.

The light sensors 3 can include, e.g., complementary-metal-oxide-semiconductor (CMOS) sensors or charge coupled devices (CCD), which can be connected to the interconnection layers 4 and to circuit devices, which can include the semiconductor devices 2, such as sense amplifiers, flash memory cells, static random access memory (SRAM) cells, dynamic random access memory (DRAM) cells, non-volatile memory cells, erasable programmable read-only memory (EPROM) cells, read-only memory (ROM) cells, magnetic random access memory (MRAM) cells, inverters, operational amplifiers, multiplexers, adders, diplexers, multipliers, analog-to-digital (A/D) converters, or digital-to-analog (D/A) converters, through the interconnection layers 4.

The dielectric layers 5 can be formed by a CVD (Chemical Vapor Deposition) process, a PECVD (Plasma-Enhanced CVD) process, a High-Density-Plasma (HDP) CVD process or a spin-on coating method. The material of the dielectric layers 5 may include silicon oxide, silicon nitride, silicon oxynitride, silicon oxycarbide (SiOC) or silicon carbon nitride (SiCN). Each of the dielectric layers 5 can be composed of one or more inorganic layers, and may have a thickness between 0.1 and 1.5 micrometers. For example, each of the dielectric layers 5 may include a layer of silicon oxynitride or silicon carbon nitride and a layer of silicon oxide or silicon oxycarbide on the layer of silicon oxynitride or silicon carbon nitride. Alternatively, each of the dielectric layers 5 may include an oxide layer, such as silicon-oxide layer, having a suitable thickness, e.g., between 0.02 and 1.2 micrometers, and a nitride layer, such as silicon-nitride layer, having a thickness between 0.02 and 1.2 micrometers on the oxide layer.

The interconnection layers 4 can be connected to the semiconductor devices 2 and the light sensors 3. Each of the interconnection layers 4 can have a suitable thickness, e.g., between 20 nanometers and 1.5 micrometers, and preferably between 100 nanometers and 1 micrometer. Each of the interconnection layers 4 may include a metal trace having a suitable width, e.g., smaller than 1 micrometer, such as between 0.05 and 0.95 micrometers. The material of the interconnection layers 4 may include electroplated copper, aluminum, aluminum-copper alloy, carbon nanotubes or a composite of the above-mentioned materials.

For example, each of the interconnection layers 4 may include an electroplated copper layer having a suitable thickness, e.g., between 20 nanometers and 1.5 micrometers, and preferably between 100 nanometers and 1 micrometer, in one of the dielectric layers 5, an adhesion/barrier layer, such as titanium-nitride layer, titanium-tungsten-alloy layer, tantalum-nitride layer, titanium layer or tantalum layer, at a bottom surface and sidewalls of the electroplated copper layer, and a seed layer of copper between the electroplated copper layer and the adhesion/barrier layer. The seed layer of copper is at the bottom surface and sidewalls of the electroplated copper layer and contacts with the bottom surface and sidewalls of the electroplated copper layer. The electroplated copper layer, the seed layer of copper and the adhesion/barrier layer can be formed by a damascene or double-damascene process including an electroplating process, a sputtering process and a chemical mechanical polishing (CMP) process. Other suitable processes may be used, however, to form such layers.

Alternatively, each of the interconnection layers 4 may include an adhesion/barrier layer on a top surface of one of the dielectric layers 5, a sputtered aluminum or aluminum-copper-alloy layer having a suitable thickness, e.g., between 20 nanometers and 1.5 micrometers, and preferably between 100 nanometers and 1 micrometer, on a top surface of the adhesion/barrier layer, and an anti-reflection layer on a top surface of the sputtered aluminum or aluminum-copper-alloy layer. The sputtered aluminum or aluminum-copper-alloy layer, the adhesion/barrier layer and the anti-reflection layer can be formed by a process including a sputtering process and an etching process. Sidewalls of the sputtered aluminum or aluminum-copper-alloy layer are not covered by the adhesion/barrier layer and the anti-reflection layer. In exemplary embodiments, the adhesion/barrier layer and the anti-reflection layer can be a titanium layer, a titanium-nitride layer or a titanium-tungsten layer.

The via plugs 17 can be in the bottommost dielectric layer 5 between the bottommost interconnection layer 4 and the semiconductor substrate 1, and connect the interconnection layers 4 to the semiconductor devices 2 and the light sensors 3. In exemplary embodiments, the via plugs 17 may include copper formed by an electroplating process or tungsten formed by a process including a chemical vapor deposition (CVD) process and a chemical mechanical polishing (CMP) process. Of course, other materials may be substituted or used in addition to copper or tungsten.

The via plugs 18 can be in the dielectric layer 5 that has a top surface having the metal traces or pads 19 formed thereon, and the via plugs 18 can connect the metal traces or pads 19 to the interconnection layers 4. In exemplary embodiments, the via plugs 18 may include copper formed by an electroplating process or tungsten formed by a process including a chemical vapor deposition (CVD) process and a chemical mechanical polishing (CMP) process or by a process including a sputtering process and a chemical mechanical polishing (CMP) process. Of course, other materials may be substituted or used in addition to copper or tungsten.

The metal traces or pads 19 can be connected to the semiconductor devices 2 and the light sensors 3 through the interconnection layers 4 and the via plugs 17 and 18. Each of the metal traces or pads 19 can have a suitable thickness, e.g., between 0.5 and 3 micrometers or between 20 nanometers and 1.5 micrometers, and a width smaller than 1 micrometer, such as between 0.2 and 0.95 micrometers.

For example, each of the metal traces or pads 19 may include an electroplated copper layer having a suitable thickness, e.g., between 0.5 and 3 micrometers or between 20 nanometers and 1.5 micrometers in the topmost dielectric layer 5 under the passivation layer 6, an adhesion/barrier layer, such as titanium layer, titanium-tungsten-alloy layer, titanium-nitride layer, tantalum-nitride layer or tantalum layer, at a bottom surface and sidewalls of the electroplated copper layer, and a seed layer of copper between the electroplated copper layer and the adhesion/barrier layer. The seed layer of copper is at the bottom surface and sidewalls of the electroplated copper layer and contacts with the bottom surface and sidewalls of the electroplated copper layer. The electroplated copper layer can have a top surface substantially coplanar with a top surface of the topmost dielectric layer 5 under the passivation layer 6, and the passivation layer 6 can be formed on the top surfaces of the electroplated copper layer and the topmost dielectric layer 5, where one of the openings **6*a* in the passivation layer 6 exposes a region of the top surface of the electroplated copper layer, and one of the below-mentioned metal pads or bumps 10 and metal structures 57** can be formed on the region of the top surface of the electroplated copper layer. The electroplated copper layer, the seed layer of copper and the adhesion/barrier layer can be formed by a damascene or double-damascene process including an electroplating process, a sputtering process and a chemical mechanical polishing (CMP) process or other suitable processes.

Alternatively, each of the metal traces or pads 19 may include an adhesion/barrier layer on a top surface of the topmost dielectric layer 5 under the passivation layer 6, a sputtered aluminum or aluminum-copper-alloy layer having a suitable thickness, e.g., between 0.5 and 3 micrometers or between 20 nanometers and 1.5 micrometers on a top surface of the adhesion/barrier layer, and an anti-reflection layer on a top surface of the sputtered aluminum or aluminum-copper-alloy layer. The sputtered aluminum or aluminum-copper-alloy layer, the adhesion/barrier layer and the anti-reflection layer can be formed by a process including a sputtering process and an etching process. Sidewalls of the sputtered aluminum or aluminum-copper-alloy layer are not covered by the adhesion/barrier layer and the anti-reflection layer. The adhesion/barrier layer and the anti-reflection layer can be, for example, a titanium layer, a titanium-nitride layer or a titanium-tungsten layer. Other materials may be used. The passivation layer 6 can be formed on a top surface of the anti-reflection layer and on the top surface of the topmost dielectric layer 5, and one of the openings **6*a* in the passivation layer 6 exposes a region of the top surface of the sputtered aluminum or aluminum-copper-alloy layer, where one of the below-mentioned metal pads or bumps 10 and metal structures 57** can be formed on the region of the top surface of the sputtered aluminum or aluminum-copper-alloy layer.

The passivation layer 6 can protect the semiconductor devices 2, the light sensors 3, the via plugs 17 and 18, the interconnection layers 4 and the metal traces or pads 19 from being damaged by moisture and foreign ion contamination. In other words, mobile ions (such as sodium ions), transition metals (such as gold, silver and copper) and impurities can be prevented from penetrating through the passivation layer 6 to the semiconductor devices 2, the light sensors 3, the via plugs 17 and 18, the interconnection layers 4 and the metal traces or pads 19.

The passivation layer 6 can be formed by a chemical vapor deposition (CVD) method, or other suitable technique(s), to a desired thickness, e.g., greater than 0.2 micrometers, such as between 0.3 and 1.5 micrometers. For exemplary embodiments, the passivation layer 6 can be made of silicon oxide (such as $SiO_2$), silicon nitride (such as $Si_3N_4$), silicon oxynitride (such as SiON), silicon oxycarbide (SiOC), PSG (phosphosilicate glass), silicon carbon nitride (such as SiCN) or a composite of the above-mentioned materials, though other suitable materials may be used.

The passivation layer 6 can be composed of one or more inorganic layers. For example, the passivation layer 6 can be a composite layer of an oxide layer, such as silicon oxide or silicon oxycarbide (SiOC), having a suitable thickness, e.g., between 0.2 and 1.2 micrometers and a nitride layer, such as silicon nitride, silicon oxynitride or silicon carbon nitride (SiCN), having a thickness, e.g., between 0.2 and 1.2 micrometers on the oxide layer. Alternatively, the passivation layer 6 can be a single layer of silicon nitride, silicon oxynitride or silicon carbon nitride (SiCN) having a thickness, e.g., between 0.2 and 1.2 micrometers. In a preferred case, the passivation layer 6 includes a topmost inorganic layer of the semiconductor wafer 100, and the topmost inorganic layer of the semiconductor wafer 100 can be a silicon nitride layer having a suitable thickness, for example, greater than 0.2 micrometers, such as between 0.2 and 1.5 micrometers. Other thicknesses for these identified layers may be used within the scope of the present disclosure.

After providing the above-mentioned semiconductor wafer 100, a layer 7 of optical or color filter array having a suitable thickness, e.g., between 0.3 and 1.5 micrometers, can be formed on the passivation layer 6, over the light sensors 3 and over the transistors of the light sensors 3. The material of the layer 7 of optical or color filter array may include dye, pigment, epoxy, acrylic or polyimide. The layer 7 of optical or color filter array, for example, may contain green filters, blue filters and red filters. Alternatively, the layer 7 of optical or color filter array may contain green filters, blue filters, red filters and white filters. Alternatively, the layer 7 of optical or color filter array may contain cyan filters, yellow filters, green filters and magenta filters. Other combinations of filters may be used.

Next, a buffer layer 20 having a suitable thickness, e.g., between 0.2 and 1 micrometers, can be formed on the layer 7 of optical or color filter array. The material of the buffer layer 20 may include epoxy, acrylic, siloxane or polyimide, and the like. Next, multiple microlenses 8 having a suitable thickness, e.g., between 0.5 and 2 micrometers, can be formed on the buffer layer 20, over the layer 7 of optical or color filter array and over the light sensors 3. The microlenses 8 may be made of PMMA (poly methyl methacrylate), siloxane, silicon oxide, or silicon nitride. Other suitable materials may be used for such microlenses 8.

Accordingly, the semiconductor wafer 100 can include a photosensitive area 55 where there are the light sensors 3, the layer 7 of optical or color filter array and the microlenses 8. The external light illuminating on the photosensitive area 55 can be focused by the microlenses 8, filtered by the layer 7 of optical or color filter array, and sensed by the light sensors 3 to generate electrical signals corresponding to the light intensity. The semiconductor wafer 100 also includes a non-photosensitive area 56 where there are the openings 6*a* in the passivation layer 6 exposing the regions of the metal traces or pads 19. The photosensitive area 55 is surrounded by the non-photosensitive area 56. Multiple metal pads or bumps 10 can be formed on the non-photosensitive area 56, as illustrated in FIGS. 1B-1F.

Referring to FIG. 1B, an adhesion/barrier layer 21 having a suitable thickness, e.g., between 1 nanometer and 0.8 micrometers, and preferably between 0.01 and 0.7 micrometers, can be formed on the regions of the metal traces or pads 19 exposed by the openings 6*a*, on the passivation layer 6, on the buffer layer 20, and on the microlenses 8. The adhesion/barrier layer 21 can be formed by sputtering a titanium-containing layer, such as titanium-tungsten-alloy layer, titanium-nitride layer or titanium layer, having a suitable thickness, e.g., between 1 nanometer and 0.8 micrometers, and preferably between 0.01 and 0.7 micrometers, on the regions of the metal traces or pads 19 exposed by the openings 6*a*, on the passivation layer 6, on the buffer layer 20, and on the microlenses 8. Alternatively, the adhesion/barrier layer 21 can be formed by sputtering a chromium-containing layer, such as chromium layer, having a thickness, e.g., between 1 nanometer and 0.8 micrometers, and preferably between 0.01 and 0.7 micrometers, on the regions of the metal traces or pads 19 exposed by the openings 6*a*, on the passivation layer 6, on the buffer layer 20, and on the microlenses 8. Alternatively, the adhesion/barrier layer 21 can be formed by sputtering a tantalum-containing layer, such as tantalum layer or tantalum-nitride layer, having a thickness, e.g., between 1 nanometer and 0.8 micrometers, and preferably between 0.01 and 0.7 micrometers, on the regions of the metal traces or pads 19 exposed by the openings 6*a*, on the passivation layer 6, on the buffer layer 20, and on the microlenses 8. Alternatively, the adhesion/barrier layer 21 can be formed by sputtering a nickel (or nickel alloy) layer having a suitable thickness, e.g., between 1 nanometer and 0.8 micrometers, and preferably between 0.01 and 0.7 micrometers, on the regions of the metal traces or pads 19 exposed by the openings 6*a*, on the passivation layer 6, on the buffer layer 20, and on the microlenses 8.

After forming the adhesion/barrier layer 21, a seed layer 22 having a suitable thickness, e.g., between 0.01 and 2 micrometers, and preferably between 0.02 and 0.5 micrometers, can be formed on the adhesion/barrier layer 21. The seed layer 22, for example, can be formed by sputtering a copper layer having a thickness between 0.01 and 2 micrometers, and preferably between 0.02 and 0.5 micrometers, on the adhesion/barrier layer 21 of any above-mentioned material. Alternatively, the seed layer 22 can be formed by sputtering a gold layer having a thickness between 0.01 and 2 micrometers, and preferably between 0.02 and 0.5 micrometers, on the adhesion/barrier layer 21 of any above-mentioned material. Alternatively, the seed layer 22 can be formed by sputtering a silver layer having a thickness between 0.01 and 2 micrometers, and preferably between 0.02 and 0.5 micrometers, on the adhesion/barrier layer 21 of any above-mentioned material. Alternatively, the seed layer 22 can be formed by sputtering an aluminum-containing layer, such as aluminum layer, aluminum-copper alloy layer or Al—Si—Cu alloy layer, having a thickness between 0.01 and 2 micrometers or between 0.4 and 3 micrometers on the adhesion/barrier layer 21 of any above-mentioned material. Other materials, techniques, and dimensions may be used for the see layer 22.

Referring to FIG. 1C, after forming the seed layer 22, a patterned photoresist layer 23 can be formed on the seed layer 22 of any above-mentioned material, and multiple openings 23*a* in the patterned photoresist layer 23 can expose multiple regions 22*a* of the seed layer 22 of any above-mentioned material. Next, referring to FIG. 1D, a metal layer 24 can be formed on the regions 22*a* of the seed layer 22 of any above-mentioned material. The metal layer 24 may have a thickness T1 between, for example, 1 and 15 micrometers, between 5 and 50 micrometers or between 3 and 100 micrometers, and greater than that of the seed layer 22, that of the adhesion/barrier layer 21, that of each of the metal traces or pads 19, and that of each of the interconnection layers 4, respectively.

For example, the metal layer 24 can be a single metal layer formed by electroplating a gold layer having a thickness between 1 and 15 micrometers, between 5 and 50 micrometers or between 3 and 100 micrometers on the regions 22*a* of the seed layer 22, preferably the above-mentioned gold layer for the seed layer 22, with an electroplating solution containing gold of between 1 and 20 grams per litter (g/l), and preferably between 5 and 15 g/l, and sulfite ion of 10 and 120 g/l, and preferably between 30 and 90 g/l. The electroplating solution may further include sodium ion, to be turned into a solution of gold sodium sulfite ($Na_3Au(SO_3)_2$), or may further include ammonium ion, to be turned into a solution of gold ammonium sulfite ($(NH_4)_3[Au(SO_3)_2]$). The electroplated gold layer can be used to be bonded with bond pads or inner leads 15 of the below-mentioned flexible substrate 9 or 9*a* by a chip-on-film (COF) process or to be wirebonded thereto by the below-mentioned wirebonded wires 42*a*, such as gold wires or copper wires.

Alternatively, the metal layer 24 can be a single metal layer formed by electroplating a copper layer having a thickness between 1 and 15 micrometers, between 5 and 50 micrometers or between 3 and 100 micrometers on the regions 22*a* of the seed layer 22, preferably the above-mentioned copper layer for the seed layer 22, with an electroplating solution containing $CuSO_4$, $Cu(CN)_2$ or $CuHPO_4$. The electroplated copper layer can be used to be bonded with bond pads or inner leads 15 of the below-mentioned flexible substrate 9 or 9*a* by a chip-on-film (COF) process or to be wirebonded thereto by the below-mentioned wirebonded wires 42*a*, such as gold wires or copper wires.

Alternatively, the metal layer 24 can be a single metal layer formed by electroplating a silver layer having a thickness between 1 and 15 micrometers, between 5 and 50 micrometers or between 3 and 100 micrometers on the regions 22*a* of the seed layer 22, preferably the above-mentioned silver layer for the seed layer 22. The electroplated silver layer can be used to be bonded with bond pads or inner leads 15 of the below-mentioned flexible substrate 9 or 9*a* by a chip-on-film (COF) process or to be wirebonded thereto by the below-mentioned wirebonded wires 42*a*, such as gold wires or copper wires.

Alternatively, the metal layer 24 can include two (double) metal layers formed by electroplating a copper layer having a thickness between 1 and 15 micrometers, between 5 and 50 micrometers or between 3 and 100 micrometers on the regions 22*a* of the seed layer 22, preferably the above-mentioned copper layer for the seed layer 22, using the above-mentioned electroplating solution for electroplating copper, and then electroplating or electroless plating a gold layer having a thickness between 0.1 and 10 micrometers, and preferably between 0.5 and 5 micrometers, on the electroplated copper layer in the openings 23*a*. The electroplated or electroless plated gold layer can be used to be bonded with bond pads or inner leads 15 of the below-mentioned flexible substrate 9 or 9*a* by a chip-on-film (COF) process or to be wirebonded thereto by the below-mentioned wirebonded wires 42*a*, such as gold wires or copper wires.

Alternatively, the metal layer 24 can include three (triple) metal layers formed by electroplating a copper layer having a thickness between 1 and 15 micrometers, between 5 and 50 micrometers or between 3 and 100 micrometers on the regions 22*a* of the seed layer 22, preferably the above-mentioned copper layer for the seed layer 22, using the above-mentioned electroplating solution for electroplating copper, then electroplating or electroless plating a nickel layer having a thickness between 0.5 and 8 micrometers, and preferably between 1 and 5 micrometers, on the electroplated copper layer in the openings 23*a*, and then electroplating or electroless plating a gold layer having a thickness between 0.1 and 10 micrometers, and preferably between 0.5 and 5 micrometers, on the electroplated or electroless plated nickel layer in the openings 23*a*. The electroplated or electroless plated gold layer can be used to be bonded with bond pads or inner leads 15 of the below-mentioned flexible substrate 9 or 9*a* by a chip-on-film (COF) process or to be wirebonded thereto by the below-mentioned wirebonded wires 42*a*, such as gold wires or copper wires.

Alternatively, the metal layer 24 can include three (triple) metal layers formed by electroplating a copper layer having a suitable thickness, e.g., between 1 and 15 micrometers, between 5 and 50 micrometers or between 3 and 100 micrometers on the regions 22*a* of the seed layer 22, preferably the above-mentioned copper layer for the seed layer 22, using the above-mentioned electroplating solution for electroplating copper, then electroplating or electroless plating a nickel layer having a thickness between 0.5 and 8 micrometers, and preferably between 1 and 5 micrometers, on the electroplated copper layer in the openings 23*a*, and then electroplating or electroless plating a platinum layer having a thickness between 0.1 and 10 micrometers, and preferably between 0.5 and 5 micrometers, on the electroplated or electroless plated nickel layer in the openings 23*a*. The electroplated or electroless plated platinum layer can be used to be bonded with bond pads or inner leads 15 of the below-mentioned flexible substrate 9 or 9*a* by a chip-on-film (COF) process or to be wirebonded thereto by the below-mentioned wirebonded wires 42*a*, such as gold wires or copper wires.

Alternatively, the metal layer 24 can be formed by electroplating a copper layer having a thickness between 1 and 15 micrometers, between 5 and 50 micrometers or between 3 and 100 micrometers on the regions 22*a* of the seed layer 22, preferably the above-mentioned copper layer for the seed layer 22, then electroplating or electroless plating a nickel layer having a thickness between 0.5 and 8 micrometers, and preferably between 1 and 5 micrometers, on the electroplated copper layer in the openings 23*a*, then electroplating or electroless plating a platinum layer having a thickness between 0.1 and 10 micrometers, and preferably between 0.5 and 5 micrometers, on the electroplated or electroless plated nickel layer in the openings 23*a*, and then electroplating or electroless plating a gold layer having a thickness between 0.1 and 10 micrometers, and preferably between 0.5 and 5 micrometers, on the electroplated or electroless plated platinum layer in the openings 23*a*. The electroplated or electroless plated gold layer can be used to be bonded with bond pads or inner leads 15 of the below-mentioned flexible substrate 9 or 9*a* by a chip-on-film (COF) process or to be wirebonded thereto by the below-mentioned wirebonded wires 42*a*, such as gold wires or copper wires.

Next, referring to FIG. 1E, the patterned photoresist layer 23 can be removed, as indicated. Referring to FIG. 1F, after removing the photoresist layer 23, the seed layer 22 not under the metal layer 24 is removed by using a wet-etching process or a dry-etching process. After removing the seed layer 22 not under the metal layer 24, the adhesion/barrier layer 21 not under the metal layer 24 is removed by using a wet-etching process or a dry-etching process.

After removing the adhesion/barrier layer 21 not under the metal layer 24, the metal pads or bumps 10 can be formed on the regions of the metal traces or pads 19 exposed by the openings 6*a* and on the passivation layer 6. The metal pads or bumps 10 can be composed of the adhesion/barrier layer 21 of any above-mentioned material on the regions of the metal traces or pads 19 exposed by the openings 6*a* and on the passivation layer 6, the seed layer 22 of any above-mentioned material on the adhesion/barrier layer 21, and the metal layer 24 of any above-mentioned material on the seed layer 22. Sidewalls of the metal layer 24 are not covered by the adhesion/barrier layer 21 and the seed layer 22. The metal pads or bumps 10 may have a suitable thickness or height H1, e.g., between 1 and 15 micrometers, between 5 and 50 micrometers or between 3 and 100 micrometers, and a suitable width W1, e.g., between 5 and 100 micrometers, and preferably between 5 and 50 micrometers. From a top perspective view, each of the metal pads or bumps 10 can be a circle-shaped metal pad or bump with a diameter, e.g., between 5 and 100 micrometers, and preferably between 5 and 50 micrometers, a square-shaped metal pad or bump with a width between 5 and 100 micrometers, and preferably between 5 and 50 micrometers, or a rectangle-shaped metal pad or bump having a shorter width between 5 and 100 micrometers, and preferably between 5 and 50 micrometers.

Next, referring to FIG. 1G, a patterned adhesive polymer 25 having a suitable thickness, e.g., between 10 and 300 micrometers, and preferably between 20 and 100 micrometers, can be formed on a bottom surface 11*a* of a transparent substrate 11 by using a screen printing process, using a process including a laminating and a photolithography process, or using a spin-coating process and a photolithography process. The material of the patterned adhesive polymer 25 can be epoxy, polyimide, SU-8 or acrylic or other suitable material. The transparent substrate 11, such as silicon based glass or acrylic, may have a thickness T2, e.g., between 200 and 500 micrometers, and preferably between 300 and 400 micrometers. The transparent substrate 11 may also include silica, alumina, gold, silver or metal oxide, e.g., $Cu_2O$, CuO, CdO, $CO_2O_3$, $Ni_2O_3$ or $MnO_2$. The glass substrate may contain a UV absorption composition, such as cerium, iron, copper, lead. The glass substrate may have a thickness between 100 and 1000 microns or between 100 and 500 microns or 100 and 300 microns.

Next, referring to FIG. 1H, the patterned adhesive polymer 25 attaches the transparent substrate 11, such as glass substrate, to the semiconductor wafer 100 using a thermal compressing process at a temperature between 150° C. and 500° C., and preferably between 180° C. and 250° C. After attaching the transparent substrate 11 to the semiconductor wafer 100, a cavity, free space or air space 26 is formed between and enclosed by the patterned adhesive polymer 25, the passivation layer 6 and the bottom surface 11*a* of the transparent substrate 11. The bottom surface 11*a* of the transparent substrate 11 provides the top end of the cavity, free space or air space 26, and the patterned adhesive polymer 25 provides the sidewall(s) of the cavity, free space or air space 26. A vertical distance D1 between a top of one of the microlenses 8 and the bottom surface 11*a* of the transparent substrate 11 can be, e.g., between 10 and 300 micrometers, and preferably between 20 and 100 micrometers. An air gap is between a top of one of the microlenses 8 and the bottom surface 11*a* of the transparent substrate 11, and the cavity, free space or air space 26 can be an airtight space or a space communicating with an ambient environment through an opening or gap in the patterned adhesive polymer 25.

Alternatively, the patterned adhesive polymer 25 can be formed on the semiconductor wafer 100 by a screen printing process and the photosensitive area 55 of the semiconductor wafer 100 is uncovered by the patterned adhesive polymer 25. Next, the transparent substrate 11 is mounted on the patterned adhesive polymer 25 by using a thermal compressing process at a temperature between 150° C. and 500° C., and preferably between 180° C. and 250° C. Next, the patterned adhesive polymer 25 can be optionally cured at the temperature between 130° C. and 300° C. Accordingly, the transparent substrate 11 can be attached to the semiconductor wafer 100 by the patterned adhesive polymer 25, and the cavity, free space or air space 26 can be formed between and enclosed by the patterned adhesive polymer 25, the semiconductor wafer 100 and the bottom surface a of the transparent substrate 11.

Next, referring to FIG. 1I, an adhesive material 27, for example, epoxy, polyimide, SU-8 or acrylic having a suitable thickness, e.g., between 20 and 150 micrometers, and preferably between 30 and 70 micrometers, can be formed on a top surface 11*b* of the transparent substrate 11, then an infrared (IR) cut filter 12 having a thickness, e.g., between 50 and 300 micrometers, and preferably between 100 and 200 micrometers, is mounted on the adhesive material 27. The adhesive material 27 can then be cured at a suitable temperature, e.g., between 130° C. and 300° C., to attach the infrared (IR) cut filter 12 to the top surface 11*b* of the transparent substrate 11. The material of the infrared (IR) cut filter 12 may include soda-lime silica or borosilicate; other suitable material(s) may of course be used for filter 12.

Accordingly, the infrared (IR) cut filter 12 can be formed over the cavity, free space or air space 26, over the microlenses 8, over the layer 7 of optical or color filter array and over the light sensors 3, and a cavity, free space or air space 28 can be formed between and enclosed by the adhesive material 27, a bottom surface 12*b* of the infrared (IR) cut filter 12 and the top surface 11*b* of the transparent substrate 11. The cavity, free space or air space 28 is over the cavity, free space or air space 26, over the microlenses 8, the layer 7 of optical or color filter array, and over the light sensors 3. The bottom surface 12*b* of the infrared (IR) cut filter 12 provides the top end of the cavity, free space or air space 28, the top surface 11*b* of the transparent substrate 11 provides the bottom end of the cavity, free space or air space 28, and the adhesive material 27 provides the sidewall(s) of the cavity, free space or air space 28. A vertical distance D2 between the top surface 11*b* of the transparent substrate 11 and the bottom surface 12*b* of the infrared (IR) cut filter 12 can be between 20 and 150 micrometers, and preferably between 30 and 70 micrometers. An air gap can be present between the top surface 11*b* of the transparent substrate 11 and the bottom surface 12*b* of the infrared (IR) cut filter 12, and the cavity, free space or air space 28 can be an airtight space or a space communicating with an ambient environment through an opening or gap in the adhesive material 27.

Next, referring to FIG. 1J, a portion of suitable covering material, e.g., low or medium tack blue tape of suitable thickness (not shown), can be attached to the bottom surface 1*b* of the semiconductor substrate 1 of the semiconductor wafer 100, and then multiple portions of the transparent substrate 11 and the patterned adhesive polymer 25 over the metal pads or bumps 10 can be removed, e.g., by a self-cutting process of a thick sawing blade cutting it with a cutting depth D3 between 200 and 500 micrometers. Accordingly, top surfaces 10*a* of the metal pads or bumps 10 are not covered by any of the transparent substrate 11 and the patterned adhesive polymer 25. The patterned adhesive polymer 25 can have a first region 25*a* contacting with the bottom surface 11*a* of the transparent substrate 11 and a second region 25*b* uncovered by the transparent substrate 11 and existing substantially coplanar with the top surfaces 10*a* of the metal pads or bumps 10, where the first region 25*a* is at a first horizontal level higher than a second horizontal level, where the second region 25*b* is.

Next, referring to FIG. 1K, a die-sawing process can be performed by using a thin sawing blade or a laser cutting process to cut through the semiconductor wafer 100 to form an image or light sensor chip 99. An oxygen plasma etching process, used to remove a portion of the patterned adhesive polymer 25 not under the transparent substrate 11 to expose upper portions of the metal pads or bumps 10, can be performed before or after the die-sawing (or cutting) process, such that the metal pads or bumps 10 have a suitable height H2, extruding from the patterned adhesive polymer 25, e.g., between 0.5 and 20 micrometers, and preferably between 5 and 15 micrometers. After the die-sawing process and the oxygen plasma etching process, the covering tape (such as low tack blue tape) can be removed from the image or light sensor chip 99. The oxygen plasma etching process can be omitted if the metal layer 24 of the metal pads or bumps 10 of the image or light sensor chip 99 is used to be wirebonded thereto, and Accordingly, the top surfaces 10*a* of the metal pads or bums 10 can be substantially coplanar with the second region 25*b* of the patterned adhesive polymer 25.

If a thin sawing blade is used to cut through the semiconductor wafer 100 in the die-sawing process, the thick sawing blade used in the step illustrated in FIG. 1J may have a width greater than that of the thin sawing blade used in the die-sawing process by more than 150 micrometers, such as between 150 micrometers and 1 millimeter or between 200 and 500 micrometers.

Using the above-mentioned steps illustrated in FIGS. 1A-1K, the image or light sensor chip 99 can be fabricated as shown in FIG. 1K. The image or light sensor chip 99 includes the photosensitive area 55 where there are the light sensors 3, the layer 7 of optical or color filter array over the light sensors 3, the microlenses 8 over the layer 7 of optical or color filter array and over the light sensors 3, the transparent substrate 11 over the microlenses 8, over the layer 7 of optical or color filter array and over the light sensors 3, and the infrared (IR) cut filter 12 over the transparent substrate 11, over the microlenses 8, over the layer 7 of optical or color filter array and over the light sensors 3, and includes the non-photosensitive area 56 where there are the patterned adhesive polymer 25 on the passivation layer 6 and the metal pads or bumps 10 in the patterned adhesive polymer 25, on the regions of the metal traces or pads 19 and on the passivation layer 6. A vertical distance D4 between the bottom surface 11*a* of the transparent substrate 11 and the top surface of the passivation layer 6 can be, e.g., between 20 and 150 micrometers, and preferably between 30 and 70 micrometers, and can be greater than the height H4 of the metal pads or bumps 10. A vertical distance D5 between the top surface 10*a* of the metal pad and bump 10 and the bottom surface 11*a* of the transparent substrate 11 can be greater than 5 micrometers, such as between 5 and 50 micrometers or between 50 and 100 micrometers. The metal traces or pads 19 are the topmost metal traces or pads having a width smaller than 1 micrometer under the passivation layer 6, that is, over the metal traces or pads 19 is no metal layer having a width smaller than 1 micrometer, in the image or light sensor chip 99. It is noted that an element in FIG. 1K indicated by the same reference number as indicated for a like or similar element in FIGS. 1A-1L can have the same material(s) and/or specification as the respective element illustrated in FIGS. 1A-1L.

FIG. 1L shows cross-sectional views of a flexible substrate 9 and the image or light sensor chip 99 illustrated in FIG. 1K. The flexible substrate 9 may be a flexible circuit film, a flexible printed-circuit board or a tape-carrier-package (TCP) tape. The flexible substrate 9, for example, can include a polymer layer 14*a* having a suitable thickness, e.g., between 10 and 50 micrometers, multiple bond pads or inner leads 15 having a thickness between 0.1 and 3 micrometers, and preferably between 0.2 and 1 micrometers, multiple metal traces 13 having a thickness between 5 and 20 micrometers on the polymer layer 14*a* and on the bond pads or inner leads 15, a polymer layer 14*b* having a thickness between 10 and 50 micrometers on the metal traces 13, and multiple connection pads or outer leads 16 having a thickness between 0.25 and 16 micrometers, and preferably between 3 and 10 micrometers, on the metal traces 13 exposed by multiple openings 14*o* in the polymer layer 14*b*.

The metal traces 13 can include a copper layer 13*a* having a thickness, e.g., between 5 and 20 micrometers on the polymer layer 14*a* and on the bond pads or inner leads 15, and an adhesion layer 13*b* having a thickness between 0.01 and 0.5 micrometers on a top surface of the copper layer 13*a*. The polymer layer 14*b* is on the adhesion layer 13*b* of the metal traces 13, and the connection pads or outer leads 16 are on the adhesion layer 13*b* of the metal traces 13 exposed by the openings 14*o* in the polymer layer 14*b*. The adhesion layer 13*b* can be a chromium layer having a thickness between 0.01 and 0.1 micrometers on the top surface of the copper layer 13*a*, or a nickel layer having a thickness between 0.01 and 0.5 micrometers on the top surface of the copper layer 13*a*. Other suitable adhesion layer materials may be used.

The polymer layer 14*a* can be, e.g., a polyimide layer, an epoxy layer, a polybenzobisoxazole (PBO) layer, a polyethylene layer or a polyester layer on a bottom surface of the copper layer 13*a*. The polymer layer 14*b* can be, e.g., a polyimide layer, an epoxy layer, a polybenzobisoxazole (PBO) layer, a polyethylene layer or a polyester layer on the adhesion layer 13*b*.

The bond pads or inner leads 15, for example, can be formed by suitable techniques including, but not limited to, electroless plating a tin-containing layer of pure tin, a tin-silver alloy, a tin-silver-copper alloy or a tin-lead alloy having a thickness, e.g., between 0.1 and 3 micrometers, and preferably between 0.2 and 1 micrometers, on the bottom surface of the copper layer 13*a*, or electroless plating a gold layer having a thickness, e.g., between 0.1 and 3 micrometers, and preferably between 0.2 and 1 micrometers, on the bottom surface of the copper layer 13*a*. The bond pads or inner leads 15 of the flexible substrate 9 can be used to be joined with the metal pads or bumps 10 of the image or light sensor chip 99 or with the below-mentioned metal structures 57 of the below-mentioned image or light sensor chip 99*b*.

The connection pads or outer leads 16, for example, can be formed by electroless plating a nickel layer having a thickness, e.g., between 0.2 and 15 micrometers, and preferably between 3 and 10 micrometers, on the adhesion layer 13*b* exposed by the openings 14*o* in the polymer layer 14*b*, and then electroless plating a wettable layer of pure tin, a tin-silver alloy, a tin-silver-copper alloy, a tin-lead alloy, gold, platinum, palladium or ruthenium having a thickness between 0.05 and 1 micrometers on the electroless plated nickel layer. Alternatively, before electroless plating the nickel layer, the adhesion layer 13*b* exposed by the openings 14*o* in the polymer layer 14*b* can be optionally dry or wet etched until the copper layer 13*a* under the openings 14*o* is exposed. Next, the nickel layer can be electroless plated on the copper layer 13*a* exposed by the openings 14*o*, and then the wettable layer of pure tin, a tin-silver alloy, a tin-silver-copper alloy, a tin-lead alloy, gold, platinum, palladium or ruthenium is electroless plated on the electroless plated nickel layer.

Referring to FIG. 1M, the bond pads or inner leads 15 of the flexible substrate 9 are bonded with the metal pads or bumps 10 of the image or light sensor chip 99 by a chip-on-film (COF) process. For example, the bond pads or inner leads 15 of the flexible substrate 9 can be thermally pressed onto the metal pads or bumps 10 of the image or light sensor chip 99 at a temperature of between 490° C. and 540° C., and preferably of between 500° C. and 520° C., for a time of between 1 and 10 seconds, and preferably of between 3 and 6 seconds.

After the chip-on-film process, an alloy 29, such as a tin alloy, a tin-gold alloy or a gold alloy, may be formed between the copper layer 13*a* and the metal layer 24 of the metal pads or bumps 10. For example, if the bond pads or inner leads 15 are formed with the above-mentioned tin-containing layer and boned with a gold layer at the top of the metal layer 24 of the metal pads or bumps 10, the alloy 29 of tin and gold can be formed between the copper layer 13*a* and the metal layer 24 of the metal pads or bumps 10 after the metal pads or bumps 10 are bonded with the bond pads or inner leads 15.

Alternatively, if the material of the bond pads or inner leads 15 is the same as that of the top of the top of the metal layer 24, there is no alloy formed between the copper layer 13*a* and the metal layer 24 of the metal pads or bumps 10 after the chip-on-film process. For example, if the bond pads or inner leads 15 are formed with the above-mentioned gold layer and boned with a gold layer at the top of the metal layer 24 of the metal pads or bumps 10, there is no alloy formed between the copper layer 13*a* and the metal layer 24 of the metal pads or bumps 10 after the metal pads or bumps 10 are bonded with the bond pads or inner leads 15.

The metal pads or bumps 10 after being bonded with the flexible substrate 9 have a thickness or height, e.g., between 1 and 15 micrometers, between 5 and 50 micrometers or between 3 and 100 micrometers and smaller than the vertical distance D4 between the bottom surface 11*a* of the transparent substrate 11 and the top surface of the passivation layer 6, and a width, e.g., between 5 and 100 micrometers, and preferably between 5 and 50 micrometers, after the chip-on-film process. Each of the metal pads or bumps 10 bonded with the flexible substrate 9 can be a circle-shaped metal pad or bump with a diameter, e.g., between 5 and 100 micrometers, and preferably between 5 and 50 micrometers, a square-shaped metal pad or bump with a width between 5 and 100 micrometers, and preferably between 5 and 50 micrometers, or a rectangle-shaped metal pad or bump having a shorter width between 5 and 100 micrometers, and preferably between 5 and 50 micrometers.

The metal pads or bumps 10 after being bonded with the flexible substrate 9 have a desired thickness or height, e.g., between 1 and 15 micrometers, between 5 and 50 micrometers or between 3 and 100 micrometers, and include the adhesion/barrier layer 21 of any above-mentioned material on the regions of the metal traces or pads 19 exposed by the openings 6*a* and on the passivation layer 6, the seed layer 22 of any above-mentioned material on the adhesion/barrier layer 21, and the metal layer 24 of any above-mentioned material on the seed layer 22.

For example, the metal pads or bumps 10 after being bonded with the flexible substrate 9 may include the adhesion/barrier layer 21 of a titanium-tungsten alloy, titanium nitride, titanium, tantalum nitride or tantalum having a thickness between 1 nanometer and 0.8 micrometers, and preferably between 0.01 and 0.7 micrometers, on the regions of the metal traces or pads 19 exposed by the openings 6*a* and on the passivation layer 6, the seed layer 22 of copper having a thickness between 0.01 and 2 micrometers, and preferably between 0.02 and 0.5 micrometers, on the adhesion/barrier layer 21 of above-mentioned material, and the metal layer 24 including an electroplated copper layer having a thickness between 1 and 15 micrometers, between 5 and 50 micrometers or between 8 and 20 micrometers on the seed layer 22 of copper, an electroplated or electroless plated nickel layer having a thickness between 0.5 and 8 micrometers, and preferably between 1 and 5 micrometers, on the electroplated copper layer, and an electroplated or electroless plated gold layer having a thickness between 0.1 and 10 micrometers, and preferably between 0.5 and 5 micrometers, between the electroplated or electroless plated nickel layer and the alloy 29 of tin and gold when the bond pads or inner leads 15 are formed of a tin-containing layer or between the electroplated or electroless plated nickel layer and the bond pads or inner leads 15 of gold on a bottom surface of the copper layer 13*a* uncovered by the polymer layer 14*a* when the bond pads or inner leads 15 are formed of a gold layer.

Alternatively, the metal pads or bumps 10 after being bonded with the flexible substrate 9 may include the adhesion/barrier layer 21 of a titanium-tungsten alloy, titanium nitride, titanium, tantalum nitride or tantalum having a thickness between 1 nanometer and 0.8 micrometers, and preferably between 0.01 and 0.7 micrometers, on the regions of the metal traces or pads 19 exposed by the openings 6*a* and on the passivation layer 6, the seed layer 22 of copper having a thickness between 0.01 and 2 micrometers, and preferably between 0.02 and 0.5 micrometers, on the adhesion/barrier layer 21 of above-mentioned material, and the metal layer 24 including an electroplated copper layer having a thickness between 1 and 15 micrometers, between 5 and 50 micrometers or between 8 and 20 micrometers on the seed layer 22 of copper, and an electroplated or electroless plated nickel layer having a thickness between 0.5 and 8 micrometers, and preferably between 1 and 5 micrometers, between the electroplated copper layer and the alloy 29 of tin and gold when the bond pads or inner leads 15 are formed of a tin-containing layer or between the electroplated copper layer and a gold layer on the bottom surface of the copper layer 13*a* uncovered by the polymer layer 14*a* when the bond pads or inner leads 15 are formed of a gold layer.

Alternatively, the metal pads or bumps 10 after being bonded with the flexible substrate 9 may include the adhesion/barrier layer 21 of a titanium-tungsten alloy, titanium-nitride or titanium having a thickness between 1 nanometer and 0.8 micrometers, and preferably between 0.01 and 0.7 micrometers, on the regions of the metal traces or pads 19 exposed by the openings 6*a* and on the passivation layer 6, the seed layer 22 of gold having a thickness between 0.01 and 2 micrometers, and preferably between 0.02 and 0.5 micrometers, on the adhesion/barrier layer 21 of above-mentioned material, and the metal layer 24 of gold having a thickness between 1 and 15 micrometers, between 5 and 50 micrometers or between 3 and 100 micrometers on the seed layer 22 of gold. When the bond pads or inner leads 15 are formed of a tin-containing layer, the metal layer 24 of gold is between the seed layer 22 of gold and the alloy 29 of tin and gold and contacts with the seed layer 22 of gold and the alloy 29 of tin and gold. When the bond pads or inner leads 15 are formed of a gold layer, the metal layer 24 of gold is between the seed layer 22 of gold and the bond pads or inner leads 15 of gold on the bottom surface of the copper layer 13*a* uncovered by the polymer layer 14*a*.

Next, referring to FIG. 1N, an encapsulation material 30, such as epoxy or polyimide with carbon or glass filler, encloses upper portions of the metal pads or bumps 10 and a portion of the flexible substrate 9 bonded with the metal pads or bumps 10 by using a molding or dispensing process. An adhesive material 31 having a thickness, e.g., between 20 and 80 micrometers, can be formed on the bottom surface 1*b* of the semiconductor substrate 1 of the image or light sensor chip 99 before or after forming the encapsulation material 30. The material of the adhesive material 31 may be silver epoxy, polyimide, polybenzobisoxazole (PBO) or acrylic. After forming the adhesive material 31, the flexible substrate 9 can be bent to have the polymer layer 14*a* of the flexible substrate 9 attached to the bottom surface 1*b* of the semiconductor substrate 1 of the image or light sensor chip 99 by the adhesive material 31 using a thermal compressing process at a temperature between 150° C. and 500° C., and preferably between 180° C. and 250° C., e.g., as indicated in FIG. 1O.

After attaching the polymer layer 14*a* of the flexible substrate 9 to the bottom surface 1*b* of the semiconductor substrate 1, the connection pads or outer leads 16 of the flexible substrate 9 are under the bottom surface 1*b* of the semiconductor substrate 1, and the flexible substrate 9 has a first portion bonded with the metal pads or bumps 10, a second portion at a sidewall of the image or light sensor chip 99, and a third portion attached to the bottom surface 1*b* of the semiconductor substrate 1. The first portion of the flexible substrate 9 is connected to the third portion of the flexible substrate 9 through the second portion of the flexible substrate 9.

Next, referring to FIG. 1P, using a suitable process, e.g., a ball-planting process and a reflowing process or using a solder printing process and a reflowing process, multiple solder balls 50 of a suitable solder, e.g., Sn—Ag—Cu alloy, a Sn—Ag alloy, a Sn—Ag—Bi alloy, a Sn—Au alloy, an In layer, a Sn—In alloy, a Ag—In alloy and/or a Sn—Pb alloy, can be formed on the wettable layer of the connection pads or outer leads 16, and an alloy 32, such as a tin-gold alloy, a tin-silver alloy, a tin-silver-copper alloy, a tin-lead alloy, may be formed between the copper layer 13*a* and the solder balls 50. As a result, the solder balls 50 having a height, e.g., between 50 and 500 micrometers, can be formed under the bottom surface 1*b* of the semiconductor substrate 1.

Accordingly, as shown in FIG. 1P, an image or light sensor package 999 can be provided with the image or light sensor chip 99, the flexible substrate 9 and the solder balls 50. The image or light sensor package 999 can be mounted on an external circuit, such as ball-grid-array (BGA) substrate, printed circuit board, semiconductor chip, metal substrate, glass substrate or ceramic substrate, through the solder balls 50, and the metal pads or bumps 10 of the image or light sensor chip 99 can be connected to the external circuit through the metal traces 13 of the flexible substrate 9 and the solder balls 50.

Figure 2A:
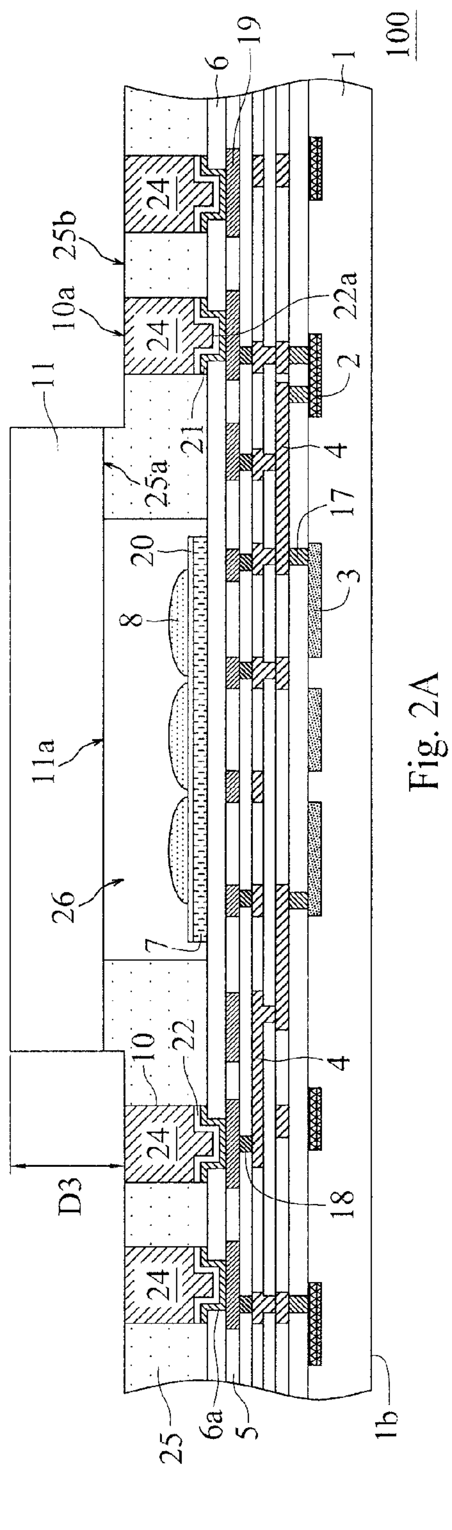
FIGS. 2A-2D are cross-sectional views depicting a process of forming an image or light sensor package according to an embodiment of the present disclosure.
Figure 2B:
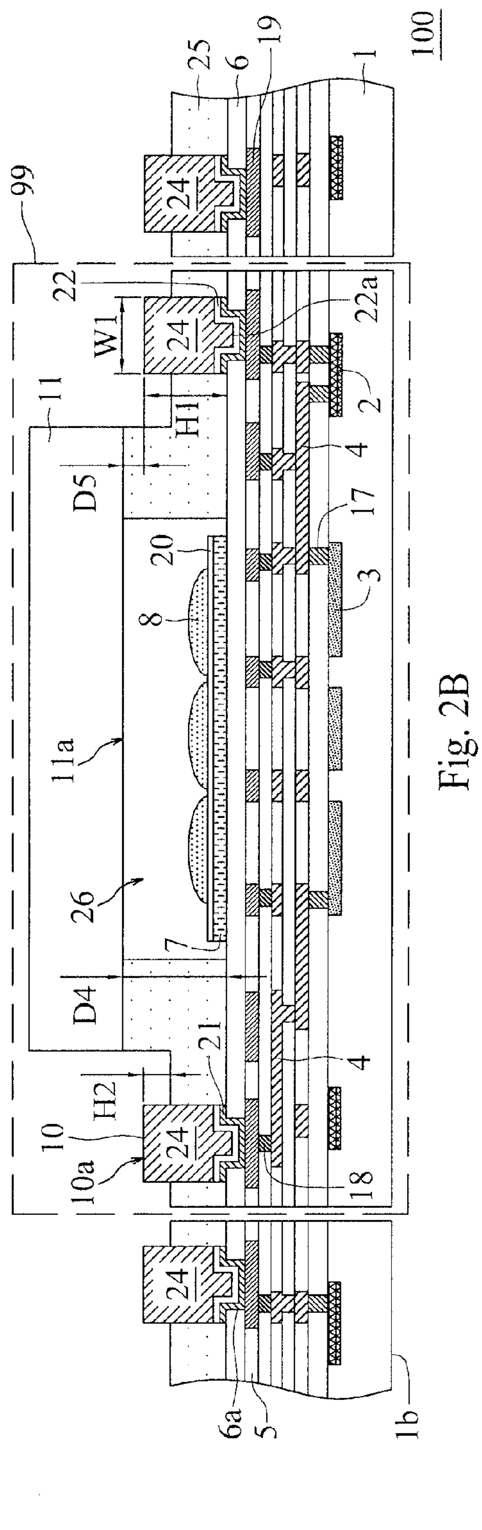
Figure 2C:
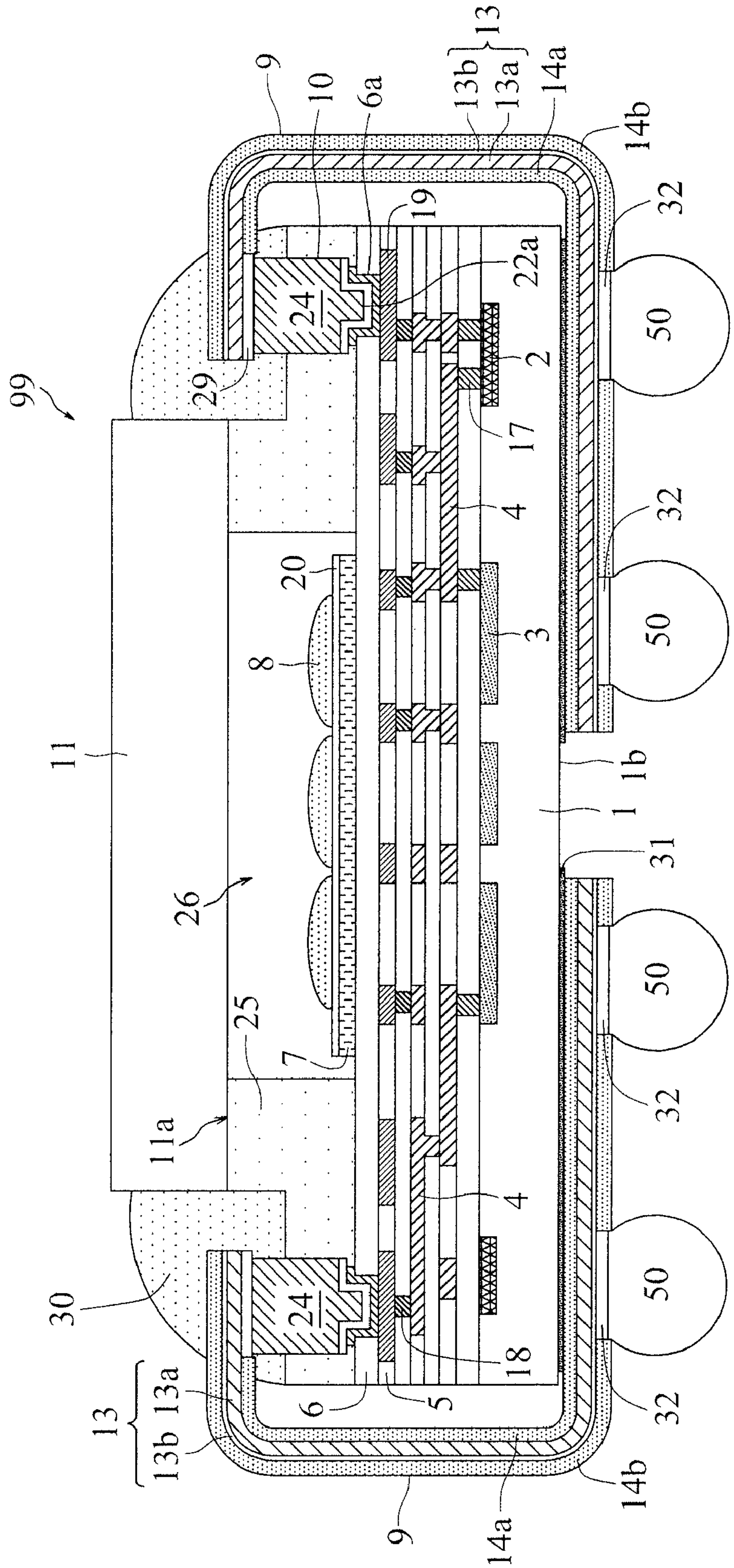

FIGS. 2A-2G depict another process for forming the image or light sensor package 999, in accordance with exemplary embodiments of the present disclosure. Referring to FIG. 2A, after performing the steps illustrated in FIGS. 1A-1H, the step illustrated in FIG. 1I can be skipped and the step illustrated in FIG. 1J can be performed to make the top surfaces 10*a* of the metal pads or bumps 10 uncovered by any of the transparent substrate 11 and the patterned adhesive polymer 25. Next, referring to FIG. 2B, the step illustrated in FIG. 1K can be performed to form an image or light sensor chip 99 that is similar to the image or light sensor chip 99 shown in FIG. 1K except that there is no infrared (IR) cut filter (such as filter 12 shown in FIG. 1K) attached to the transparent substrate 11 by the adhesive material 27. Next, the steps/processes shown and described for FIGS. 1M-1P can be performed as shown in FIG. 2C. Next, referring to FIG. 2D, the step/process shown and described for FIG. 1I can be performed to attach an infrared (IR) cut filter 12 to the top surface 11*b* of the transparent substrate 11 by the adhesive material 27. It should be noted that an element in FIGS. 2A-2D indicated by the same reference number as for a like or similar element indicated in FIGS. 1A-1P can have the same material(s) and/or specification as the respective element illustrated in FIGS. 1A-1P.

Figure 3A:
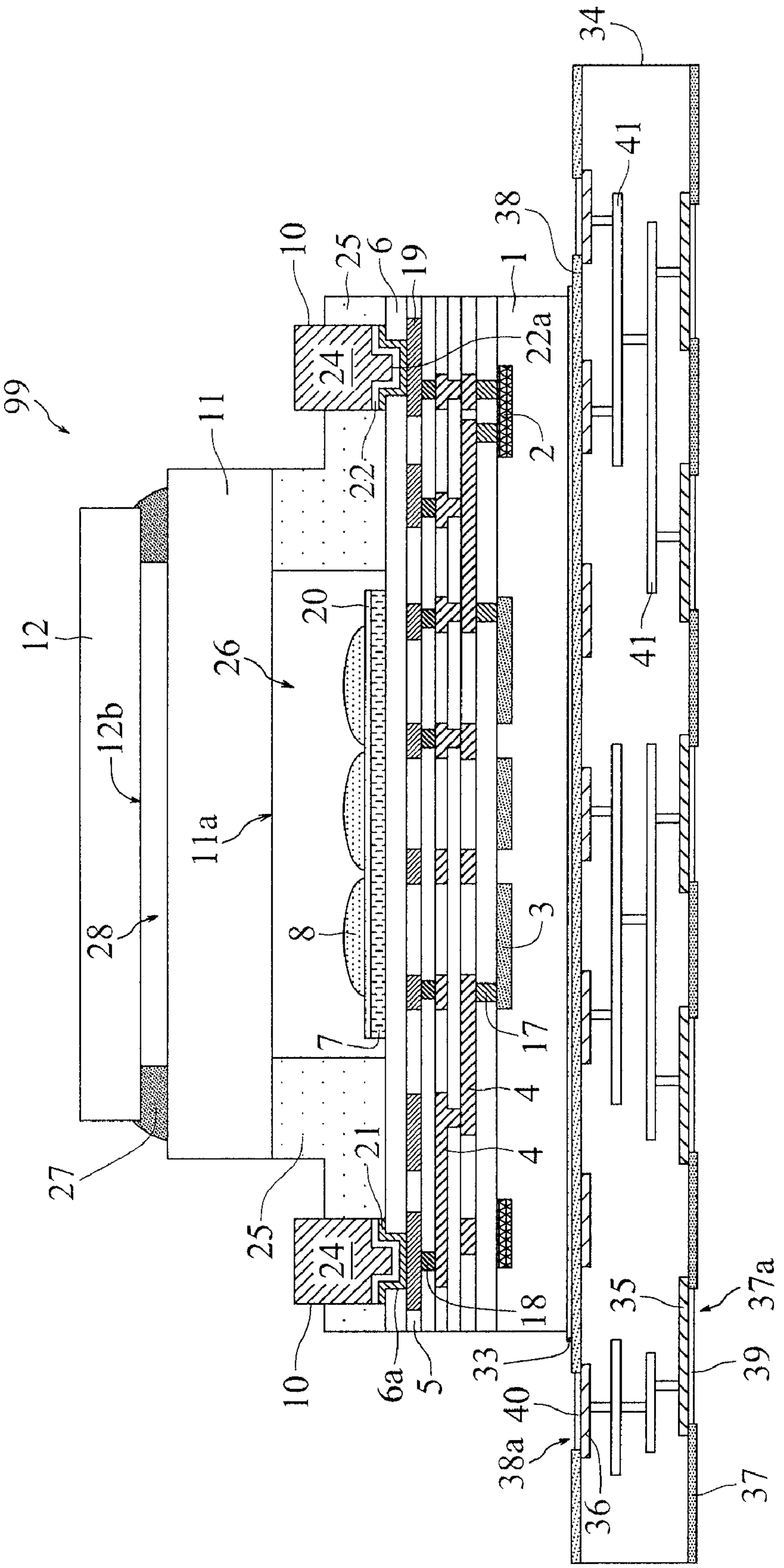
FIGS. 3A-3D are cross-sectional views depicting a process of forming an image or light sensor package according to an embodiment of the present disclosure.

FIGS. 3A-3D show a process for forming an image or light sensor package according to exemplary embodiments of the present disclosure. Referring to FIG. 3A, an adhesive material 33, e.g., one of silver epoxy, polyimide or acrylic, etc., is formed on a top surface of a package substrate 34 by a dispensing process or a screen-printing process, then the image or light sensor chip 99 illustrated in FIG. 1K is mounted onto the adhesive material 33, and then the adhesive material 33 is baked at a suitable temperature, e.g., between 100° C. and 200° C. to attach the image or light sensor chip 99 to the top surface of the package substrate 34.

For example, the package substrate 34, such as rigid printed circuit board, flexible printed circuit board, flexible substrate or ball-grid-array substrate, may include a metallization structure having multiple connection traces or pads 35, multiple copper layers 41 and multiple metal traces or pads 36, a layer 37 of solder mask or solder resist at the bottom surface of the package substrate 34, a layer 38 of solder mask or solder resist at the top surface of the package substrate 34, and an insulating layer, e.g., made of ceramic, Bismaleimide Triazine (BT), Flame Retardant material (FR-4 or FR-5), polyimide and/or Polybenzobisoxazole (PBO), between the copper layers 41. Multiple openings 37*a* in the layer 37 of solder mask or solder resist expose bottom surfaces of the connection traces or pads 35, and a metal layer 39 is formed on the bottom surfaces of the connection traces or pads 35 exposed by the openings 37*a*. Multiple openings 38*a* in the layer 38 of solder mask or solder resist expose top surfaces of the metal traces or pads 36, and a metal layer 40 is formed on the top surfaces of the metal traces or pads 36 exposed by the openings 38*a*.

The connection traces or pads 35 can be connected to the metal traces or pads 36 through the copper layers 41. The copper layers 41 have a thickness between 5 and 30 micrometers, and can be formed by an electroplating process. The layers 37 and 38 of solder mask or solder resist can be a photo sensitive epoxy, polyimide or acrylic.

The connection traces or pads 35 can be formed with a copper layer having a thickness between 5 and 30 micrometers, and the metal layer 39 can be formed with a nickel layer having a thickness between 0.1 and 10 micrometers on a bottom surface of the copper layer exposed by the openings 37*a*, and a wettable layer of gold, platinum, palladium, ruthenium or a ruthenium alloy having a thickness between 0.05 and 5 micrometers on a bottom surface of the nickel layer.

The metal traces or pads 36 can be formed with a copper layer having a thickness between 5 and 30 micrometers, and the metal layer 40 can be formed with a nickel layer having a thickness between 1 and 10 micrometers on a top surface of the copper layer exposed by the openings 38*a*, and a layer of gold, copper, aluminum or palladium having a thickness, e.g., between 0.01 and 5 micrometers, and preferably between 0.05 and 1 micrometers, on a top surface of the nickel layer.

Figure 3B:
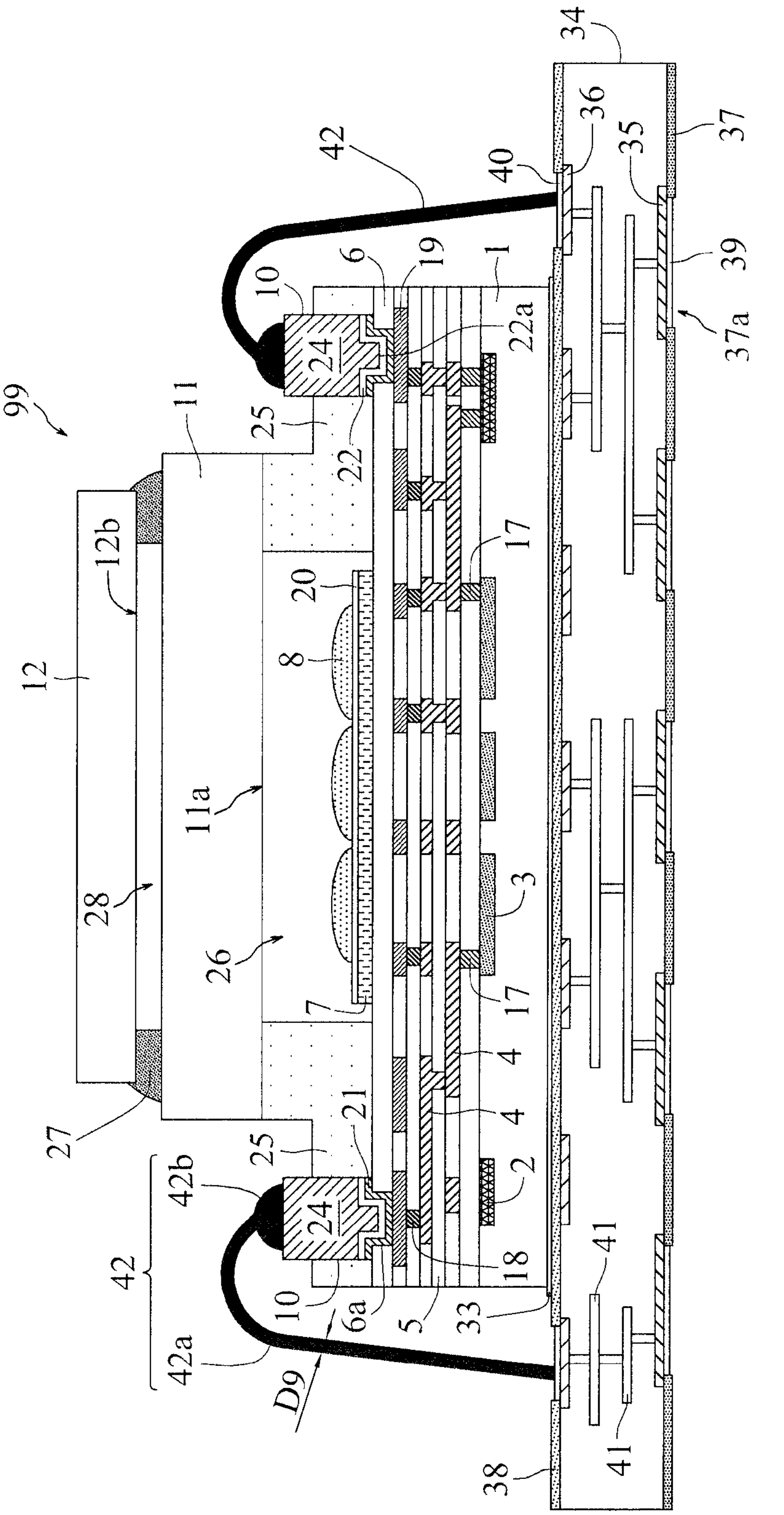

Next, referring to FIG. 3B, using a wire-bonding process, one end of each wirebonded wire 42 can be ball bonded with the metal layer 24 of one of the metal pads or bumps 10 of the image or light sensor chip 99, and the other end of each wirebonded wire 42 can be wedge bonded with the metal layer 40 of the package substrate 34. Accordingly, the metal pads or bumps 10 of the image or light sensor chip 99 can be connected to the metal traces or pads 36 of the package substrate 34 through the wirebonded wires 42.

The wirebonded wires 42 may each be made of suitable wire material, e.g., include a wire 42*a* of gold or copper having a suitable wire diameter D9 between, e.g., 10 and 20 micrometers or between 20 and 50 micrometers. The wires can each have a ball bond 42*b* at an end of the wire 42*a* to be ball bonded with the metal layer 24 of one of the metal pads or bumps 10, and a wedge bond at the other end of the wire 42*a* to be wedge bonded with the metal layer 40 of the package substrate 34. For example, the wirebonded wires 42 can be wirebonded gold wires each having the wire 42*a* of gold having the wire diameter D9 and the ball bond 42*b* at an end of the wire 42*a* to be ball bonded with the gold layer, the copper layer, the aluminum layer or the palladium layer of the metal layer 24, where a contact area between the ball bond 42*b* and the metal layer 24 may have a width, e.g., between 10 and 25 micrometers or between 25 and 75 micrometers. Each of the wirebonded gold wires can be wedge bonded with the layer of gold, copper, aluminum or palladium of the metal layer 40 of the package substrate 34.

Alternatively, the wirebonded wires 42 can be wirebonded copper wires each having the wire 42*a* of copper having the wire diameter D9 and the ball bond 42*b* at an end of the wire 42*a* to be ball bonded with the gold layer, the copper layer, the aluminum layer or the palladium layer of the metal layer 24, where a contact area between the ball bond 42*b* and the metal layer 24 may have a suitable width, e.g., between 10 and 25 micrometers or between 25 and 75 micrometers. Each of the wirebonded copper wires can be wedge bonded with the layer of gold, copper, aluminum or palladium of the metal layer 40 of the package substrate 34.

Figure 3C:
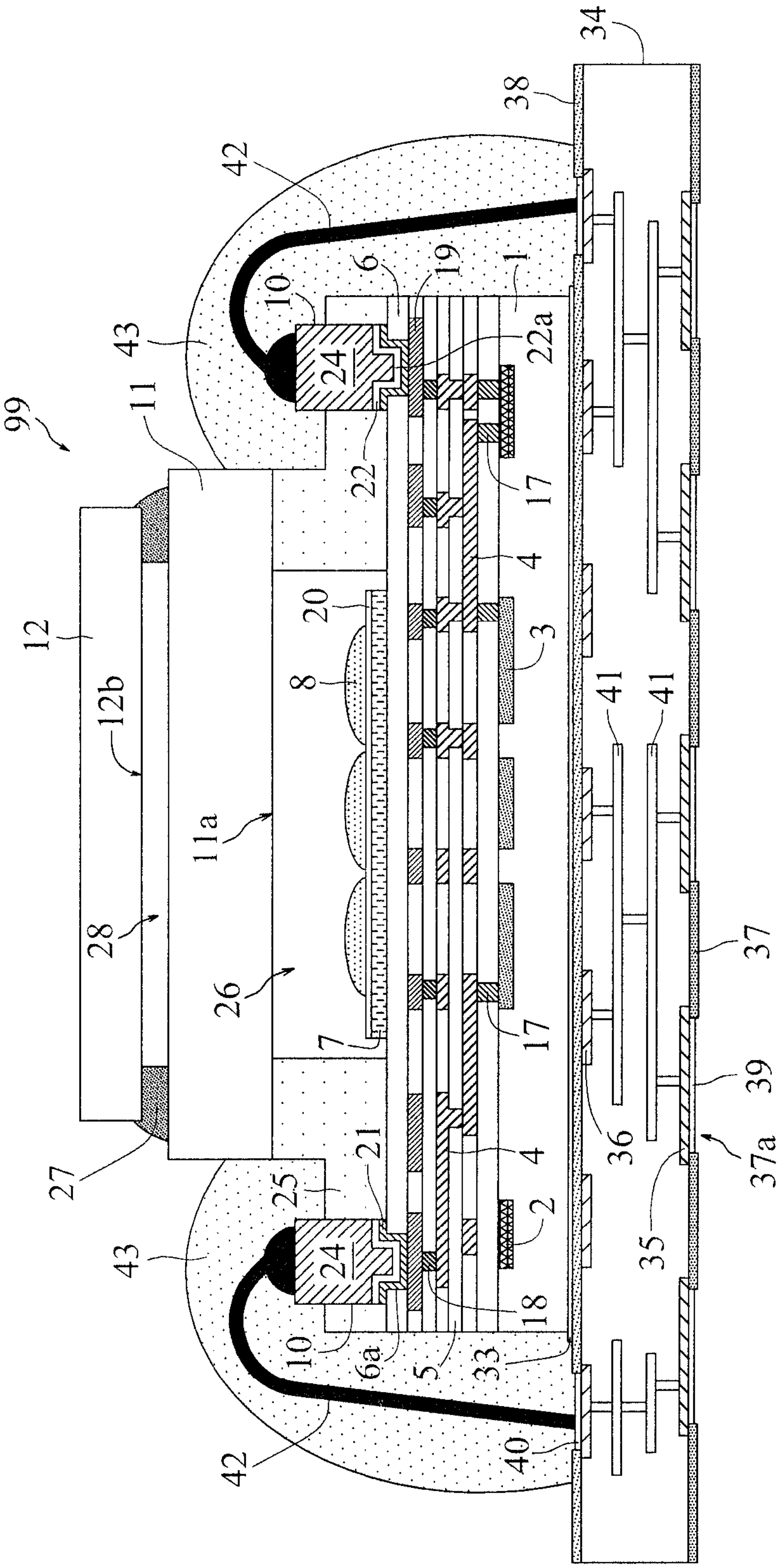

Next, referring to FIG. 3C, an encapsulation material 43 of epoxy or polyimide containing carbon or glass filler can be formed on the wirebonded wires 42, on the top surface of the package substrate 34 and at sidewalls of the image or light sensor chip 99, encapsulating the wirebonded wires 42 and a top portion of the metal layer 24 of the metal pads or bumps 10, by a molding process or a dispensing process.

Figure 3D:
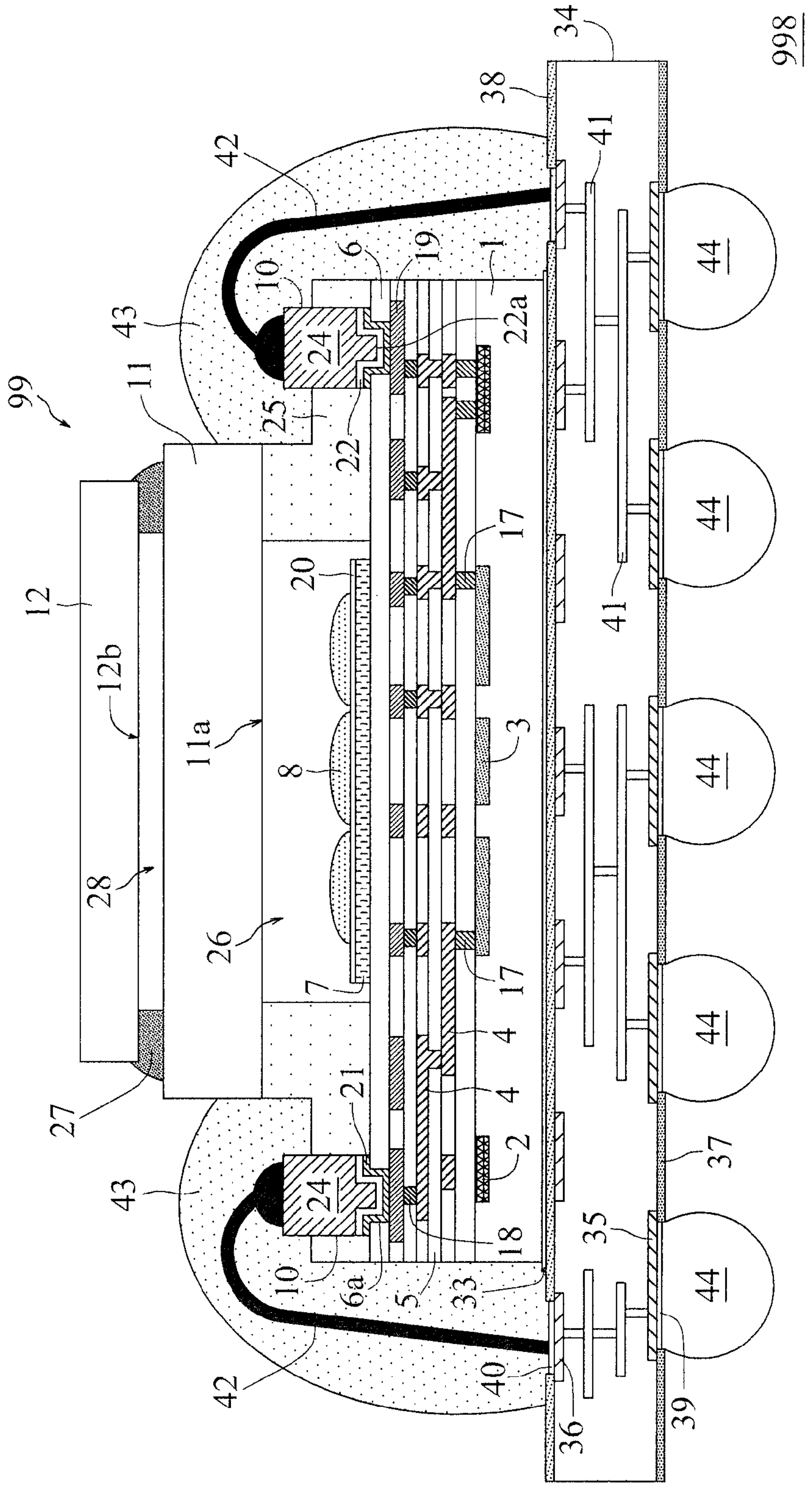

Next, referring to FIG. 3D, a solder can be formed on the wettable layer of the metal layer 39 of the package substrate 34 by a ball planting process or a screen printing process, and then the solder can be reflowed and fused with the wettable layer to form multiple solder balls 44 having a suitable diameter, e.g., between 0.25 and 1.2 millimeters on the nickel layer of the metal layer 39 of the package substrate 34. Accordingly, an image or light sensor package 998 can be provided with the package substrate 34, the image or light sensor chip 99 attached to the top surface of the package substrate 34, the wirebonded wires 42 connecting the metal pads or bumps 10 of the image or light sensor chip 99 to the metal traces or pads 36 of the package substrate 34, and the solder balls 44 formed on the bottom surface of the package substrate 34. The material of the solder balls 44 can be a Sn—Ag—Cu alloy, a Sn—Ag alloy, a Sn—Ag—Bi alloy, a Sn—Au alloy or a Sn—Pb alloy in preferred embodiments, though others may be used. The solder balls 44 can be connected to the wirebonded wires 42 through the connection traces or pads 35, the copper layers 41 and the metal traces or pads 36.

Figure 3E:
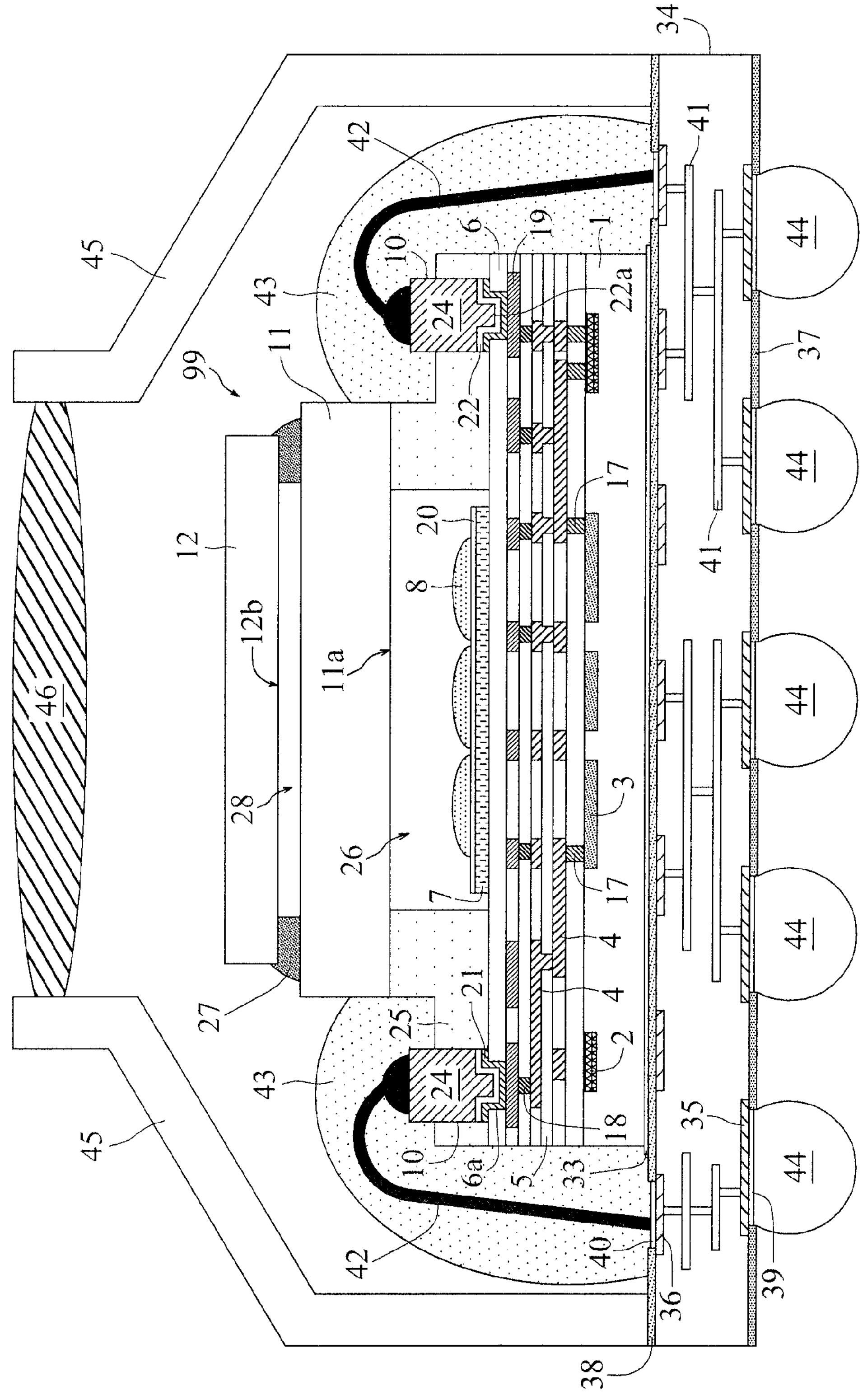
FIGS. 3E and 3F are cross-sectional views depicting image or light sensor modules according to an embodiment of the present disclosure.

Next, referring to FIG. 3E, a lens holder 45, for holding one or more lenses 46, can be attached to the layer 38 of solder mask or solder resist of the package substrate 34 by an adhesive polymer or metal solder. Accordingly, an image or light sensor module can be provided with the package substrate 34, the image or light sensor chip 99 attached to the top surface of the package substrate 34, the wirebonded wires 42, encapsulated with the encapsulation material 43, connecting the metal pads or bumps 10 of the image or light sensor chip 99 to the metal traces or pads 36 of the package substrate 34, the solder balls 44 formed on the bottom surface of the package substrate 34, and the lens holder 45 with the set of lens 46 attached to the layer 38 of solder mask or solder resist of the package substrate 34 by the adhesive polymer or metal solder. The set of lens 46 can be over the infrared (IR) cut filter 12, the transparent substrate 11, the microlenses 8, the layer 7 of optical or color filter array and the light sensors 3 of the image or light sensor chip 99.

Figure 3F:
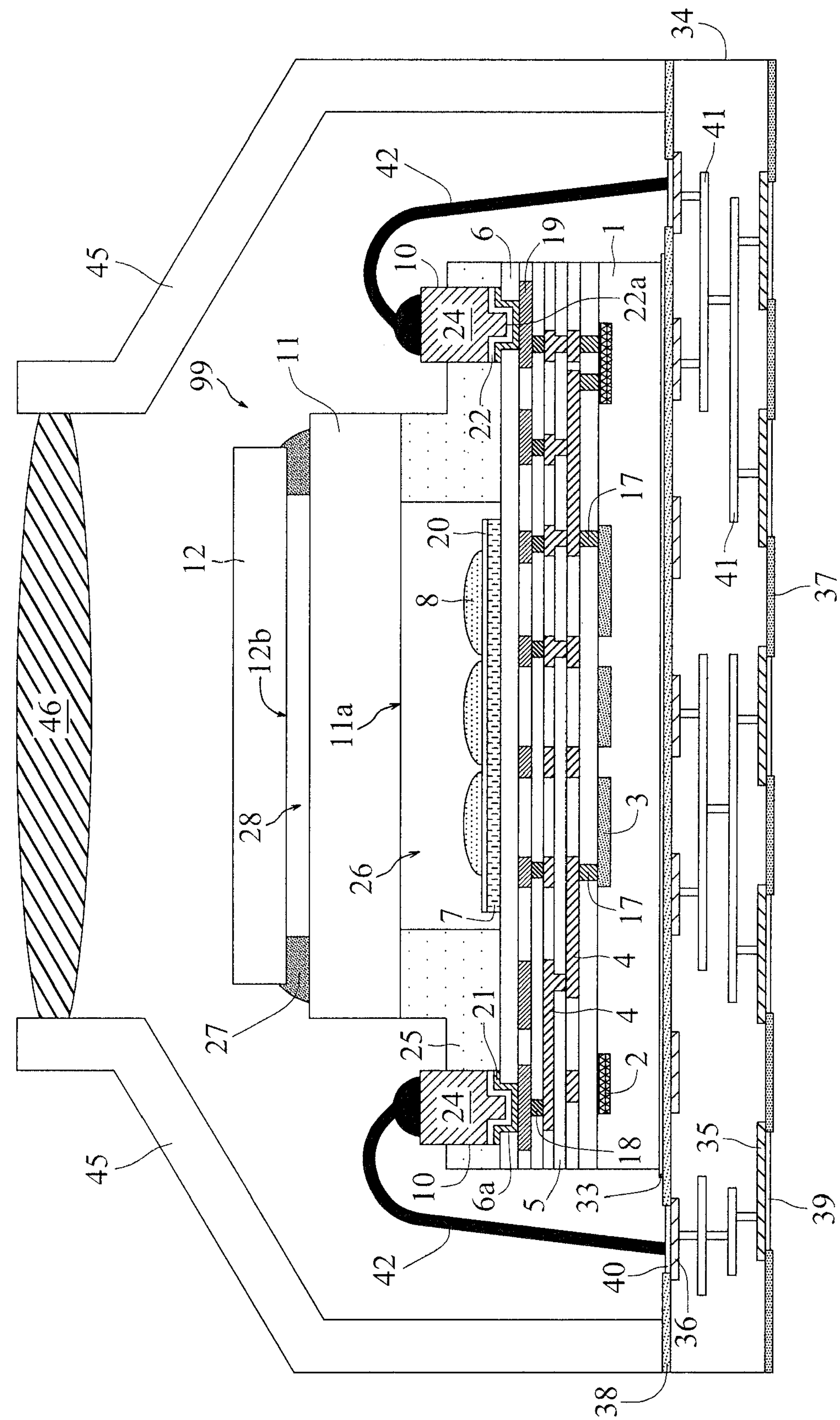

FIG. 3F is a cross sectional view depicting another example of an image or light sensor module, in accordance with an embodiment of the present disclosure. The image or light sensor module shown in FIG. 3F is similar to that shown in FIG. 3E except that there is no encapsulation material enclosing the wirebonded wires 42, and there are no solder balls formed on the bottom surface of the package substrate 34. The process flow for forming the image or light sensor module shown in FIG. 3F is similar to that for forming the image or light sensor module shown in FIG. 3E except that there is no step of forming the encapsulation material 43 shown in FIG. 3C and there is no step of forming the solder balls 44 shown in FIG. 3D.

Figure 4A:
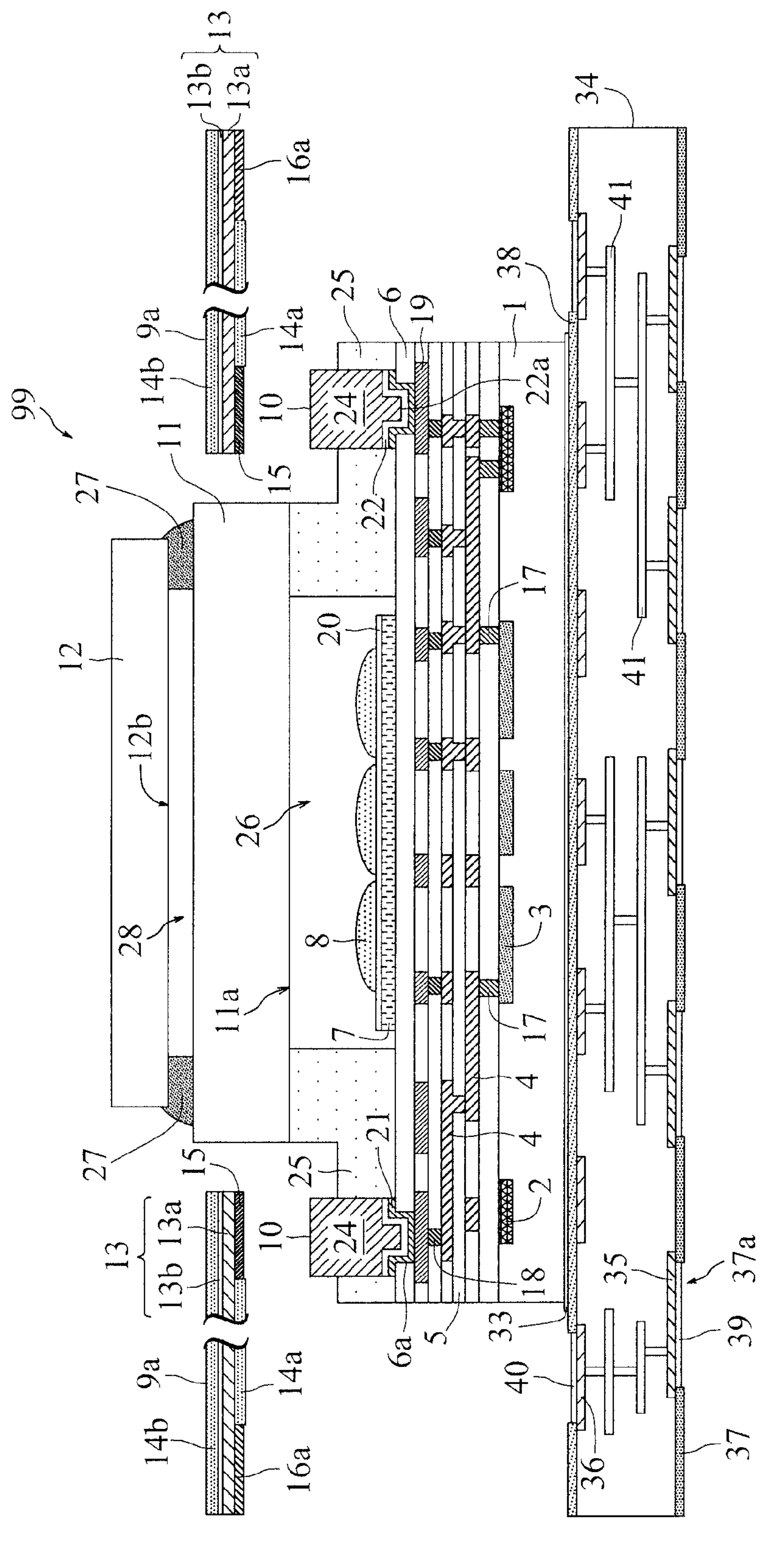
FIGS. 4A-4E are cross-sectional views depicting a process of forming an image or light sensor package according to an embodiment of the present disclosure.

FIGS. 4A-4E show a process for forming an image or light sensor package according to exemplary embodiments of the present disclosure. Referring to FIG. 4A, the image or light sensor chip 99 illustrated in FIG. 1K can be attached to the top surface of the package substrate 34 illustrated in FIG. 3A by the adhesive material 33 of silver epoxy, polyimide or acrylic, and the step shown in FIG. 4A can be referred to as the step illustrated in FIG. 3A.

After attaching the image or light sensor chip 99 to the top surface of the package substrate 34, a flexible substrate 9*a*, such as flexible circuit film, tape-carrier-package (TCP) tape or flexible printed-circuit board, is going to be bonded with the metal pads or bumps 10 of the image or light sensor chip 99. The flexible substrate 9*a* shown in FIG. 4A is similar to the flexible substrate 9 shown in FIG. 1L except that there are no connection pads or outer leads 16 on the metal traces 13 exposed by the openings 14*o* in the polymer layer 14*b*, and there are multiple connection pads or outer leads 16*a* formed on a bottom surface of the copper layer 13*a* of the metal traces 13 uncovered by the polymer layer 14*a*. The connection pads or outer leads 16*a*, for example, can be formed form a metal layer of pure tin, a tin-silver alloy, a tin-silver-copper alloy, a tin-lead alloy, gold, platinum, palladium or ruthenium having a thickness between 0.1 and 3 micrometers, and preferably between 0.2 and 1 micrometers, on the bottom surface of the copper layer 13*a* of the metal traces 13 by an electroless plating. It is noted that an element in FIG. 4A indicated by the same reference number as indicated for a like or similar element in FIG. 1L can have the same material(s) and/or specification as the respective element illustrated in FIG. 1L.

Figure 4B:
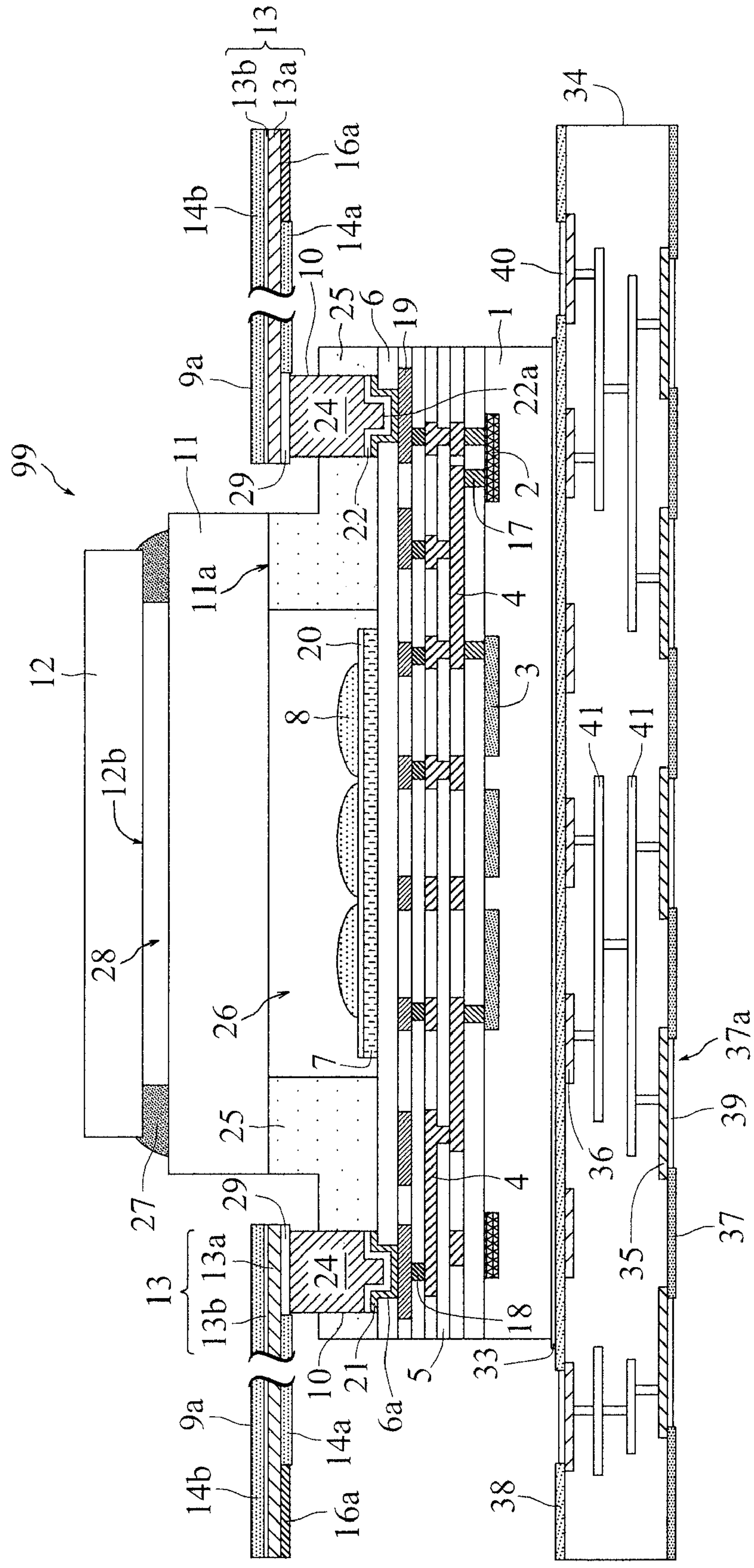

Referring to FIG. 4B, the bond pads or inner leads 15 (shown in FIG. 4A) of the flexible substrate 9*a* can be bonded with the metal pads or bumps 10 of the image or light sensor chip 99 by a chip-on-film (COF) process, and the step shown in FIG. 4B can be referred to as the step illustrated in FIG. 1M.

After the chip-on-film process, the alloy 29, such as a tin alloy, a tin-gold alloy or a gold alloy, may be formed between the copper layer 13*a* and the metal layer 24 of the metal pads or bumps 10. Alternatively, if the material of the bond pads or inner leads 15 is the same as that of the top of the metal layer 24, there is no alloy formed between the copper layer 13*a* of the flexible substrate 9*a* and the metal layer 24 of the metal pads or bumps 10 after the chip-on-film process. For more detailed description, please refer to the illustration in FIG. 1M.

The metal pads or bumps 10 after being bonded with the flexible substrate 9*a* may have a thickness or height between 5 and 50 micrometers, and preferably between 10 and 20 micrometers, and a width between 5 and 100 micrometers, and preferably between 5 and 50 micrometers, after the chip-on-film process. The specification of the metal pads or bumps 10 after being bonded with the flexible substrate 9*a* as shown in FIG. 4B can be referred to as the specification of the metal pads or bumps 10 after being bonded with the flexible substrate 9 as illustrated in FIG. 1M.

Figure 4C:
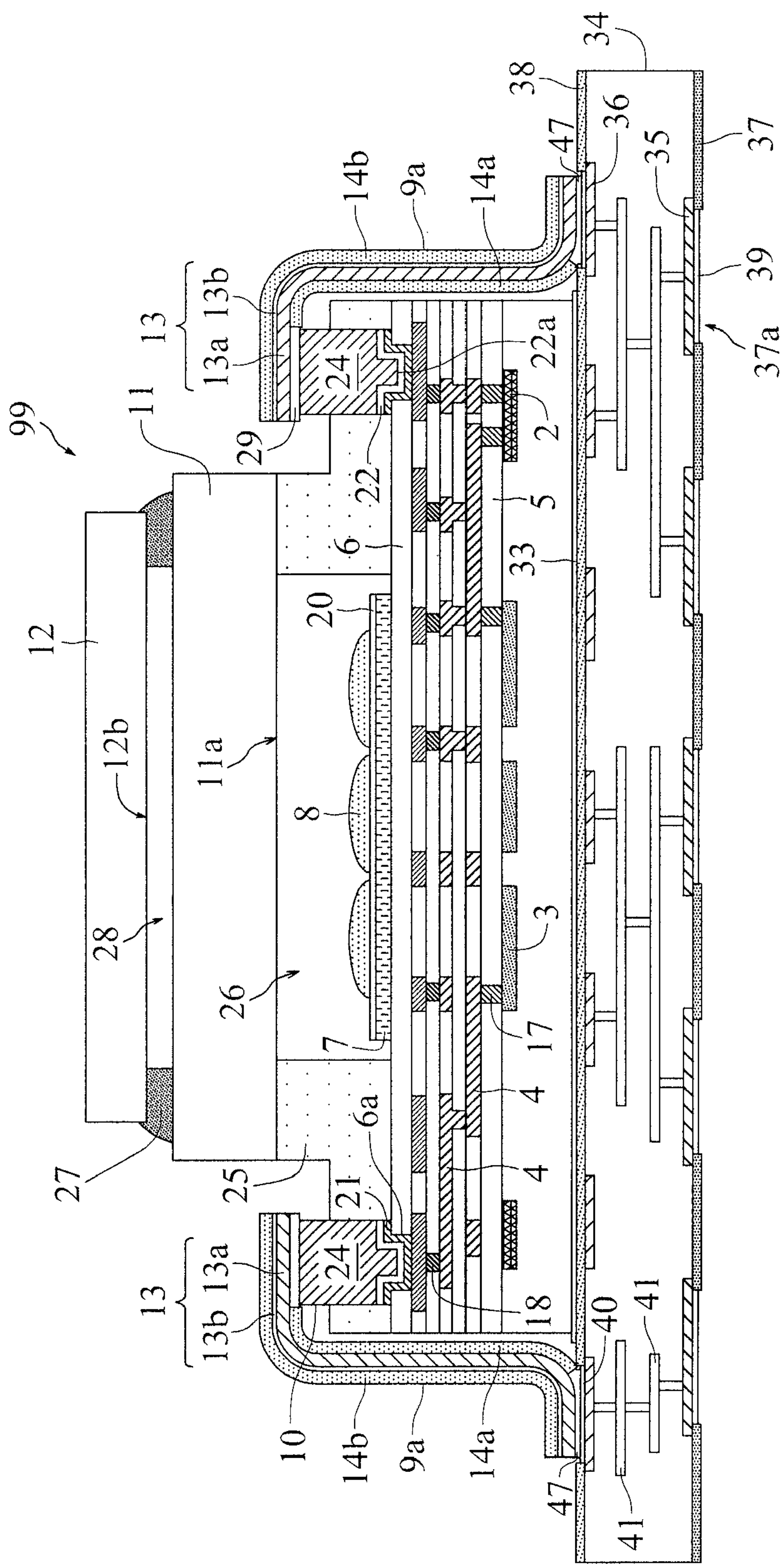

Next, referring to FIG. 4C, the connection pads or outer leads 16*a* (shown in FIG. 4B) of the flexible substrate 9*a* are bonded with the metal layer 40 of the package substrate 34 by a heat pressing process. For example, the connection pads or outer leads 16*a* of the flexible substrate 9*a* can be thermally pressed onto the metal layer 40 of the package substrate 34 at a temperature of between 490° C. and 540° C., and preferably of between 500° C. and 520° C., for a time of between 1 and 10 seconds, and preferably of between 3 and 6 seconds.

After the heat pressing process, a metal layer 47 may be formed between the copper layer 13*a* of the flexible substrate 9*a* and the nickel layer of the metal layer 40 of the package substrate 34. For example, if the connection pads or outer leads 16*a* are formed of a tin-containing layer and boned with the gold layer of the metal layer 40, the metal layer 47, e.g., of a tin-gold alloy can be formed between the copper layer 13*a* of the flexible substrate 9*a* and the nickel layer of the metal layer 40 of the package substrate 34 after the connection pads or outer leads 16*a* are bonded with the gold layer of the metal layer 40. Alternatively, if the connection pads or outer leads 16*a* are formed of a gold layer and bonded with the gold layer of the metal layer 40, the metal layer 47 of gold can be formed between the copper layer 13*a* of the flexible substrate 9*a* and the nickel layer of the metal layer 40 of the package substrate 34 after the connection pads or outer leads 16*a* are bonded with the gold layer of the metal layer 40.

Accordingly, the flexible substrate 9*a* has a first portion bonded with the metal layer 24 of the metal pads or bumps 10, a second portion at a sidewall of the image or light sensor chip 99, and a third portion bonded with the metal layer 40 of the package substrate 34. The first portion of the flexible substrate 9*a* can be connected to the third portion of the flexible substrate 9*a* through the second portion of the flexible substrate 9*a*. The metal pads or bumps 10 of the image or light sensor chip 99 can be connected to the metal traces or pads 36 of the package substrate 34 through the metal traces 13 of the flexible substrate 9*a*.

Figure 4D:
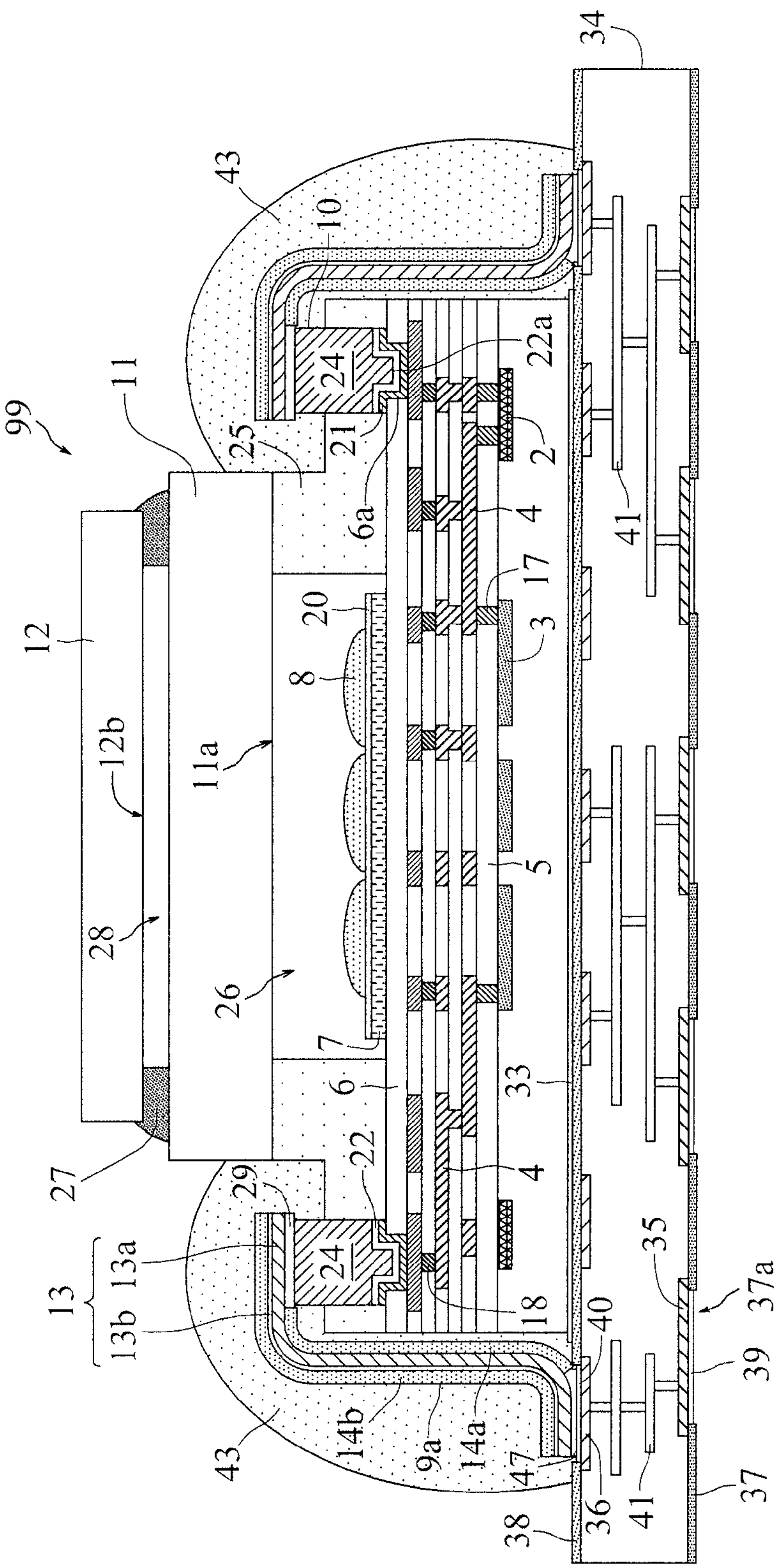

Next, referring to FIG. 4D, an encapsulation material 43 of epoxy or polyimide containing carbon or glass filler can be formed on the flexible substrate 9*a* and at sidewalls of the image or light sensor chip 99, encapsulating the flexible substrate 9*a* and a top portion of the metal layer 24 of the metal pads or bumps 10, by a molding process or a dispensing process.

Figure 4E:
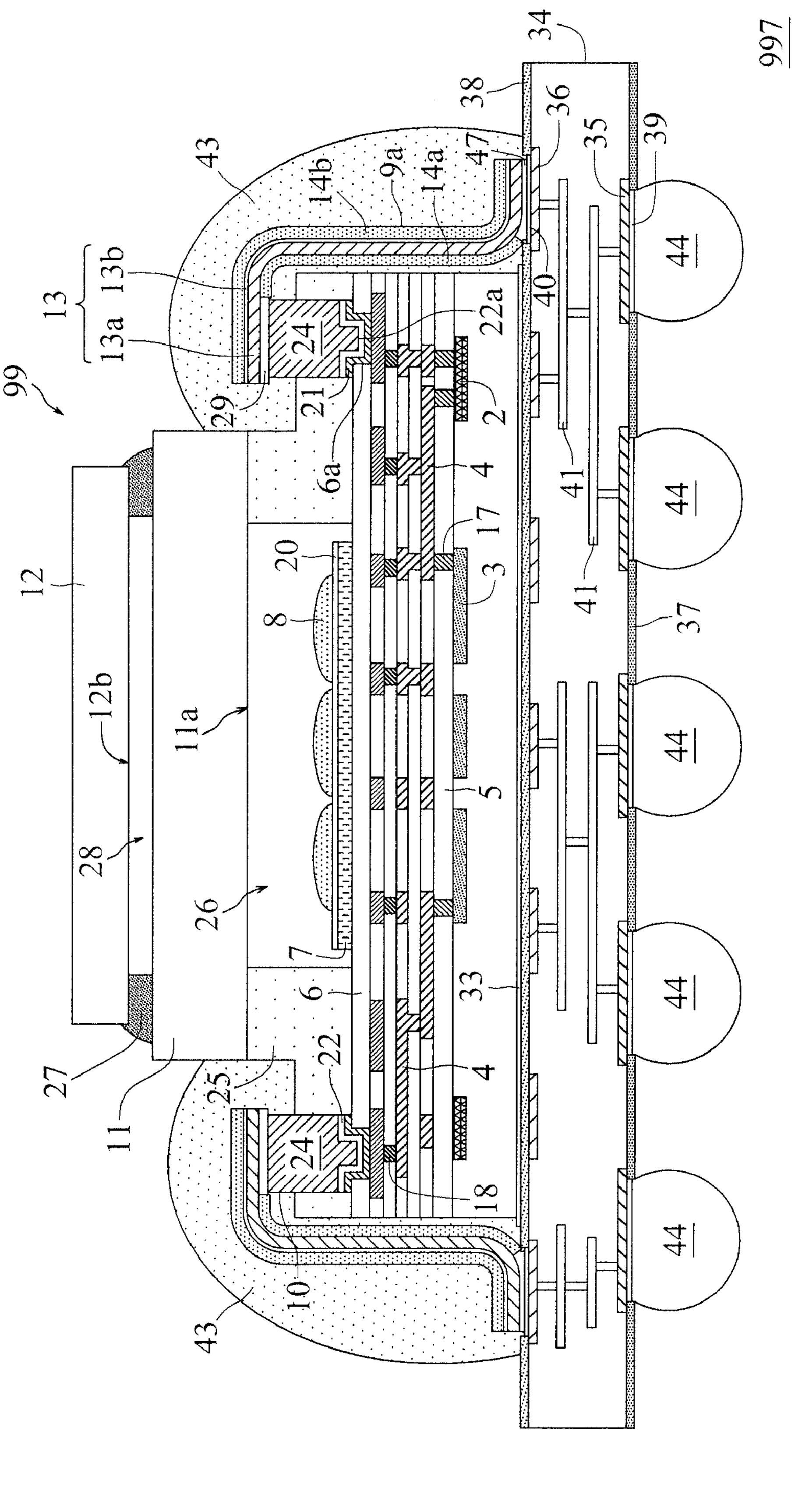

Next, referring to FIG. 4E, the solder balls 44 can be formed on the metal layer 39 of the package substrate 34, and the step shown in FIG. 4E can be referred to as the step illustrated in FIG. 3D. The solder balls 44 can be connected to the flexible substrate 9*a* through the connection traces or pads 35, the copper layers 41 and the metal traces or pads 36. Accordingly, an image or light sensor package 997 can be provided with the package substrate 34, the image or light sensor chip 99 attached to the top surface of the package substrate 34, the flexible substrate 9*a* connecting the metal pads or bumps 10 of the image or light sensor chip 99 to the metal traces or pads 36 of the package substrate 34, and the solder balls 44 formed on the bottom surface of the package substrate 34.

Figure 4F:
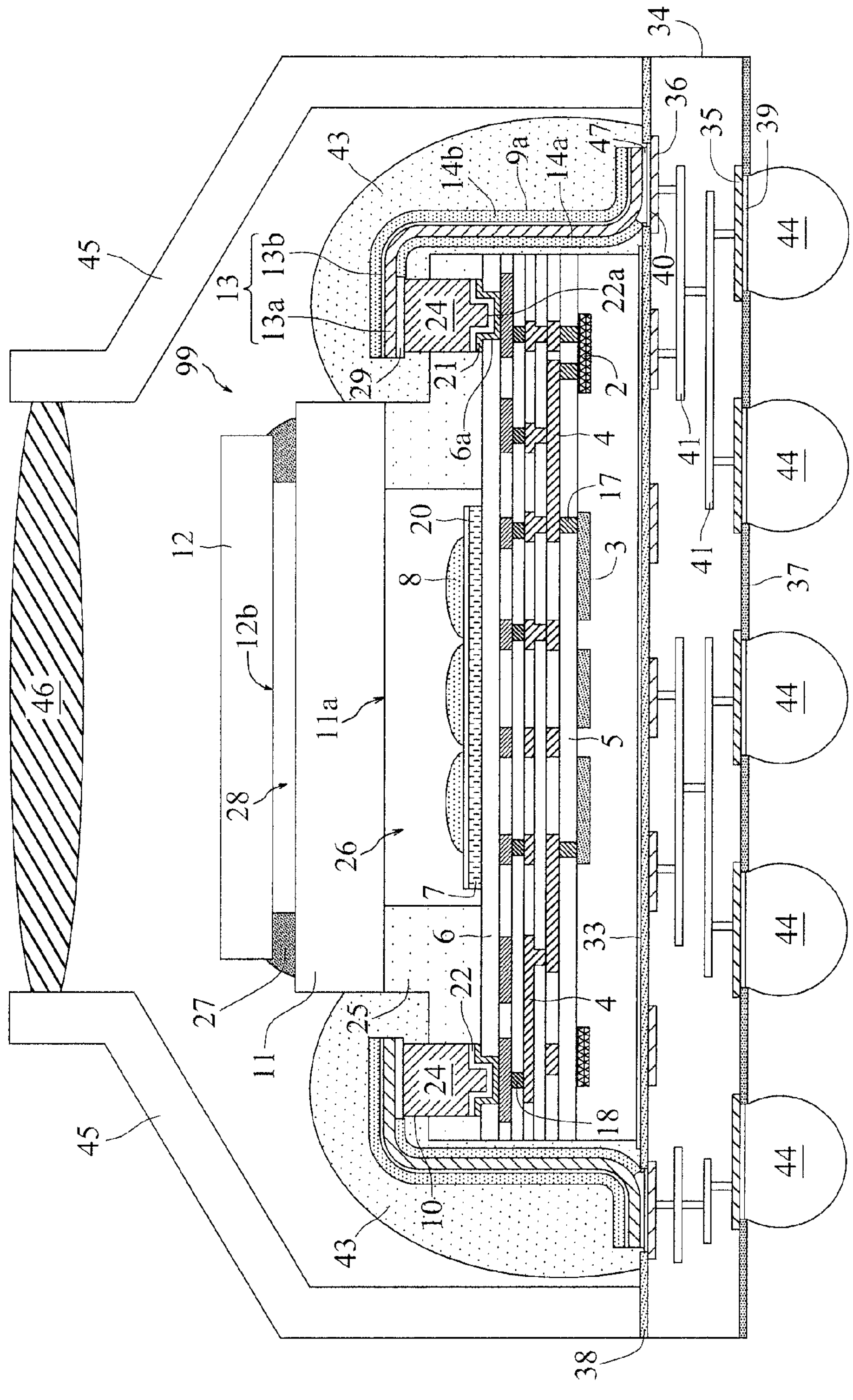
FIGS. 4F and 4G are cross-sectional views depicting image or light sensor modules according to an embodiment of the present disclosure.

Next, referring to FIG. 4F, a lens holder 45, for holding one or more lenses 46, can be attached to the layer 38 of solder mask or solder resist of the package substrate 34 by an adhesive polymer or a metal solder. Therefore, an image or light sensor module can be provided with the package substrate 34, the image or light sensor chip 99 attached to the top surface of the package substrate 34, the flexible substrate 9*a*, encapsulated with the encapsulation material 43, connecting the metal pads or bumps 10 of the image or light sensor chip 99 to the metal traces or pads 36 of the package substrate 34, the solder balls 44 formed on the bottom surface of the package substrate 34, and the lens holder 45 with the set of lens 46 attached to the layer 38 of solder mask or solder resist of the package substrate 34 by the adhesive polymer or metal solder. The set of lens 46 is over the infrared (IR) cut filter 12, the transparent substrate 11, the microlenses 8, the layer 7 of optical or color filter array and the light sensors 3 of the image or light sensor chip 99.

Figure 4G:
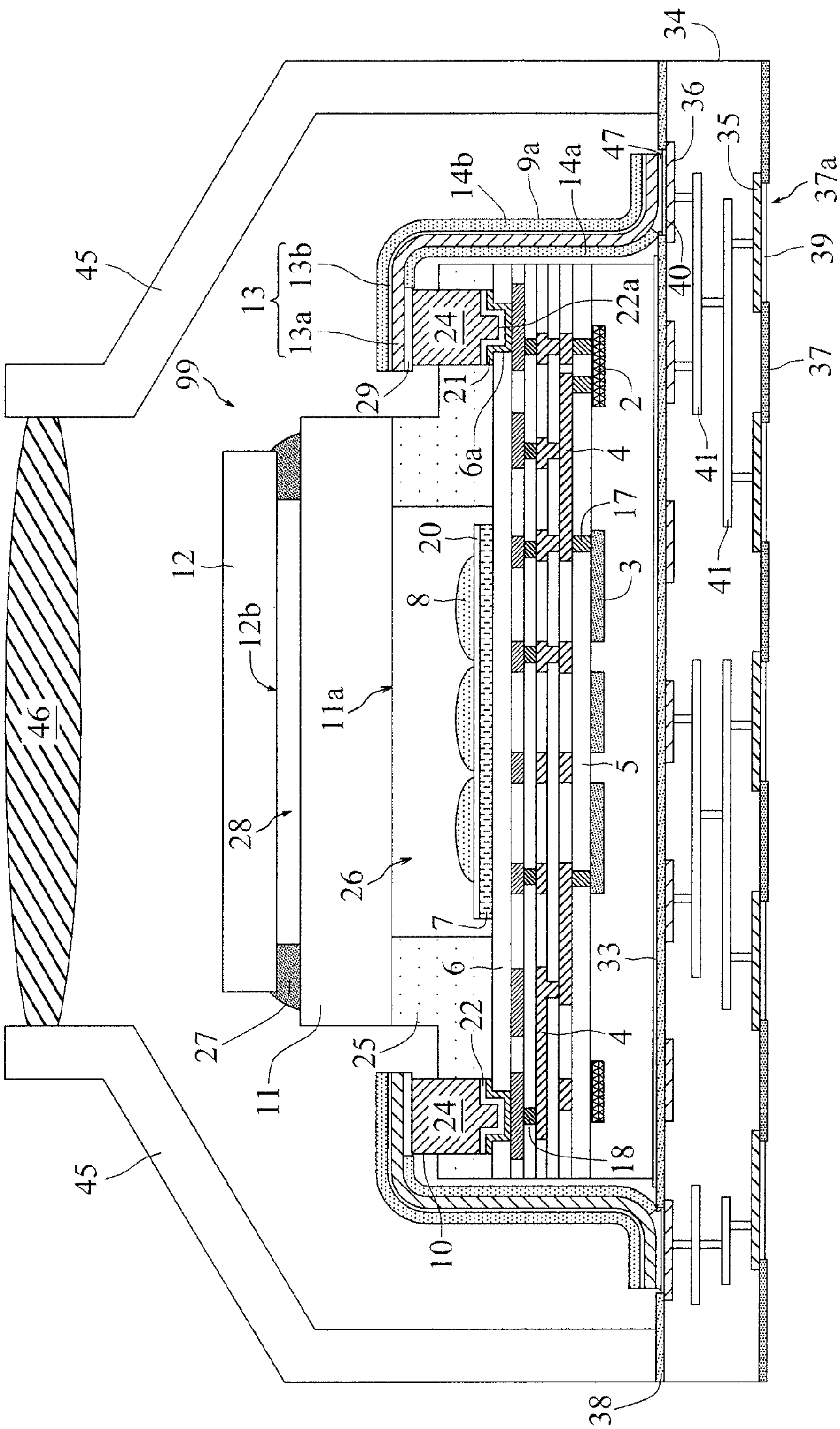

FIG. 4G is a cross sectional view depicting another example of an image or light sensor module, in accordance with the present disclosure. The image or light sensor module shown in FIG. 4G is similar to that shown in FIG. 4F except that there is no encapsulation material enclosing the flexible substrate 9*a*, and there are no solder balls formed on the bottom surface of the package substrate 34. The process flow for forming the image or light sensor module shown in FIG. 4G is similar to that for forming the image or light sensor module shown in FIG. 4F except that there is no step of forming the encapsulation material 43 shown in FIG. 4D and there is no step of forming the solder balls 44 shown in FIG. 4E.

Figure 5A:
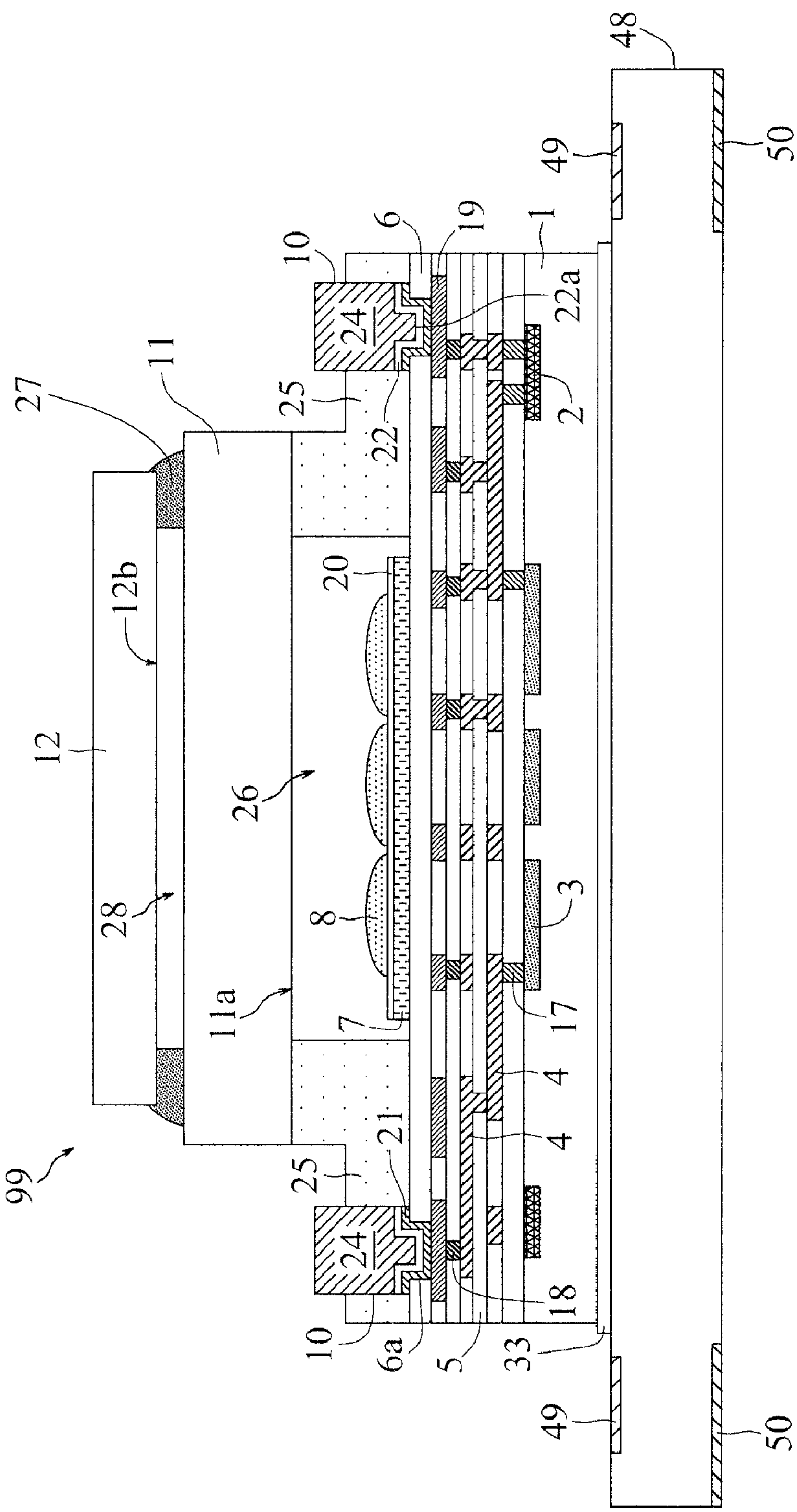
FIGS. 5A-5C are cross-sectional views depicting a process of forming an image or light sensor package according to an embodiment of the present disclosure.
Figure 5B:
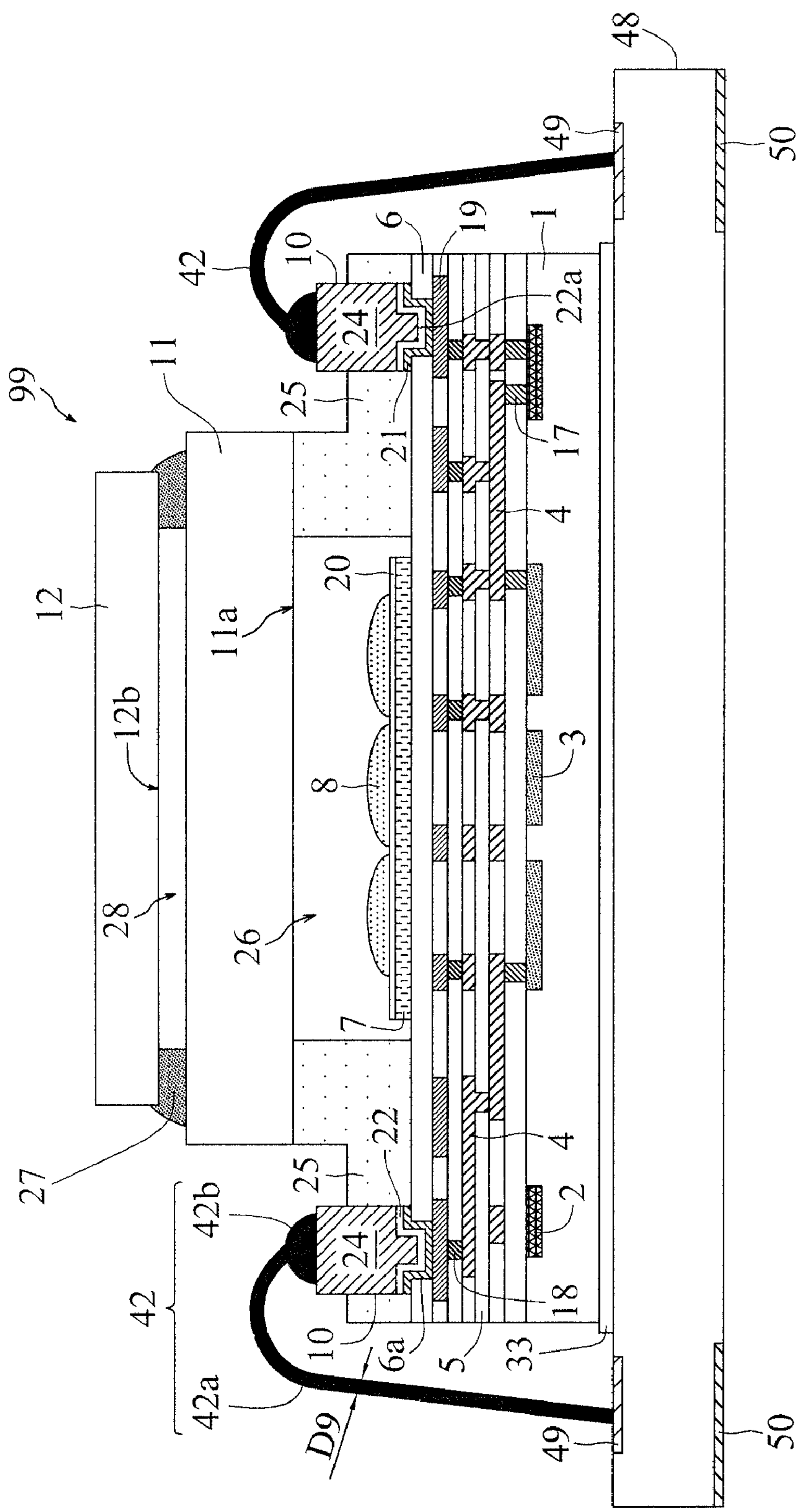
Figure 5C:
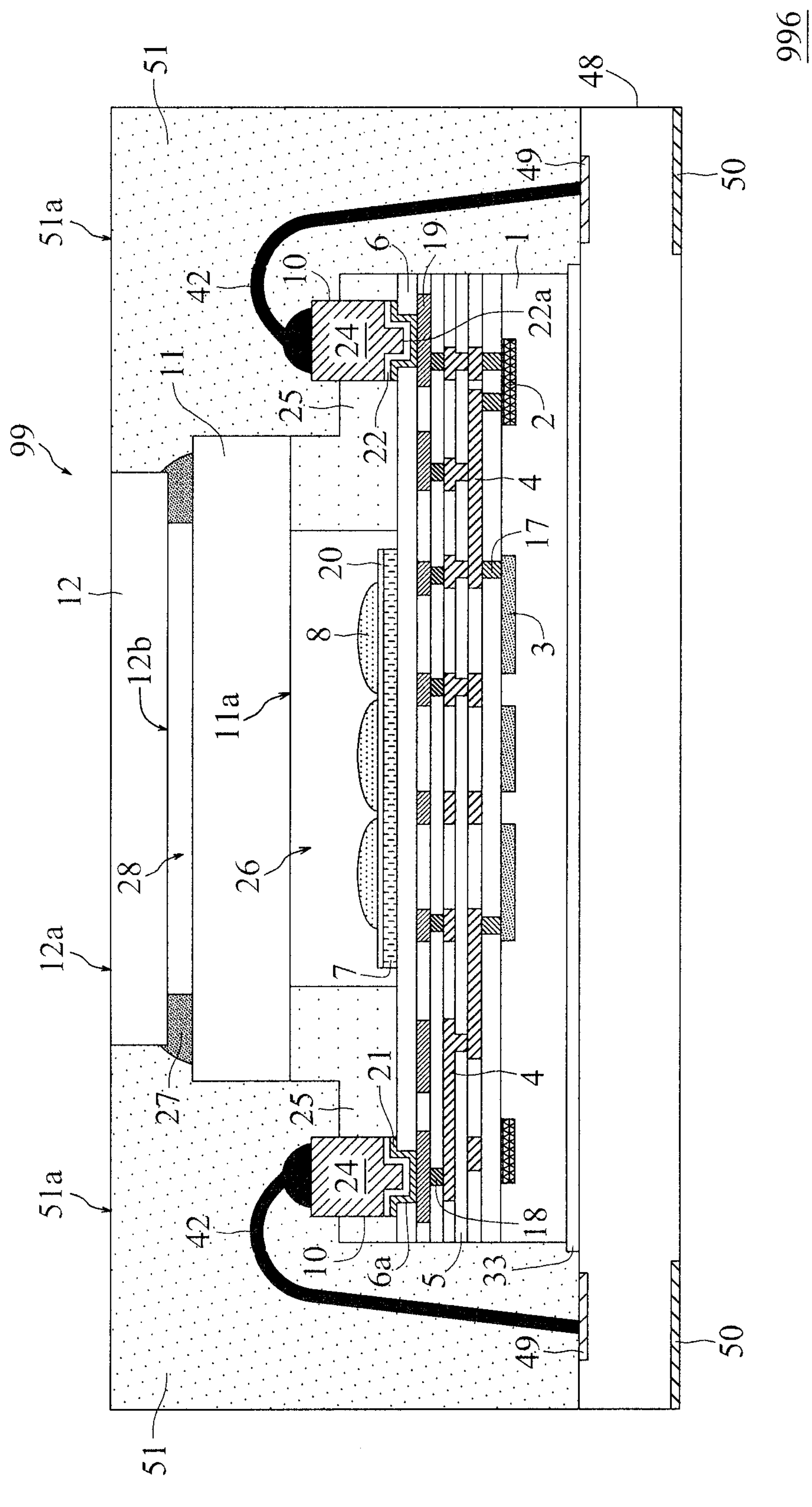

FIGS. 5A-5C show a process for forming an image or light sensor package according to exemplary embodiments of the present disclosure. Referring to FIG. 5A, the image or light sensor chip 99 illustrated in FIG. 1K can be attached to the top surface of a substrate 48 by an adhesive material 33 of silver epoxy, polyimide or acrylic. The substrate 48, such as ceramic substrate or organic substrate, may include multiple metal pads 49 at the top surface of the substrate 48, multiple metal pads 50 at the bottom surface of the substrate 48, and a metallization structure between the top surface and the bottom surface of the substrate 48. The metal pads 49 are connected to the metal pads 50 through the metallization structure of the substrate 48.

Next, referring to FIG. 5B, using a wire-bonding process, one end of each wirebonded wire 42 can be ball bonded with the metal layer 24 of one of the metal pads or bumps 10 of the image or light sensor chip 99, and the other end of each wirebonded wire 42 can be wedge bonded with one of the metal pads 49 of the substrate 48. Accordingly, the metal pads or bumps 10 of the image or light sensor chip 99 can be connected to the metal pads 49 of the substrate 48 through the wirebonded wires 42. The specification of the wirebonded wires 42 ball bonded with the metal layer 24 as shown in FIG. 5B can be referred to as the specification of the wirebonded wires 42 ball bonded with the metal layer 24 as illustrated in FIG. 3B.

Next, referring to FIG. 5C, an encapsulation material 51 of epoxy or polyimide containing carbon or glass filler can be formed on the wirebonded wires 42, on the top surface of the substrate 48 and at sidewalls of the image or light sensor chip 99, encapsulating the wirebonded wires 42 and a top portion of the metal layer 24 of the metal pads or bumps 10, by a molding process. The top surface 12*a* of the infrared (IR) cut filter 12 is not covered with the encapsulation material 51, and the top surface 51*a* of the encapsulation material 51 is substantially coplanar with the top surface 12*a* of the infrared (IR) cut filter 12 of the image or light sensor chip 99.

Accordingly, an image or light sensor package 996 can be provided with the substrate 48, the image or light sensor chips 99 attached to the top surface of the substrate 48 by the adhesive material 33, the wirebonded wires 42 connecting the metal pads or bumps 10 of the image or light sensor chip 99 to the metal pads 49 of the substrate 48, and the encapsulation material 51 formed by a molding process on the top surface of the substrate 48, on the wirebonded wires 42 and at sidewalls of the image or light sensor chip 99, encapsulating the wirebonded wires 42 and a top portion of the metal layer 24 of the metal pads or bumps 10. The image or light sensor package 996 can be connected to an external circuit, such as printed circuit board, ball-grid-array (BGA) substrate, metal substrate, ceramic substrate or glass substrate, through the metal pads 50. If the substrate 48 is a ceramic substrate, the image or light sensor package 996 is a ceramic leadless chip carrier (CLCC) package. If the substrate 48 is an organic substrate, the image or light sensor package 996 is an organic leadless chip carrier (OLCC) package.

Figure 6A:
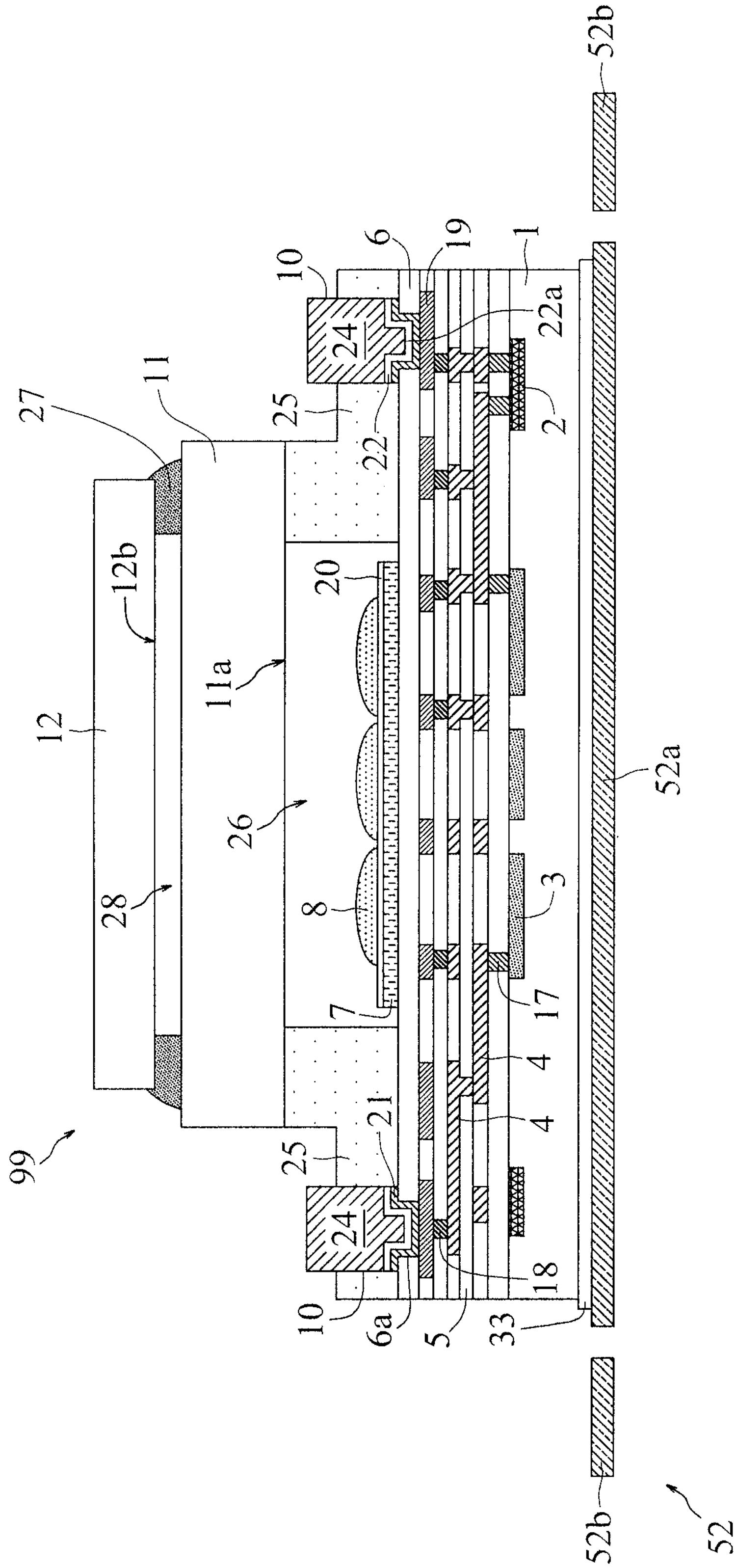
FIGS. 6A-6C are cross-sectional views depicting a process of forming a quad flat no-lead (QFN) package according to an embodiment of the present disclosure.
Figure 6B:
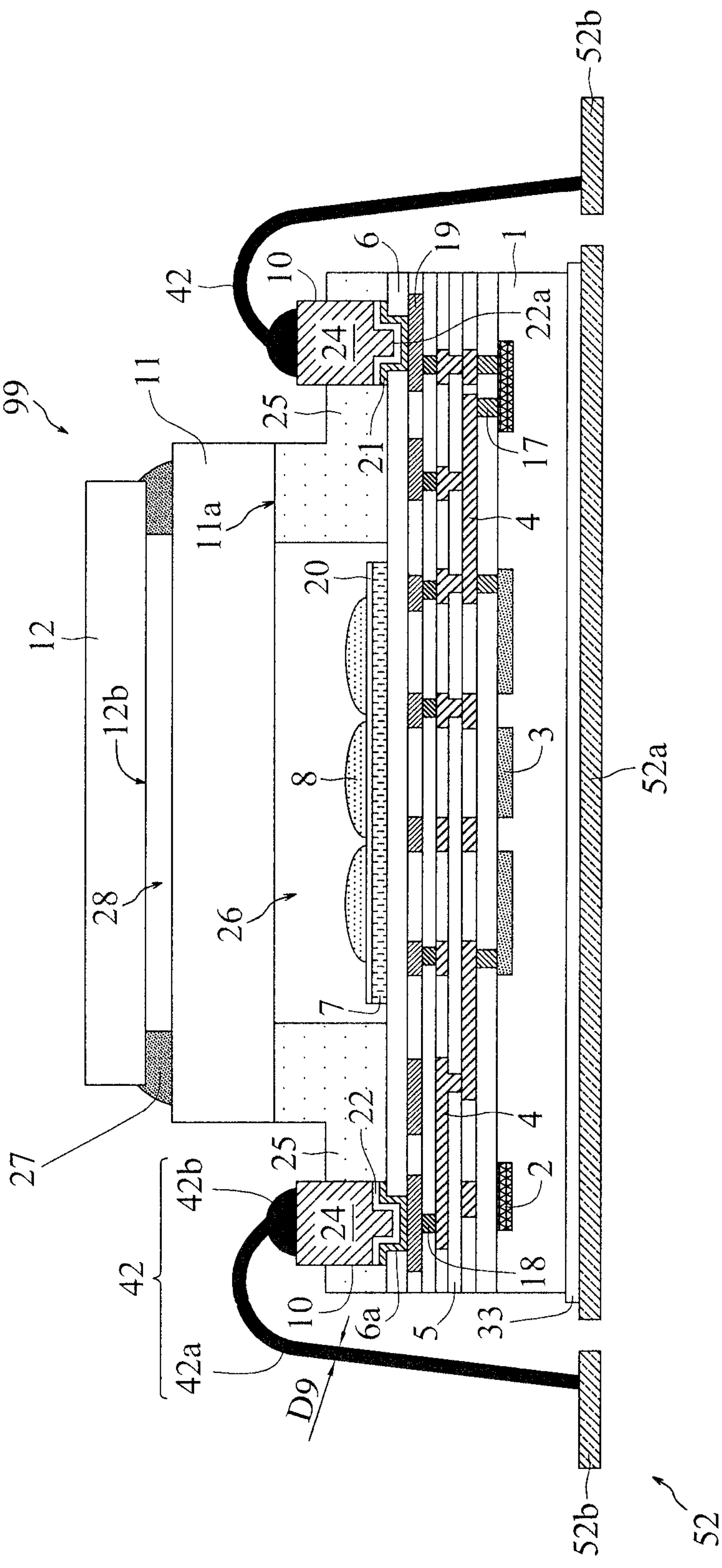
Figure 6C:
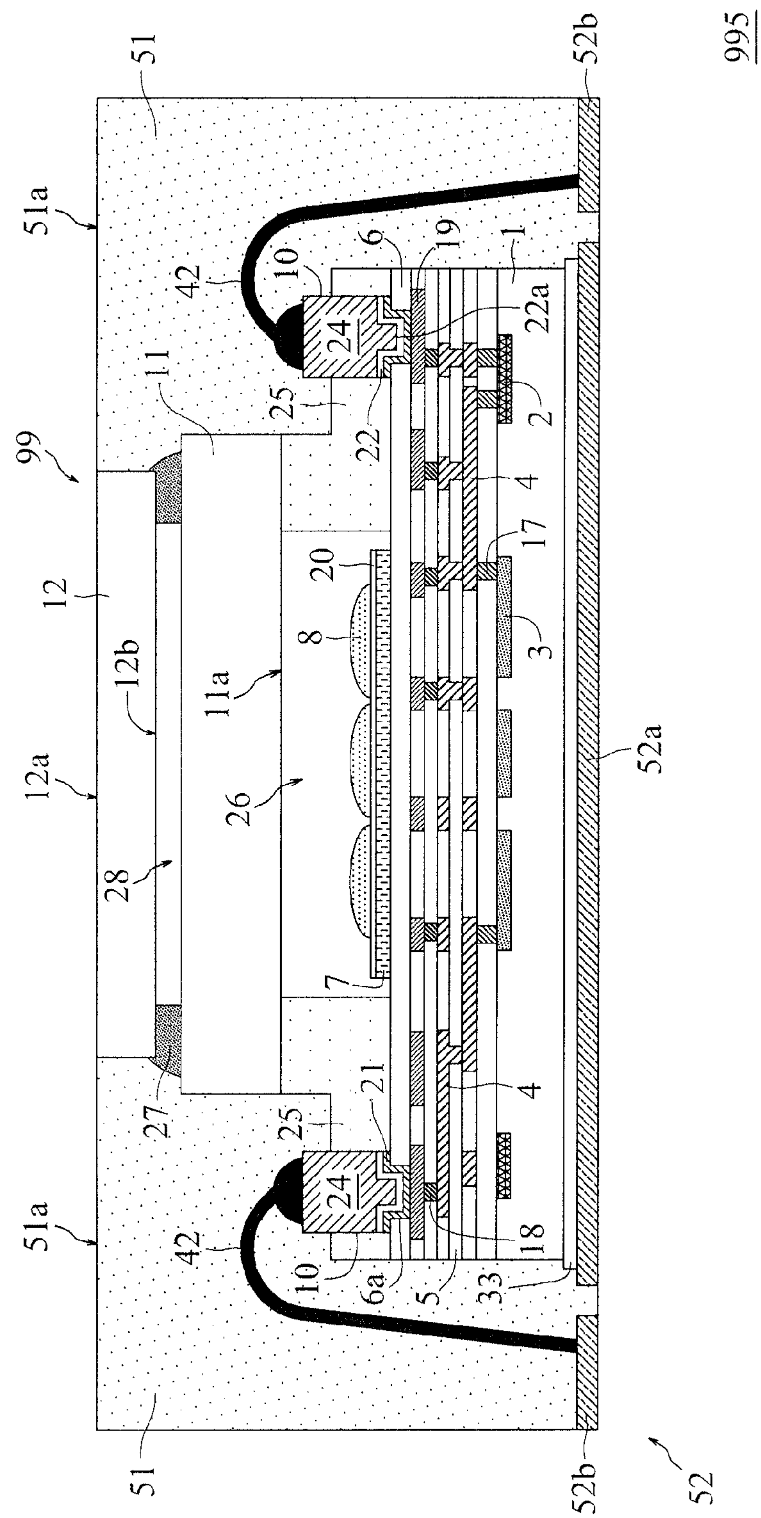

FIGS. 6A-6C show a process for forming a quad flat no-lead (QFN) package according to exemplary embodiments of the present disclosure. Referring to FIG. 6A, the image or light sensor chips 99 illustrated in FIG. 1K can be attached to a die paddle 52*a* of a lead frame 52 by an adhesive material 33 of silver epoxy, polyimide or acrylic. The lead frame 52 has leads 52*b* arranged around the periphery of the die paddle 52*a*, and a gold or silver layer (not shown) may be formed on top surfaces of the leads 52*b*.

Next, referring to FIG. 6B, using a wire-bonding process, one end of each wirebonded wire 42 can be ball bonded with the metal layer 24 of one of the metal pads or bumps 10 of the image or light sensor chip 99, and the other end of each wirebonded wire 42 can be wedge bonded with the gold or silver layer formed on the leads 52*b* of the lead frame 52. Accordingly, the metal pads or bumps 10 of the image or light sensor chip 99 can be connected to the leads 52*b* of the lead frame 52 through the wirebonded wires 42. The specification of the wirebonded wires 42 ball bonded with the metal layer 24 as shown in FIG. 6B can be referred to as the specification of the wirebonded wires 42 ball bonded with the metal layer 24 as illustrated in FIG. 3B.

Next, referring to FIG. 6C, an encapsulation material 51 of suitable composition, e.g., epoxy or polyimide containing carbon or glass filler, can be formed on the lead frame 52, on the wirebonded wires 42 and at sidewalls of the image or light sensor chip 99, encapsulating the wirebonded wires 42 and a top portion of the metal layer 24 of the metal pads or bumps 10, by a molding process. The top surface 12*a* of the infrared (IR) cut filter 12 is not covered with the encapsulation material 51, and the top surface 51*a* of the encapsulation material 51 is coplanar with the top surface 12*a* of the infrared (IR) cut filter 12 of the image or light sensor chip 99.

Accordingly, a quad flat no-lead (QFN) package 995 is provided with the lead frame 52, the image or light sensor chips 99 attached to the die paddle 52*a* of the lead frame 52 by the adhesive material 33, the wirebonded wires 42 connecting the metal pads or bumps 10 of the image or light sensor chip 99 to the leads 52*b* of the lead frame 52, and the encapsulation material 51 formed by a molding process on the lead frame 52, on the wirebonded wires 42 and at sidewalls of the image or light sensor chip 99, encapsulating the wirebonded wires 42 and a top portion of the metal layer 24 of the metal pads or bumps 10. The quad flat no-lead (QFN) package 995 can be connected to an external circuit, such as printed circuit board, ball-grid-array (BGA) substrate, metal substrate, ceramic substrate or glass substrate, through the leads 52*b*.

Figure 7:
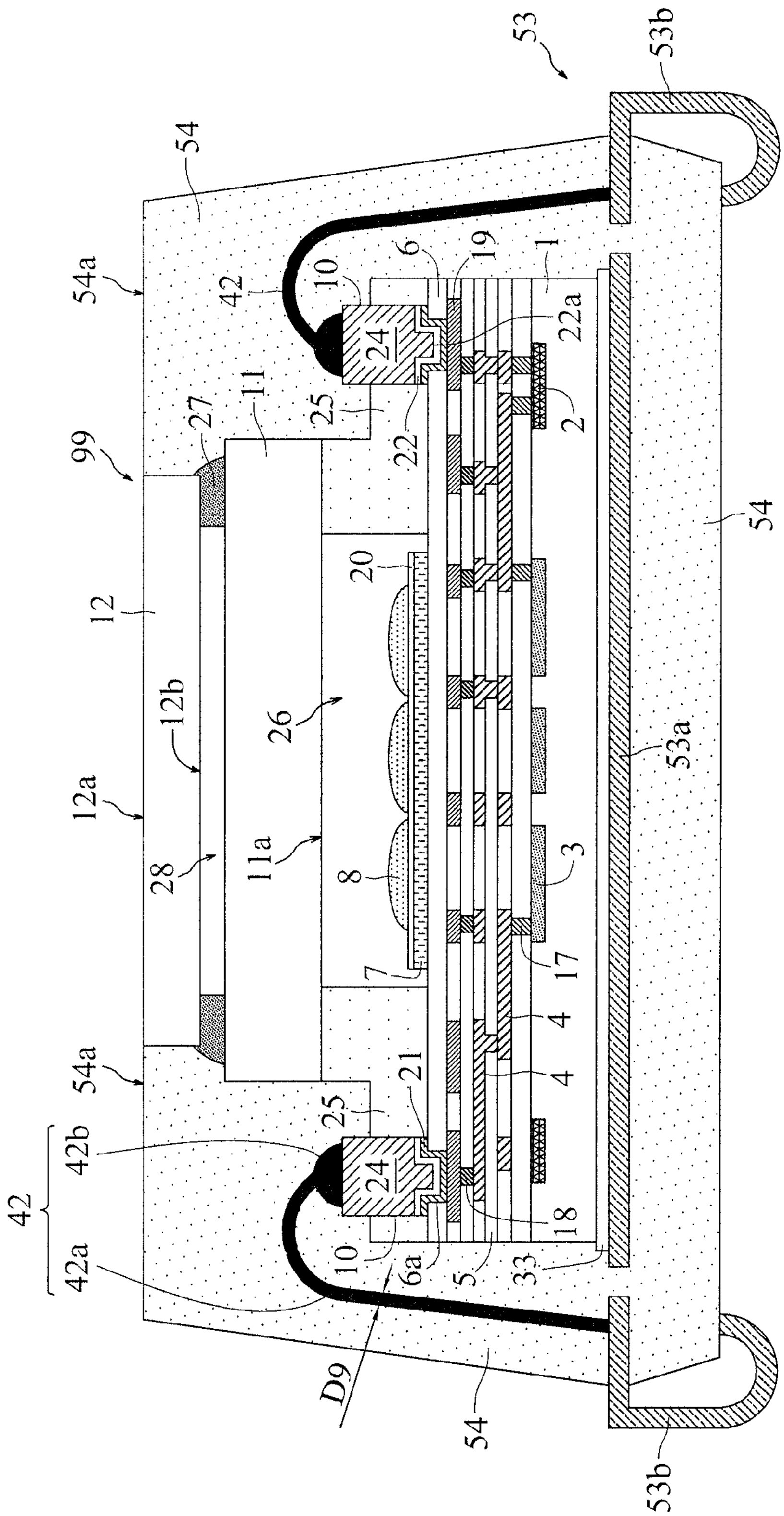
FIG. 7 is a cross-sectional view depicting a plastic leaded chip carrier (PLCC) package according to an embodiment of the present disclosure.

FIG. 7 is a cross sectional view depicting an example of a plastic leaded chip carrier (PLCC) package, in accordance with further embodiments of the present disclosure. The PLCC can be formed with a lead frame 53, the image or light sensor chip 99 illustrated in FIG. 1K attached to a die attach pad 53*a* of the lead frame 53 by an adhesive material 33 of silver epoxy, polyimide or acrylic, the wirebonded wires 42 connecting the metal pads or bumps 10 of the image or light sensor chip 99 to J-shaped leads 53*b* of the lead frame 53, and an encapsulation material 54 formed by a molding process, encapsulating the wirebonded wires 42, a top portion of the metal layer 24 of the metal pads or bumps 10, and inner leads of the J-shaped leads 53*b*, and covering sidewalls of the image or light sensor chip 99 and a bottom surface of the die attach pad 53*a*. The J-shaped leads 53*b* are arranged around the periphery of the die attach pad 53*a*, and have outer leads not covered with the encapsulation material 54. The top surface 12*a* of the infrared (IR) cut filter 12 is not covered with the encapsulation material 54, and the top surface 54*a* of the encapsulation material 54 is substantially coplanar with the top surface 12*a* of the infrared (IR) cut filter 12 of the image or light sensor chip 99. The specification of the wirebonded wires 42 ball bonded with the metal layer 24 as shown in FIG. 7 can be referred to as the specification of the wirebonded wires 42 ball bonded with the metal layer 24 as illustrated in FIG. 3B. The plastic leaded chip carrier (PLCC) package can be connected to an external circuit, such as printed circuit board, ceramic substrate, ball-grid-array (BGA) substrate, metal substrate or glass substrate, through the J-shaped leads 53*b*.

Figure 8A:
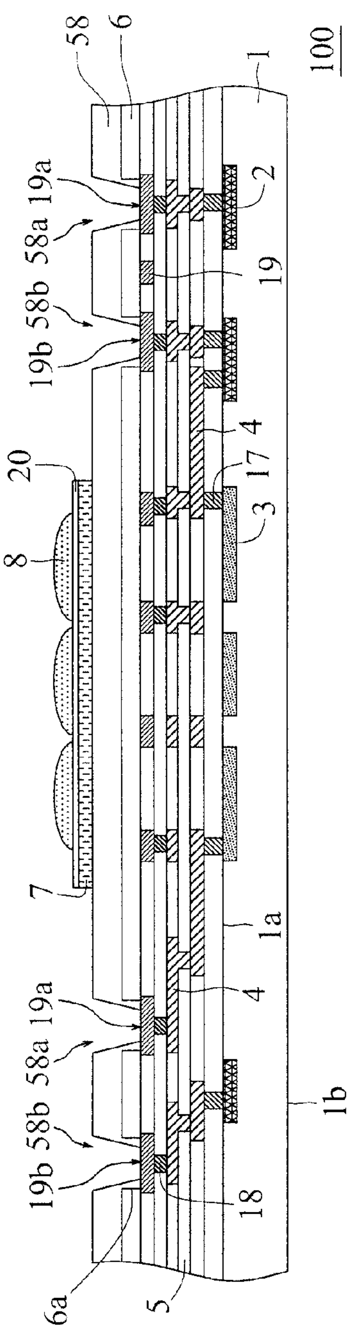
FIGS. 8A-8F are cross-sectional views depicting a process of forming an image or light sensor chip according to an embodiment of the present disclosure.

FIGS. 8A-8F show a process for forming an image or light sensor chip according to further embodiments of the present disclosure. Referring to FIG. 8A, a semiconductor wafer 100 is similar to the semiconductor wafer 100 shown in FIG. 1A except that there is a polymer layer 58 having a thickness between 2 and 30 micrometers formed on the passivation layer 6. Multiple openings 58*a* and 58*b* in the polymer layer 58 are over multiple regions 19*a* and 19*b* of the metal traces or pads 19 exposed by the openings 6*a* in the passivation layer 6 and expose them. The openings 6*a* are over the regions 19*a* and 19*b*, and the regions 19*a* and 19*b* are at bottoms of the openings 6*a*.

After forming the polymer layer 58, a layer 7 of optical or color filter array can be formed on the polymer layer 58, over the light sensors 3 and over the transistors of the light sensors 3, then the buffer layer 20 is formed on the layer 7 of optical or color filter array, and then the microlenses 8 are formed on the buffer layer 20, over the layer 7 of optical or color filter array and over the light sensors 3. An element in FIG. 8A indicated by the same reference number as indicated for a like or similar element in FIG. 1A can have the same material(s) and/or specification as the respective element illustrated in FIG. 1A.

Figure 8B:
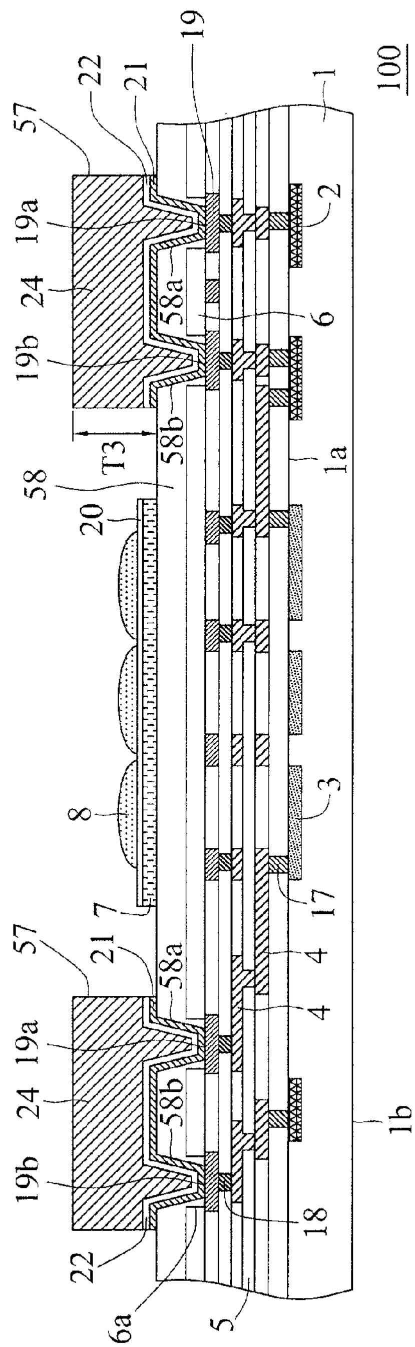

Next, referring to FIG. 8B, multiple structures 57, such as metal pads, metal bumps, metal pillars or metal traces, can be formed on the regions 19*a* and 19*b* exposed by the openings 58*a* and 58*b*, on the polymer layer 58 and in the openings 58*a* and 58*b*. The metal structures 57 may have a thickness T3 between 1 and 15 micrometers, between 5 and 50 micrometers or between 3 and 100 micrometers, and a width between 5 and 100 micrometers, and preferably between 5 and 50 micrometers. The metal structures 57 can be connected to the semiconductor devices 2 and the light sensors 3 through the metal traces or pads 19, the interconnection layers 4 and the via plugs 17 and 18.

The metal structures 57 can be formed by the following steps, which are similar to the steps illustrated in FIGS. 1B-1F. First, the adhesion/barrier layer 21 illustrated in FIG. 1B can be formed on the regions 19*a* and 19*b* of the metal traces or pads 19 exposed by the openings 58*a* and 58*b*, on the polymer layer 58 and on the microlenses 8. Next, the seed layer 22 illustrated in FIG. 1B can be formed on the adhesion/barrier layer 21. Next, the patterned photoresist layer 23 can be formed on the seed layer 22, and multiple openings in the photoresist layer 23 can expose multiple regions of the seed layer 22. Next, the metal layer 24 illustrated in FIG. 1D can be formed on the regions of the seed layer 22 exposed by the openings in the patterned photoresist layer 23. Next, the patterned photoresist layer 23 can be removed. Next, the seed layer 22 not under the metal layer 24 can be removed by using a wet-etching process or a dry-etching process. Next, the adhesion/barrier layer 21 not under the metal layer 24 can be removed by using a wet-etching process or a dry-etching process. Accordingly, each of the metal structures 57 can be composed of the adhesion/barrier layer 21 of any material mentioned in FIG. 1B on the regions 19*a* and 19*b* of the metal traces or pads 19 and on the polymer layer 58, the seed layer 22 of any material mentioned in FIG. 1B on the adhesion/barrier layer 21, and the metal layer 24 of any material mentioned in FIG. 1D on the seed layer 22, where the metal layer 24 has sidewalls not covered by the adhesion/barrier layer 21 and the seed layer 22.

Figure 8C:
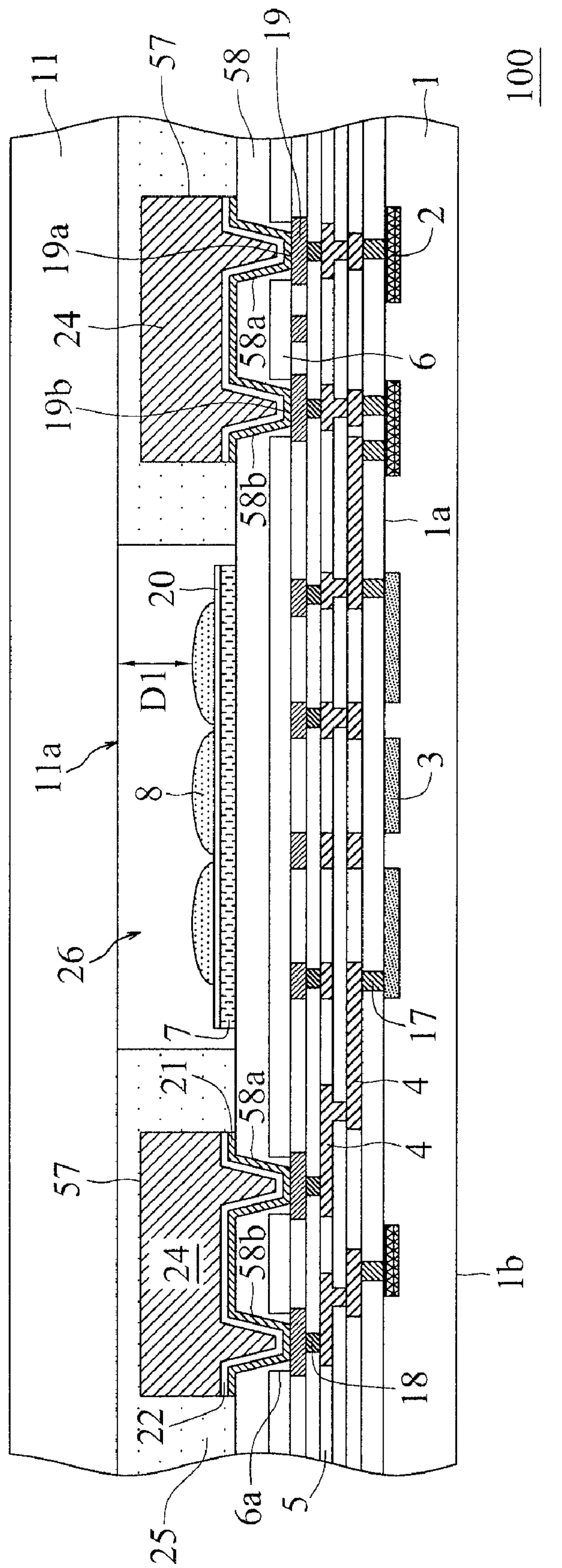

Next, referring to FIG. 8C, a patterned adhesive polymer 25 attaches a transparent substrate 11, such as glass substrate, to the top surface of the semiconductor wafer 100 using a thermal compressing process, e.g., at a temperature between 150° C. and 500° C., and preferably between 180° C. and 250° C. After attaching the transparent substrate 11 to the top surface of the semiconductor wafer 100, a cavity, free space or air space 26 is formed between and enclosed by the patterned adhesive polymer 25, the polymer layer 58 and a bottom surface 11*a* of the transparent substrate 11. An air gap is between a top of one of the microlenses 8 and the bottom surface 11*a* of the transparent substrate 11, and a vertical distance D1 between a top of one of the microlenses 8 and the bottom surface 1*a* of the transparent substrate 11 is between 10 and 300 micrometers, and preferably between 20 and 100 micrometers. The specification of the cavity, free space or air space 26 as shown in FIG. 8C can be referred to as the specification of the cavity, free space or air space 26 as illustrated in FIG. 1H.

Figure 8D:
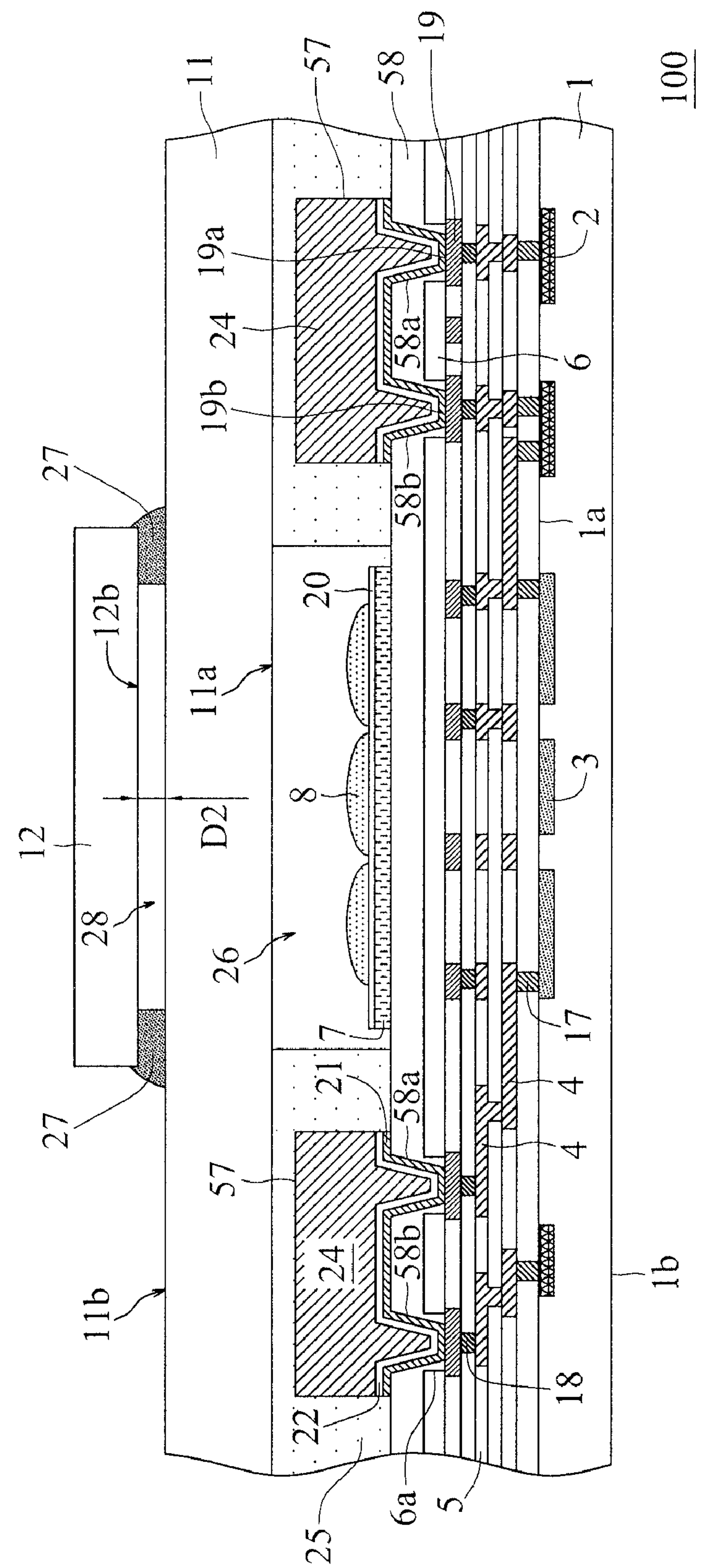

Next, referring to FIG. 8D, the step illustrated in FIG. 1I can be performed to attach the infrared (IR) cut filter 12 to the top surface 11*b* of the transparent substrate 11 by the adhesive material 27. For more detailed description, please refer to the illustration in FIG. 1I.

Figure 8E:
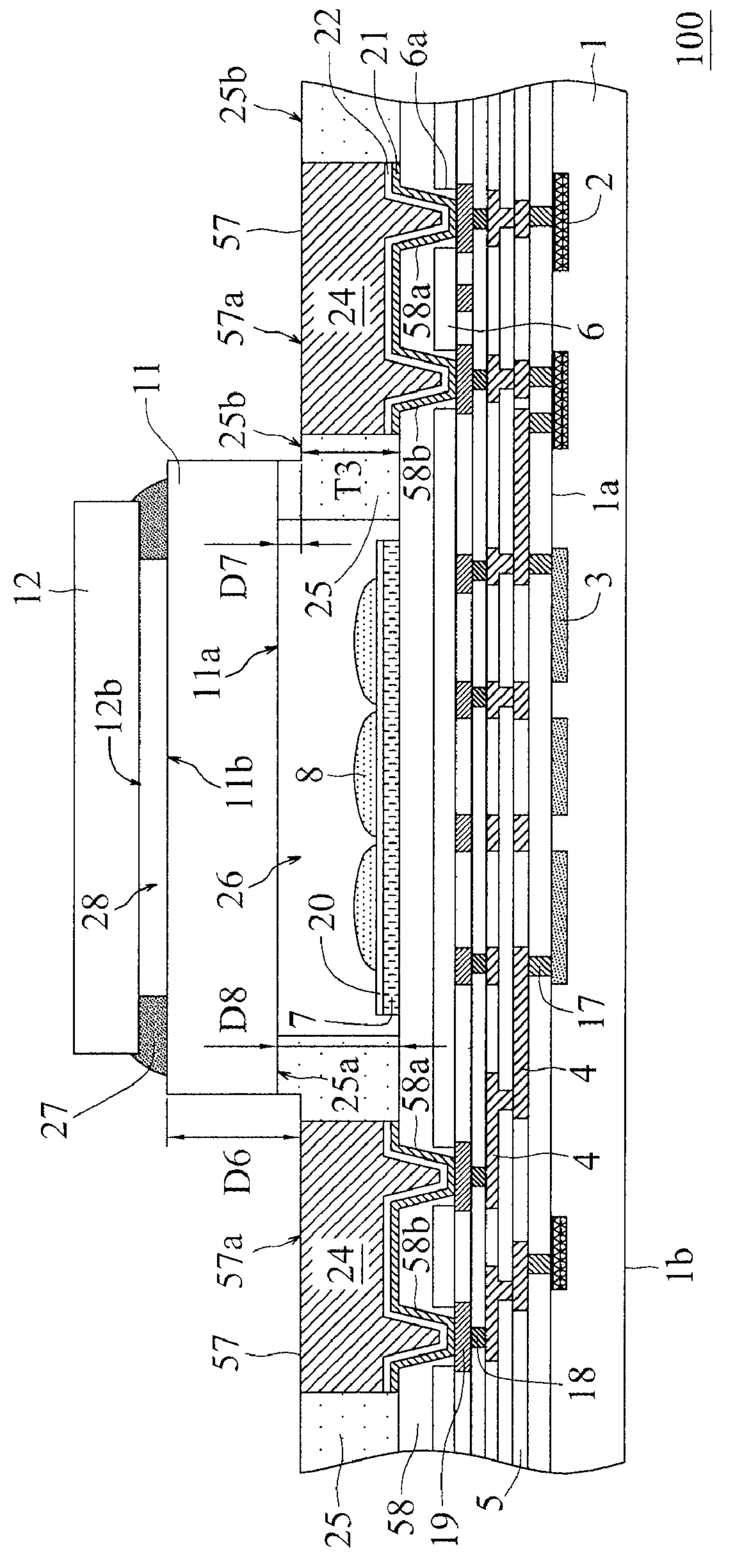

Next, referring to FIG. 8E, a covering material, e.g., blue tape (not shown), can be attached to the bottom surface 1*b* of the semiconductor substrate 1, and then multiple portions of the transparent substrate 11 and the patterned adhesive polymer 25 over the metal structures 57 can be removed by a self-cutting process of a thick sawing blade cutting it with a cutting depth D6 between 200 and 500 micrometers. Accordingly, top surfaces 57*a* of the metal structures 57 are not covered by any of the transparent substrate 11 and the patterned adhesive polymer 25. The patterned adhesive polymer 25 have a first region 25*a* contacting with the bottom surface 11*a* of the transparent substrate 11 and a second region 25*b* uncovered by the transparent substrate 11 and existing substantially coplanar with the top surfaces 57*a* of the metal structures 57, where the first region 25*a* is at a first horizontal level higher than a second horizontal level, at which the second region 25*b* is, and a vertical distance D7 between the first region 25*a* and the second region 25*b* is greater than 5 micrometers, such as between 5 and 50 micrometers or between 50 and 100 micrometers. A vertical distance D8 between the top surface of the polymer layer 58 and the bottom surface 11*a* of the transparent substrate 11 can be between 20 and 150 micrometers, and preferably between 30 and 70 micrometers, and can be greater than the thickness T3 of the metal structures 57.

Figure 8F:
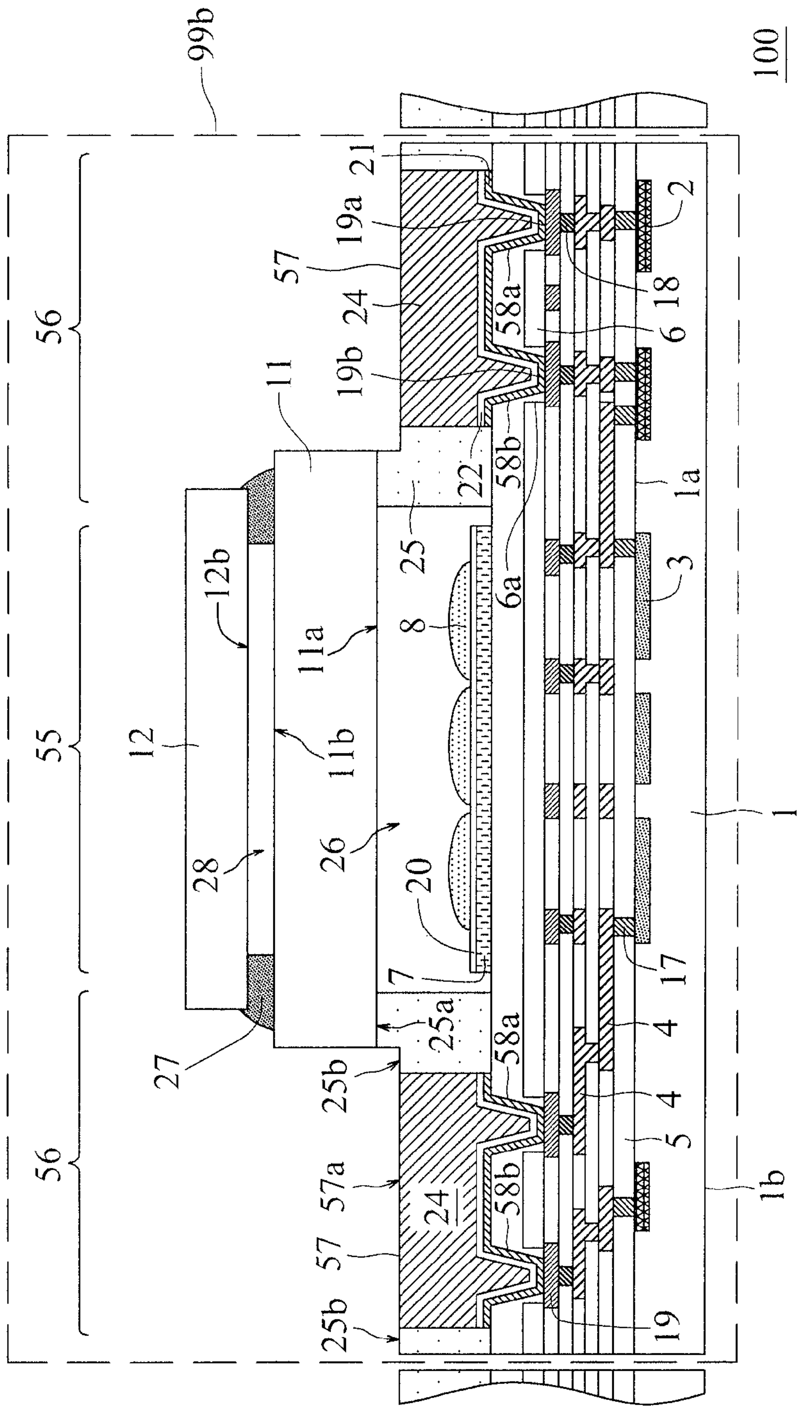

Next, referring to FIG. 8F, a die-sawing process is performed by using a thin sawing blade or a laser cutting process to cut through the semiconductor wafer 100 to form an image or light sensor chip 99*b*. If a thin sawing blade is used to cut through the semiconductor wafer 100 in the die-sawing process, the thick sawing blade used in the self-cutting process may have a width greater than that of the thin sawing blade used in the die-sawing process by more than 150 micrometers, such as between 150 micrometers and 1 millimeter or between 200 and 500 micrometers. After the die-sawing process, the image or light sensor chip 99*b* is detached from the covering material, e.g., blue tape.

The image or light sensor chip 99*b* includes a photosensitive area 55 where there are the light sensors 3, the layer 7 of optical or color filter array over the light sensors 3, the microlenses 8 over the layer 7 of optical or color filter array and over the light sensors 3, the transparent substrate 11 over the microlenses 8, over the layer 7 of optical or color filter array and over the light sensors 3, and the infrared (IR) cut filter 12 over the transparent substrate 11, over the microlenses 8, over the layer 7 of optical or color filter array and over the light sensors 3, and includes a non-photosensitive area 56 where there are the patterned adhesive polymer 25 on the polymer layer 58 and the metal structures 57 in the patterned adhesive polymer 25, on the regions 19*a* and 19*b* of the metal traces or pads 19, on the polymer layer 58 and in the openings 58*a* and 58*b*. The metal structure 57 of the image or light sensor chip 99*b* connect one of the metal traces or pads 19 to another one of the metal traces or pads 19, that is, the region 19*a* of the metal trace or pad 19 can be connected to the region 19*b* of the metal trace or pad 19 through the metal structure 57, where a gap can be between the metal traces or pads 19 can be connected through the metal structure 57.

Alternatively, an oxygen plasma etching process, used to remove a portion of the patterned adhesive polymer 25 not under the transparent substrate 11 to expose upper portions of the metal structures 57, can be performed before or after the die-sawing process, such that the metal structures 57 have a height, extruding from the patterned adhesive polymer 25, e.g., between 0.5 and 20 micrometers, and preferably between 5 and 15 micrometers. Accordingly, the metal structures 57 of the image or light sensor chip 99*b* have the upper portions uncovered by the patterned adhesive polymer 25, and bonded with the bond pads or inner leads 15 of the above-mentioned flexible substrate 9 or 9*a* by a chip-on-film (COF) process or with multiple metal pads of another substrate, such as ball-grid-array (BGA) substrate, printed circuit board, metal substrate, glass substrate or ceramic substrate.

Figure 8G:
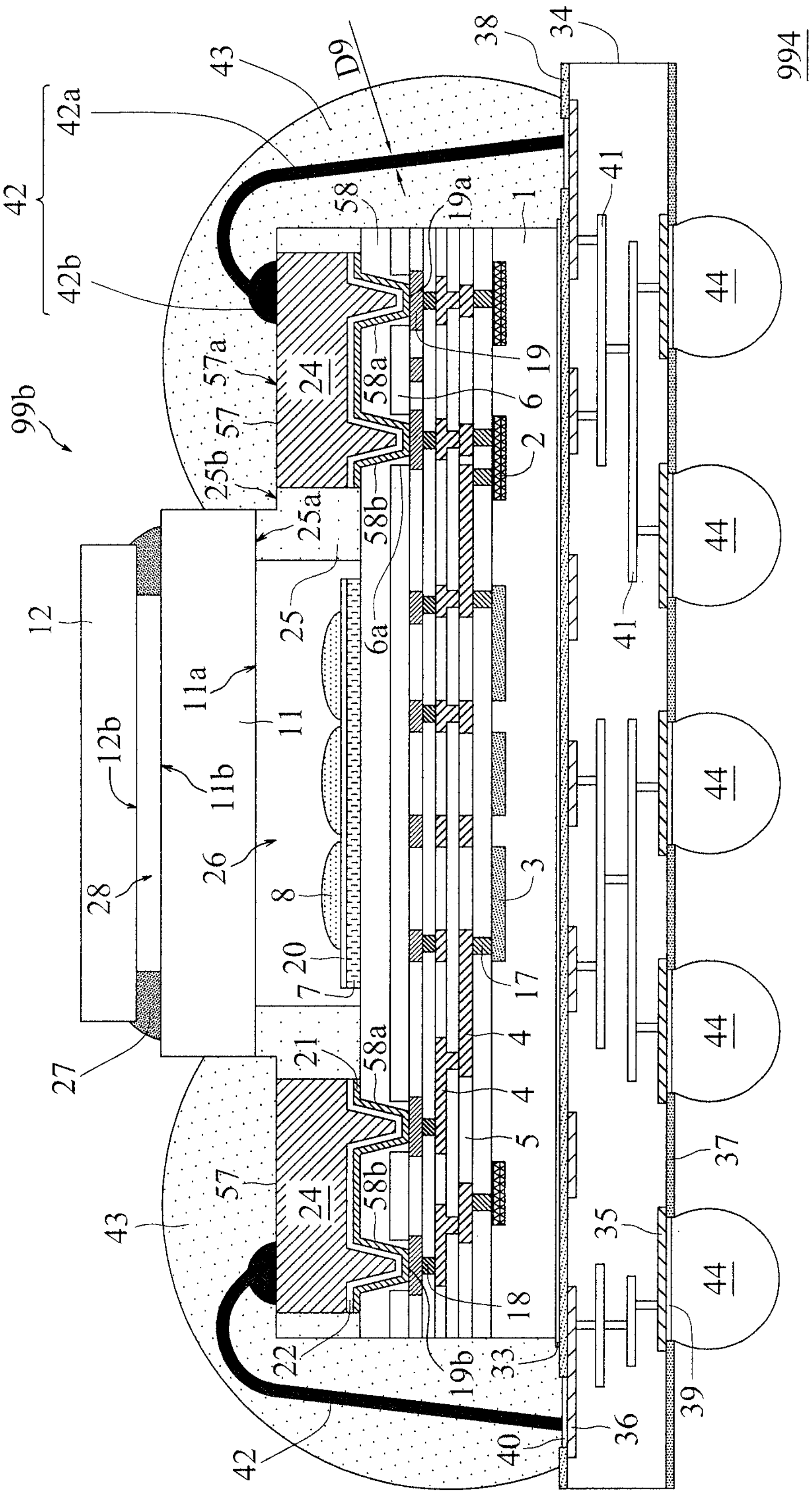
FIGS. 8G and 8H are cross sectional views depicting image or light sensor packages according to an embodiment of the present disclosure.

FIG. 8G is a cross-sectional view depicting an image or light sensor package 994 according to the present disclosure. The image or light sensor chip 99*b* shown in FIG. 8F can be packaged by the steps illustrated in FIGS. 3A-3D to form an image or light sensor package 994. The wirebonded wires 42 can each have one end ball bonded with the metal layer 24 of one of the metal structures 57 of the image or light sensor chip 99*b*, and the other end wedge bonded with the metal layer 40 of the package substrate 34. The specification of the wirebonded wires 42 ball bonded with the metal layer 24 as shown in FIG. 8G can be referred to as the specification of the wirebonded wires 42 ball bonded with the metal layer 24 as illustrated in FIG. 3B. The encapsulation material 43 can be formed on the wirebonded wires 42, on the top surfaces 57*a* of the metal structures 57, on the top surface of the package substrate 34 and at sidewalls of the image or light sensor chip 99*b*, encapsulating the wirebonded wires 42. An element in FIG. 8G indicated by the same reference number as indicated for a like or similar element in FIGS. 3A-3D and 8A-8F can have the same material(s) and/or specification as the respective element illustrated in FIGS. 3A-3D and 8A-8F.

Figure 8H:
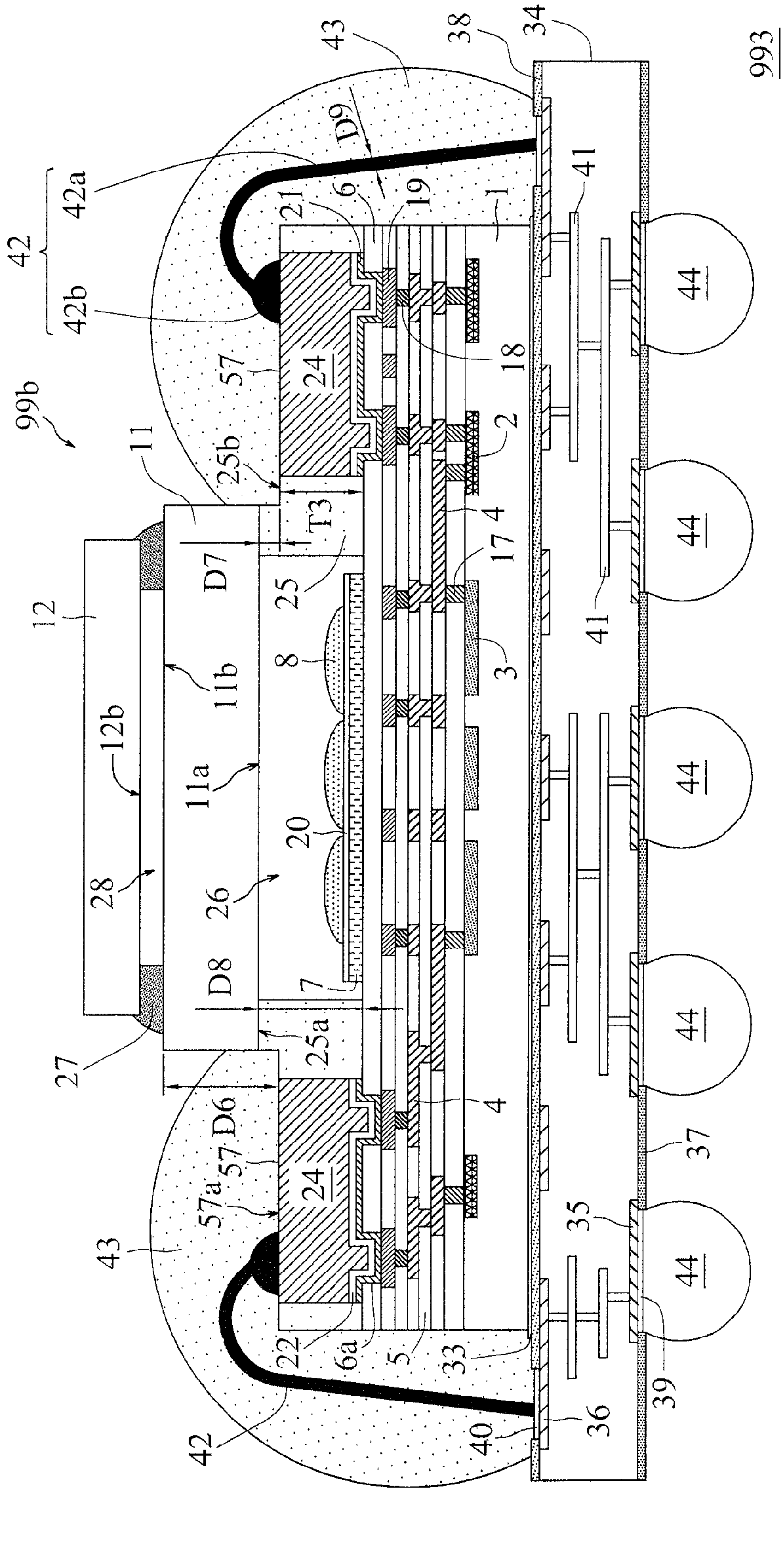

FIG. 8H is a cross sectional view depicting an image or light sensor package 993 that is similar to the image or light sensor package 994 shown in FIG. 8G except that the polymer layer 58 is omitted. An element in FIG. 8H indicated by the same reference number as indicated for a like or similar element in FIGS. 3A-3D and 8A-8F can have or be made of the same material(s) and have the same specification as the respective element illustrated in FIGS. 3A-3D and 8A-8F.

Figure 9A:
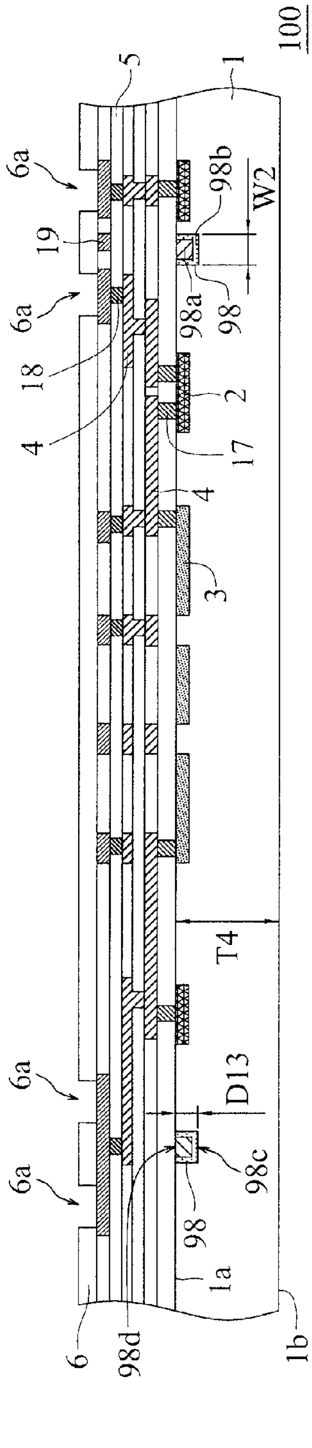
FIGS. 9A-9H are cross-sectional views depicting a process of forming an image or light sensor chip according to an embodiment of the present disclosure.

FIGS. 9A-9H show a process for forming an image or light sensor chip according to further embodiments of the present disclosure. Referring to FIG. 9A, a semiconductor wafer 100 is provided with a semiconductor substrate 1, multiple etching stops 98, multiple semiconductor devices 2, multiple light sensors 3, multiple interconnection layers 4, multiple dielectric layers 5, multiple via plugs 17 and 18, multiple metal traces or pads 19 and a passivation layer 6. Multiple openings 6*a* in the passivation layer 6 are over multiple regions of the metal traces or pads 19 and expose them, and the regions of the metal traces or pads 19 are at bottoms of the openings 6*a*. The semiconductor substrate 1 can be a silicon substrate, a silicon-germanium substrate or a gallium arsenide (GaAs) substrate, and has a thickness T4 between 50 micrometers and 1 millimeter, and preferably between 75 and 250 micrometers. An element in FIG. 9A indicated by the same reference number as indicated for a like or similar element in FIG. 1A can have the same material(s) and/or specification as the respective element illustrated in FIG. 1A.

The etching stops 98 having a width W2, e.g., between 0.05 and 10 micrometers, between 0.1 and 5 micrometers or between 0.1 and 2 micrometers are formed in the semiconductor substrate 1 and have first surfaces 98*c* and second surfaces 98*d* opposite to the first surfaces 98*c*. The second surfaces 98*d* may be substantially coplanar with the top surface 1*a* of the semiconductor substrate 1, and a vertical distance D13 between the first surface 98*c* and the second surface 98*d* can be between, e.g., 1.5 and 5 micrometers, between 1 and 10 micrometers or between 5 and 50 micrometers. The etching stops 98 may include a first layer 98*a* and a second layer 98*b* at a bottom surface and sidewalls of the first layer 98*a*. For example, when the first layer 98*a* may include a layer of silicon oxide or polysilicon having a thickness between, e.g., 1.5 and 5 micrometers, between 1 and 10 micrometers or between 5 and 50 micrometers, the second layer 98*b* may include a nitride layer, such as silicon nitride or silicon oxynitride, having a thickness, e.g., between 0.05 and 2 micrometers or between 1 and 5 micrometers at a bottom surface and sidewalls of the layer of silicon oxide or polysilicon, where the nitride layer 98*b* and the layer 98*a* of silicon oxide or polysilicon can be formed by a chemical vapor deposition (CVD) process. Alternatively, when the first layer 98*a* may include a metal layer of copper, gold or aluminum having a thickness, e.g., between 1.5 and 5 micrometers, between 1 and 10 micrometers or between 5 and 50 micrometers, the second layer 98*b* may include a nitride layer, such as silicon nitride or silicon oxynitride, having a thickness, e.g., between 0.05 and 2 micrometers or between 1 and 5 micrometers at a bottom surface and sidewalls of the metal layer of copper, gold or aluminum, where the metal layer 98*a* of copper, gold or aluminum can be formed by a process including electroplating, electroless plating or sputtering, and the nitride layer 98*b* can be formed by a chemical vapor deposition (CVD) process.

Figure 9B:
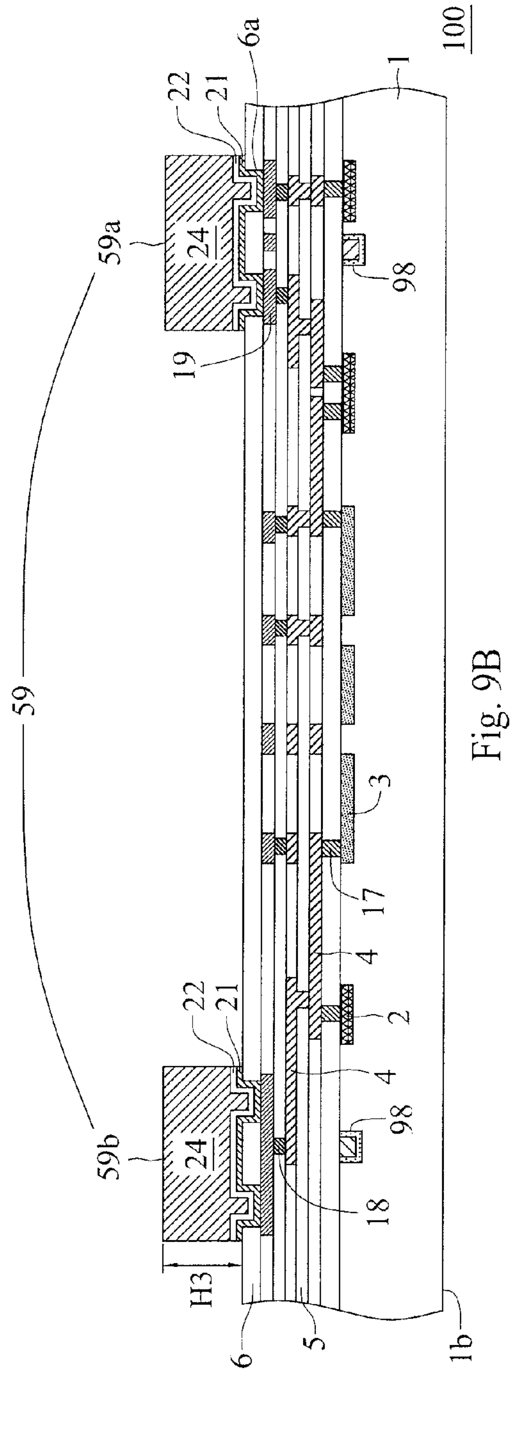

Next, referring to FIG. 9B, multiple metal structures 59 including metal structures 59*a* and 59*b* can be formed on the regions of the metal traces or pads 19 exposed by the openings 6*a* and on the passivation layer 6. The metal structure 59*a* is formed on two metal traces or pads 19 exposed by the openings 6*a* and connects the two metal traces or pads 19, where a gap can be between the metal traces or pads 19 connected through the metal structure 59*a*. The metal structure 59*b* is formed on two regions of one of the metal traces or pads 19 exposed by the openings 6*a*. The metal structures 59 including the metal structures 59*a* and 59*b* can be metal pads, metal bumps, metal pillars or metal traces, and may have a height or thickness H3, e.g., between 1 and 15 micrometers, between 5 and 50 micrometers or between 3 and 100 micrometers. The metal structures 59 can be connected to the semiconductor devices 2 and the light sensors 3 through the metal traces or pads 19, the via plugs 17 and 18 and the interconnection layers 4.

The metal structures 59 including the metal structures 59*a* and 59*b* can be formed by the following steps, which are similar to the steps illustrated in FIGS. 1B-1F. First, the adhesion/barrier layer 21 illustrated in FIG. 1B can be formed on the regions of the metal traces or pads 19 exposed by the openings 6*a* and on the passivation layer 6. Next, the seed layer 22 illustrated in FIG. 1B can be formed on the adhesion/barrier layer 21. Next, the patterned photoresist layer 23 can be formed on the seed layer 22, and multiple openings in the photoresist layer 23 can expose multiple regions of the seed layer 22. Next, the metal layer 24 illustrated in FIG. 1D can be formed on the regions of the seed layer 22 exposed by the openings in the patterned photoresist layer 23. Next, the patterned photoresist layer 23 can be removed. Next, the seed layer 22 not under the metal layer 24 can be removed by using a wet-etching process or a dry-etching process. Next, the adhesion/barrier layer 21 not under the metal layer 24 can be removed by using a wet-etching process or a dry-etching process. An element in FIG. 9B indicated by the same reference number as indicated in FIGS. 1B-1F can have or be made of the same material(s) and/or have the same specification as the respective element illustrated in FIGS. 1B-1F.

Figure 9C:
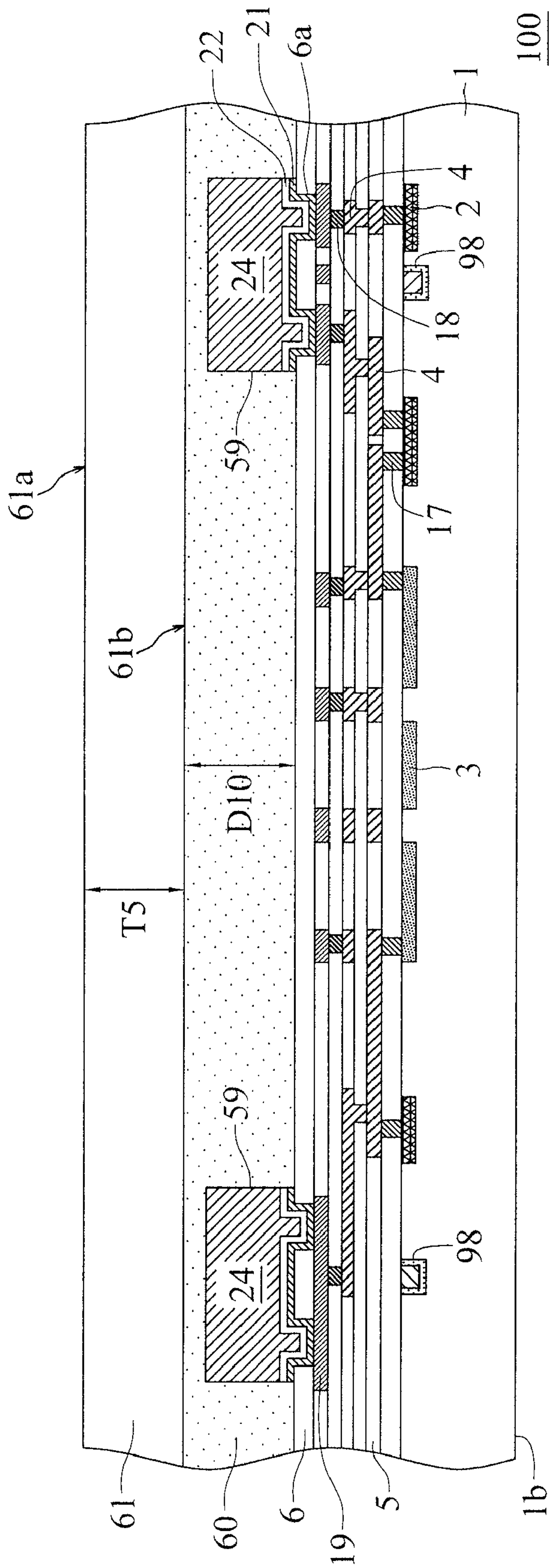

Next, referring to FIG. 9C, an adhesive polymer 60 attaches a substrate 61 to the top surface of the semiconductor wafer 100 using a thermal compressing process at a temperature between 150° C. and 500° C., and preferably between 180° C. and 250° C. The metal structures 59 are enclosed by the adhesive polymer 60, and the adhesive polymer 60 contacts with sidewalls of the metal structures 59. The material of the adhesive polymer 60 includes epoxy, polyimide, SU-8 or acrylic. The substrate 61 has a top surface 61*a* and a bottom surface 61*b*, and a vertical distance D10 between the top surface of the passivation layer 6 and the bottom surface 61*b* is between, e.g., 5 and 300 micrometers, and preferably between 10 and 50 micrometers. The substrate 61 can be a silicon substrate, a polymer-containing substrate, a glass substrate, a ceramic substrate or a metal substrate including copper or aluminum, where the polymer-containing substrate may include, e.g., acrylic. The substrate 61 has a thickness T5 between, e.g., 50 micrometers and 1 millimeter, between 100 and 500 micrometers or between 100 and 300 micrometers.

Figure 9D:
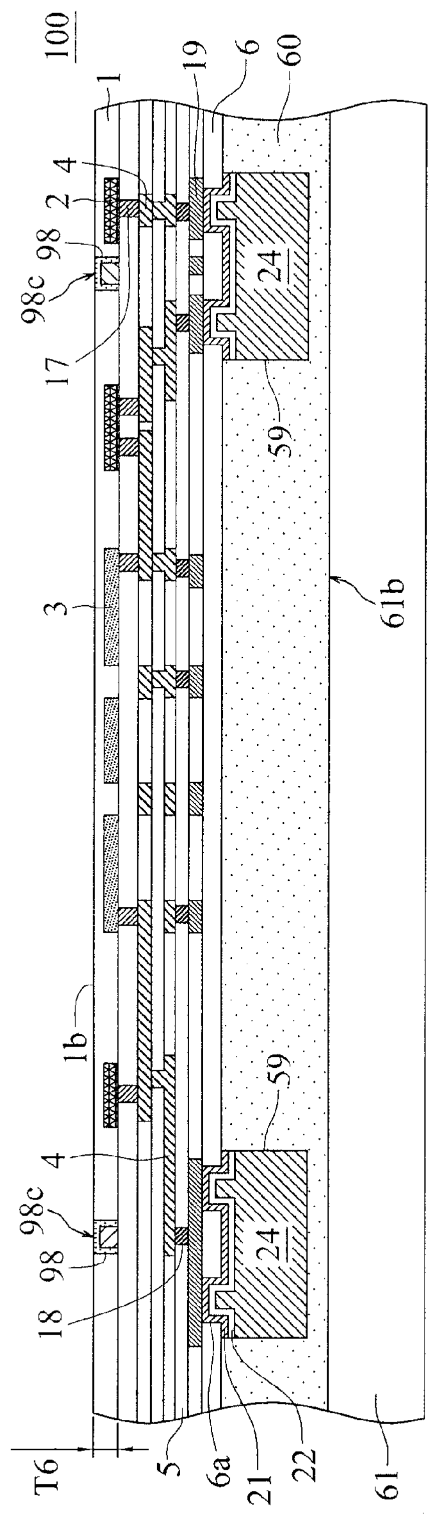

Next, referring to FIG. 9D, the semiconductor wafer 100 is flipped over, and then the semiconductor substrate 1 is thinned to expose the first surfaces 98*c* of the etching stops 98 by grinding or chemical mechanical polishing (CMP) the bottom surface 1*b* of the semiconductor substrate 1. Accordingly, the thinned semiconductor substrate 1 has a thickness T6 between, e.g., 1.5 and 5 micrometers, between 1 and 10 micrometers or between 3 and 50 micrometers, and the first surfaces 98*c* of the etching stops 98 are substantially coplanar with the bottom surface 1*b* of the thinned semiconductor substrate 1. Alternatively, the above-mentioned step of flipping over the semiconductor wafer 100 can be moved after the above-mentioned step of thinning the semiconductor substrate 1, to perform the following processes.

Figure 9E:
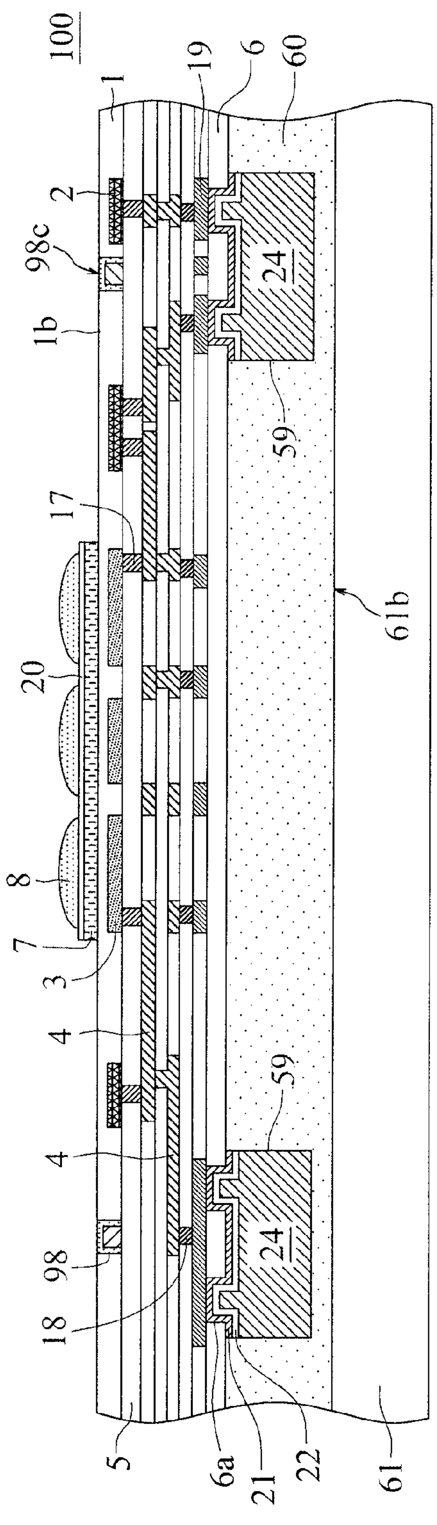

Next, referring to FIG. 9E, a layer 7 of optical or color filter array can be formed on the bottom surface 1*b* of the thinned semiconductor substrate 1, over the light sensors 3 and over the transistors of the light sensors 3, then a buffer layer 20 can be formed on the layer 7 of optical or color filter array, and then multiple microlenses 8 can be formed on the buffer layer 20, over the layer 7 of optical or color filter array and over the light sensors 3. The specification of the layer 7 of optical or color filter array, the buffer layer 20 and the microlenses 8 as shown in FIG. 9E can be referred to as the specification of the layer 7 of optical or color filter array, the buffer layer 20 and the microlenses 8 as illustrated in FIG. 1A.

Figure 9F:
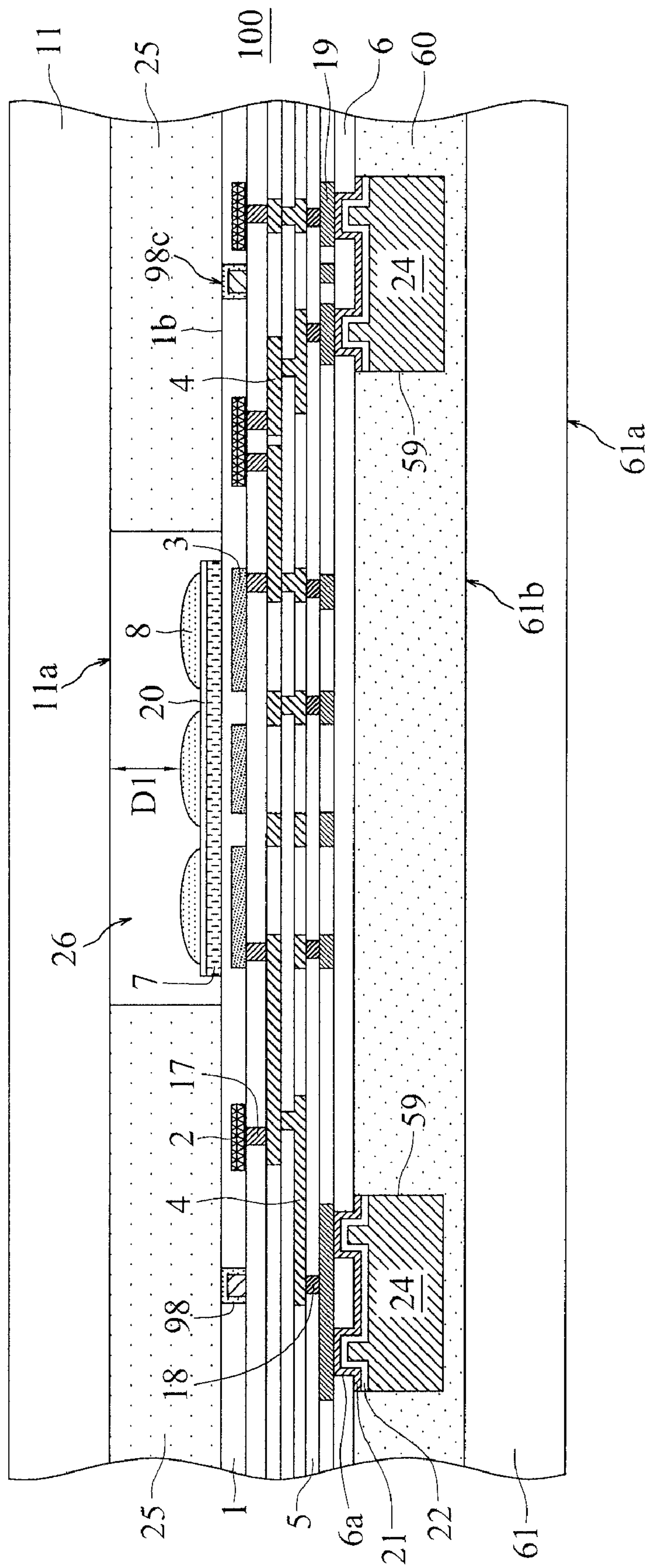

Next, referring to FIG. 9F, a patterned adhesive polymer 25 attaches a transparent substrate 11 to the bottom surface 1*b* of the thinned semiconductor substrate 1 using a thermal compressing process at a temperature between 150° C. and 500° C., and preferably between 180° C. and 250° C. After attaching the transparent substrate 11 to the bottom surface 1*b* of the thinned semiconductor substrate 1, a cavity, free space or air space 26 is formed between and enclosed by the patterned adhesive polymer 25, the bottom surface 1*b* of the thinned semiconductor substrate 1 and a bottom surface 11*a* of the transparent substrate 11. An air gap is between a top of one of the microlenses 8 and the bottom surface 11*a* of the transparent substrate 11, and a vertical distance D1 between a top of one of the microlenses 8 and the bottom surface 11*a* of the transparent substrate 11 is between 10 and 300 micrometers, and preferably between 20 and 100 micrometers. The specification of the cavity, free space or air space 26 as shown in FIG. 9F can be referred to as the specification of the cavity, free space or air space 26 as illustrated in FIG. 1H.

Figure 9G:
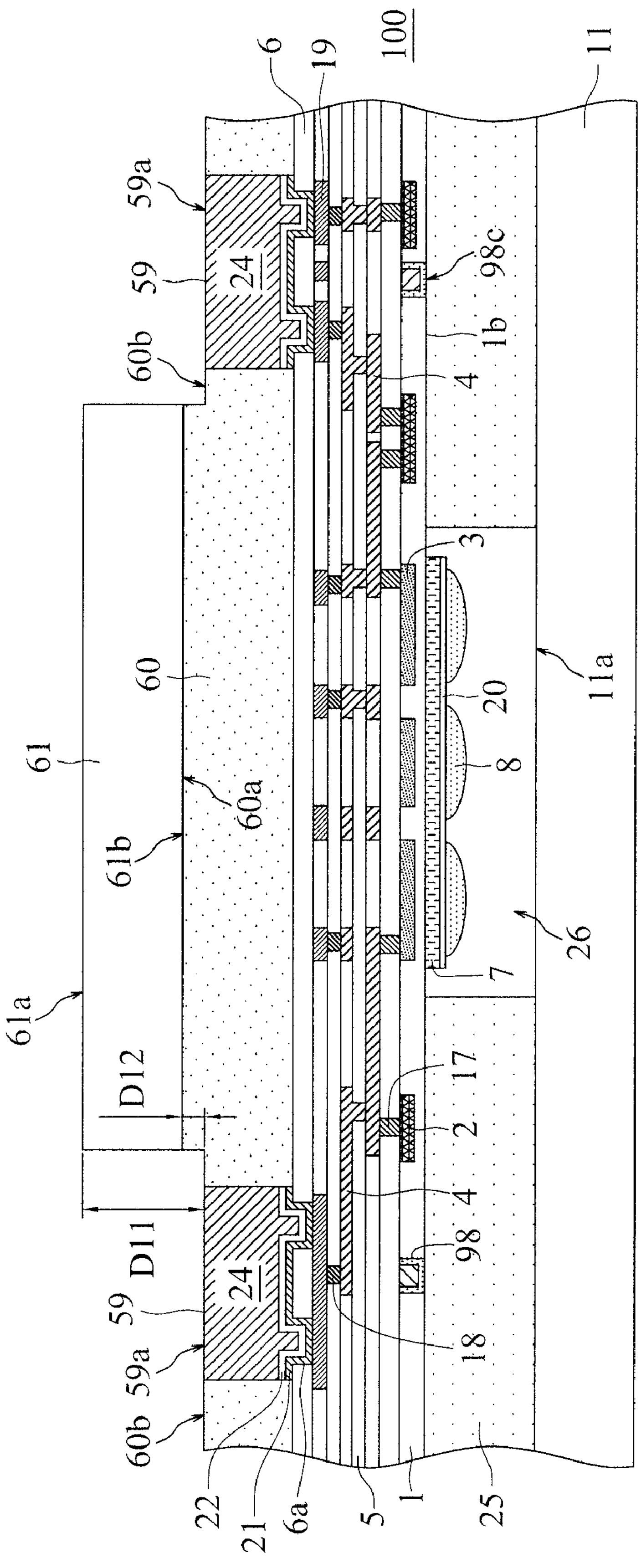

Referring to FIG. 9G, after the step illustrated in FIG. 9F, the semiconductor wafer 100 is flipped over, then a covering material, e.g., blue tape (not shown), can be attached to the transparent substrate 11, and then multiple portions of the substrate 61 and the adhesive polymer 60 over the metal structures 59 are removed, e.g., by a self-cutting process of a thick sawing blade cutting it with a cutting depth D11 between 200 and 500 micrometers. Accordingly, top surfaces 59*a* of the metal structures 59 are not covered by any of the substrate 61 (shown with top and bottom surfaces 61*a* and 61*b*, respectively) and the adhesive polymer 60. The adhesive polymer 60 has a first region 60*a* contacting with the bottom surface 61*b* of the substrate 61 and a second region 60*b* uncovered by the substrate 61 and existing substantially coplanar with the top surfaces 59*a* of the metal structures 59, where the first region 60*a* is at a first horizontal level higher than a second horizontal level, at which the second region 60*b* is, and a vertical distance D12 between the first region 60*a* and the second region 60*b* is, e.g., greater than 5 micrometers, such as between 5 and 50 micrometers or between 50 and 100 micrometers.

Figure 9H:
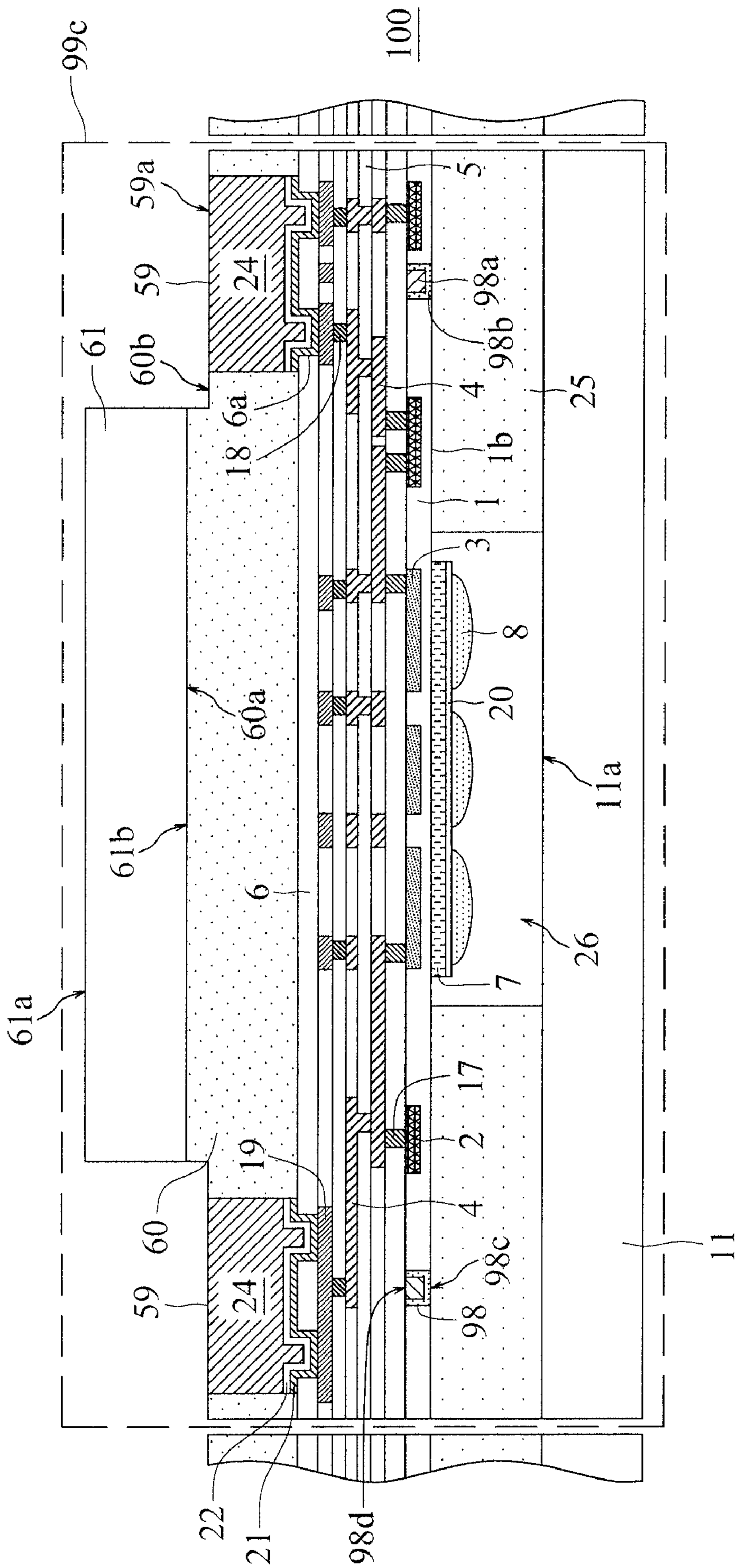

Next, referring to FIG. 9H, a die-sawing/cutting process can be performed, e.g., by using a thin sawing blade or a laser cutting process to cut through the semiconductor wafer 100 to form an image or light sensor chip 99*c*. If a thin sawing blade is used to cut through the semiconductor wafer 100 in the die-sawing process, the thick sawing blade used in the step illustrated in FIG. 9G may have a width greater than that of the thin sawing blade used in the die-sawing process by more than 150 micrometers, such as between 150 micrometers and 1 millimeter or between 200 and 500 micrometers. After the die-sawing process, the image or light sensor chip 99*c* can be detached or removed from the covering material, e.g., blue tape.

Alternatively, an oxygen plasma etching process, used to remove a portion of the adhesive polymer 60 not under the substrate 61 to expose upper portions of the metal structures 59, can be performed before or after the die-sawing process, such that the metal structures 59 have a height, extruding from the adhesive polymer 60, e.g., between 0.5 and 20 micrometers, and preferably between 5 and 15 micrometers. Accordingly, the metal structures 59 of the image or light sensor chip 99*c* have the upper portions uncovered by the adhesive polymer 60, and bonded with the bond pads or inner leads 15 of the above-mentioned flexible substrate 9 or 9*a* by a chip-on-film (COF) process or with multiple metal pads of a substrate, such as ball-grid-array (BGA) substrate, printed circuit board, metal substrate, glass substrate or ceramic substrate.

Alternatively, a polymer layer having a thickness between 2 and 30 micrometers can be formed on the passivation layer 6 before forming the metal structures 59 illustrated in FIG. 9B, where multiple openings in the polymer layer are over the regions of the metal traces or pads 19 exposed by the openings 6*a* and expose them. After forming the polymer layer, the step illustrated in FIG. 9B can be performed to form the metal structures 59 on the polymer layer, in the openings in the polymer layer and on the regions of the metal traces or pads 19 exposed by the openings in the polymer layer, where the adhesion/barrier layer 21 can be formed on the polymer layer, in the openings in the polymer layer and on the regions of the metal traces or pads 19 exposed by the openings in the polymer layer. Next, the steps illustrated in FIGS. 9C-9H can be performed to form the image or light sensor chip 99*c*.

Figure 9I:
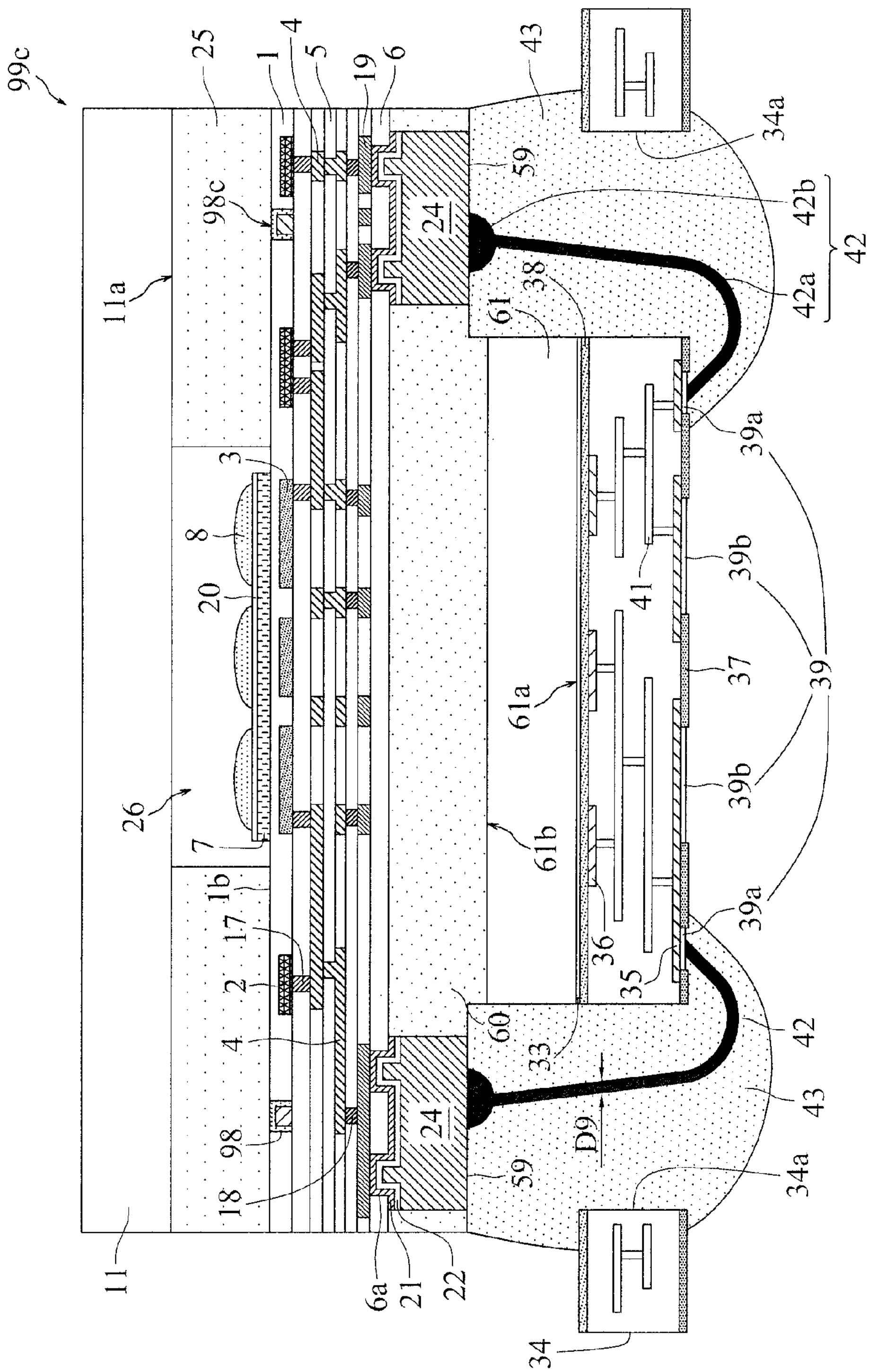
FIGS. 9I and 9J are cross-sectional views depicting a process of forming an image or light sensor package according to an embodiment of the present disclosure.
Figure 9J:
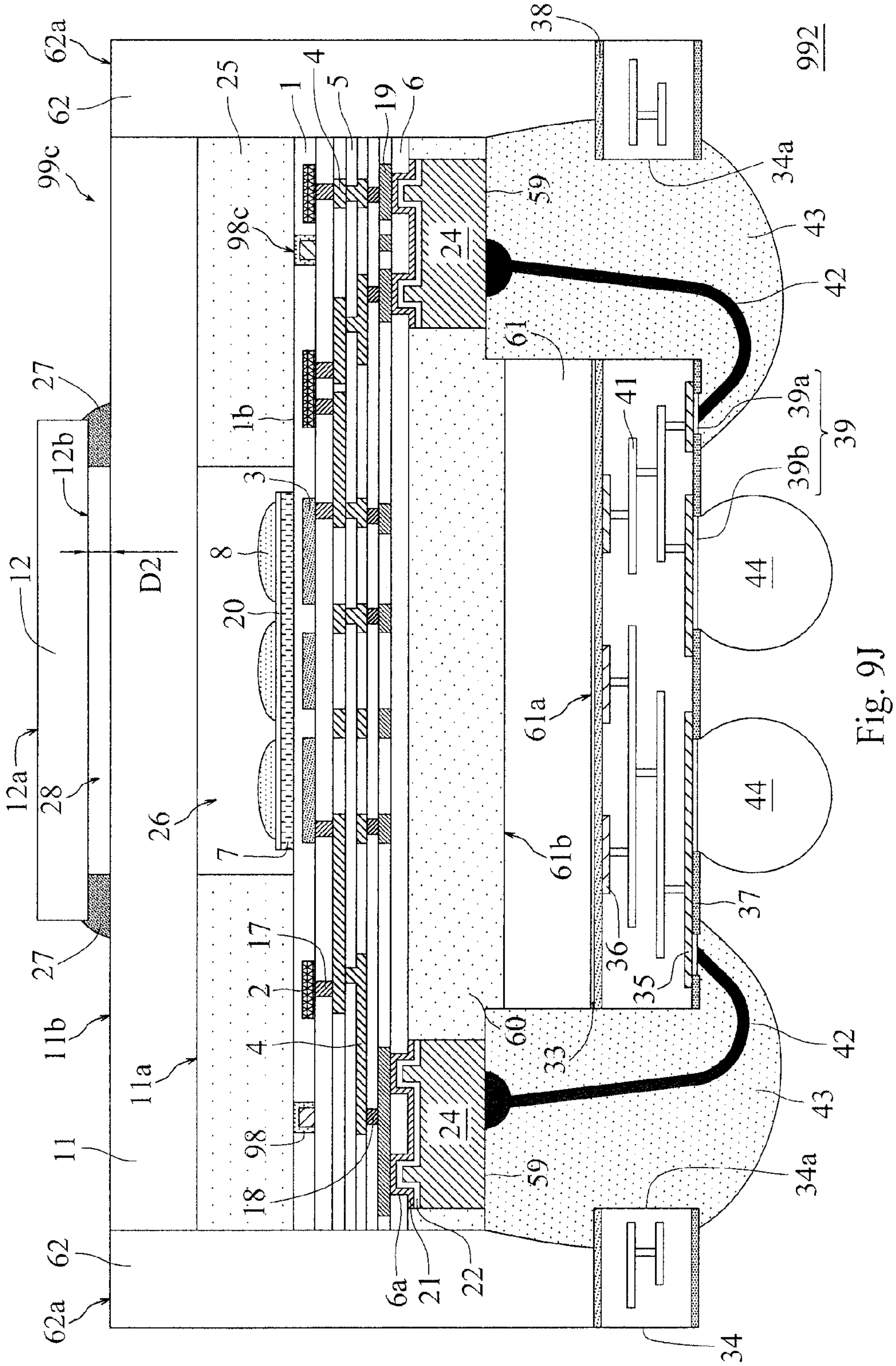

FIGS. 9I-9J show a process for forming an image or light sensor package according to embodiments of the present disclosure. Referring to FIG. 9I, the top surface 61*a* of the substrate 61 of the above-mentioned image or light sensor chip 99*c* can be attached to a top surface of a package substrate 34 by an adhesive material 33 of silver epoxy, polyimide or acrylic. The package substrate 34 shown in FIG. 9I is similar to that shown in FIG. 3A except that there are multiple openings 34*a* in the package substrate 34. The metal layer 39 which is formed on the bottom surfaces of the connection traces or pads 35 includes the metal layers 39*a* and 39*b*.

After attaching the substrate 61 of the image or light sensor chip 99*c* to the package substrate 34, multiple wirebonded wires 42 can connect the metal structures 59 of the image or light sensor chip 99*c* to the metal layer 39*a* of the package substrate 34 passing through the openings 34*a* using a wirebonding process. The wirebonded wires 42 each include a wire 42*a* of gold or copper having a wire diameter D9 between 10 and 20 micrometers or between 20 and 50 micrometers, a ball bond 42*b* at an end of the wire 42*a* to be ball bonded with the metal layer 24 of one of the metal structures 59, and a wedge bond at the other end of the wire 42*a* to be wedge bonded with the metal layer 39*a* of the package substrate 34. The specification of the wirebonded wires 42 ball bonded with the metal layer 24 as shown in FIG. 9I can be referred to as the specification of the wirebonded wires 42 ball bonded with the metal layer 24 as illustrated in FIG. 3B.

After forming the wirebonded wires 42, an encapsulation material 43 of epoxy or polyimide containing carbon or glass filler can be formed on the wirebonded wires 42, on the top surfaces 59*a* of the metal structures 59, on the layers 37 and 38 of solder mask or solder resist, at the sidewalls of the substrate 61 and in the openings 34*a*, encapsulating the wirebonded wires 42, by a dispensing process.

Next, referring to FIG. 9J, after forming the encapsulation material 43, multiple solder balls 44 having a diameter, e.g., between 0.25 and 1.2 millimeters can be formed on the metal layer 39*b* of the package substrate 34. The material of the solder balls 44 can be, e.g., a Sn—Ag—Cu alloy, a Sn—Ag alloy, a Sn—Ag—Bi alloy, a Sn—Au alloy or a Sn—Pb alloy. The process of forming the solder balls 44 on the metal layer 39*b* of the package substrate 34 as shown in FIG. 9J can be referred to as the process of forming the solder balls 44 on the metal layer 39 of the package substrate 34 as illustrated in FIG. 3D.

After forming the solder balls 44, an encapsulation material 62 of epoxy or polyimide containing carbon or glass filler can be formed on the layer 38 of solder mask or solder resist and at the sidewalls of the image or light sensor chip 99*c* by a molding process.

After forming the encapsulation material 62, the step illustrated in FIG. 1I can be performed to attach the infrared (IR) cut filter 12 to the top surface 11*b* of the transparent substrate 11 by the adhesive material 27. For more detailed description, please refer to the illustration in FIG. 1I.

Accordingly, an image or light sensor package 992 can be provided with the image or light sensor chip 99*c*, the package substrate 34, the wirebonded wires 42, the solder balls 44, and the infrared (IR) cut filter 12. The top surface 12*a* of the infrared (IR) cut filter 12 and the top surface 11*b* of the transparent substrate 11 are not covered with the encapsulation material 62, and the top surface 62*a* of the encapsulation material 62 can be substantially coplanar with the top surface 11*b* of the transparent substrate 11. The wirebonded wires 42 can be connected to the solder balls 44 through the connection traces or pads 35 and the copper layers 41 of the package substrate 34, and the solder balls 44 can be connected to an external circuit, such as ball-grid-array (BGA) substrate, printed circuit board, semiconductor chip, metal substrate, glass substrate or ceramic substrate.

Figure 9K:
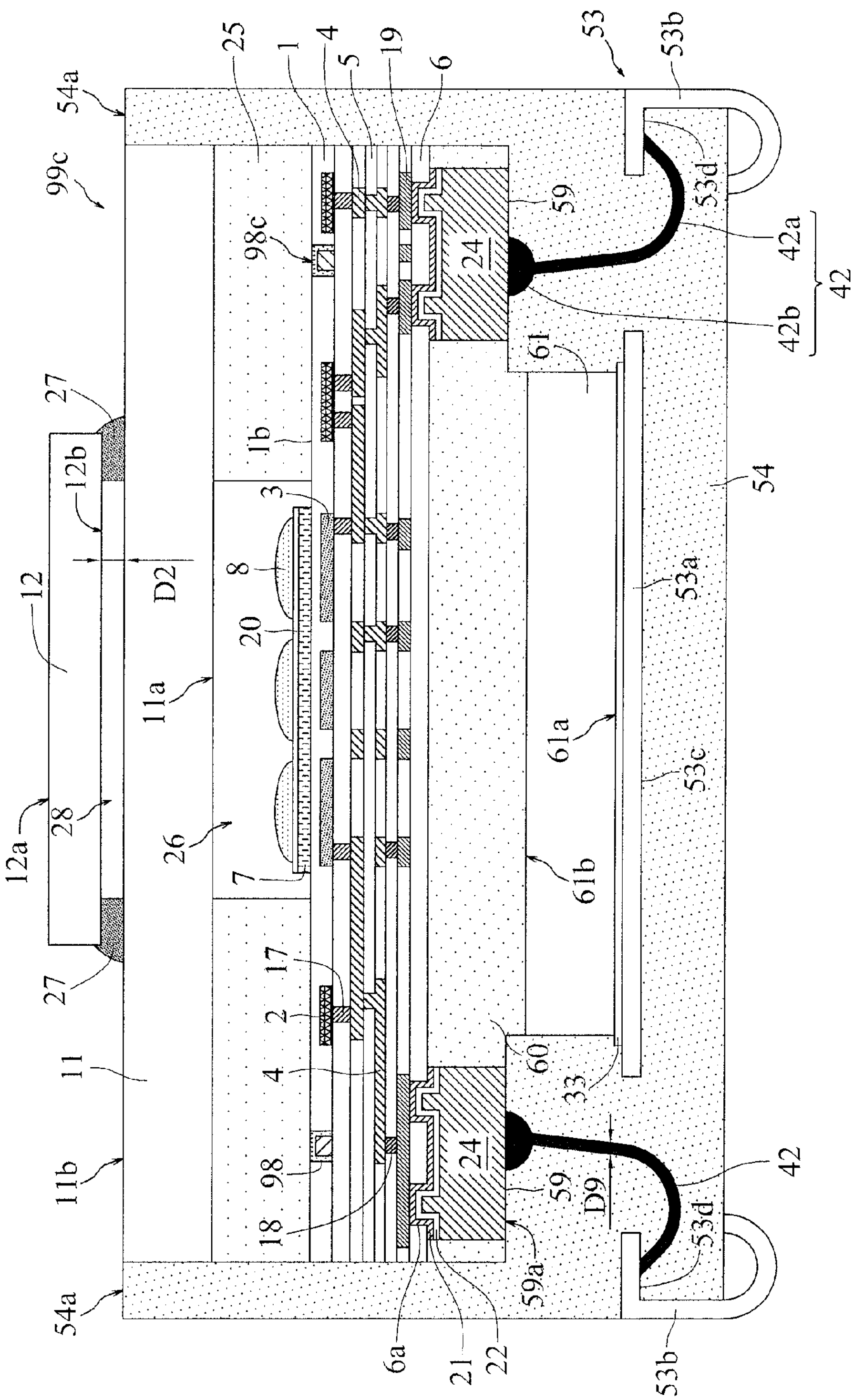
FIG. 9K is a cross sectional view depicting a plastic leaded chip carrier (PLCC) package according to an embodiment of the present disclosure.

FIG. 9K is a cross sectional view depicting an example of a plastic leaded chip carrier (PLCC) package that is provided with a lead frame 53, the image or light sensor chip 99*c* illustrated in FIG. 9H attached to a die attach pad 53*a* of the lead frame 53 by an adhesive material 33 of silver epoxy, polyimide or acrylic, multiple wirebonded wires 42 connecting the metal structures 59 of the image or light sensor chip 99*c* to J-shaped leads 53*b* of the lead frame 53, an infrared (IR) cut filter 12 attached to the top surface 11*b* of the transparent substrate 11 of the image or light sensor chip 99*c* by an adhesive material 27 of epoxy, polyimide or acrylic, and an encapsulation material 54 formed by a molding process, encapsulating the wirebonded wires 42 and inner leads of the J-shaped leads 53*b*, and covering sidewalls of the image or light sensor chip 99*c* and a bottom surface 53*c* of the die attach pad 53*a*. The plastic leaded chip carrier (PLCC) package can be connected to an external circuit, such as printed circuit board, ceramic substrate, ball-grid-array (BGA) substrate, metal substrate or glass substrate, through the J-shaped leads 53*b*.

In FIG. 9K, the J-shaped leads 53*b* are arranged around the periphery of the die attach pad 53*a*, and have outer leads not covered with the encapsulation material 54. The top surface 12*a* of the infrared (IR) cut filter 12 and the top surface 11*b* of the transparent substrate 11 are not covered with the encapsulation material 54, and the top surface 54*a* of the encapsulation material 54 is substantially coplanar with the top surface 11*b* of the transparent substrate 11. A cavity, free space or air space 28 can be formed between and enclosed by the adhesive material 27, the infrared (IR) cut filter 12 and the top surface 11*b* of the transparent substrate 11, and an air gap is between the top surface 11*b* of the transparent substrate 11 and the bottom surface 12*b* of the infrared (IR) cut filter 12. The specification of the infrared (IR) cut filter 12, the adhesive material 27 and the cavity, free space or air space 28 as shown in FIG. 9K can be referred to as the specification of the infrared (IR) cut filter 12, the adhesive material 27 and the cavity, free space or air space 28 as illustrated in FIG. 1I. Alternatively, the adhesive material 27 and the infrared (IR) cut filter 12 can be omitted.

In FIG. 9K, the wirebonded wires 42 each include a wire 42*a* having a wire diameter D9 between 10 and 20 micrometers or between 20 and 50 micrometers, a ball bond 42*b* at an end of the wire 42*a* to be ball bonded with the metal layer 24 of one of the metal structures 59, and a wedge bond at the other end of the wire 42*a* to be wedge bonded with a bottom surface 53*d* of one of the inner leads of the J-shaped leads 53*b*. The specification of the wirebonded wires 42 ball bonded with the metal layer 24 as shown in FIG. 9K can be referred to as the specification of the wirebonded wires 42 ball bonded with the metal layer 24 as illustrated in FIG. 3B.

Figure 10A:
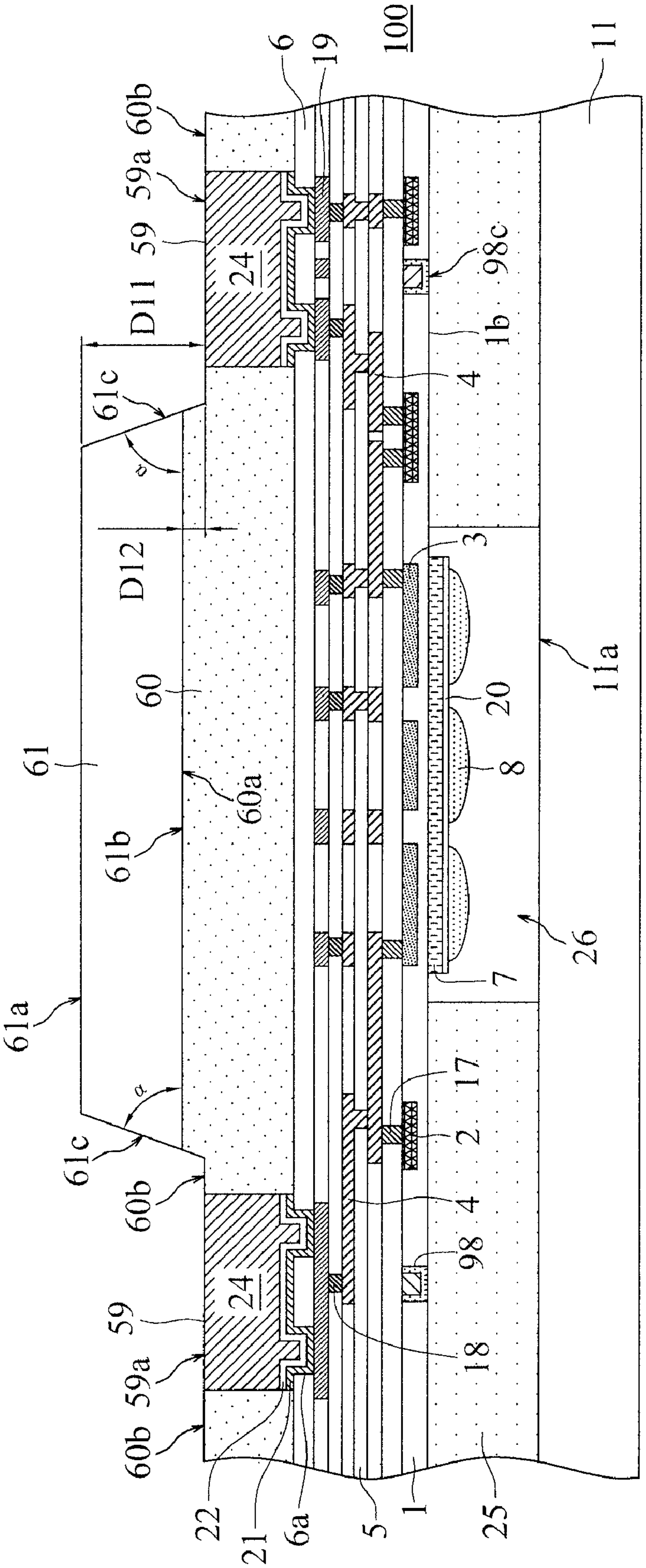

FIGS. 10A-10F show a process for forming an image or light sensor chip according to further embodiments of the present disclosure. Referring to FIG. 10A, after performing the steps illustrated in FIGS. 9A-9F, the semiconductor wafer 100 is flipped over, then a covering material, e.g., blue tape (not shown), is attached to the transparent substrate 11, then multiple portions of the substrate 61 and the adhesive polymer 60 over the metal structures 59 are removed by a self-cutting process of a thick sawing blade cutting it with a cutting depth D11, e.g., between 200 and 500 micrometers, and then the covering material, e.g., blue tape, is detached from the transparent substrate 11. Accordingly, top surfaces 59*a* of the metal structures 59 may not be covered by any of the substrate 61 and the adhesive polymer 60. The adhesive polymer 60 has a first region 60*a* contacting the bottom surface 61*b* of the substrate 61 and a second region 60*b* uncovered by the substrate 61 and existing substantially coplanar with the top surfaces 59*a* of the metal structures 59, where the first region 60*a* is at a first horizontal level higher than a second horizontal level, at which the second region 60*b* is, and a vertical distance D12 between the first region 60*a* and the second region 60*b* is greater than 5 micrometers, such as between 5 and 50 micrometers or between 50 and 100 micrometers. The substrate 61 has can have sloped sidewall 61*c* with a slope angle $\alpha$ between the sloped sidewall 61*c* and the bottom surface 61*b* being between 20 and 80 degrees, and preferably between 35 and 65 degrees.

Figure 10B:
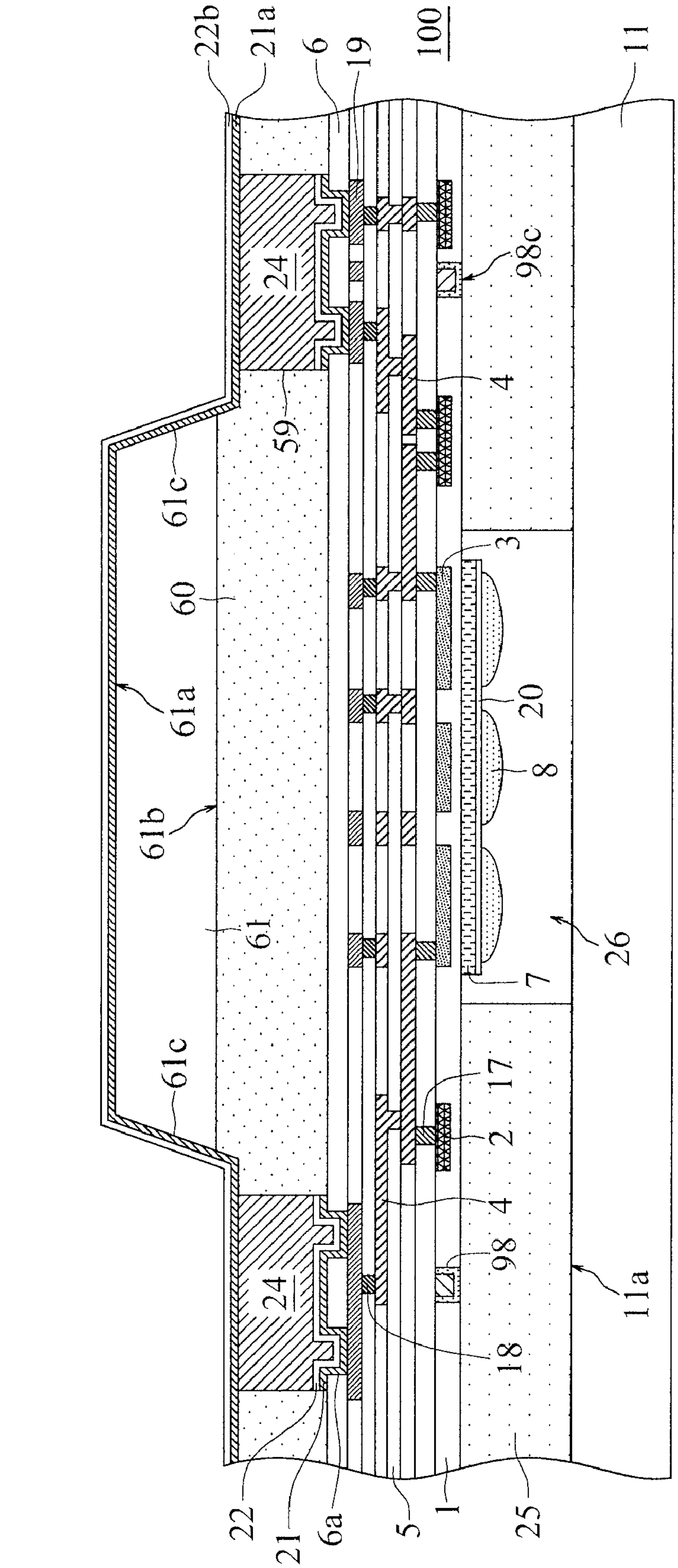

Next, referring to FIG. 10B, an adhesion/barrier layer 21*a* having a thickness, e.g., between 1 nanometer and 0.8 micrometers, and preferably between 0.01 and 0.7 micrometers, can be formed on the top surface 61*a* and the sloped sidewalls 61*c* of the substrate 61, on the top surfaces 59*a* of the metal structures 59 and on the second region 60*b* of the adhesive polymer 60. The adhesion/barrier layer 21*a* can be formed by sputtering a titanium-containing layer, such as titanium layer, titanium-tungsten-alloy layer or titanium-nitride layer, a tantalum-containing layer, such as tantalum layer or tantalum-nitride layer, a chromium-containing layer, such as chromium layer, or a nickel layer having a thickness between 1 nanometer and 0.8 micrometers, and preferably between 0.01 and 0.7 micrometers, on the top surface 61*a* and the sloped sidewalls 61*c* of the substrate 61, on the top surfaces 59*a* of the metal structures 59 and on the second region 60*b* of the adhesive polymer 60. Other techniques may be used for forming adhesion/barrier layer 21.

After forming the adhesion/barrier layer 21*a*, a seed layer 22*b* having a suitable thickness, e.g., between 0.01 and 2 micrometers, and preferably between 0.02 and 0.5 micrometers, can be formed on the adhesion/barrier layer 21*a*, over the top surface 61*a* of the substrate 61, over the top surfaces 59*a* of the metal structures 59, over the second region 60*b* of the adhesive polymer 60 and at the sloped sidewalls 61*c* of the substrate 61. The seed layer 22*b* can be formed by sputtering a copper layer, a gold layer or a silver layer having a thickness between 0.01 and 2 micrometers, and preferably between 0.02 and 0.5 micrometers, on the adhesion/barrier layer 21*a* of any above-mentioned material, over the top surface 61*a* of the substrate 61, over the top surfaces 59*a* of the metal structures 59, over the second region 60*b* of the adhesive polymer 60 and at the sloped sidewalls 61*c* of the substrate 61.

Figure 10C:
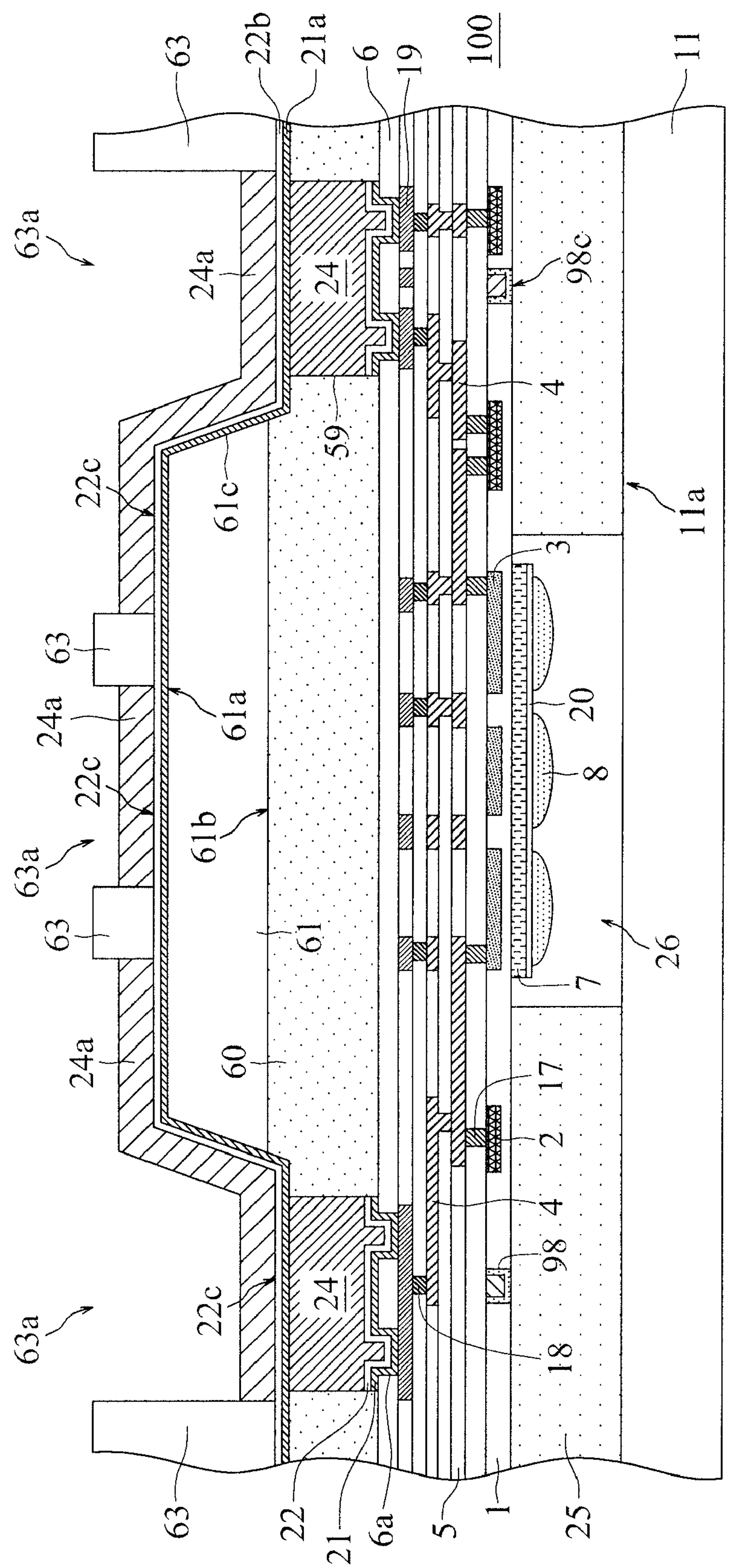

Next, referring to FIG. 10C, after forming the seed layer 22*b*, a patterned photoresist layer 63 is formed on the seed layer 22*b* of any above-mentioned material, and multiple openings 63*a* in the patterned photoresist layer 63 expose multiple regions 22*c* of the seed layer 22*b* of any above-mentioned material. Next, a metal layer 24*a* is formed on the regions 22*c* of the seed layer 22*b* of any above-mentioned material, over the top surface 61*a* of the substrate 61, over the top surfaces 59*a* of the metal structures 59, over the second region 60*b* of the adhesive polymer 60 and at the sloped sidewalls 61*c* of the substrate 61. The metal layer 24*a* may have a thickness, e.g., between 1 and 15 micrometers, between 5 and 50 micrometers or between 3 and 100 micrometers, and greater than that of the seed layer 22*b*, that of the adhesion/barrier layer 21*a*, that of each of the metal traces or pads 19, and that of each of the interconnection layers 4, respectively.

For example, the metal layer 24*a* can be a single metal layer formed by electroplating a gold layer having a thickness between 1 and 15 micrometers, between 5 and 50 micrometers or between 3 and 100 micrometers on the regions 22*c* of the seed layer 22*b*, preferably the above-mentioned gold layer for the seed layer 22*b*, with an electroplating solution containing gold with a concentration, e.g., of between 1 and 20 grams per litter (g/l), and preferably between 5 and 15 g/l, and sulfite ion of 10 and 120 g/l, and preferably between 30 and 90 g/l. The electroplating solution may further include sodium ion, to be turned into a solution of gold sodium sulfite ($Na_3Au(SO_3)_2$), or may further include ammonium ion, to be turned into a solution of gold ammonium sulfite ($(NH_4)_3[Au(SO_3)_2]$)

Alternatively, the metal layer 24*a* can be a single metal layer formed by electroplating a copper layer having a thickness between 1 and 15 micrometers, between 5 and 50 micrometers or between 3 and 100 micrometers on the regions 22*c* of the seed layer 22*b*, preferably the above-mentioned copper layer for the seed layer 22*b*, with an electroplating solution containing $CuSO_4$, $Cu(CN)_2$ or $CuHPO_4$.

Alternatively, the metal layer 24*a* can be a single metal layer formed by electroplating a silver layer having a thickness between 1 and 15 micrometers, between 5 and 50 micrometers or between 3 and 100 micrometers on the regions 22*c* of the seed layer 22*b*, preferably the above-mentioned silver layer for the seed layer 22*b*.

Alternatively, the metal layer 24*a* can be two (double) metal layers formed by electroplating a copper layer having a thickness, e.g., between 1 and 15 micrometers, between 5 and 50 micrometers or between 3 and 100 micrometers on the regions 22*c* of the seed layer 22*b*, preferably the above-mentioned copper layer for the seed layer 22*b*, using the above-mentioned electroplating solution for electroplating copper, and then electroplating or electroless plating a gold layer having a thickness, e.g., between 0.1 and 10 micrometers, and preferably between 0.5 and 5 micrometers, on the electroplated copper layer in the openings 63*a*.

Alternatively, the metal layer 24*a* can include three (triple) metal layers formed by electroplating a copper layer having a suitable thickness, e.g., between 1 and 15 micrometers, between 5 and 50 micrometers or between 3 and 100 micrometers on the regions 22*c* of the seed layer 22*b*, preferably the above-mentioned copper layer for the seed layer 22*b*, using the above-mentioned electroplating solution for electroplating copper, then electroplating or electroless plating a nickel layer having a thickness between 0.5 and 8 micrometers, and preferably between 1 and 5 micrometers, on the electroplated copper layer in the openings 63*a*, and then electroplating or electroless plating a gold layer having a thickness, e.g., between 0.1 and 10 micrometers, and preferably between 0.5 and 5 micrometers, on the electroplated or electroless plated nickel layer in the openings 63*a*.

Figure 10D:
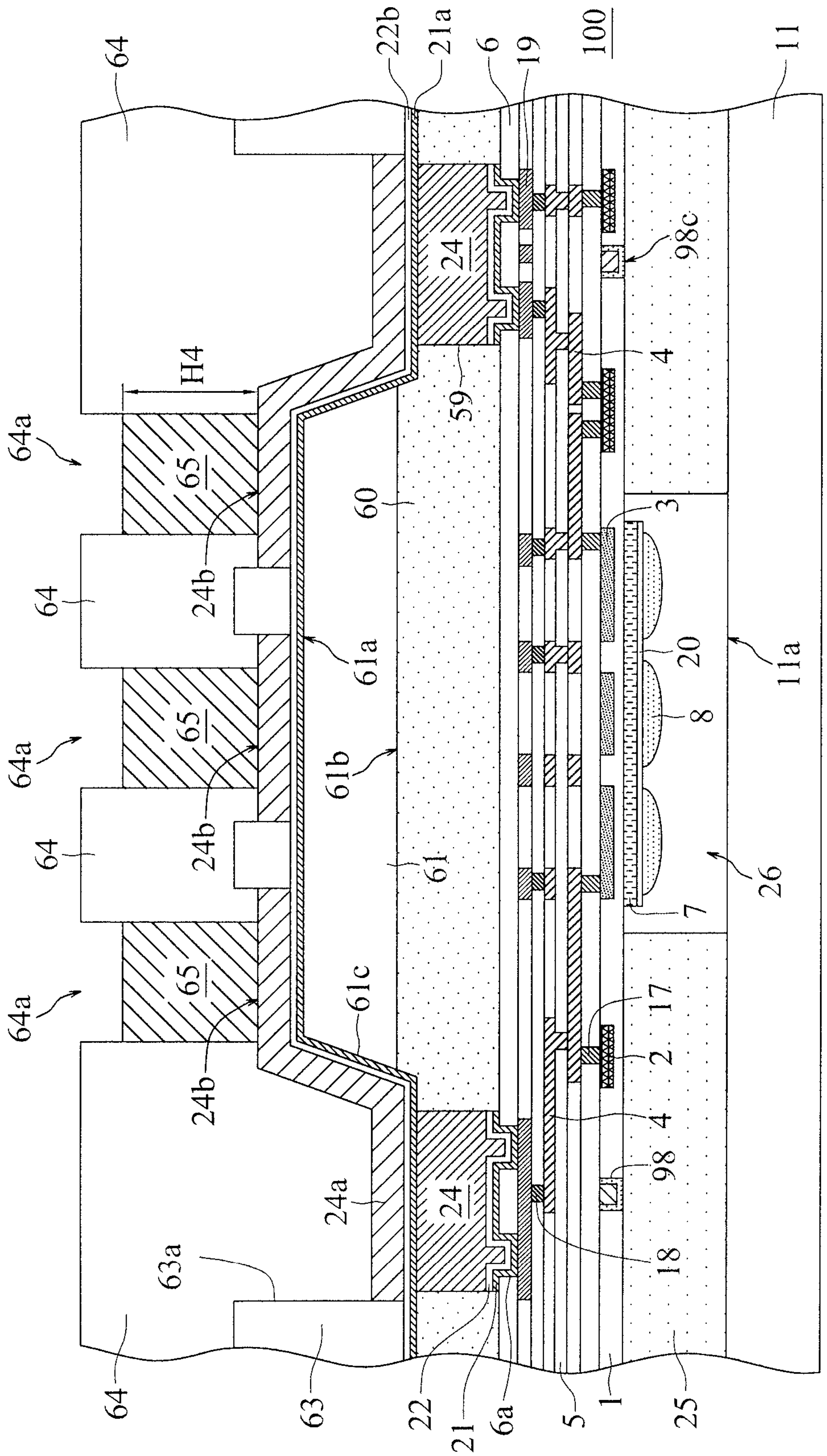

Next, referring to FIG. 10D, after forming the metal layer 24*a*, a patterned photoresist layer 64 is formed on the patterned photoresist layer 63 and on the metal layer 24*a* of any above-mentioned material, and multiple openings 64*a* in the patterned photoresist layer 64 expose multiple regions 24*b* of the metal layer 24*a* of any above-mentioned material. Next, multiple metal bumps 65 can be formed on the regions 24*b* of the metal layer 24*a* of any above-mentioned material. The metal bumps 65 may have a height H4, e.g., between 5 and 50 micrometers, between 50 and 100 micrometers or between 10 and 250 micrometers, and greater than that of the seed layer 22*b*, that of the adhesion/barrier layer 21*a*, that of each of the metal traces or pads 19, and that of each of the interconnection layers 4, respectively.

For example, the metal bumps 65 can be a single metal layer formed by electroplating a gold layer having a thickness, e.g., between 5 and 50 micrometers, between 50 and 100 micrometers or between 10 and 250 micrometers on the regions 24*b* of the metal layer 24*a* of any above-mentioned material using the above-mentioned electroplating solution for electroplating gold. The electroplated gold layer can be used to be connected to an external circuit, such as ball-grid-array (BGA) substrate, printed circuit board, semiconductor chip, metal substrate, glass substrate or ceramic substrate.

Alternatively, the metal bumps 65 can be a single metal layer formed by electroplating a copper layer having a thickness, e.g., between 5 and 50 micrometers, between 50 and 100 micrometers or between 10 and 250 micrometers on the regions 24*b* of the metal layer 24*a* of any above-mentioned material with an electroplating solution containing $CuSO_4$, $Cu(CN)_2$ or $CuHPO_4$. The electroplated copper layer can be used to be connected to an external circuit, such as ball-grid-array (BGA) substrate, printed circuit board, semiconductor chip, metal substrate, glass substrate or ceramic substrate.

Alternatively, the metal bumps 65 can be a single metal layer formed by electroplating a silver layer having a thickness, e.g., between 5 and 50 micrometers, between 50 and 100 micrometers or between 10 and 250 micrometers on the regions 24*b* of the metal layer 24*a* of any above-mentioned material. The electroplated silver layer can be used to be connected to an external circuit, such as ball-grid-array (BGA) substrate, printed circuit board, semiconductor chip, metal substrate, glass substrate or ceramic substrate.

Alternatively, the metal bumps 65 can be a single metal layer formed by electroplating a tin-containing layer of pure tin, a tin-silver alloy, a tin-silver-copper alloy or a tin-lead alloy having a thickness, e.g., between 5 and 50 micrometers, between 50 and 100 micrometers or between 10 and 250 micrometers on the regions 24*b* of the metal layer 24*a* of any above-mentioned material. The electroplated tin-containing layer can be used to be connected to an external circuit, such as ball-grid-array (BGA) substrate, printed circuit board, semiconductor chip, metal substrate, glass substrate or ceramic substrate.

Alternatively, the metal bumps 65 can include two (double) metal layers formed by electroplating a copper layer having a thickness, e.g., between 1 and 5 micrometers, between 5 and 15 micrometers or between 15 and 100 micrometers on the regions 24*b* of the metal layer 24*a* of any above-mentioned material using the above-mentioned electroplating solution for electroplating copper, and then electroplating or electroless plating a gold layer having a thickness, e.g., between 0.1 and 10 micrometers, and preferably between 0.5 and 5 micrometers, on the electroplated copper layer in the openings 64*a*. The electroplated or electroless plated gold layer can be used to be connected to an external circuit, such as ball-grid-array (BGA) substrate, printed circuit board, semiconductor chip, metal substrate, glass substrate or ceramic substrate.

Alternatively, the metal bumps 65 can include two (double) metal layers formed by electroplating a copper layer having a thickness between 1 and 5 micrometers, between 5 and 15 micrometers or between 15 and 100 micrometers on the regions 24*b* of the metal layer 24*a* of any above-mentioned material using the above-mentioned electroplating solution for electroplating copper, and then electroplating or electroless plating a tin-containing layer of pure tin, a tin-silver alloy, a tin-silver-copper alloy or a tin-lead alloy having a thickness between 0.5 and 100 micrometers, and preferably between 5 and 50 micrometers, on the electroplated copper layer in the openings 64*a*. The electroplated or electroless plated tin-containing layer can be used to be connected to an external circuit, such as ball-grid-array (BGA) substrate, printed circuit board, semiconductor chip, metal substrate, glass substrate or ceramic substrate.

Alternatively, the metal bumps 65 can include three (triple) metal layers formed by electroplating a copper layer having a thickness between 1 and 5 micrometers, between 5 and 15 micrometers or between 15 and 100 micrometers on the regions 24*b* of the metal layer 24*a* of any above-mentioned material using the above-mentioned electroplating solution for electroplating copper, then electroplating or electroless plating a nickel layer having a thickness between 0.5 and 8 micrometers, and preferably between 1 and 5 micrometers, on the electroplated copper layer in the openings 64*a*, and then electroplating or electroless plating a gold layer having a thickness between 0.1 and 10 micrometers, and preferably between 0.5 and 5 micrometers, on the electroplated or electroless plated nickel layer in the openings 64*a*. The electroplated or electroless plated gold layer can be used to be connected to an external circuit, such as ball-grid-array (BGA) substrate, printed circuit board, semiconductor chip, metal substrate, glass substrate or ceramic substrate.

Alternatively, the metal bumps 65 can include three (triple) metal layers formed by electroplating a copper layer having a thickness between 1 and 5 micrometers, between 5 and 15 micrometers or between 15 and 100 micrometers on the regions 24*b* of the metal layer 24*a* of any above-mentioned material using the above-mentioned electroplating solution for electroplating copper, then electroplating or electroless plating a nickel layer having a thickness between 0.5 and 8 micrometers, and preferably between 1 and 5 micrometers, on the electroplated copper layer in the openings 64*a*, and then electroplating or electroless plating a tin-containing layer of pure tin, a tin-silver alloy, a tin-silver-copper alloy or a tin-lead alloy having a thickness, e.g., between 0.5 and 100 micrometers, and preferably between 5 and 50 micrometers, on the electroplated or electroless plated nickel layer in the openings 64*a*. The electroplated or electroless plated tin-containing layer can be used to be connected to an external circuit, such as ball-grid-array (BGA) substrate, printed circuit board, semiconductor chip, metal substrate, glass substrate or ceramic substrate.

Figure 10E:
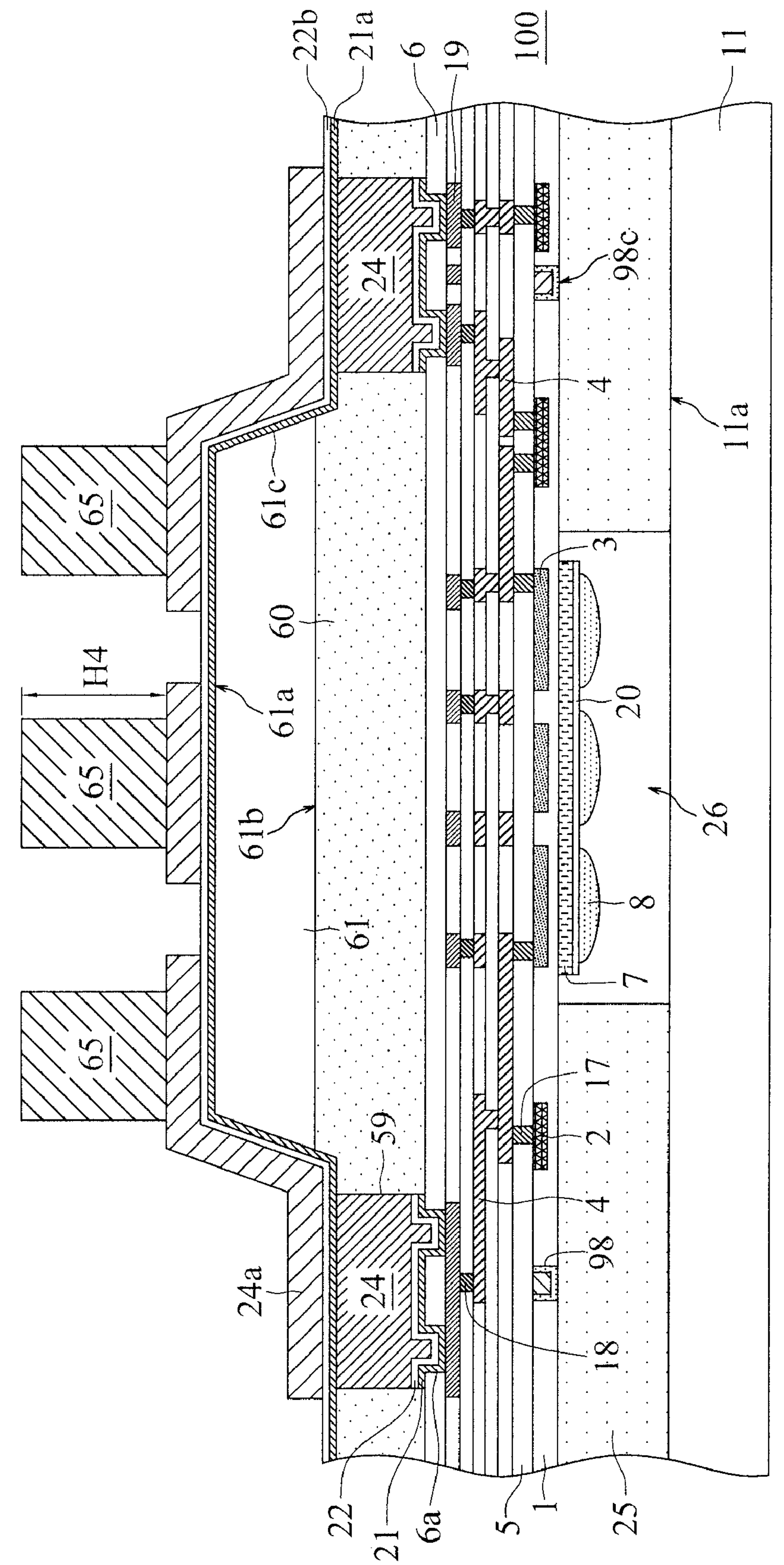

Referring to FIG. 10E, after forming the metal bumps 65, the patterned photoresist layers 63 and 64 are removed. Alternatively, after forming the metal layer 24*a*, the patterned photoresist layer 63 can be removed, then the patterned photoresist layer 64 can be formed on the seed layer 22*b* and on the metal layer 24*a*, then the metal bumps 65 illustrated in FIG. 10D can be formed on the regions 24*b* of the metal layer 24*a* exposed by the openings 64*a* in the patterned photoresist layer 64, and then the patterned photoresist layer 64 can be removed.

Figure 10F:
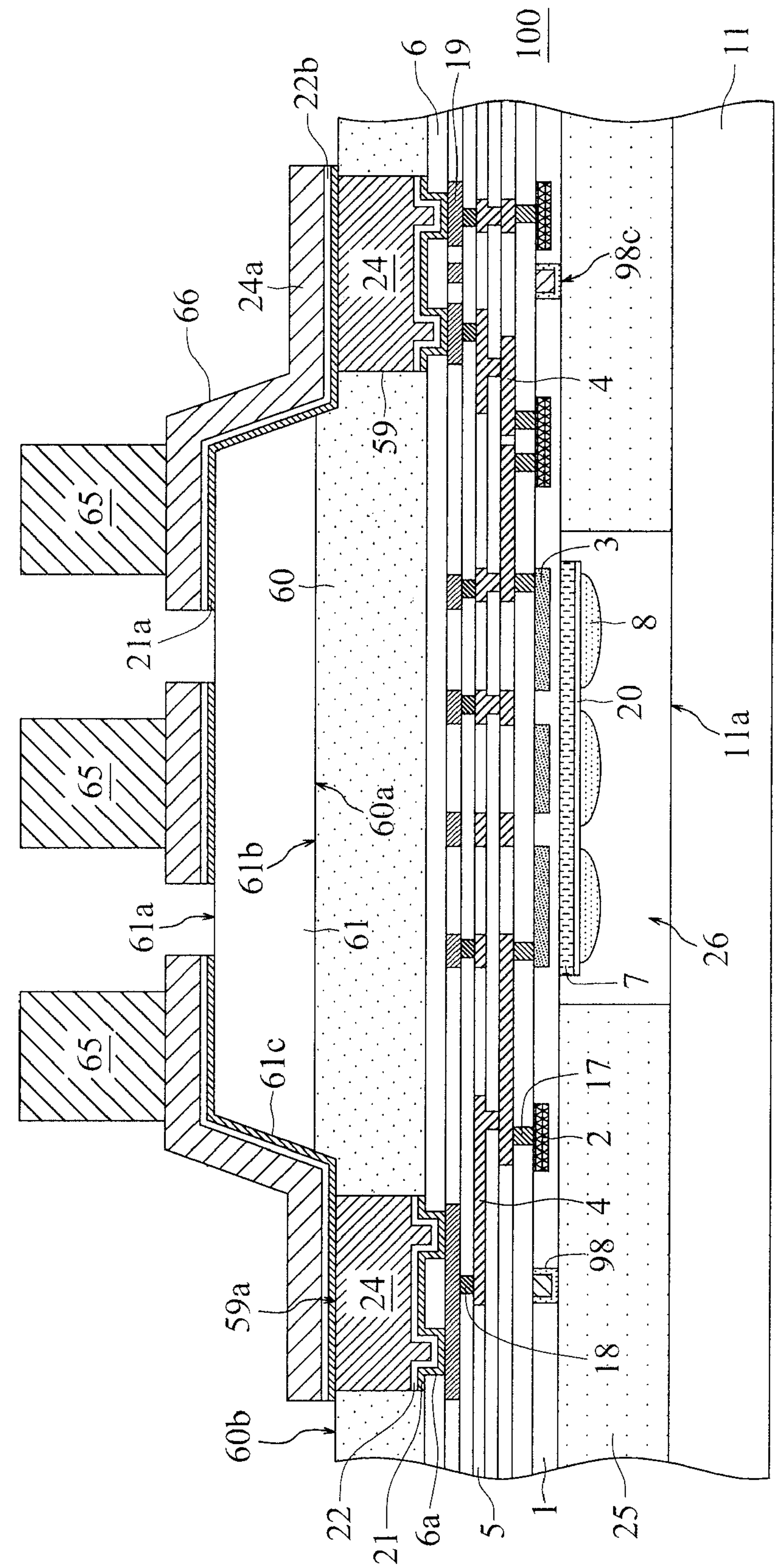

Next, referring to FIG. 10F, the seed layer 22*b* not under the metal layer 24*a* is removed by using a wet-etching process or a dry-etching process, and then the adhesion/barrier layer 21*a* not under the metal layer 24*a* is removed, e.g., by using a wet-etching process or a dry-etching process. Accordingly, multiple metal traces 66, composed of the adhesion/barrier layer 21*a*, the seed layer 22*b* and the metal layer 24*a*, can be formed on the top surfaces 59*a* of the metal structures 59, on the top surface 61*a* and the sloped sidewalls 61*c* of the substrate 61 and on the second region 60*b* of the adhesive polymer 60, where sidewalls of the metal layer 24*a* are not covered by the adhesion/barrier layer 21*a* and the seed layer 22*b*. The metal bumps 65 can be formed on the metal layer 24*a* of the metal traces 66, over the top surface 61*a* of the substrate 61, over the light sensors 3, over the layer 7 of optical or color filter array and over the microlenses 8, and can be connected to the metal layer 24 of the metal structures 59 through the metal traces 66.

Figure 10G:
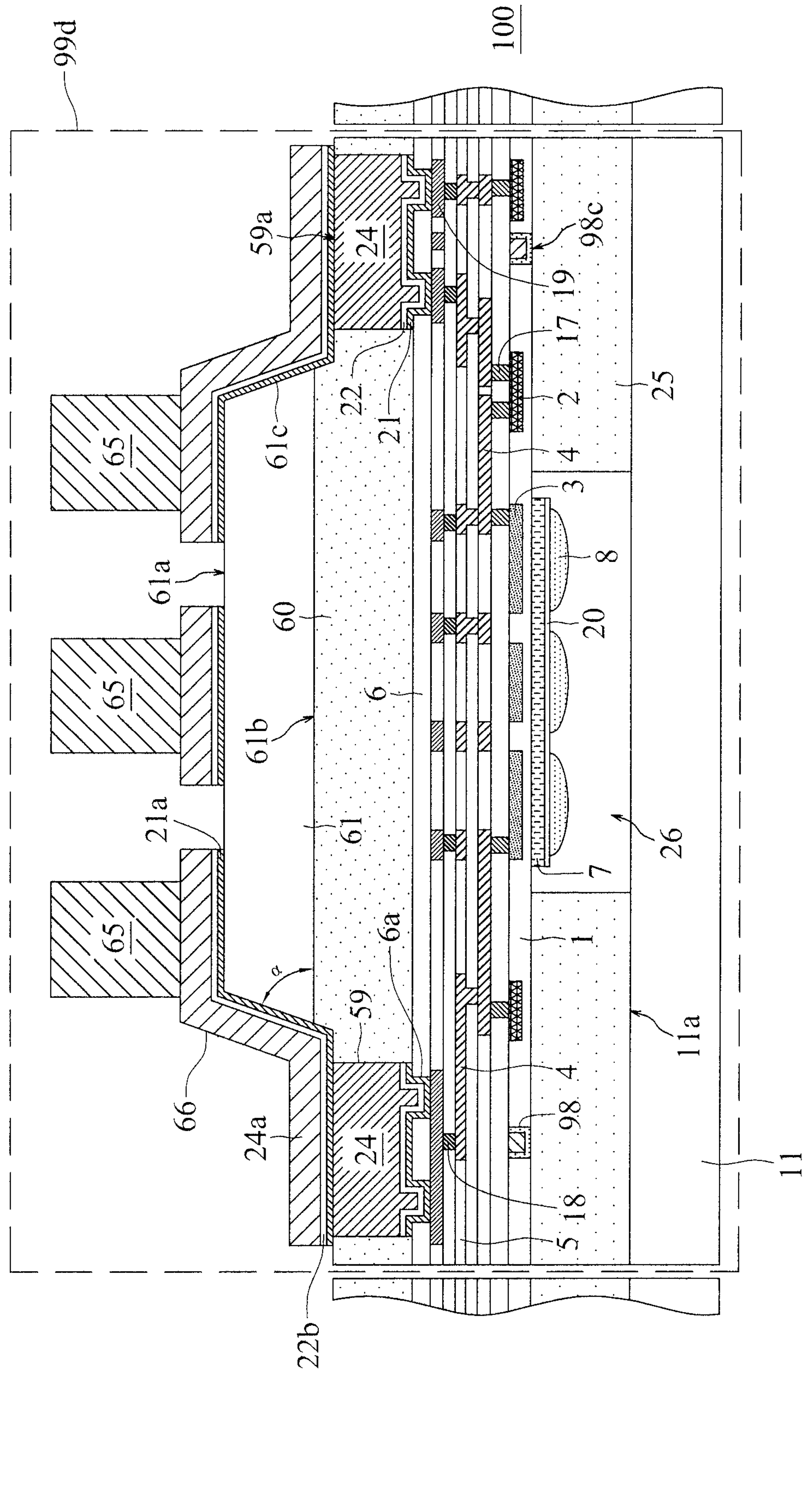

Referring to FIG. 10G, after removing the adhesion/barrier layer 21*a* not under the metal layer 24*a*, a covering tape, e.g., blue tape, or other suitable material (not shown) is attached to the transparent substrate 11, and then a die-sawing process is performed by using a thin sawing blade or a laser cutting process to cut through the semiconductor wafer 100 and the transparent substrate 11 to form an image or light sensor chip 99*d*. If a thin sawing blade is used to cut through the semiconductor wafer 100 and the transparent substrate 11 in the die-sawing process, the thick sawing blade used in the step illustrated in FIG. 10A may have a width greater than that of the thin sawing blade used in the die-sawing process by more than 150 micrometers, such as between 150 micrometers and 1 millimeter or between 200 and 500 micrometers. After the die-sawing process, the image or light sensor chip 99*d* is detached from the covering (blue) tape. The metal bumps 65 of the image or light sensor chip 99*d* can be connected to an external circuit, such as ball-grid-array (BGA) substrate, printed circuit board, semiconductor chip, metal substrate, glass substrate or ceramic substrate.

Figure 10H:
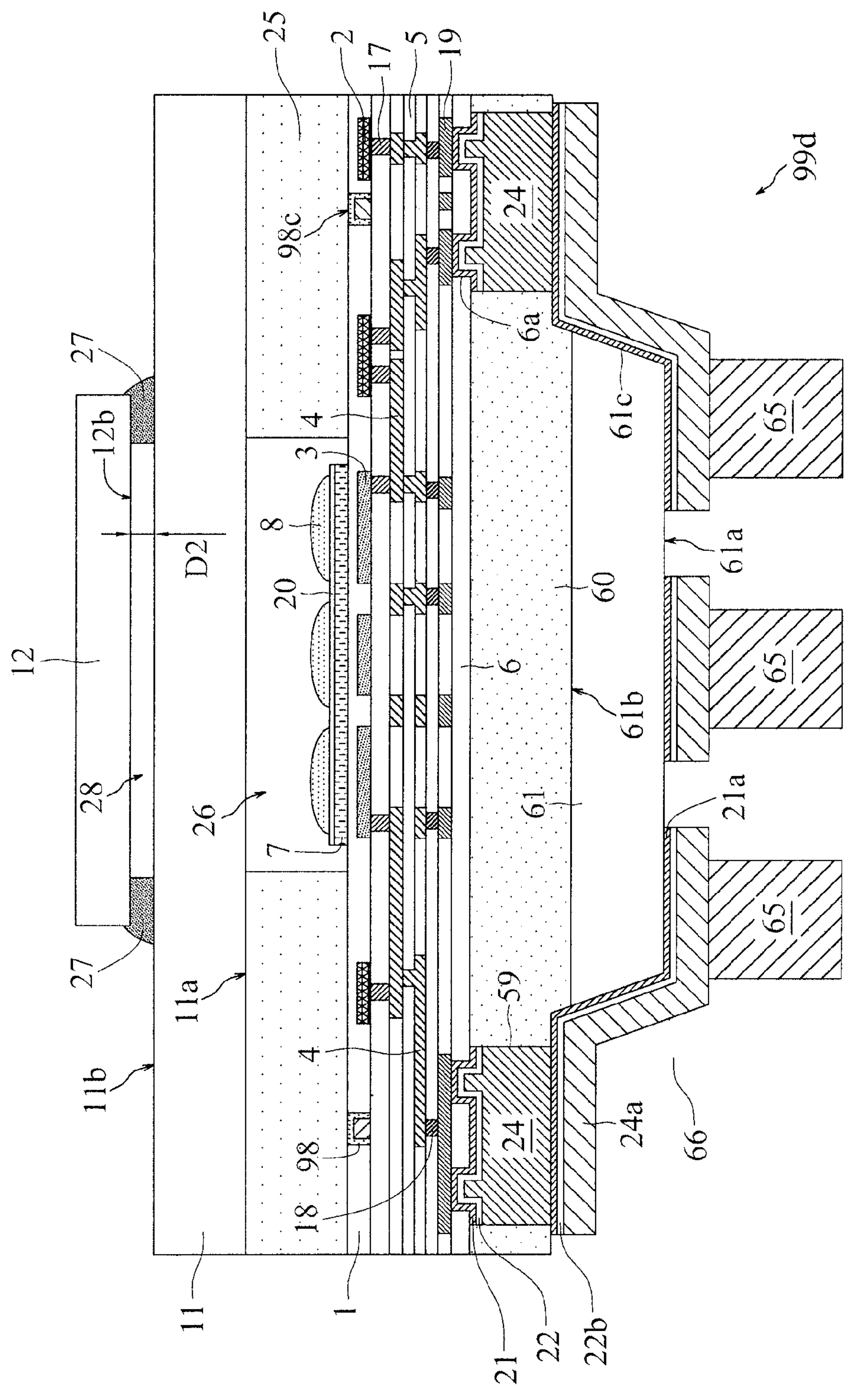

Referring to FIG. 10H, after the image or light sensor chip 99*d* is detached from the covering blue tape, the step illustrated in FIG. 1I can be performed to attach the infrared (IR) cut filter 12 to the top surface 11*b* of the transparent substrate 11 by the adhesive material 27. The infrared (IR) cut filter 12 is formed over the cavity, free space or air space 26, over the microlenses 8, over the layer 7 of optical or color filter array and over the light sensors 3. For more detailed description, please refer to the illustration in FIG. 1I.

Figure 10I:
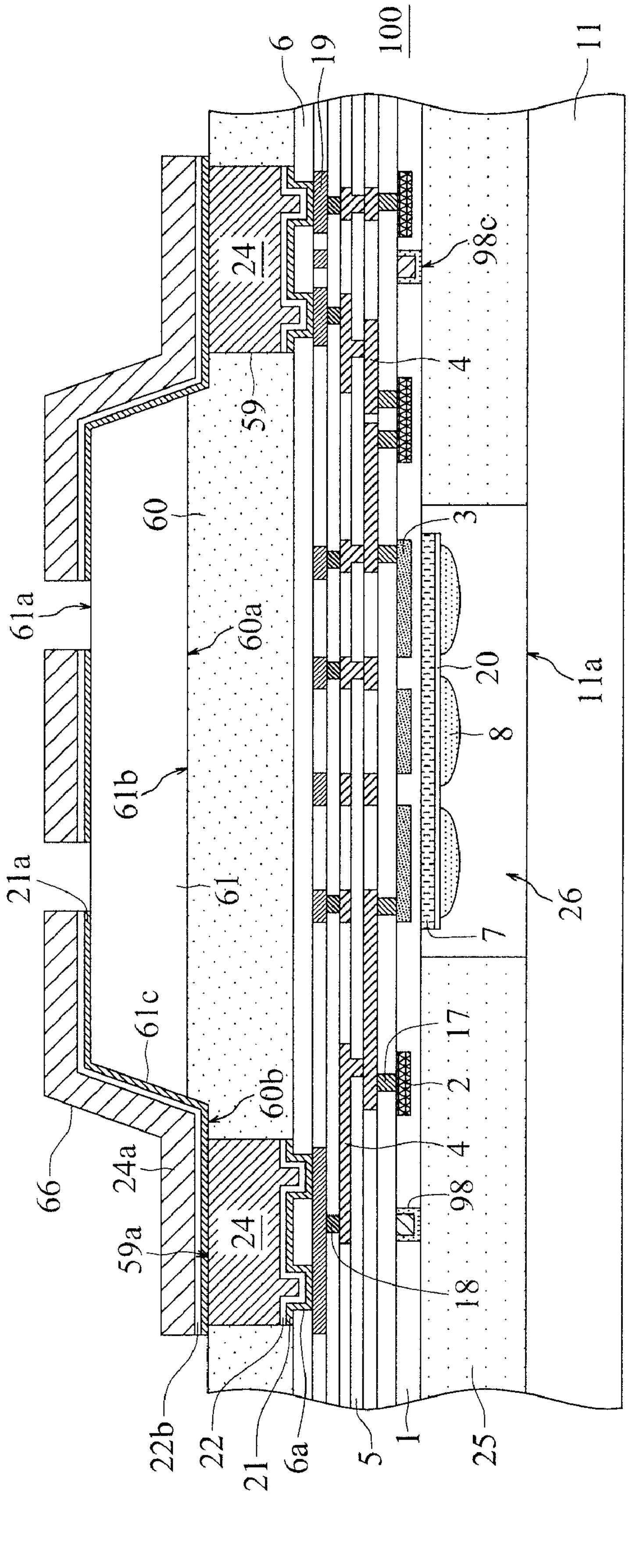

FIGS. 10I-10L show a process for forming an image or light sensor chip according to embodiments of the present disclosure. Referring to FIG. 10I, after the steps illustrated in FIGS. 9A-9F and 10A-10C, the patterned photoresist layer 63 is removed, next the seed layer 22*b* not under the metal layer 24*a* is removed by using a wet-etching process or a dry-etching process, and next the adhesion/barrier layer 21*a* not under the metal layer 24*a* is removed by using a wet-etching process or a dry-etching process. Accordingly, multiple metal traces 66, composed of the adhesion/barrier layer 21*a*, the seed layer 22*b* and the metal layer 24*a*, can be formed on the top surfaces 59*a* of the metal structures 59, on the top surface 61*a* and the sloped sidewalls 61*c* of the substrate 61 and on the second region 60*b* of the adhesive polymer 60, where sidewalls of the metal layer 24*a* are not covered by the adhesion/barrier layer 21*a* and the seed layer 22*b*.

Figure 10J:
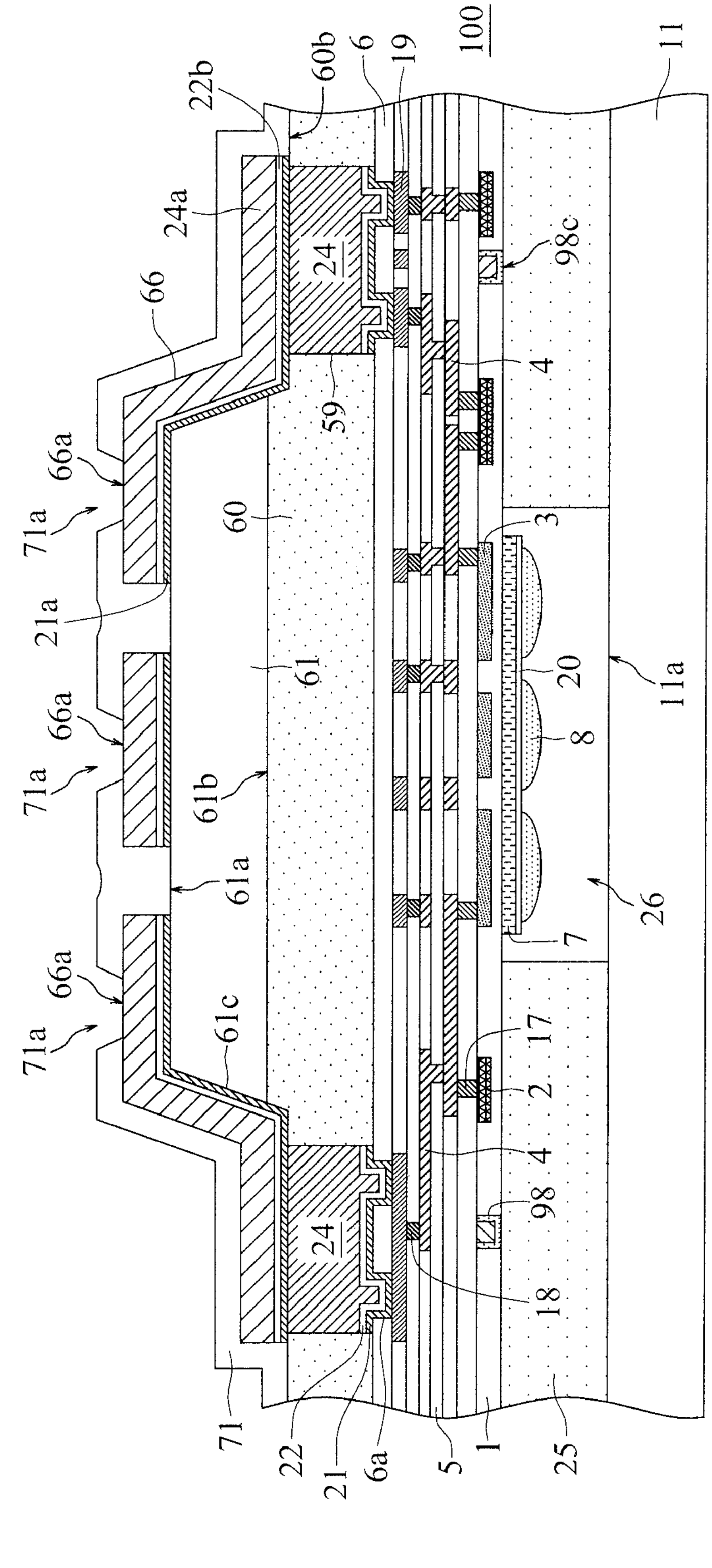

Next, referring to FIG. 10J, a polymer layer 71 can be formed on the metal traces 66, on the top surface 61*a* of the substrate 61, on the second region 60*b* of the adhesive polymer 60 and at the sloped sidewalls 61*c* of the substrate 61. Multiple openings 71*a* in the polymer layer 71 are over multiple regions 66*a* of the metal traces 66 and expose them, and the regions 66*a* are at bottoms of the openings 71*a*.

Figure 10K:
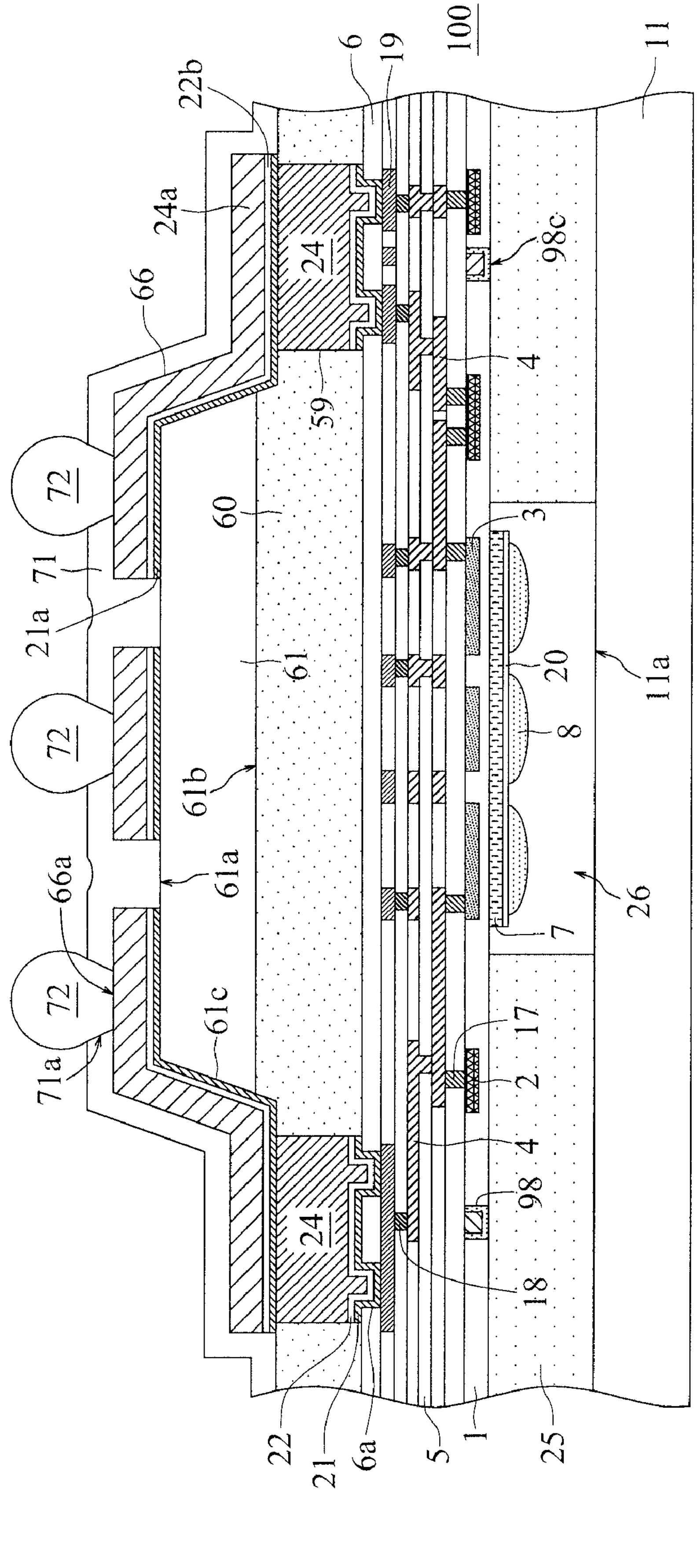

Next, referring to FIG. 10K, using a ball-planting process and a reflowing process or using a solder printing process and a reflowing process, multiple solder balls 72 having a height between 50 and 500 micrometers can be formed on the regions 66*a* of copper, gold or silver at the top of the metal layer 24*a* exposed by the openings 71*a* and over the top surface 61*a* of the substrate 61. The solder balls 50 may include a Sn—Ag—Cu alloy, a Sn—Ag alloy, a Sn—Ag—Bi alloy, a Sn—Au alloy or a Sn—Pb alloy.

Figure 10L:
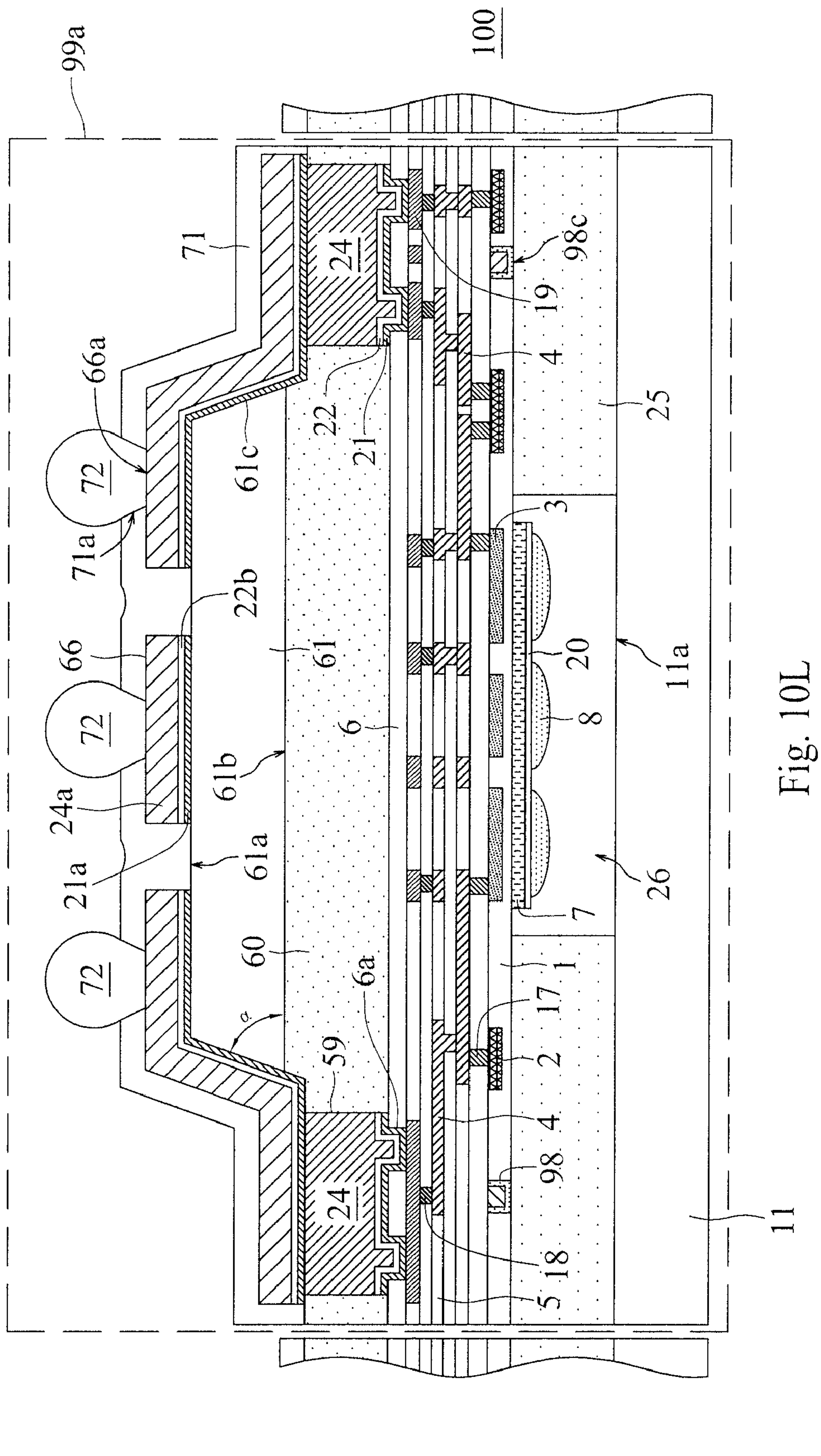

Next, referring to FIG. 10L, a covering material, e.g., blue tape, (not shown) can be attached to the transparent substrate 11, and then a die-sawing process is performed by using a thin sawing blade or a laser cutting process to cut through the semiconductor wafer 100 and the transparent substrate 11 to form an image or light sensor chip 99*a*. If a thin sawing blade is used to cut through the semiconductor wafer 100 and the transparent substrate 11 in the die-sawing process, the thick sawing blade used in the self-cutting process illustrated in FIG. 10A may have a width greater than that of the thin sawing blade used in the die-sawing process by more than 150 micrometers, such as between 150 micrometers and 1 millimeter or between 200 and 500 micrometers. After the die-sawing process, the image or light sensor chip 99*a* is detached from the covering material, e.g., blue tape. The solder balls 72 of the image or light sensor chip 99*a* can be connected to an external circuit, such as ball-grid-array (BGA) substrate, printed circuit board, semiconductor chip, metal substrate, glass substrate or ceramic substrate, and can be connected to the metal structures 57 through the metal traces 66.

Figure 10M:
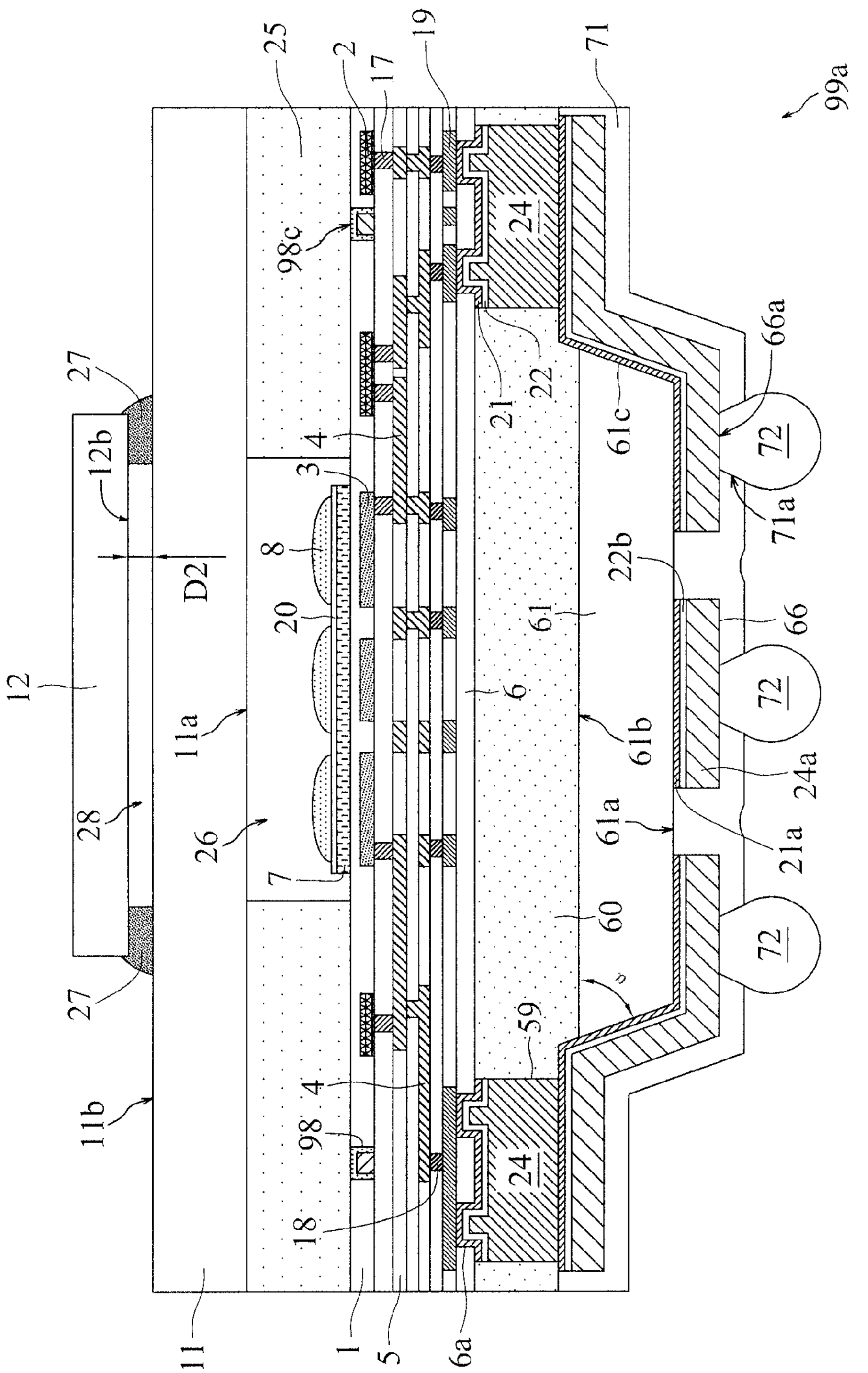

Referring to FIG. 10M, after the image or light sensor chip 99*a* is detached from the covering material (blue tape), the step illustrated in FIG. 1I can be performed to attach the infrared (IR) cut filter 12 to the top surface 11*b* of the transparent substrate 11 by the adhesive material 27. The infrared (IR) cut filter 12 is formed over the cavity, free space or air space 26, over the microlenses 8, over the layer 7 of optical or color filter array and over the light sensors 3. For more detailed description, please refer to the illustration in FIG. 1I.

Figure 11A:
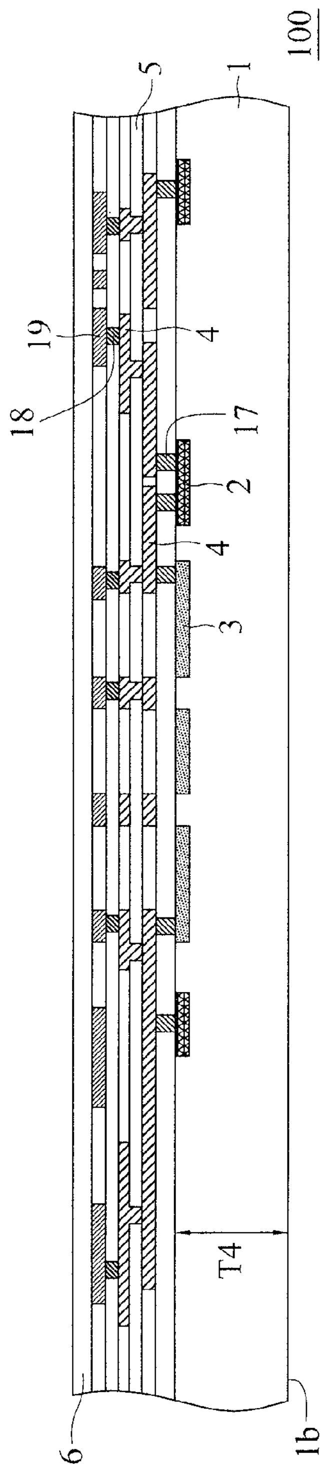
Figure 11B:
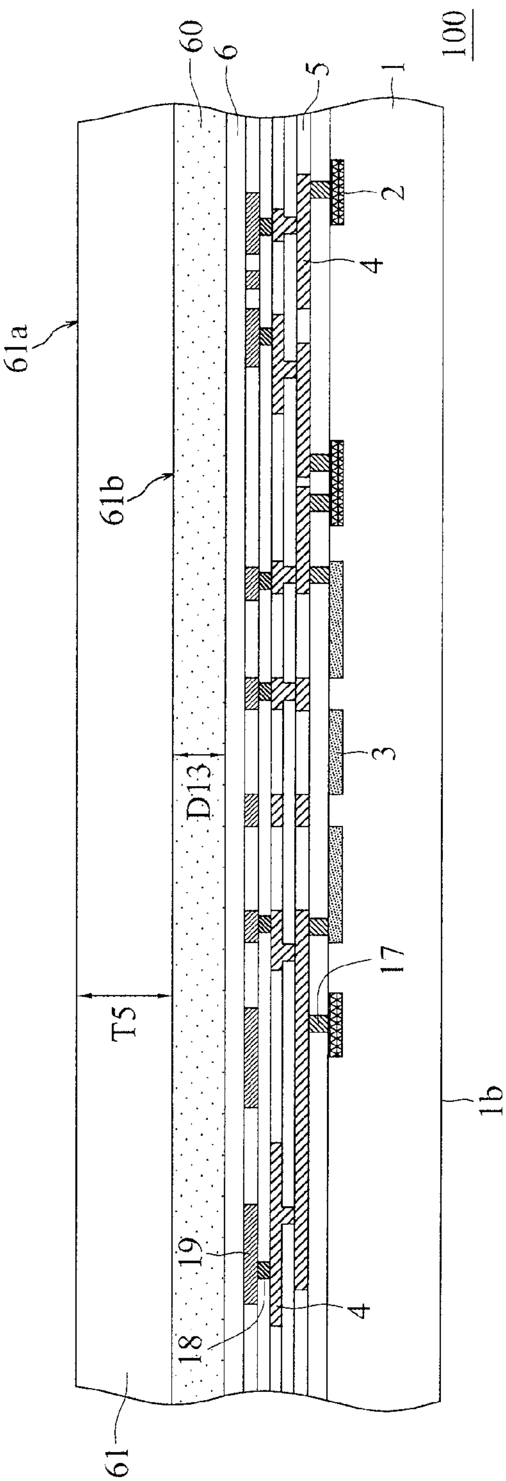
Figure 11C:
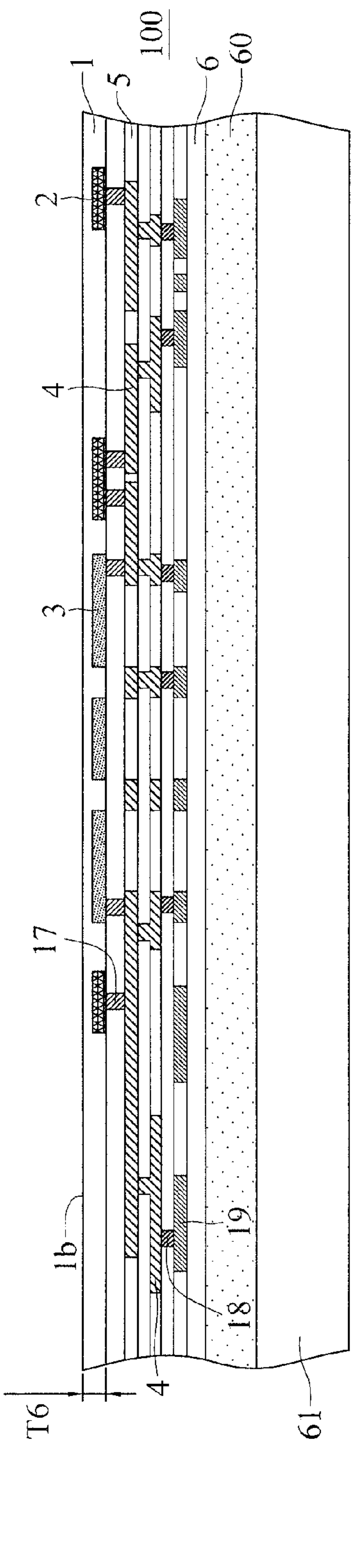
Figure 11D:
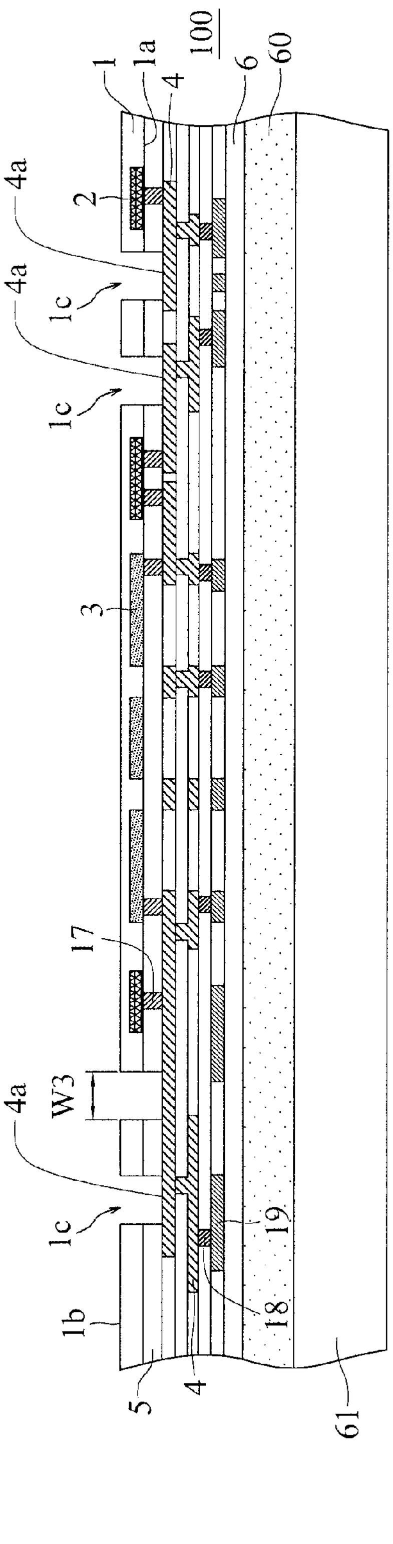
Figure 11E:
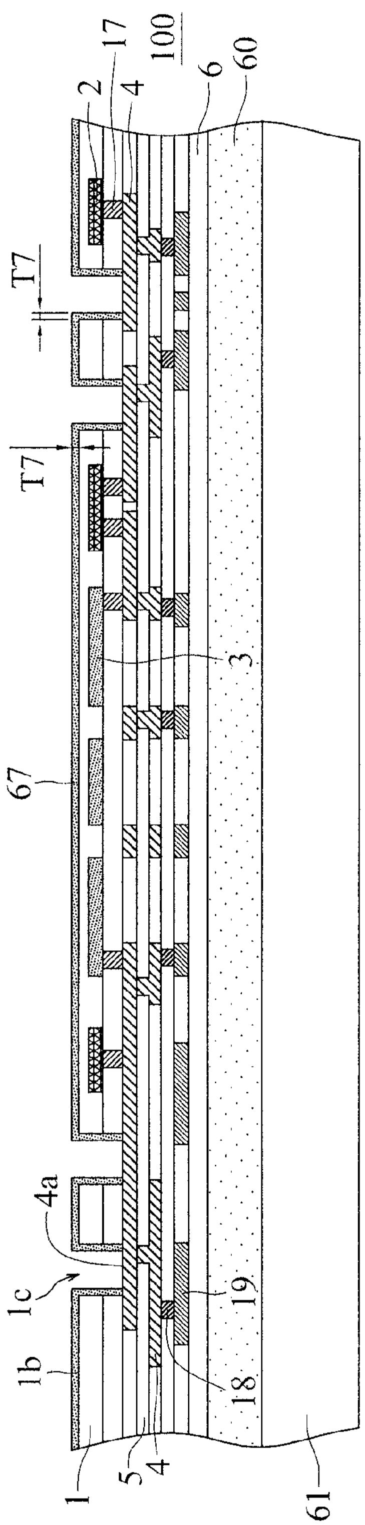
Figure 11F:
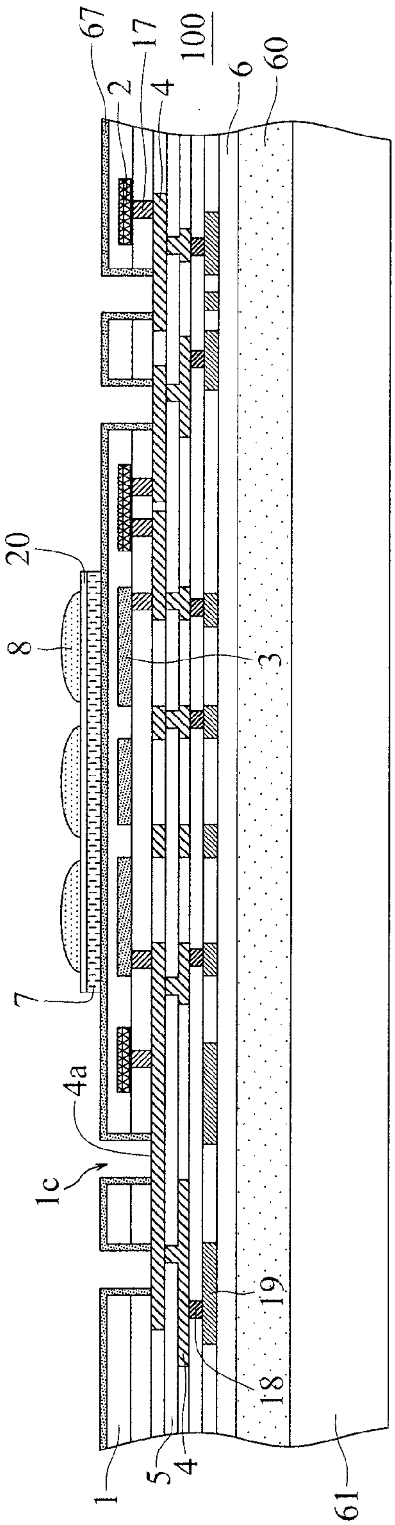
Figure 11G:
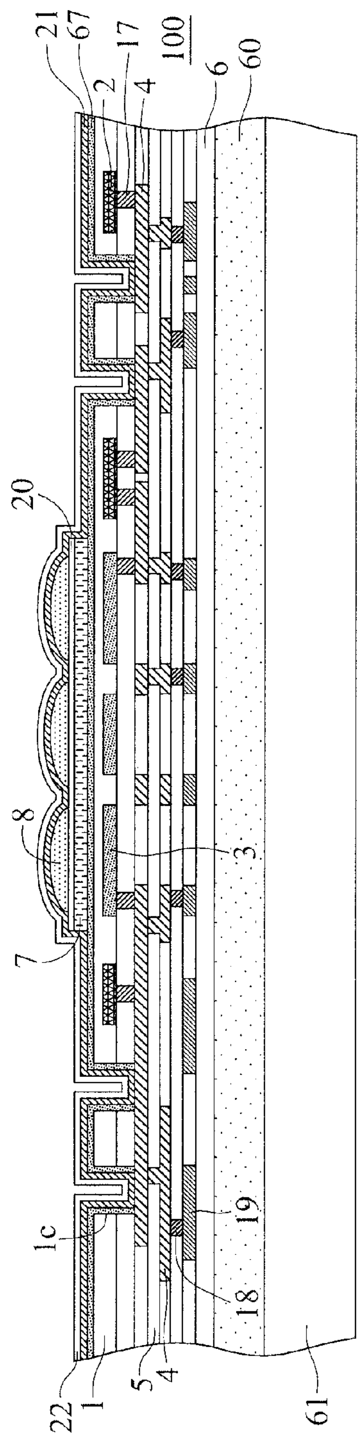
Figure 11H:
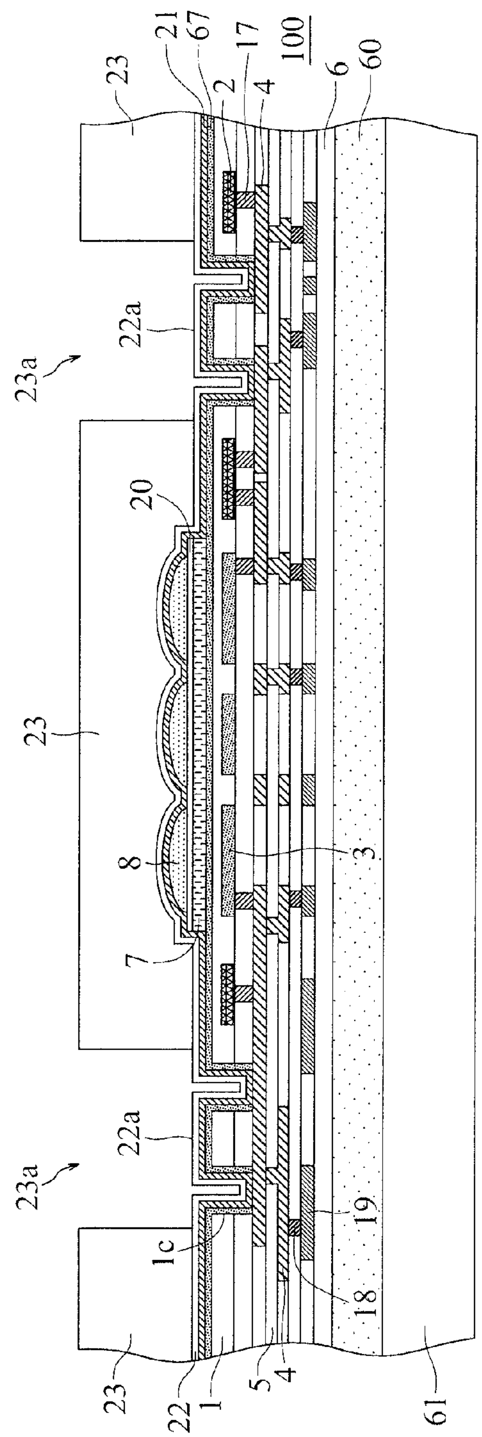
Figure 11I:
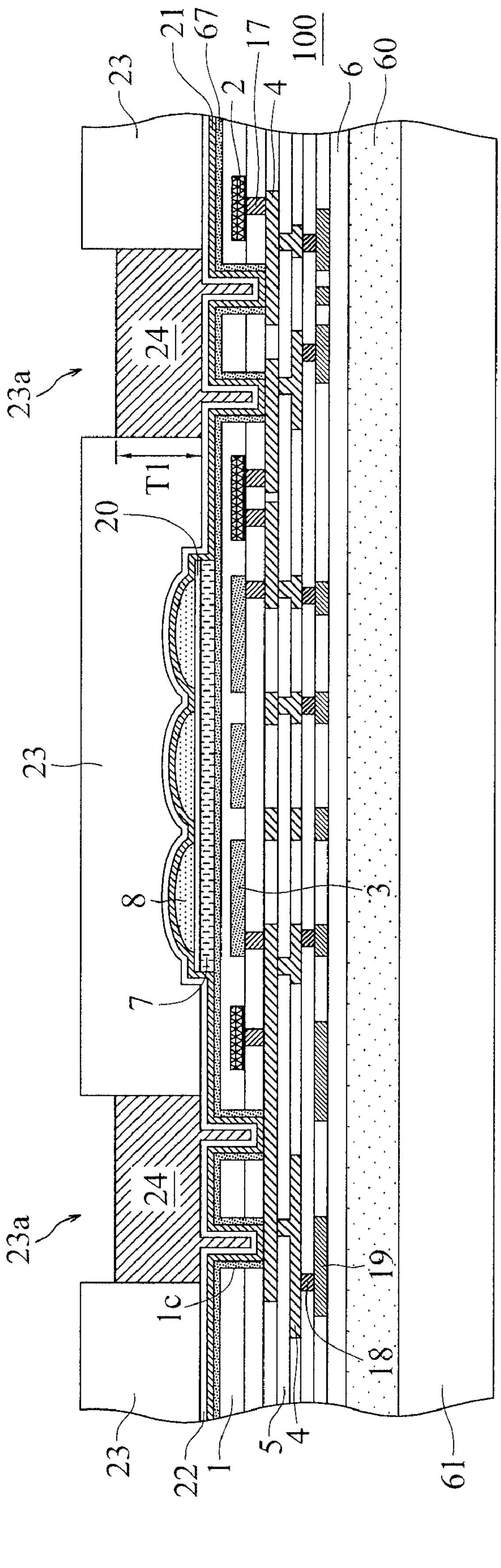
Figure 11J:
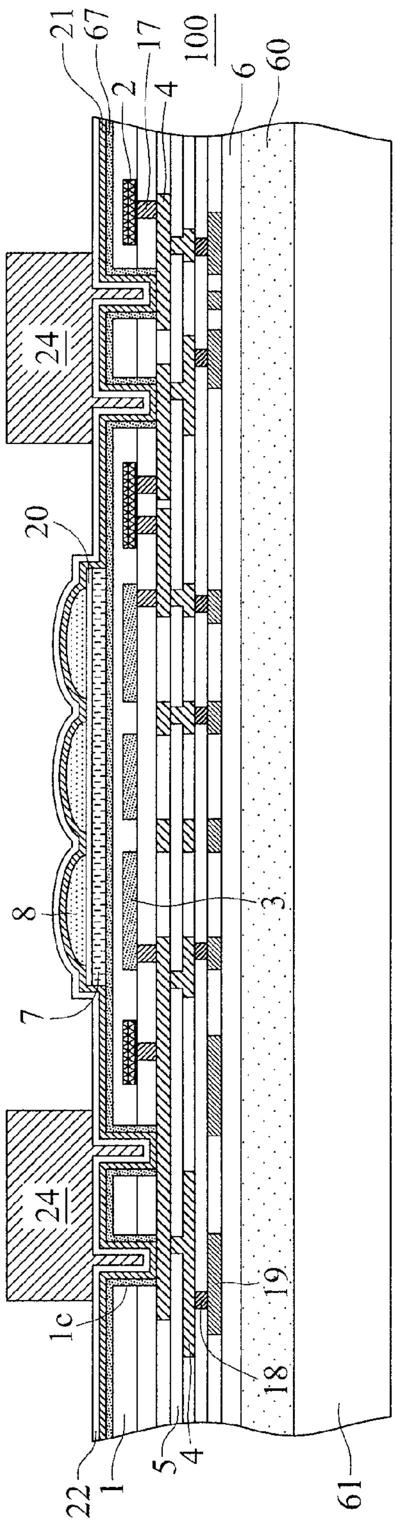
Figure 11K:
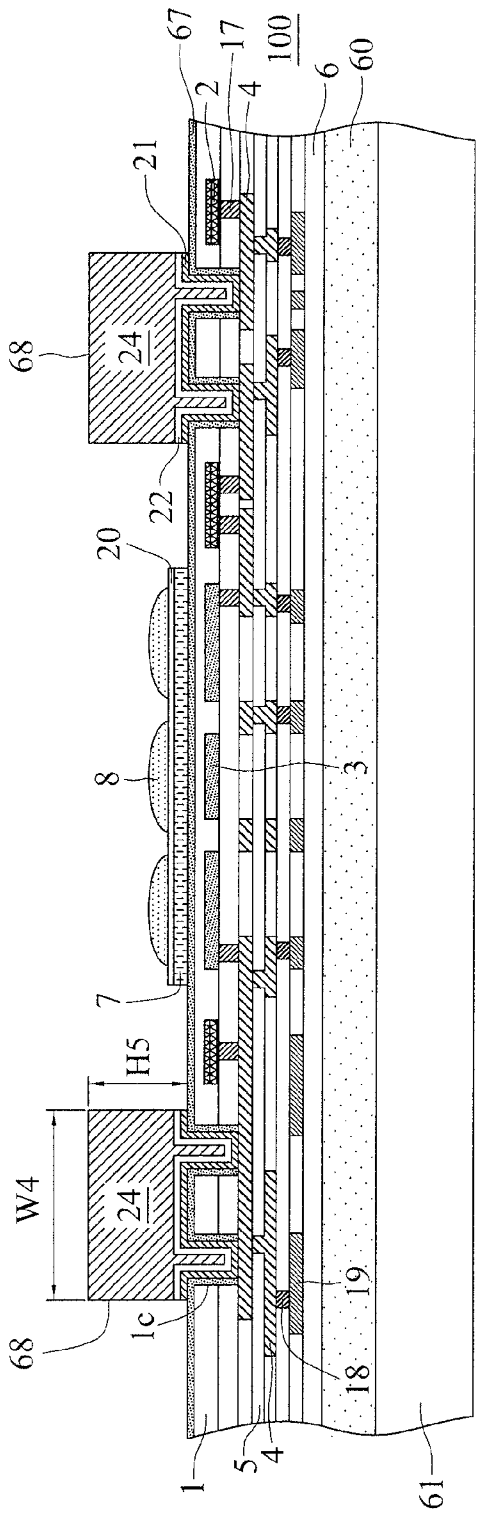
Figure 11L:
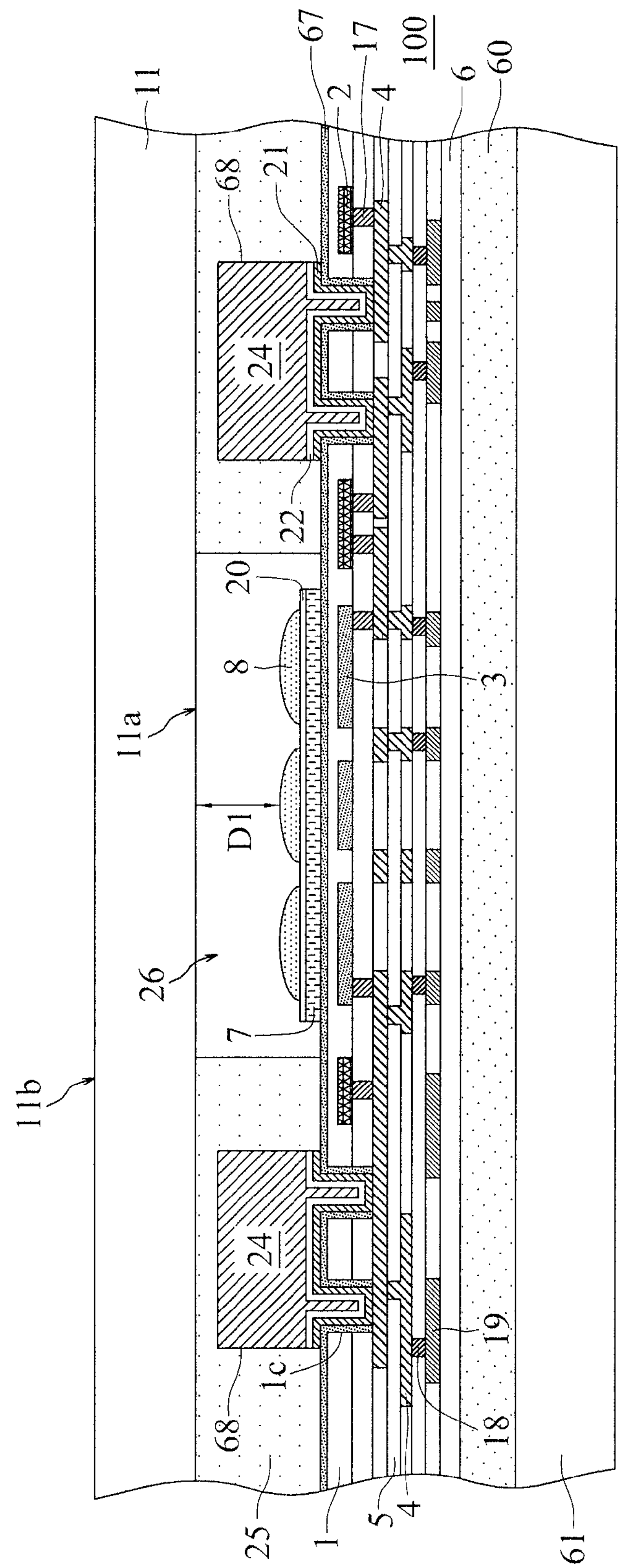
Figure 11M:
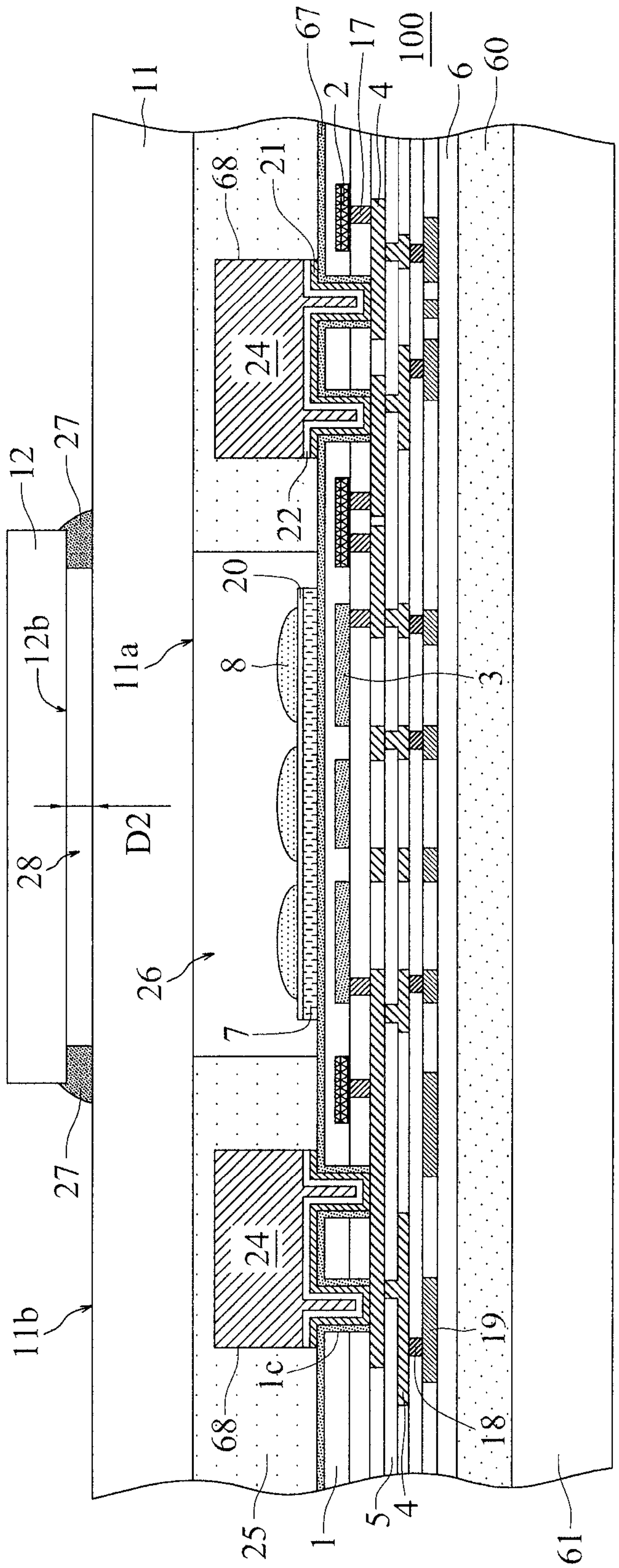
Figure 11N:
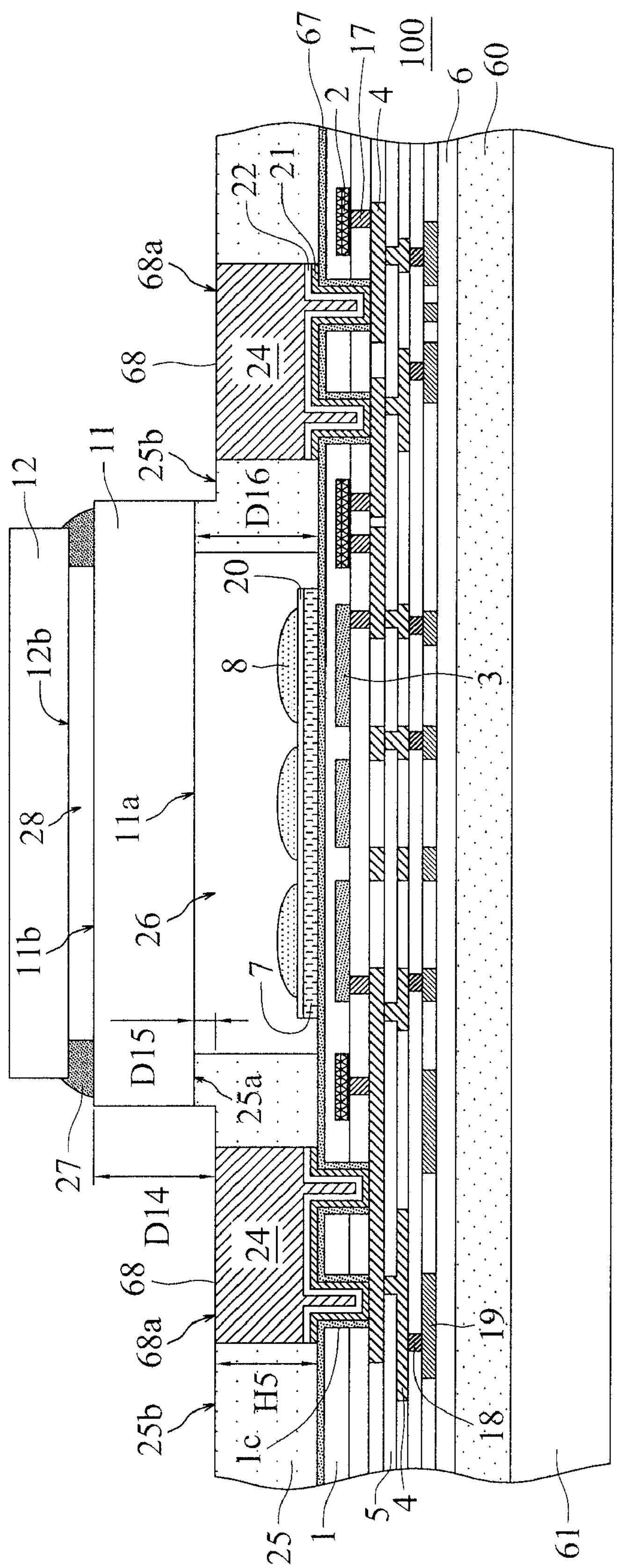
Figure 11O:
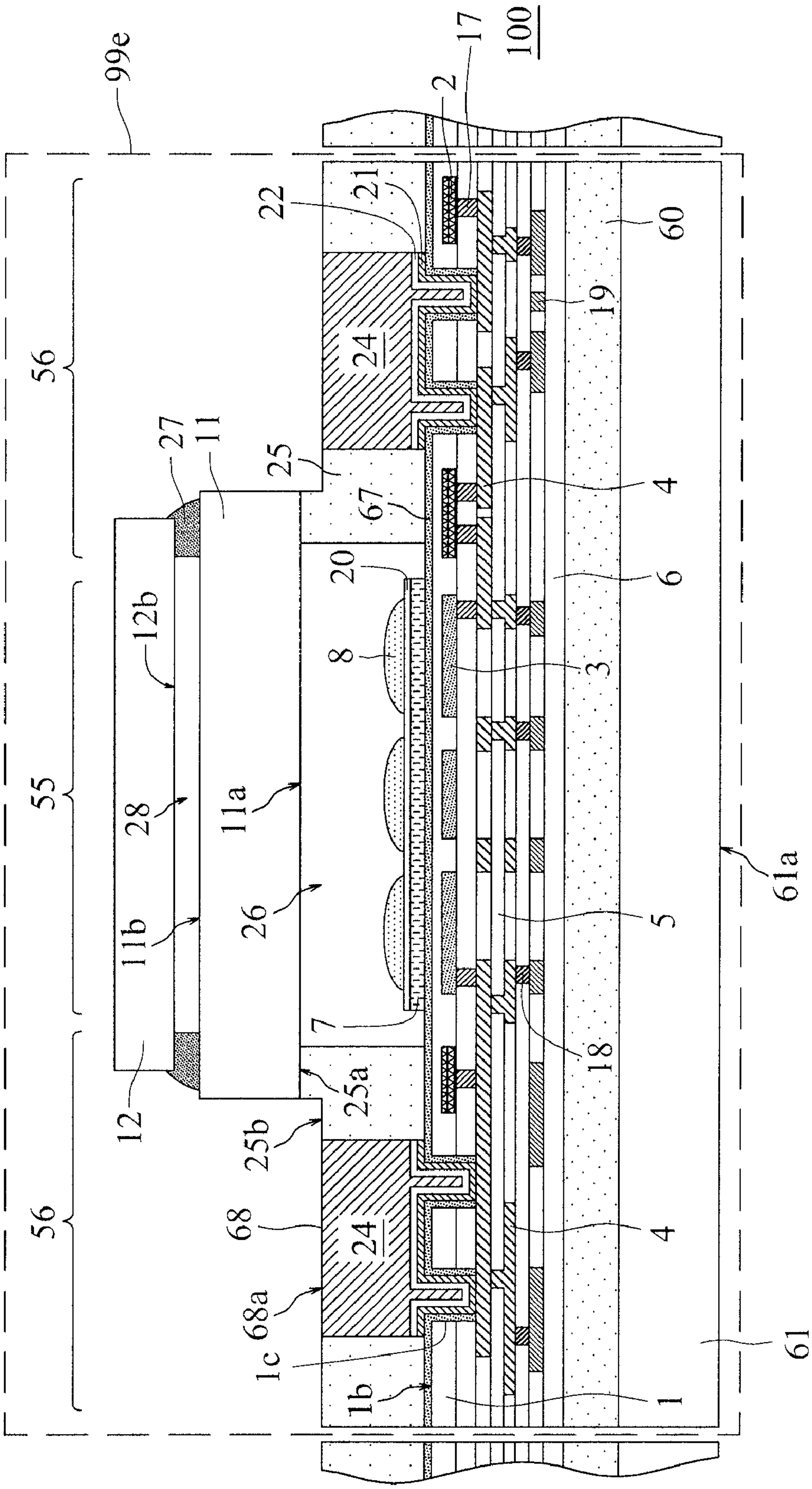

FIGS. 11A-11O show a process for forming an image or light sensor chip according to embodiments of the present disclosure. Referring to FIG. 11A, a semiconductor wafer 100 is provided with a semiconductor substrate 1, multiple semiconductor devices 2, multiple light sensors 3, multiple interconnection layers 4, multiple dielectric layers 5, multiple via plugs 17 and 18, multiple metal traces or pads 19 and a passivation layer 6. The semiconductor substrate 1 can be, e.g., a silicon substrate, a silicon-germanium substrate or a gallium arsenide (GaAs) substrate, and has a thickness T4, e.g., between 50 micrometers and 1 millimeter, and preferably between 75 and 250 micrometers. An element in FIG. 11A indicated by the same reference number as indicated for a like or similar element in FIG. 1A can have or be made from the same material(s) and/or have the same specification as the respective element in FIG. 1A.

Referring to FIG. 11B, an adhesive polymer 60 of epoxy, polyimide, SU-8 or acrylic attaches a substrate 61 to the top surface of the semiconductor wafer 100 using a thermal compressing process at a temperature between 150° C. and 500° C., and preferably between 180° C. and 250° C. The substrate 61 has a top surface 61*a* and a bottom surface 61*b*, and a vertical distance D13 between the top surface of the passivation layer 6 and the bottom surface 61*b* is between 5 and 50 micrometers, and preferably between 15 and 20 micrometers. The substrate 61 may have a thickness, e.g., T5 between 50 micrometers and 1 millimeter, between 100 and 500 micrometers or between 100 and 300 micrometers, and can be a silicon substrate, a polymer-containing substrate, a glass substrate, a ceramic substrate or a metal substrate including copper or aluminum, where the polymer-containing substrate may include acrylic.

Next, referring to FIG. 11C, the semiconductor wafer 100 is flipped over, and then the semiconductor substrate 1 is thinned to a thickness T6, e.g., between 1.5 and 5 micrometers, between 1 and 10 micrometers or between 3 and 50 micrometers by a suitable process such as grinding or chemical mechanical polishing (CMP) the bottom surface 1*b* of the semiconductor substrate 1. Alternatively, the above-mentioned step of flipping over the semiconductor wafer 100 can be moved after the above-mentioned step of thinning the semiconductor substrate 1, to perform the following processes.

Next, referring to FIG. 11D, using a dry etching process, multiple through vias 1*c* are formed in the thinned semiconductor substrate 1 and at least one dielectric layer 5, exposing regions 4*a* of the interconnection layer 4. The through vias 1*c* penetrate completely through the thinned semiconductor substrate 1 and the dielectric layer 5. The through vias 1*c* have a depth between 1 and 10 micrometers or between 1.5 and 5 micrometers, and a diameter or width W3 between 5 and 100 micrometers or between 10 and 30 micrometers.

Next, referring to FIG. 11E, an insulating layer 67 having a thickness T7 between 0.2 and 2 micrometers, between 2 and 5 micrometers or between 5 and 30 micrometers can be formed on the bottom surface 1*b* of the thinned semiconductor substrate 1 and on sidewalls of the through vias 1*c*. The insulating layer 67, for example, can be a polymer layer, such as polyimide layer, benzocyclobutene layer or polybenzoxazole layer, a nitride layer, such as silicon-nitride layer, a silicon-oxynitride layer, a silicon-carbon-nitride (SiCN) layer, a silicon-oxycarbide (SiOC) layer or a silicon-oxide layer on the bottom surface 1*b* of the thinned semiconductor substrate 1 and on sidewalls of the through vias 1*c*.

Alternatively, the insulating layer 67 may include a first layer having a thickness, e.g., between 0.2 and 30 micrometers or between 0.5 and 5 micrometers on the bottom surface 1*b* of the thinned semiconductor substrate 1, and a second layer having a thickness, e.g., between 0.2 and 30 micrometers or between 0.5 and 5 micrometers on the sidewalls of the through vias 1*c*. In a first case, the first layer can be formed by depositing a silicon-nitride or silicon-carbon-nitride layer having a thickness between 0.2 and 1.2 micrometers on the bottom surface 1*b* of the thinned semiconductor substrate 1 using a chemical mechanical deposition (CVD) process. In a second case, the first layer can be formed by depositing a silicon-oxide or silicon oxycarbide layer having a thickness between 0.2 and 1.2 micrometers on the bottom surface 1*b* of the thinned semiconductor substrate 1 using a chemical mechanical deposition (CVD) process, and then depositing a silicon-nitride or silicon-carbon-nitride layer having a thickness between 0.2 and 1.2 micrometers on the silicon-oxide or silicon oxycarbide layer using a chemical mechanical deposition (CVD) process. In a third case, the first layer can be formed by depositing a silicon-nitride layer having a thickness between 0.2 and 1.2 micrometers on the bottom surface 1*b* of the thinned semiconductor substrate 1 using a chemical mechanical deposition (CVD) process, and then coating a polymer layer having a thickness between 2 and 30 micrometers on the silicon-nitride. The second layer can be a polymer layer, such as polyimide layer, benzocyclobutene layer, polybenzoxazole layer, a nitride layer, such as silicon-nitride layer, a silicon-oxynitride layer, a silicon-carbon-nitride (SiCN) layer, a silicon-oxycarbide (SiOC) layer, a silicon-oxide layer on the sidewalls of the through vias 1*c*.

Next, referring to FIG. 11F, a layer 7 of optical or color filter array can be formed on the insulating layer 67, over the light sensors 3 and over the transistors of the light sensors 3, then a buffer layer 20 can be formed on the layer 7 of optical or color filter array, and then multiple microlenses 8 can be formed on the buffer layer 20, over the layer 7 of optical or color filter array and over the light sensors 3. The specification of the layer 7 of optical or color filter array, the buffer layer 20 and the microlenses 8 as shown in FIG. 11F can be similar to or the same as the specification of the layer 7 of optical or color filter array, the buffer layer 20 and the microlenses 8 as illustrated in FIG. 1A.

Next, referring to FIG. 11G, an adhesion/barrier layer 21 having a suitable thickness, e.g., between 1 nanometer and 0.8 micrometers, and preferably between 0.01 and 0.7 micrometers, can be formed on the regions 4*a* of the interconnection layer 4 exposed by the through vias 1*c*, on the insulating layer 67 and in the through vias 1*c*. The adhesion/barrier layer 21 can be formed by sputtering a titanium-containing layer, such as titanium layer, titanium-tungsten-alloy layer or titanium-nitride layer, a tantalum-containing layer, such as tantalum layer or tantalum-nitride layer, a chromium-containing layer, such as chromium layer, or a nickel layer having a thickness, e.g., between 1 nanometer and 0.8 micrometers, and preferably between 0.01 and 0.7 micrometers, on the regions 4*a* of the interconnection layer 4 exposed by the through vias 1*c*, on the insulating layer 67 and in the through vias 1*c*.

After forming the adhesion/barrier layer 21, a seed layer 22 having a suitable thickness, e.g., between 0.01 and 2 micrometers, and preferably between 0.02 and 0.5 micrometers, can be formed on the adhesion/barrier layer 21 and in the through vias 1*c*. The seed layer 22 can be formed by sputtering a copper layer, a gold layer or a silver layer having a thickness, e.g., between 0.01 and 2 micrometers, and preferably between 0.02 and 0.5 micrometers, on the adhesion/barrier layer 21 of any above-mentioned material and in the through vias 1*c*.

Referring to FIG. 11H, after forming the seed layer 22, a patterned photoresist layer 23 can be formed on the seed layer 22 of any above-mentioned material, and multiple openings 23*a* in the patterned photoresist layer 23 can expose multiple regions 22*a* of the seed layer 22 of any above-mentioned material. Next, referring to FIG. 11I, a metal layer 24 can be formed on the regions 22*a* of the seed layer 22 of any above-mentioned material and in the through vias 1*c*. The metal layer 24 may have a thickness T1, e.g., between 1 and 15 micrometers, between 5 and 50 micrometers or between 3 and 100 micrometers, and greater than that of the seed layer 22, that of the adhesion/barrier layer 21 and that of each of the interconnection layers 4, respectively. The process of forming the metal layer 24 as shown in FIG. 11I can be referred to as the process of forming the metal layer 24 as illustrated in FIG. 1D, and the specification of the metal layer 24 shown in FIG. 11I can be referred to as the specification of the metal layer 24 as illustrated in FIG. 1D.

Referring to FIG. 11J, after forming the metal layer 24, the patterned photoresist layer 23 can be removed. Next, referring to FIG. 11K, the seed layer 22 not under the metal layer 24 is removed by using a wet-etching process or a dry-etching process, and then the adhesion/barrier layer 21 not under the metal layer 24 is removed by using a wet-etching process or a dry-etching process.

Accordingly, multiple metal structures 68, composed of the adhesion/barrier layer 21, the seed layer 22 and the metal layer 24, can be formed on the regions 4*a* of the interconnection layer 4 exposed by the through vias 1*c*, on the insulating layer 67 and in the through vias 1*c*, where sidewalls of the metal layer 24 are not covered by the adhesion/barrier layer 21 and the seed layer 22. The metal structures 68 can be metal bumps, metal pillars or metal traces, and may have a height H5, e.g., between 1 and 15 micrometers, between 5 and 50 micrometers or between 3 and 100 micrometers, and a diameter or width W4, e.g., between 5 and 100 micrometers, and preferably between 5 and 50 micrometers.

Next, referring to FIG. 11L, a patterned adhesive polymer 25 attaches a transparent substrate 11, such as glass substrate, to the insulating layer 67 using a thermal compressing process at a temperature between 150° C. and 500° C., and preferably between 180° C. and 250° C. After attaching the transparent substrate 11 to the insulating layer 67, a cavity, free space or air space 26 is formed between and enclosed by the patterned adhesive polymer 25, the insulating layer 67 and a bottom surface 11*a* of the transparent substrate 11. An air gap is between a top of one of the microlenses 8 and the bottom surface 11*a* of the transparent substrate 11, and a vertical distance D1 between a top of one of the microlenses 8 and the bottom surface 11*a* of the transparent substrate 11 is between, e.g., 10 and 300 micrometers, and preferably between 20 and 100 micrometers. The specification of the cavity, free space or air space 26 as shown in FIG. 11L can be the same as or similar to the specification of the cavity, free space or air space 26 as illustrated in FIG. 1H.

Next, referring to FIG. 11M, the step illustrated in FIG. 1I can be performed to attach the infrared (IR) cut filter 12 to the top surface 11*b* of the transparent substrate 11 by the adhesive material 27. The infrared (IR) cut filter 12 is formed over the cavity, free space or air space 26, over the microlenses 8, over the layer 7 of optical or color filter array and over the light sensors 3. For more detailed description, please refer to the illustration in FIG. 1I.

Next, referring to FIG. 11N, a covering material, e.g., blue tape of desired tack and thickness (not shown), can be attached to the substrate 61, and then multiple portions of the transparent substrate 11 and the patterned adhesive polymer 25 over the metal structures 68 can be removed by a self-cutting process of a thick sawing blade cutting it with a cutting depth D14, e.g., between 200 and 500 micrometers. Accordingly, top surfaces 68*a* of the metal structures 68 are not covered by any of the transparent substrate 11 and the patterned adhesive polymer 25. The patterned adhesive polymer 25 have a first region 25*a* contacting with the bottom surface 11*a* of the transparent substrate 11 and a second region 25*b* uncovered by the transparent substrate 11 and existing substantially coplanar with the top surfaces 68*a* of the metal structures 68, where the first region 25*a* is at a first horizontal level higher than a second horizontal level, at which the second region 25*b* is, and a vertical distance D15 between the first region 25*a* and the second region 25*b* is greater than 5 micrometers, such as between 5 and 50 micrometers or between 50 and 100 micrometers. A vertical distance D16 between the top surface of the insulating layer 67 and the bottom surface 11*a* of the transparent substrate 11 can be between 20 and 150 micrometers, and preferably between 30 and 70 micrometers, and can be greater than the height H5 of the metal structures 68.

Next, referring to FIG. 11O, a die-sawing process is performed by using a thin sawing blade or a laser cutting process to cut through the semiconductor wafer 100 to form an image or light sensor chip 99*e*. If a thin sawing blade is used to cut through the semiconductor wafer 100 in the die-sawing process, the thick sawing blade used in the step illustrated in FIG. 11N may have a width greater than that of the thin sawing blade used in the die-sawing process, e.g., by more than 150 micrometers, such as between 150 micrometers and 1 millimeter or between 200 and 500 micrometers. After the die-sawing process, the image or light sensor chip 99*e* can be detached from the blue tape.

Alternatively, an oxygen plasma etching process, used to remove a portion of the patterned adhesive polymer 25 not under the transparent substrate 11 to expose upper portions of the metal structures 68, can be performed before or after the die-sawing process, such that the metal structures 68 have a height, extruding from the patterned adhesive polymer 25, between, e.g., 0.5 and 20 micrometers, and preferably between 5 and 15 micrometers. Accordingly, the metal structures 68 of the image or light sensor chip 99*e* have the upper portions uncovered by the patterned adhesive polymer 25, and bonded with the bond pads or inner leads 15 of the above-mentioned flexible substrate 9 or 9*a* by a chip-on-film (COF) process or with multiple metal pads of a substrate, such as printed circuit board, ball-grid-array (BGA) substrate, metal substrate, glass substrate or ceramic substrate.

The image or light sensor chip 99*e* includes a photosensitive area 55 where there are the light sensors 3, the layer 7 of optical or color filter array, the microlenses 8, the transparent substrate 11, the infrared (IR) cut filter 12 and the cavities, free spaces or air spaces 26 and 28, and a non-photosensitive area 56 where there are the metal structures 68 and the through vias 1*c*. The photosensitive area 55 is surrounded by the non-photosensitive area 56.

Figure 11P:
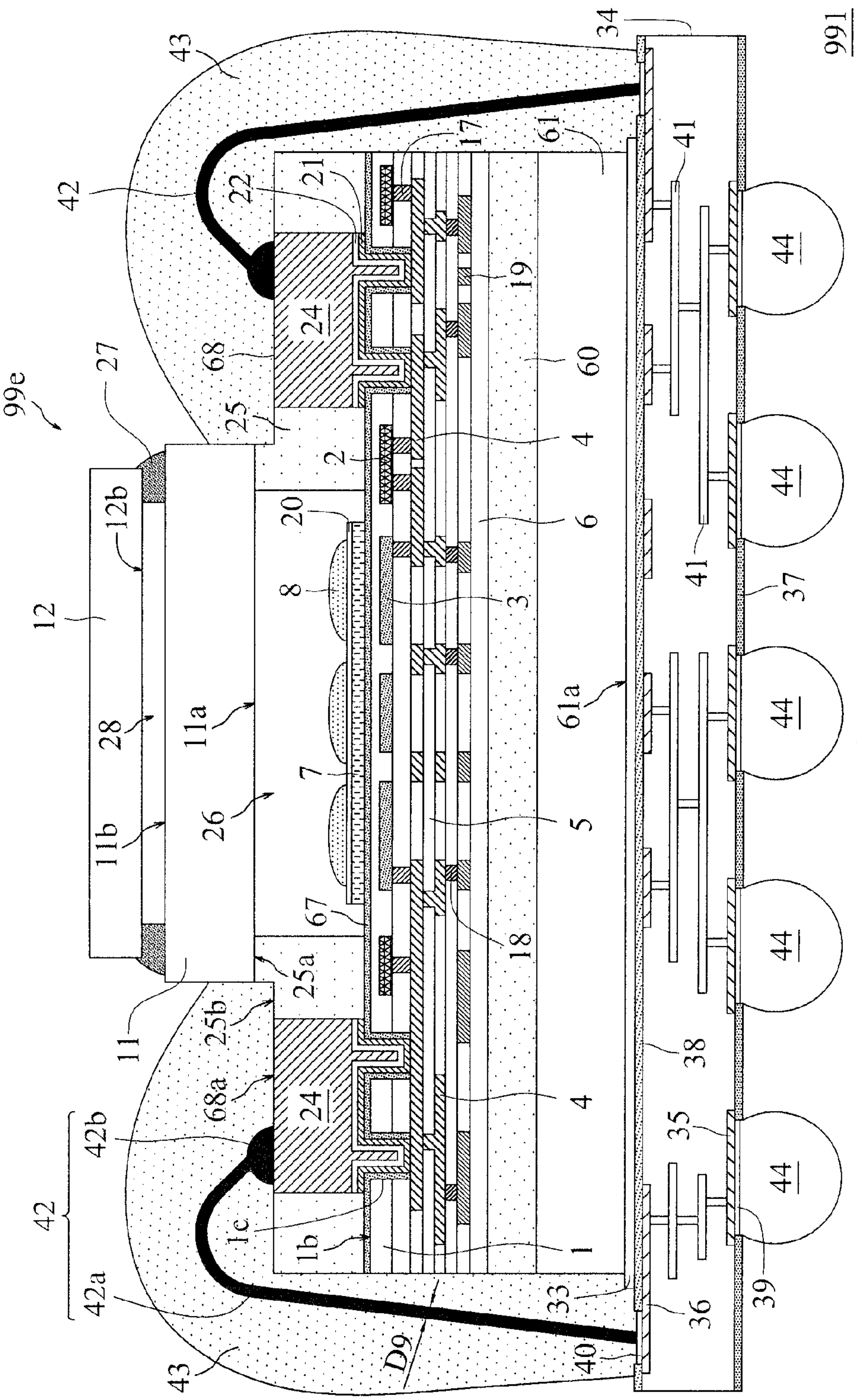

FIG. 11P is a cross-sectional view depicting an image or light sensor package according to an embodiment of the present disclosure. The image or light sensor chip 99*e* shown in FIG. 11O can be packaged by the steps illustrated in FIGS. 3A-3D to form an image or light sensor package 991. The wirebonded wires 42 each have one end ball bonded with the metal layer 24 of one of the metal structures 68 of the image or light sensor chip 99*e*, and the other end wedge bonded with the metal layer 40 of the package substrate 34. The specification of the wirebonded wires 42 ball bonded with the metal layer 24 as shown in FIG. 11P can be referred to as the specification of the wirebonded wires 42 ball bonded with the metal layer 24 as illustrated in FIG. 3B. The encapsulation material 43 can be formed on the wirebonded wires 42, on the top surfaces 68*a* of the metal structures 68, on the top surface of the package substrate 34 and at sidewalls of the image or light sensor chip 99*e*, encapsulating the wirebonded wires 42. An element in FIG. 11P indicated by the same reference number as a like or similar element in FIGS. 3A-3D and 11A-11O can have the same or similar material(s) and/or specification as the respective element shown and described for FIGS. 3A-3D and 11A-11O.

Figure 12A:
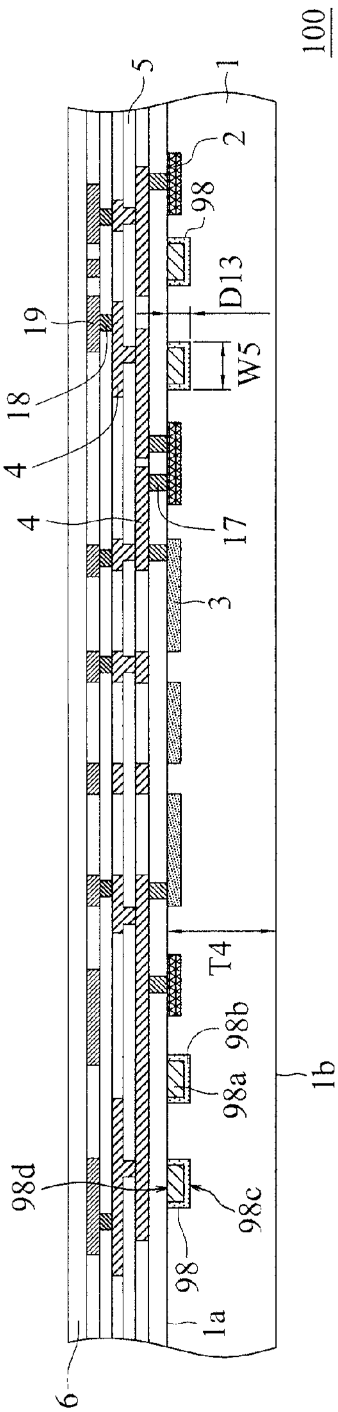
FIGS. 12A-12G are cross-sectional views depicting a process of forming an image or light sensor chip according to an embodiment of the present disclosure.

FIGS. 12A-12G show a process for forming an image or light sensor chip according to further embodiments of the present disclosure. Referring to FIG. 12A, a semiconductor wafer 100 is similar to that shown in FIG. 9A except that the etching stops 98 each have a width W5, e.g., between 3 and 15 micrometers or between 15 and 35 micrometers. An element in FIG. 12A indicated by the same reference number as a like or similar element in FIGS. 1A and 9A can have or include the same material(s) and/or specification as the respective element in FIGS. 1A and 9A.

Figure 12B:
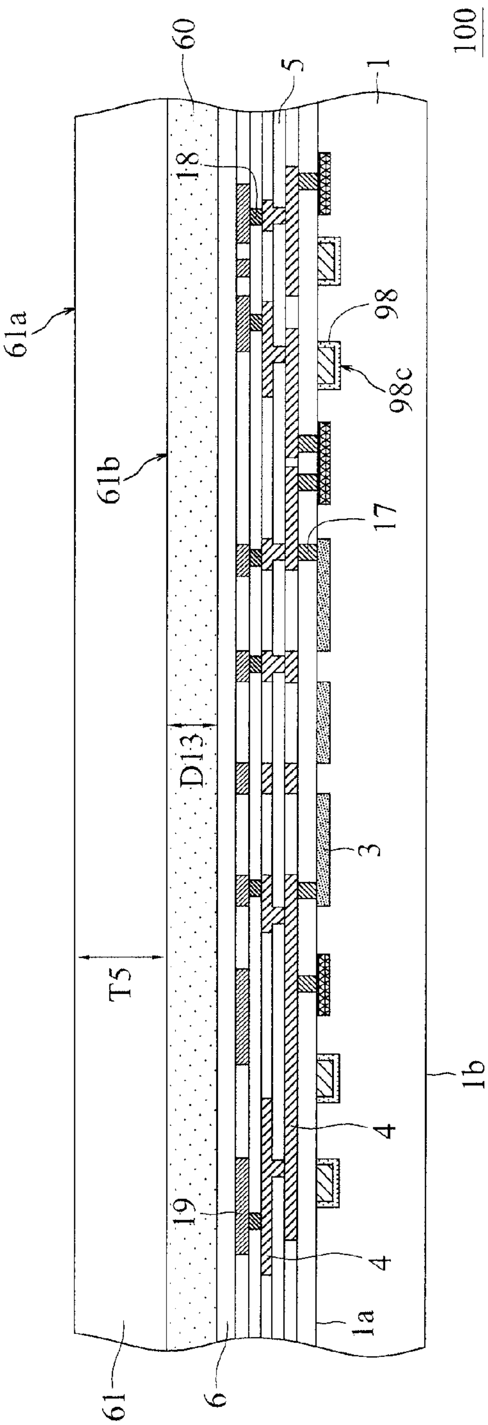

Referring to FIG. 12B, an adhesive polymer 60 of epoxy, polyimide, SU-8 or acrylic attaches a substrate 61 to the top surface of the semiconductor wafer 100 using a thermal compressing process at a temperature between 150° C. and 500° C., and preferably between 180° C. and 250° C. A vertical distance D13 between the top surface of the passivation layer 6 and the bottom surface 61*b* is, e.g., between 5 and 50 micrometers, and preferably between 15 and 20 micrometers. The specification of the substrate 61 can be the same as the substrate 61 illustrated in FIG. 11B.

Figure 12C:
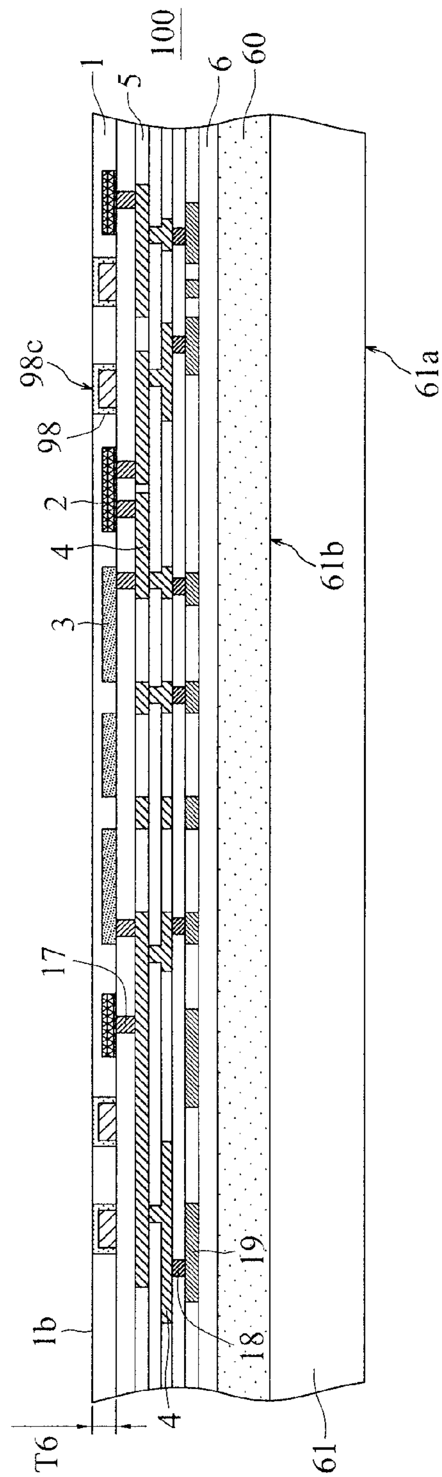

Next, referring to FIG. 12C, the semiconductor wafer 100 is flipped over, and then the semiconductor substrate 1 is thinned to expose the first surfaces 98*c* of the etching stops 98 by grinding or chemical mechanical polishing (CMP) the bottom surface 1*b* of the semiconductor substrate 1. Accordingly, the thinned semiconductor substrate 1 has a thickness T6, e.g., between 1.5 and 5 micrometers, between 1 and 10 micrometers or between 3 and 50 micrometers, and the first surfaces 98*c* of the etching stops 98 are substantially coplanar with the bottom surface 1*b* of the thinned semiconductor substrate 1. Alternatively, the above-mentioned step of flipping over the semiconductor wafer 100 can be moved after the above-mentioned step of thinning the semiconductor substrate 1, to perform the following processes.

Figure 12D:
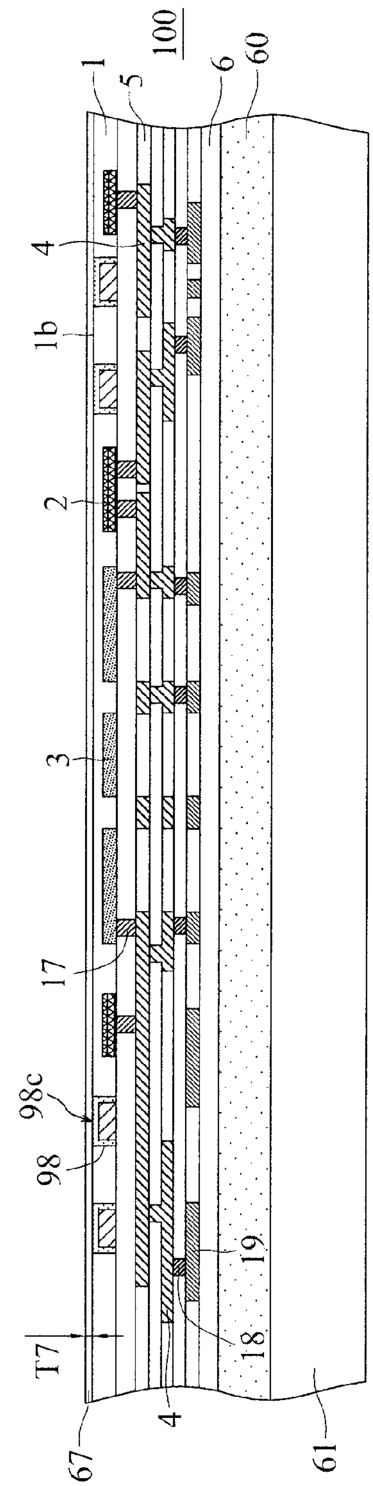

Next, referring to FIG. 12D, an insulating layer 67 having a thickness T7, e.g., between 0.2 and 2 micrometers, between 2 and 5 micrometers or between 5 and 30 micrometers can be formed on the bottom surface 1*b* of the thinned semiconductor substrate 1 and on the first surfaces 98*c* of the etching stops 98. For example, the insulating layer 67 can be a polymer layer, such as polyimide layer, benzocyclobutene layer or polybenzoxazole layer, a nitride layer, such as silicon-nitride layer, a silicon-oxynitride layer, a silicon-carbon-nitride (SiCN) layer, a silicon-oxycarbide (SiOC) layer or a silicon-oxide layer having a thickness T7 between 0.2 and 2 micrometers, between 2 and 5 micrometers or between 5 and 30 micrometers on the bottom surface 1*b* of the thinned semiconductor substrate 1 and on the first surfaces 98*c* of the etching stops 98.

Figure 12E:
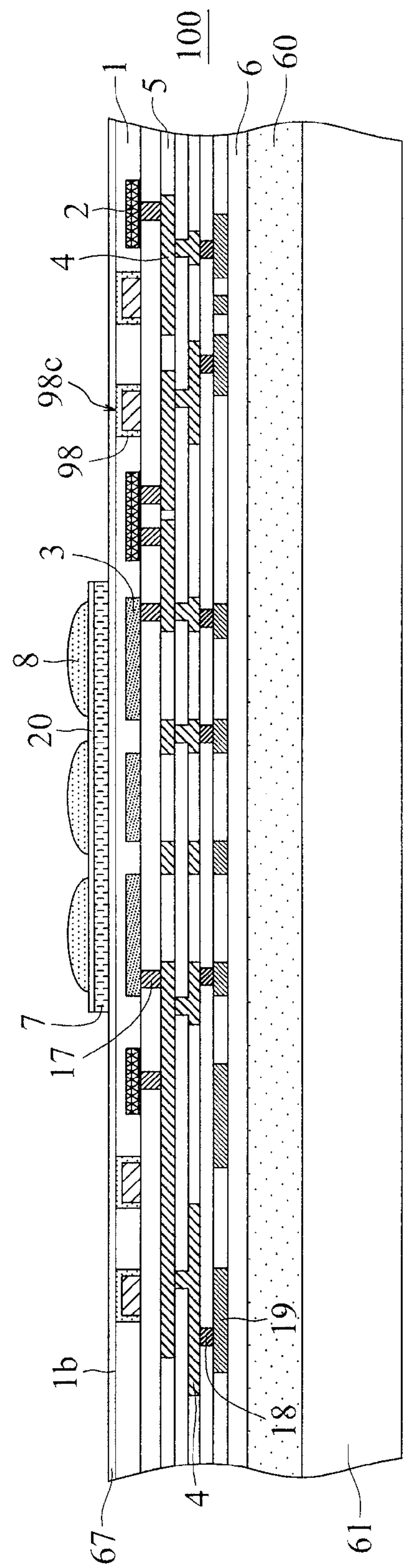

Next, referring to FIG. 12E, a layer 7 of optical or color filter array can be formed on the insulating layer 67, over the light sensors 3 and over the transistors of the light sensors 3, then a buffer layer 20 can be formed on the layer 7 of optical or color filter array, and then multiple microlenses 8 can be formed on the buffer layer 20, over the layer 7 of optical or color filter array and over the light sensors 3. The specification of the layer 7 of optical or color filter array, the buffer layer 20 and the microlenses 8 as shown in FIG. 12E can be referred to as the specification of the layer 7 of optical or color filter array, the buffer layer 20 and the microlenses 8 as illustrated in FIG. 1A.

Figure 12F:
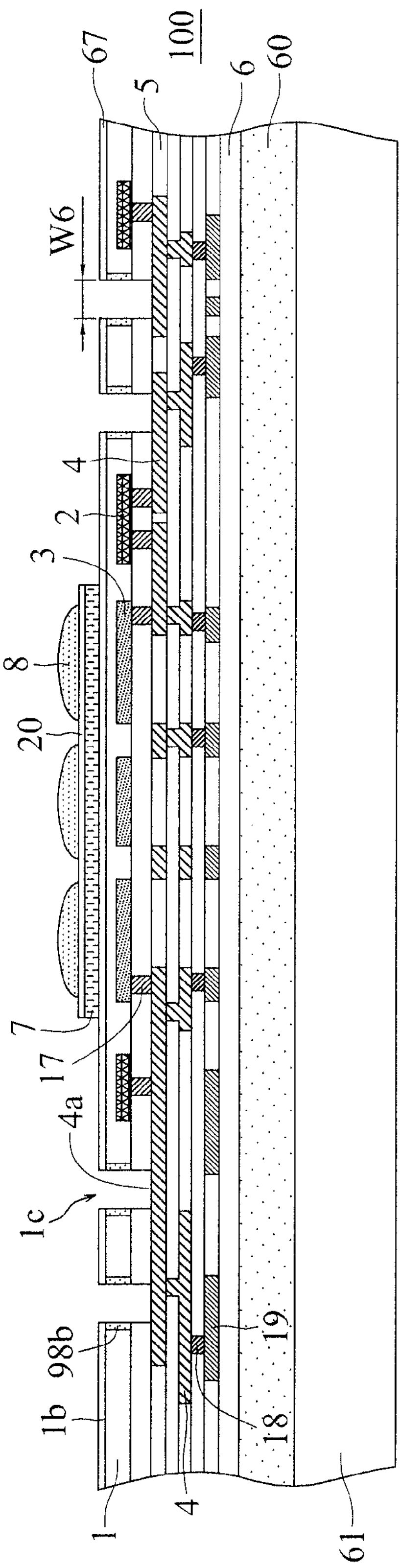

Next, referring to FIG. 12F, multiple through vias 1*c* are formed in the thinned semiconductor substrate 1, at least one dielectric layer 5 and the insulating layer 67, exposing regions 4*a* of the interconnection layer 4, by a photolithography process and an etching process to remove the first layer 98*a* of the etching stops 98, the insulating layer 67 on the etching stops 98, the second layer 98*b* at the top of the etching stops 98 and the dielectric layer 5 under the etching stops 98. The second layer 98*b* is not completely removed and has a portion in the thinned semiconductor substrate 1 and at sidewalls of the through vias 1*c*. The through vias 1*c* have a depth, e.g., between 1.5 and 5 micrometers, between 1 and 10 micrometers or between 5 and 50 micrometers, and a diameter or width W6 between 2 and 10 micrometers or between 10 and 30 micrometers.

Figure 12G:
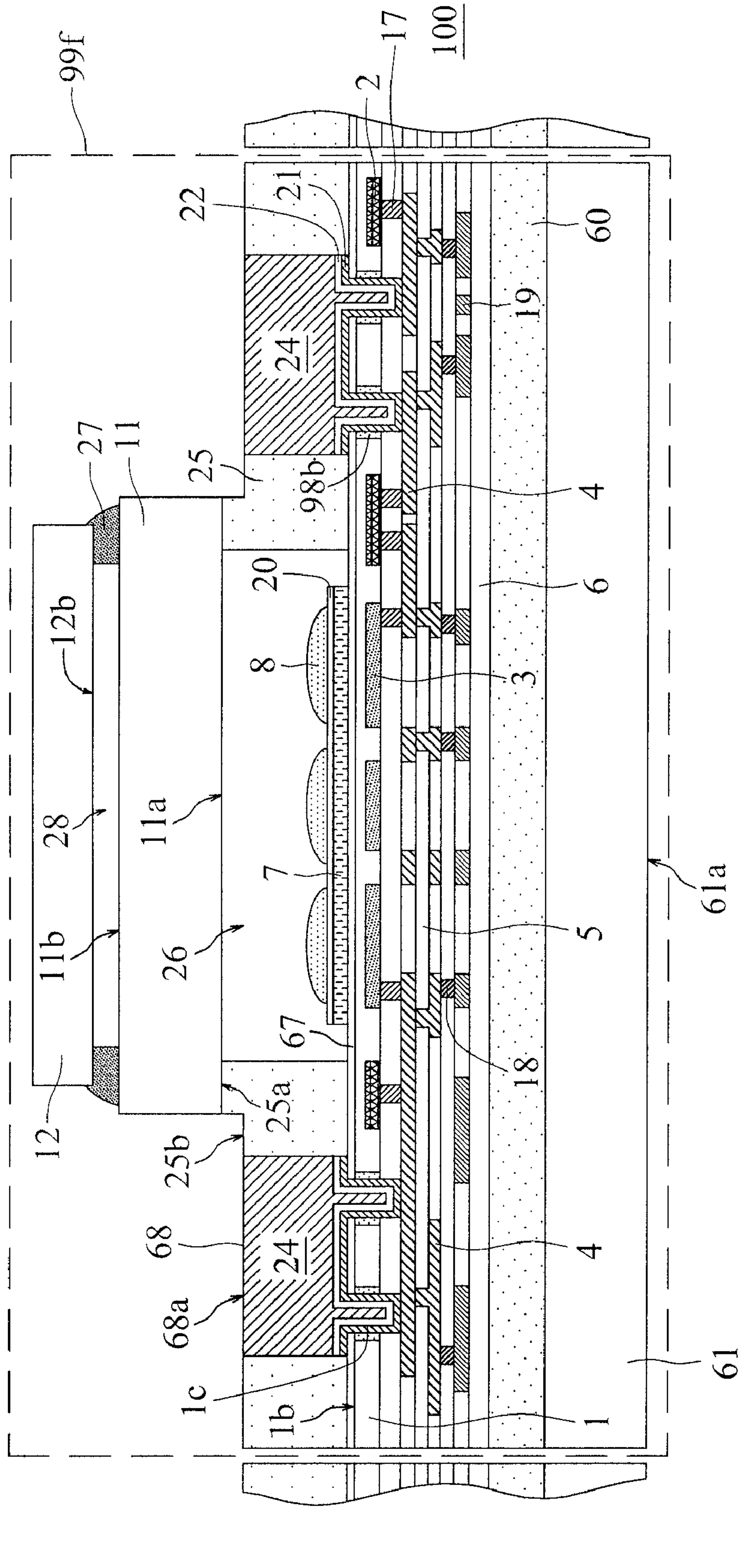

Next, referring to FIG. 12G, the steps illustrated in FIGS. 11G-11O can be performed to form an image or light sensor chip 99*f*. If a thin sawing blade is used to cut through the semiconductor wafer 100 in the die-sawing process, the thick sawing blade used to remove the portions of the transparent substrate 11 and the patterned adhesive polymer 25 over the metal structures 68 may have a width greater than that of the thin sawing blade used in the die-sawing process by more than 150 micrometers, such as between 150 micrometers and 1 millimeter or between 200 and 500 micrometers. After the die-sawing process, the image or light sensor chip 99*f* is detached from the blue tape.

Alternatively, an oxygen plasma etching process, used to remove a portion of the patterned adhesive polymer 25 not under the transparent substrate 11 to expose upper portions of the metal structures 68, can be performed before or after the die-sawing process, such that the metal structures 68 have a height, extruding from the patterned adhesive polymer 25, between, e.g., 0.5 and 20 micrometers, and preferably between 5 and 15 micrometers. Accordingly, the metal structures 68 of the image or light sensor chip 99*f* have the upper portions uncovered by the patterned adhesive polymer 25, and bonded with the bond pads or inner leads 15 of the above-mentioned flexible substrate 9 or 9*a* by a chip-on-film (COF) process or with multiple metal pads of a substrate, such as printed circuit board, ball-grid-array (BGA) substrate, metal substrate, glass substrate or ceramic substrate.

Figure 12H:
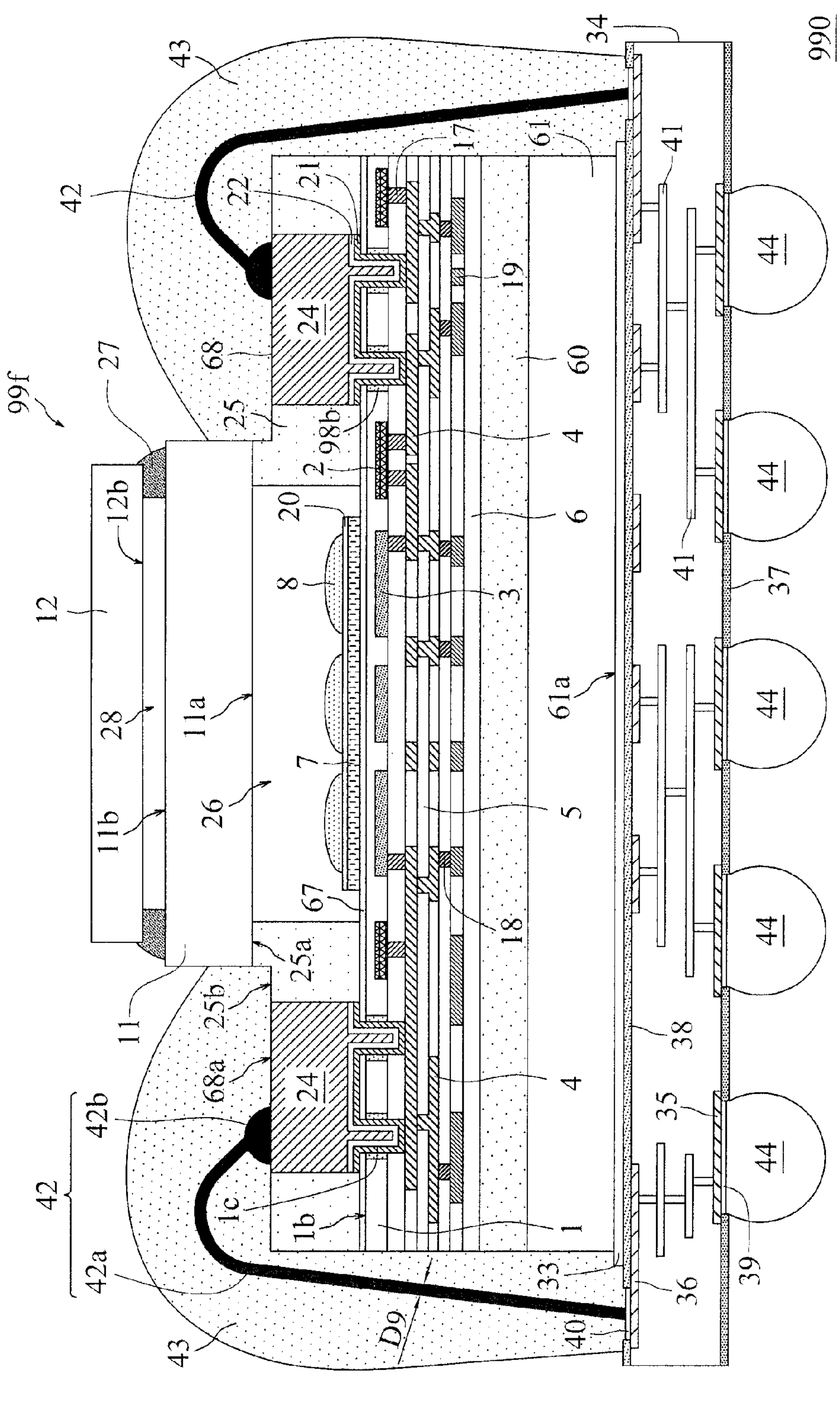
FIG. 12H is a cross-sectional view depicting an image or light sensor package according to an embodiment of the present disclosure.

FIG. 12H is a cross-sectional view depicting an image or light sensor package according to an embodiment of the present disclosure. The image or light sensor chip 99*f* shown in FIG. 12G can be packaged by the steps illustrated in FIGS. 3A-3D to form an image or light sensor package 990. The wirebonded wires 42 each have one end ball bonded with the metal layer 24 of one of the metal structures 68 of the image or light sensor chip 99*f*, and the other end wedge bonded with the metal layer 40 of the package substrate 34. The specification of the wirebonded wires 42 ball bonded with the metal layer 24 as shown in FIG. 12H can be referred to as the specification of the wirebonded wires 42 ball bonded with the metal layer 24 as illustrated in FIG. 3B. The encapsulation material 43 can be formed on the wirebonded wires 42, on the top surfaces 68*a* of the metal structures 68, on the top surface of the package substrate 34 and at sidewalls of the image or light sensor chip 99*f*, encapsulating the wirebonded wires 42. An element in FIG. 12H indicated by the same reference number as a like or similar element indicated in FIGS. 3A-3D and 12A-12G can have the same or similar material(s) and/or specification as the corresponding element in FIGS. 3A-3D and 12A-12G.

Figure 2D:
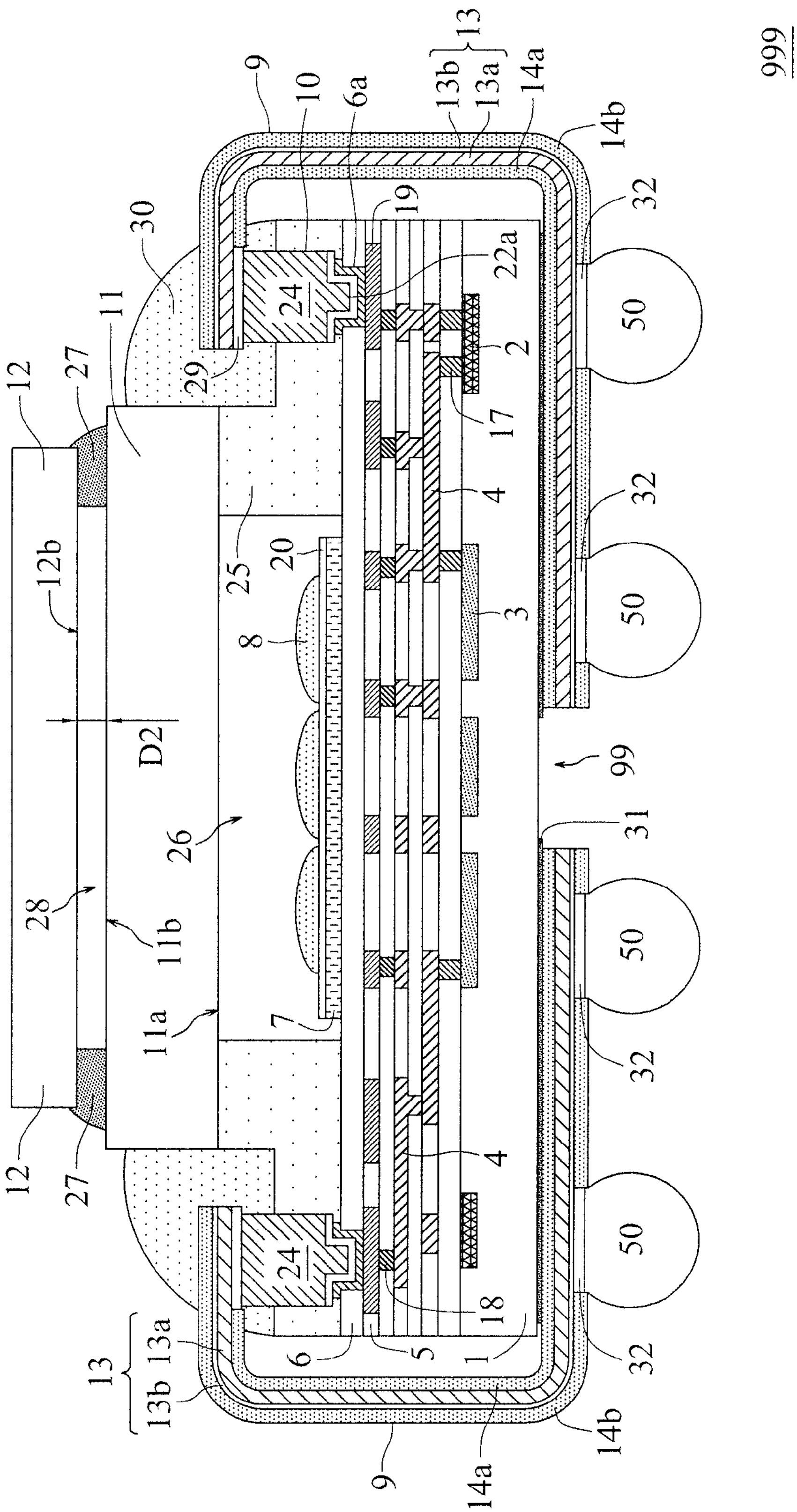

The image or light sensor chip 99 illustrated in FIGS. 1P, 2D and 4E-4G can be replaced by the image or light sensor chip 99*e* illustrated in FIG. 11O or the image or light sensor chip 99*f* illustrated in FIG. 12G. The top surface 61*a* of the substrate 61 of the image or light sensor chip 99*e* or 99*f* can be attached to the third portion of the flexible substrate 9 by the adhesive material 31, as shown in FIGS. 1P and 2D, and the bond pads or inner leads 15 of the flexible substrate 9 can be bonded with the metal layer 24 of the metal structures 68 of the image or light sensor chip 99*e* or 99*f* by a chip-on-film (COF) process. The top surface 61*a* of the substrate 61 of the image or light sensor chip 99*e* or 99*f* can be attached to the top surface of the package substrate 34 by the adhesive material 33, as shown in FIGS. 4E-4G, and the bond pads or inner leads 15 of the flexible substrate 9*a* can be bonded with the metal layer 24 of the metal structures 68 of the image or light sensor chip 99*e* or 99*f* by a chip-on-film (COF) process. The specification of the metal structures 68 after being bonded with the flexible substrate 9 or 9*a* can be referred to as the specification of the metal pads or bumps 10 after being bonded with the flexible substrate 9 as illustrated in FIG. 1M.

The image or light sensor chip 99 illustrated in FIGS. 3E, 3F, 5C, 6C and 7 can be replaced by the image or light sensor chip 99*e* illustrated in FIG. 11O or the image or light sensor chip 99*f* illustrated in FIG. 12G. The top surface 61*a* of the substrate 61 of the image or light sensor chip 99*e* or 99*f* can be attached to the top surface of the package substrate 34 by the adhesive material 33, as shown in FIGS. 3E and 3F, and the wirebonded wires 42 each can have one end ball bonded with the metal layer 24 of one of the metal structures 68 of the image or light sensor chip 99*e* or 99*f*. The top surface 61*a* of the substrate 61 of the image or light sensor chip 99*e* or 99*f* can be attached to the top surface of the substrate 48 by the adhesive material 33, as shown in FIG. 5C, and the wirebonded wires 42 each can have one end ball bonded with the metal layer 24 of one of the metal structures 68 of the image or light sensor chip 99*e* or 99*f*. The top surface 61*a* of the substrate 61 of the image or light sensor chip 99*e* or 99*f* can be attached to the die paddle 52*a* of the lead frame 52 by the adhesive material 33, as shown in FIG. 6C, and the wirebonded wires 42 each can have one end ball bonded with the metal layer 24 of one of the metal structures 68 of the image or light sensor chip 99*e* or 99*f*. The top surface 61*a* of the substrate 61 of the image or light sensor chip 99*e* or 99*f* can be attached to the die attach pad 53*a* of the lead frame 53 by the adhesive material 33, as shown in FIG. 7, and the wirebonded wires 42 each can have one end ball bonded with the metal layer 24 of one of the metal structures 68 of the image or light sensor chip 99*e* or 99*f*. The specification of the wirebonded wires 42 ball bonded with the metal layer 24 can be as the same or similar to the specification of the wirebonded wires 42 ball bonded with the metal layer 24 as illustrated in FIG. 3B.

The above-mentioned layer 7 of optical or color filter array 7, microlenses 8 and buffer layer 20 can be replaced by a microelectromechanical system (also written as micro-electro-mechanical system). When the microelectromechanical system (MEMS) is applied to the processes illustrated in FIGS. 1A-1P, 2A-2D, 3A-3F, 4A-4G, 5A-5C, 6A-6C, 7 and 8H, the microelectromechanical system can be formed on the passivation layer 5 and over the transistors of the light sensors 3 and provided in the cavity, free space or air space 26, as illustrated in the process of FIGS. 1A-1P, 2A-2D, 3A-3F, 4A-4G, 5A-5C, 6A-6C, 7 and 8H.

Figure 13A:
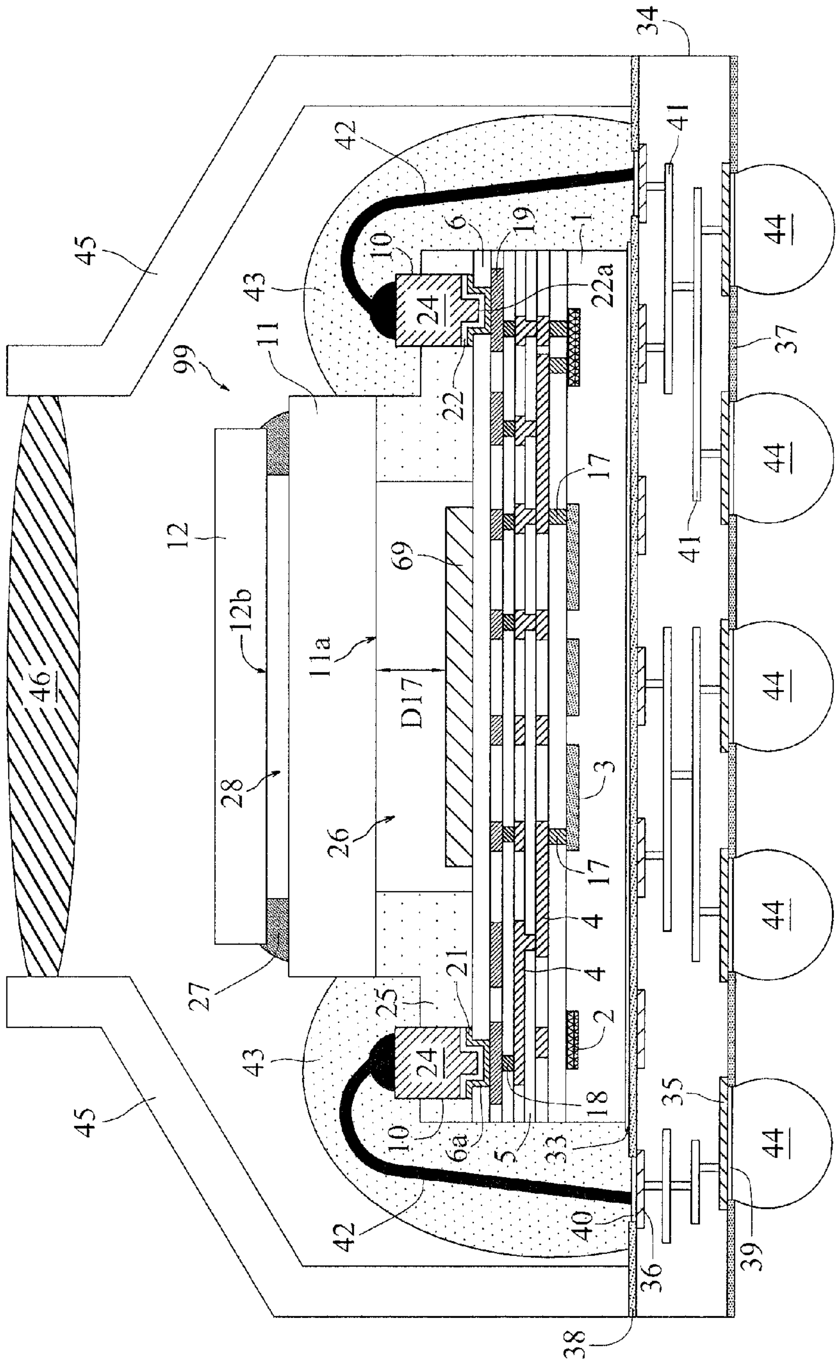
FIG. 13A is a cross-sectional view depicting an image or light sensor module according to an embodiment of the present disclosure.

For example, referring to FIG. 13A, the layer 7 of optical or color filter array, the buffer layer 20 and the microlenses 8 of the image or light sensor module shown in FIG. 3E can be replaced by a microelectromechanical system 69, and the microelectromechanical system 69 can be formed on the passivation layer 6 and over the transistors of the light sensors 3 and provided in the cavity, free space or air space 26. An element in FIG. 13A indicated by the same reference number as a like or similar element indicated in FIGS. 3A-3E can have the same or similar material(s) and/or specification as the respective element shown and described for FIGS. 3A-3E.

When the microelectromechanical system is applied to the processes illustrated in FIGS. 8A-8G, the microelectromechanical system can be formed on the polymer layer 58 and over the transistors of the light sensors 3 and provided in the cavity, free space or air space 26, as illustrated in the process of FIGS. 8A-8G. For example, referring to FIG. 13B, the layer 7 of optical or color filter array, the buffer layer 20 and the microlenses 8 of the image or light sensor package 994 shown in FIG. 8G can be replaced by the microelectromechanical system 69, and the microelectromechanical system 69 can be formed on the polymer layer 58 and over the transistors of the light sensors 3 and provided in the cavity, free space or air space 26. An element in FIG. 13B indicated by the same reference number as a like or similar element in FIGS. 8A-8G can have the same or similar material(s) and/or specification as the respective element in FIGS. 8A-8G.

When the microelectromechanical system is applied to the processes illustrated in FIGS. 9A-9K and 10A-10M, the microelectromechanical system can be formed on the bottom surface 1*b* of the thinned semiconductor substrate 1 and over the transistors of the light sensors 3 and provided in the cavity, free space or air space 26, as illustrated in the process of FIGS. 9A-9K and 10A-10M. For example, referring to FIG. 13C, the layer 7 of optical or color filter array, the buffer layer 20 and the microlenses 8 of the image or light sensor package 992 shown in FIG. 9J can be replaced by the microelectromechanical system 69, and the microelectromechanical system 69 can be formed on the bottom surface 1*b* of the thinned semiconductor substrate 1 and over the transistors of the light sensors 3 and provided in the cavity, free space or air space 26. An element in FIG. 13C indicated by the same reference number as a like or similar element indicated in FIGS. 9A-9J can have the same material(s) and/or specification as the respective element illustrated in FIGS. 9A-9J.

When the microelectromechanical system is applied to the processes illustrated in FIGS. 11A-11P and 12A-12H, the microelectromechanical system can be formed on the insulating layer 67 and over the transistors of the light sensors 3 and provided in the cavity, free space or air space 26, as illustrated in the process of FIGS. 11A-11P and 12A-12H. For example, referring to FIG. 13D, the layer 7 of optical or color filter array, the buffer layer 20 and the microlenses 8 of the image or light sensor package 990 shown in FIG. 12H can be replaced by the microelectromechanical system 69, and the microelectromechanical system 69 can be formed on the insulating layer 67 and over the transistors of the light sensors 3 and provided in the cavity, free space or air space 26. An element in FIG. 13D indicated by the same reference number as a like or similar element indicated in FIGS. 12A-12H can have the same material(s) and/or specification as the respective element illustrated in FIGS. 12A-12H.

In FIGS. 13A-13D, a vertical distance D17 between the bottom surface 11*a* of the transparent substrate 11 and a top surface of the microelectromechanical system 69 can be between, e.g., 10 and 300 micrometers, and preferably between 20 and 100 micrometers. An air gap is between the bottom surface 11*a* of the transparent substrate 11 and the top surface of the microelectromechanical system 69. The microelectromechanical system (MEMS) 69 can be an inertial sensor including a mechanical movable portion.

Figure 13B:
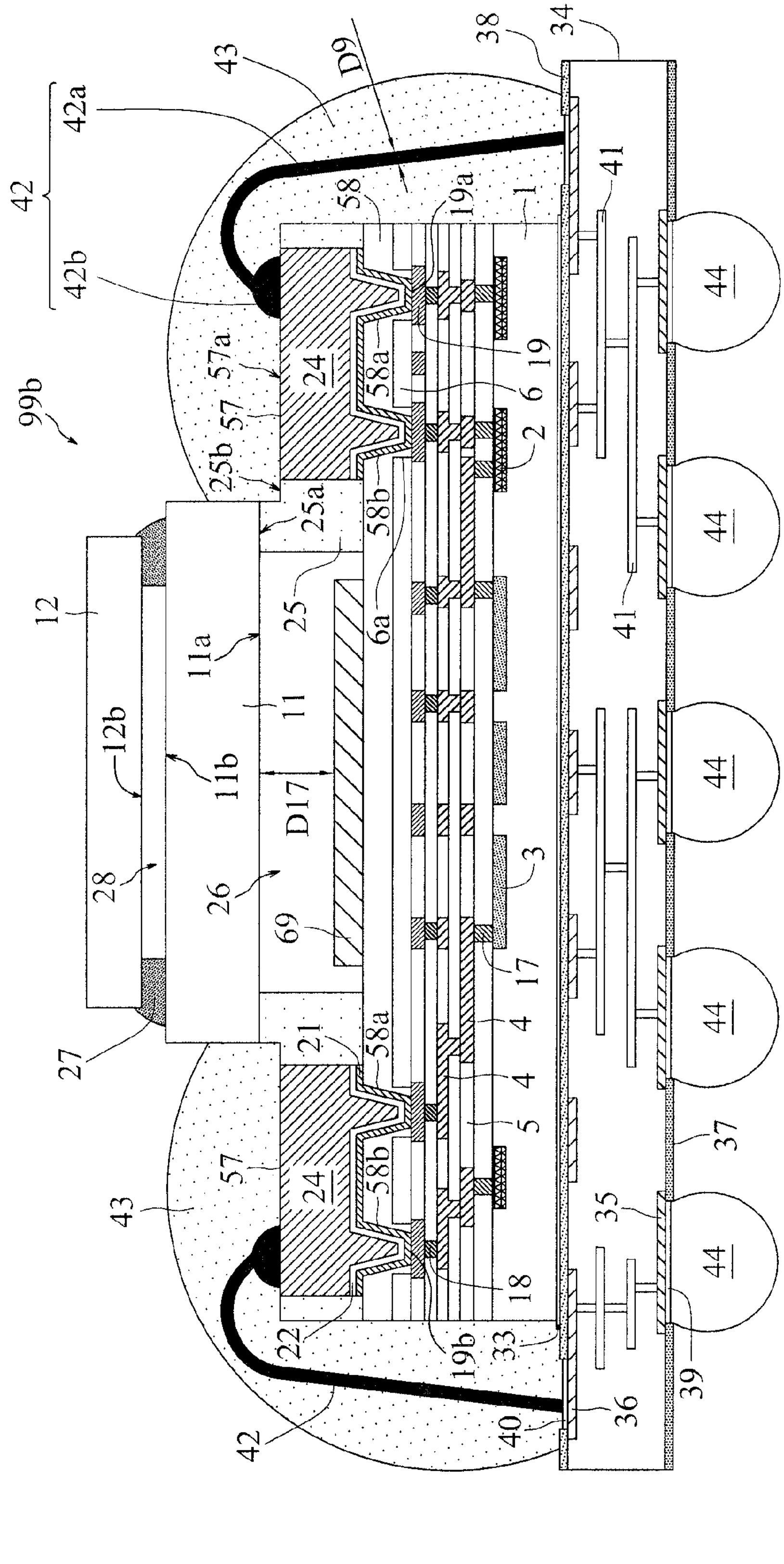
FIG. 13B-13D are cross-sectional views depicting image or light sensor packages according to an embodiment of the present disclosure.
Figure 13C:
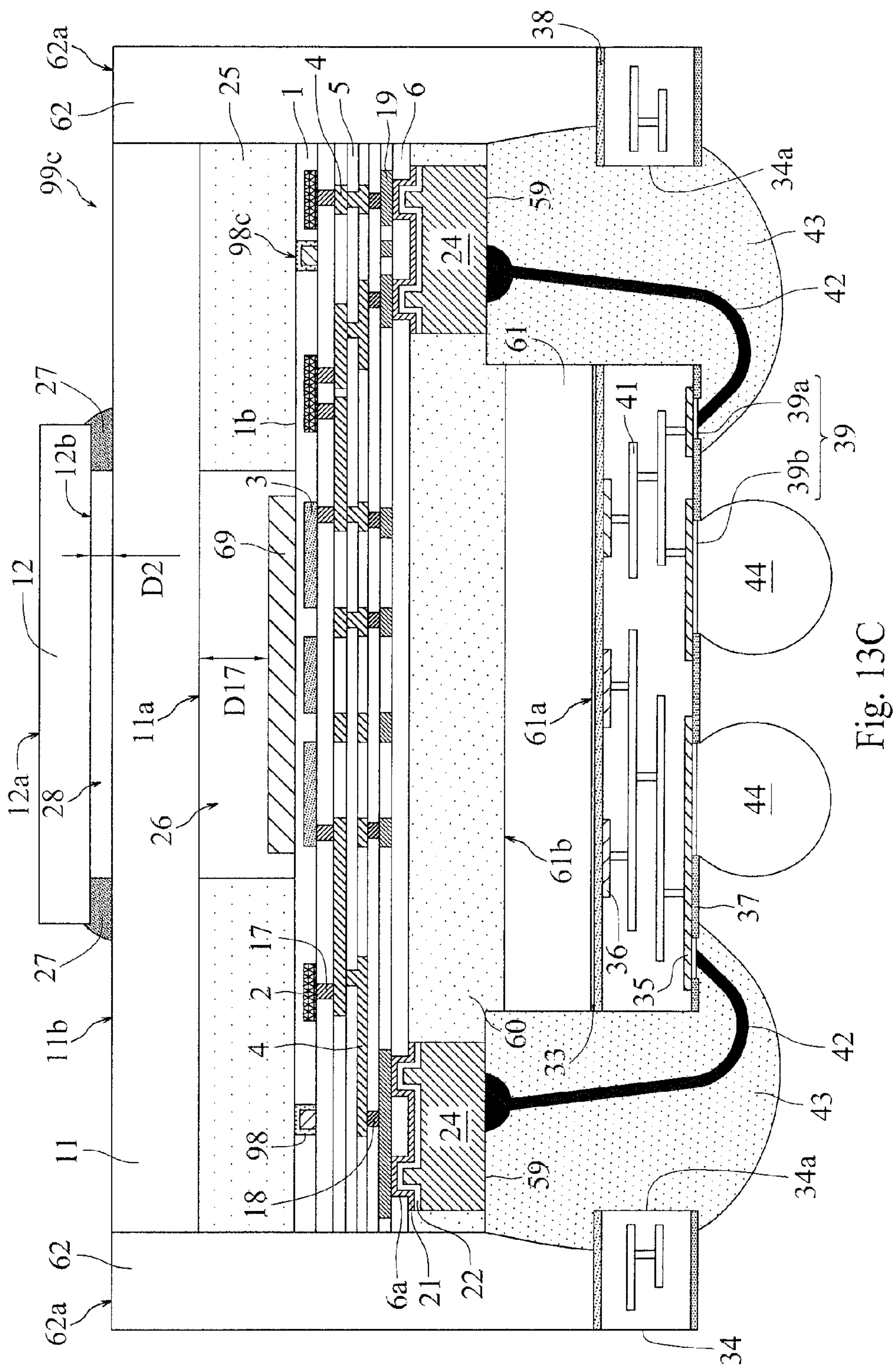
Figure 13D:
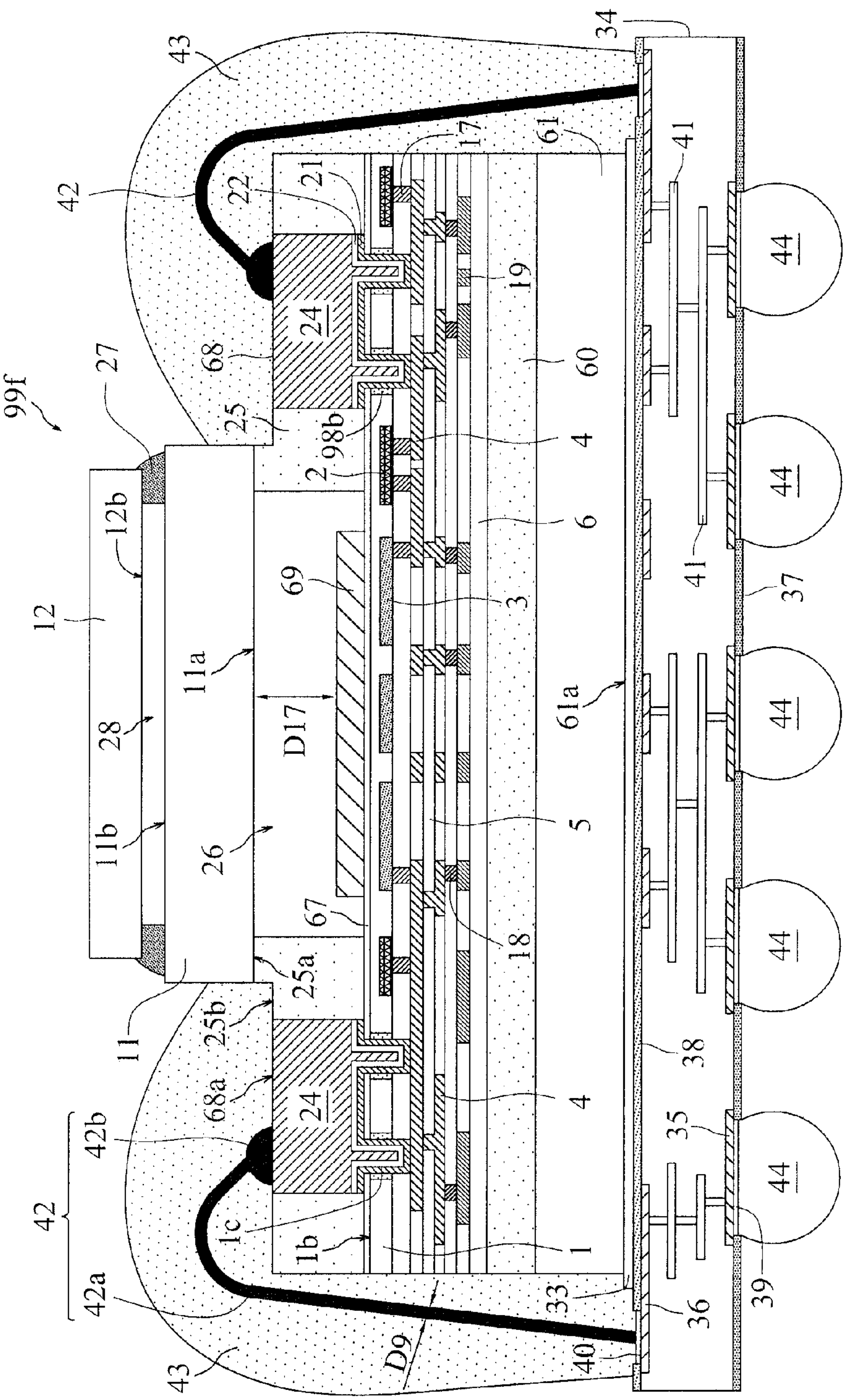

The above-mentioned image or light sensor chips 99 and 99*a*-99*f*, the above-mentioned image or light sensor packages 990-999, the image or light sensor package shown in FIGS. 13B-13D, the image or light sensor modules shown in FIGS. 3E, 3F, 4F, 4G and 13A, and the plastic leaded chip carrier (PLCC) package shown in FIGS. 7 and 9K can be used in and for various applications, including but not limited to the following: telephones, e.g., cordless phones, mobile phones, so-called Smartphones; computers, e.g., Netbook computers, notebook computers, personal digital assistants (PDA), pocket personal computers, portable personal computers, electronic books, digital books, desktop computers, etc.; cameras and image sensors, e.g., digital cameras, image scanner devices, digital video cameras, digital picture frames; and, automobile electronic products such as on-board cameras and sensors, proximity sensors and IR lidar cruise control systems, and the like. Moreover, light sensor chips and light sensor packages according to the present disclosure can accommodate virtually any type of semiconductor materials suitable for forming semiconductor light sensors; and, while the present disclosure is provided in the context of light sensors, light emitting devices may be formed by chips and packages according to the present disclosure.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

In reading the present disclosure, one skilled in the art will appreciate that embodiments of the present disclosure, e.g., design of structure and/or control of methods described herein, can be implemented in hardware, software, firmware, or any combinations of such, and over one or more networks. Suitable software can include computer-readable or machine-readable instructions for performing methods and techniques (and portions thereof) of designing and/or controlling the implementation of tailored RF pulse trains. Any suitable software language (machine-dependent or machine-independent) may be utilized. Moreover, embodiments of the present disclosure can be included in or carried by various signals, e.g., as transmitted over a wireless RF or IR communications link or downloaded from the Internet.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Furthermore, unless stated otherwise, the numerical ranges provided are intended to be inclusive of the stated lower and upper values. Moreover, unless stated otherwise, all material selections and numerical values are representative of preferred embodiments and other ranges and/or materials may be used.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents.

What is claimed is:

1. A light sensor chip comprising:

a semiconductor substrate;

multiple transistors each including a diffusion or doped area in said semiconductor substrate and a gate over a top surface of said semiconductor substrate;

a first dielectric layer over said top surface of said semiconductor substrate;

an interconnection layer over said first dielectric layer;

a second dielectric layer over said interconnection layer and over said first dielectric layer;

a metal trace over said second dielectric layer, wherein said metal trace has a width smaller than 1 micrometer;

an insulating layer on a first region of said metal trace, over said interconnection layer and over said first and second dielectric layers, wherein an opening in said insulating layer is over a second region of said metal trace, and said second region is at a bottom of said opening;

a polymer layer on said insulating layer;

a metal layer on said second region of said metal trace, wherein said metal layer includes a portion in said polymer layer, wherein said metal layer is connected to said second region of said metal trace through said opening, wherein said metal layer has a thickness between 3 and 100 micrometers and a width between 5 and 100 micrometers; and a transparent substrate on a top surface of said polymer layer and over said multiple transistors, wherein an air space is between said insulating layer and said transparent substrate and over said multiple transistors, wherein a bottom surface of said transparent substrate provides a top wall of said air space, and said polymer layer provides a sidewall of said air space.

2. The light sensor chip of claim 1, further comprising a microelectromechanical system in said air space and over said multiple transistors.

3. The light sensor chip of claim 1, further comprising a layer of filter array and multiple microlenses in said air space and over said multiple transistors.

4. The light sensor chip of claim 1, wherein said multiple transistors compose a complementary-metal-oxide-semiconductor (CMOS) device or a charge coupled device (CCD).

5. The light sensor chip of claim 1, wherein said transparent substrate includes a glass substrate.

6. The light sensor chip of claim 1, wherein said metal layer includes a copper layer or a gold layer.

* * * * *